US 9,240,551 B2

(12) United States Patent
Hayoz et al.

(10) Patent No.: US 9,240,551 B2
(45) Date of Patent: Jan. 19, 2016

(54) POLYMERS BASED ON BENZODIONES

(71) Applicant: BASF SE, Ludwigshafen (DE)

(72) Inventors: Pascal Hayoz, Hofstetten (CH); Mathias Dueggeli, Sissach (CH)

(73) Assignee: BASF SE, Ludwigshafen (DE)

( * ) Notice: Subject to any disclaimer, the term of this patent is extended or adjusted under 35 U.S.C. 154(b) by 79 days.

(21) Appl. No.: 14/349,773

(22) PCT Filed: Oct. 3, 2012

(86) PCT No.: PCT/EP2012/069510
§ 371 (c)(1),
(2) Date: Apr. 4, 2014

(87) PCT Pub. No.: WO2013/050401
PCT Pub. Date: Apr. 11, 2013

(65) Prior Publication Data
US 2014/0302637 A1    Oct. 9, 2014

Related U.S. Application Data

(60) Provisional application No. 61/542,830, filed on Oct. 4, 2011, provisional application No. 61/596,755, filed on Feb. 9, 2012.

(30) Foreign Application Priority Data

Oct. 4, 2011  (EP) ..................................... 11183765
Feb. 9, 2012  (EP) ..................................... 12154730

(51) Int. Cl.
*H01L 35/24*    (2006.01)
*H01L 51/00*    (2006.01)
(Continued)

(52) U.S. Cl.
CPC .......... *H01L 51/0003* (2013.01); *C08G 61/124* (2013.01); *C08G 61/126* (2013.01);
(Continued)

(58) Field of Classification Search
CPC .................................................. H01L 51/0003
USPC ................................ 257/40, E51.001; 438/99
See application file for complete search history.

(56) References Cited

U.S. PATENT DOCUMENTS 6,690,029 B1    2/2004  Anthony et al.
2003/0021913 A1   1/2003  O'Neill et al.
(Continued)

FOREIGN PATENT DOCUMENTS

EP    0 252 406 A2    1/1988
EP    0 574 118 A1    12/1993
(Continued)

OTHER PUBLICATIONS

International Search Report issued Apr. 29, 2013 in PCT/EP2012/069510.

Masakatsu Nakatsuka et al., "3,7-Dihalo-2H, 6H-benzo[I,2-b:4,5-b']dithiophene-2, 6-dione. New Wurster-type Acceptors Isoelectronic with 2,6-anthraquinone", Chemistry Letters, No. 6, XP-055012968, Jan. 1, 1983, pp. 905-908.
(Continued)

*Primary Examiner* — Anthony Ho
(74) *Attorney, Agent, or Firm* — Oblon, McClelland, Maier & Neustadt, L.L.P.

(57) ABSTRACT

The present invention relates to polymers comprising one or more (repeating) unit(s) of the formula (I), and compounds of formula (III), wherein Y, $Y^{15}$, $Y^{16}$ and $Y^{17}$ are independently of each other a group of formula (A), (B) or (C) and their use as IR absorber, organic semiconductor in organic devices, especially in organic photovoltaics and photodiodes, or in a device containing a diode and/or an organic field effect transistor. The polymers and compounds according to the invention can have excellent solubility in organic solvents and excellent film-forming properties. In addition, high efficiency of energy conversion, excellent field-effect mobility, good on/off current ratios and/or excellent stability can be observed, when the polymers and compounds according to the invention are used in organic field effect transistors, organic photovoltaics and photodiodes.

$$-\!\!\left[Ar^3\right]_{\overline{c}}\!\left[Ar^2\right]_{\overline{b}}\!\left[Ar^1\right]_{\overline{a}}\!Y\!-\!\left[Ar^{1'}\right]_{\overline{a'}}\!\left[Ar^{2'}\right]_{\overline{b'}}\!\left[Ar^{3'}\right]_{\overline{c'}}\!\!- \quad (I)$$

$$A^1\!-\!Y\!-\!\left[A^3\!-\!Y^{15}\right]_{\overline{o}}\!\left[A^4\!-\!Y^{16}\right]_{\overline{p}}\!\left[A^5\!-\!Y^{17}\right]_{\overline{q}}\!A^2 \quad (III)$$

(A), (B), (C) [chemical structures]

20 Claims, No Drawings

(51) Int. Cl.

| | | |
|---|---|---|
| *C08G 61/12* | (2006.01) | |
| *H01L 51/05* | (2006.01) | |
| *C09B 57/00* | (2006.01) | |
| *C09B 69/10* | (2006.01) | |
| *C09B 69/00* | (2006.01) | |
| *H01L 51/42* | (2006.01) | |

(52) U.S. Cl.
CPC .............. *C09B 57/00* (2013.01); *C09B 69/008* (2013.01); *C09B 69/102* (2013.01); *C09B 69/109* (2013.01); *H01L 51/0036* (2013.01); *H01L 51/0043* (2013.01); *H01L 51/0558* (2013.01); *C08G 2261/124* (2013.01); *C08G 2261/1412* (2013.01); *C08G 2261/226* (2013.01); *C08G 2261/228* (2013.01); *C08G 2261/3222* (2013.01); *C08G 2261/3223* (2013.01); *C08G 2261/3243* (2013.01); *C08G 2261/344* (2013.01); *C08G 2261/411* (2013.01); *C08G 2261/91* (2013.01); *C08G 2261/92* (2013.01); *H01L 51/0037* (2013.01); *H01L 51/42* (2013.01); *Y02E 10/549* (2013.01)

(56) References Cited

U.S. PATENT DOCUMENTS

| | | |
|---|---|---|
| 2006/0013549 A1 | 1/2006 | Shtein et al. |
| 2007/0079867 A1 | 4/2007 | Chittibabu et al. |
| 2008/0241492 A1 | 10/2008 | Demartin Maeder et al. |

FOREIGN PATENT DOCUMENTS

| | | |
|---|---|---|
| EP | 0 648 770 A2 | 4/1995 |
| EP | 0 648 817 A1 | 4/1995 |
| EP | 0 742 255 A1 | 11/1996 |
| EP | 0 761 772 A1 | 3/1997 |
| EP | 1 086 984 A2 | 3/2001 |
| WO | WO 94/12577 A2 | 6/1994 |
| WO | WO 98/32802 A1 | 7/1998 |
| WO | WO 98/45757 A1 | 10/1998 |
| WO | WO 98/58027 A1 | 12/1998 |
| WO | WO 99/01511 A1 | 1/1999 |
| WO | WO 00/17275 A1 | 3/2000 |
| WO | WO 00/36210 A1 | 6/2000 |
| WO | WO 00/39221 A1 | 7/2000 |
| WO | WO 00/63297 A1 | 10/2000 |
| WO | WO 03/052841 A1 | 6/2003 |
| WO | WO 2004/101581 A2 | 11/2004 |
| WO | WO 2004/112161 A2 | 12/2004 |
| WO | WO 2007/082584 A1 | 7/2007 |
| WO | WO 2008/001123 A1 | 1/2008 |
| WO | WO 2008/107089 A1 | 9/2008 |
| WO | WO 2009/047104 A2 | 4/2009 |
| WO | WO 2010/108873 A1 | 9/2010 |
| WO | WO 2010/136352 A1 | 12/2010 |
| WO | WO 2012/003918 A1 | 1/2012 |
| WO | WO 2012/017005 A2 | 2/2012 |
| WO | WO 2012/175530 A1 | 12/2012 |
| WO | WO 2014/072292 A2 | 5/2014 |

OTHER PUBLICATIONS

Weibin Cui et al., "Benzodipyrrolidones and Their Polymers", Macromolecules, vol. 44, No. 20, XP-055012951, Sep. 20, 2011, pp. 7869-7873.

Kai Zhang et al., "Low-Bandgap Benzodifuranone-Based Polymers", Macromolecules, vol. 44, No. 12, XP-055012952, Jun. 28, 2011, pp. 4596-4599.

C. W. Greenhalgh et al., "The Synthesis of Quinodimethanes in the Benzodifuranone and Benzodipyrrolidone Series", Dyes and Pigments, 1 (2), 1980, pp. 103-120.

POLYMERS BASED ON BENZODIONES

The present invention relates to polymers comprising one or more (repeating) unit(s) of the formula (I), and compounds of formula (III) and their use as IR absorber, organic semiconductor in organic devices, especially in organic photovoltaics and photodiodes, or in a device containing a diode and/or an organic field effect transistor. The polymers and compounds according to the invention can have excellent solubility in organic solvents and excellent film-forming properties. In addition, high efficiency of energy conversion, excellent field-effect mobility, good on/off current ratios and/or excellent stability can be observed, when the polymers and compounds according to the invention are used in organic field effect transistors, organic photovoltaics and photodiodes.

WO2012/003918 relates to polymers comprising repeating units of formula

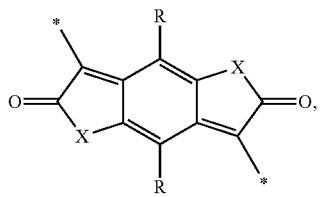

wherein X is O, S, or NR$^x$. While copolymers, such as, for example,

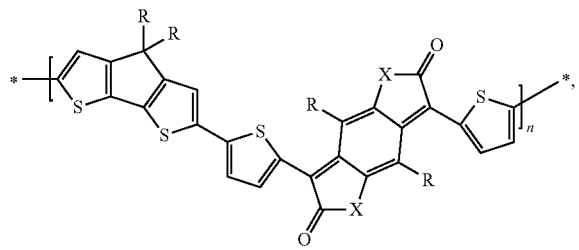

are mentioned as preferred compounds, where a thiophenylen group is directly bonded to the isobenzo DPP basic structure, WO2012/003918 fails to disclose a method for the production of the corresponding isobenzo DPP monomers

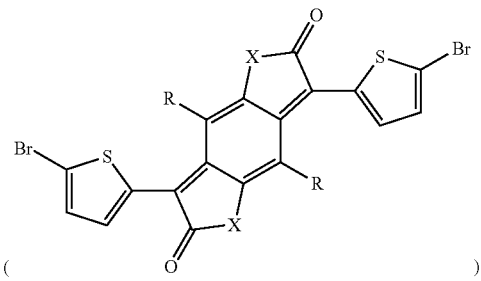

which are necessary for the production of the copolymers. Examples 1 to 4 of WO2012/003918 only disclose polymers having a phenylen group directly bonded to the benzodifurandion basic skeleton. While the synthesis of 3,7-dibromo-benzo[1,2-b;4,5-b]dithiophene-2,6-dione has been described in Chemistry Letters (1983) 905-908, the extension to bisarylated derivatives as shown in scheme 3 of WO2012/003918 is a mere theoretical possibility, which has not been reduced to practice.

Kai Zhang and Bernd Tieke, Macromolecules 44 (2011) 4596-4599 relates to π-conjugated monomers and polymers containing benzodifuranone units in the main chain:

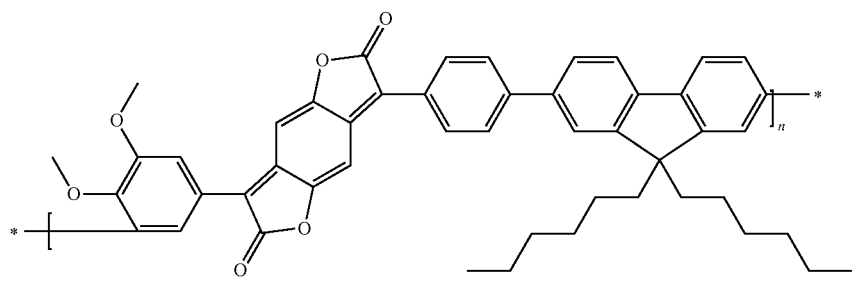

(P1)

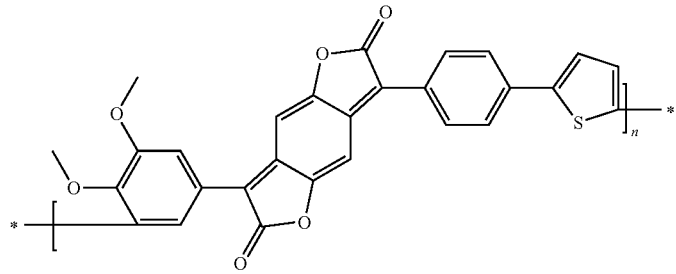

(P2)

The polymers show very broad absorption bands with a high extinction coefficient up to 32-500 L mol$^{-1}$ cm$^{-1}$. The polymers also show reversible redox behavior, giving small HOMO-LUMO gaps up to 1.30 eV with strong donor-acceptor character.

Weibin Cui et al., Macromolecules 44 (2011) 7869-7873 describes the synthesis of several benzodipyrrolidone-based small molecules.

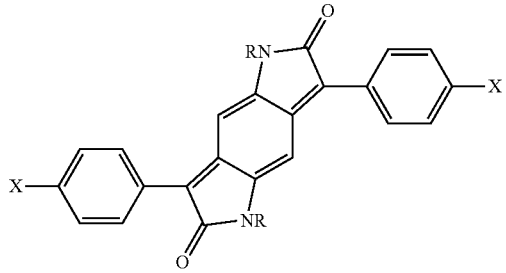

| Cpd. | X | R |
|---|---|---|
| 3a | H | H |
| 3b | Br | H |
| 5a-1 | H | Methyl |
| 5a-2 | H | Ethylhexyl |
| 5b | Br | Octyldodecyl |

Moreover, two benzodipyrrolidone-based low-band-gap conjugated polymers were prepared by means of Suzuki coupling polymerization.

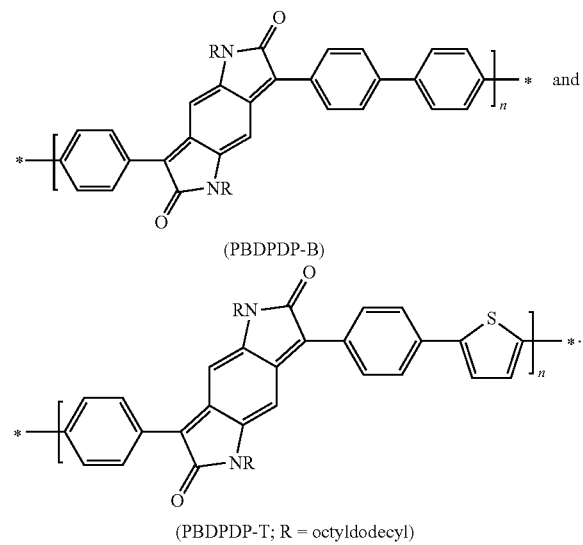

The band gaps were estimated to be 1.9 eV of PBDPDP-B and 1.68 eV of PBDPDP-T. The synthesis of the symmetrical monomers requires the condensation of 0.5 eq. hydroquinone and 1 eq. of a mandelic acid derivative, respectively, leading to a double cyclization of benzodihydrofuranone, followed by oxidation to the conjugated benzodifuranones. The synthesis of such symmetrical benzofuranediones is, for example, described in Dyes and Pigments (1980), 1(2), 103-120.

EP0252406A2 describes a process for the preparation of dyes of the formula

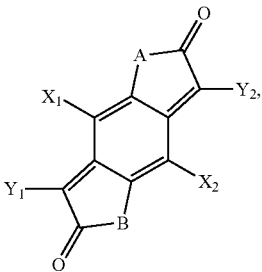

where A and B are each O, S or N-alkyl, $X_1$ and $X_2$ are each H, halogen or hydrocarbon radicals, and $Y_1$ and $Y_2$ are each preferably aryl. The compounds described in the examples are characterized in that A and B are —O— and at least one of $Y_1$ and $Y_2$ is an aryl group.

EP0574118A1 relates to benzodifuranone dyes carrying at least one thiazolyl group.

Among others benzodifuranone dyes of formula

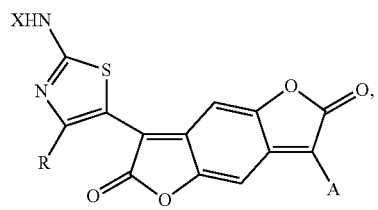

(3)

are disclosed, wherein R is —H or alkyl; X is —H, alkyl or alkylcarbonyl; A is a phenyl group which is unsubstituted or substituted by from one to three substituents; or A is a group of the formula

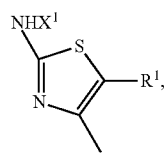

(4)

wherein $R^1$ is —H or alkyl; and $X^1$ is —H, alkyl or alkylcarbonyl.

WO9412577A2 relates to a process for the preparation of a polycyclic dye of the Formula

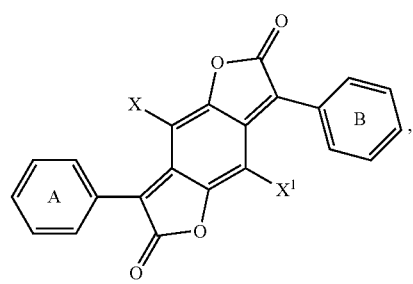

wherein ring A is unsubstituted or is substituted by from 1 to 5 groups; ring B is unsubstituted or is substituted by from 1 to 5 groups; X and $X^1$ each independently is —H, halogen, cyano, alkyl or aryl.

The synthesis of the symmetrical monomers required the condensation of 0.5 eq. hydroquinone and 1 eq. of a mandelic acid derivative, respectively, leading to a double cyclization of benzodihydrofuranone, followed by oxidation to the conjugated benzodifuranones.

It is one object of the present invention to provide polymers and compounds, which show high efficiency of energy conversion, excellent field-effect mobility, good on/off current ratios and/or excellent stability, when used in organic field effect transistors, organic photovoltaics (solar cells) and photodiodes. Another object of the invention is to provide polymers and compounds with very low band gap, which can also be used as infrared (IR) absorbers. Still another object of the invention is to provide a new synthesis route to benzodiones with 5-ring-heterocycles (instead of (substituted)phenyl) directly attached to the benzodione basic structure to form structures where the benzodione core and the directly attached 5-ring-heterocycles are arranged in a planar manner.

In a first aspect of the present invention, said object has been solved by polymers, comprising one or more (repeating) unit(s) of the formula $+[Ar^3]_c+[Ar^2]_b+[Ar^1]_a Y-[Ar^{1'}]_{a'}+[Ar^{2'}]_{b'}+[Ar^{3'}]_{c'}$ (I), wherein Y is a group of formula

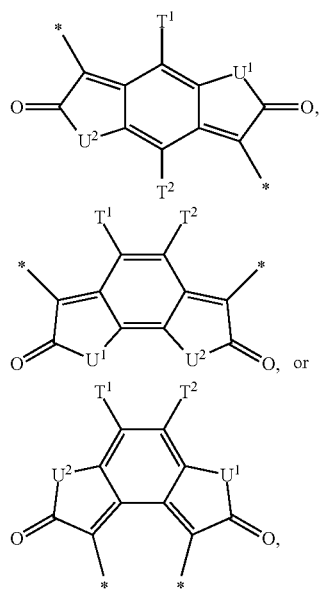

a is 1, 2, or 3; a' is 1, 2, or 3; b is 0, 1, 2, or 3; b' is 0, 1, 2, or 3; c is 0, 1, 2, or 3; c' is 0, 1, 2, or 3;

$U^1$ is O, S, or $NR^1$;

$U^2$ is O, S, or $NR^2$;

$T^1$ and $T^2$ are independently of each other hydrogen, halogen, hydroxyl, cyano, —$COOR^{103}$, —$OCOR^{103}$, —$NR^{112}COR^{103}$, —$CONR^{112}R^{113}$, —$SOR^{103'}$, —$SO_2R^{103'}$, —$NR^{112}SO_2R^{103'}$, —$NR^{112}R^{113}$, $C_1$-$C_{25}$alkyl, which may be substituted by E and/or interrupted by D, $C_5$-$C_{12}$cycloalkyl, which can be substituted one to three times with $C_1$-$C_8$alkyl and/or $C_1$-$C_8$alkoxy; $C_7$-$C_{25}$arylalkyl, $C_6$-$C_{24}$aryl, $C_6$-$C_{24}$aryl which is substituted by G, $C_2$-$C_{20}$heteroaryl, or $C_2$-$C_{20}$heteroaryl which is substituted by G;

$R^1$ and $R^2$ may be the same or different and are selected from hydrogen, a $C_1$-$C_{100}$alkyl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group; and/or can optionally be interrupted by —O—, —S—, —$NR^{39}$—, $CONR^{39}$—, $NR^{39}CO$—, —COO—, —CO— or —OCO—, a $C_2$-$C_{100}$alkenyl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group; and/or can optionally be interrupted by —O—, —S—, —$NR^{39}$—, $CONR^{39}$—, $NR^{39}CO$—, —COO—, —CO— or —OCO—, a $C_3$-$C_{100}$alkinyl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group; and/or can optionally be interrupted by —O—, —S—, —$NR^{39}$—, $CONR^{39}$—, $NR^{39}CO$—, —COO—, —CO— or —OCO—, a $C_3$-$C_{12}$cycloalkyl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group; and/or can optionally be interrupted by —O—, —S—, —$NR^{39}$—, $CONR^{39}$—, $NR^{39}CO$—, —COO—, —CO— or —OCO—, a $C_6$-$C_{24}$aryl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group;

a $C_2$-$C_{20}$heteroaryl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group;

a —CO—$C_1$-$C_{18}$alkyl group, a —CO—$C_5$-$C_{12}$cycloalkyl group, or —COO—$C_1$-$C_{18}$alkyl group;

$R^{39}$ is hydrogen, $C_1$-$C_{18}$alkyl, $C_1$-$C_{18}$haloalkyl, $C_7$-$C_{25}$arylalkyl, or $C_1$-$C_{18}$alkanoyl, $R^{103}$ and $R^{103'}$ are independently of each other $C_1$-$C_{100}$alkyl, especially $C_3$-$C_{25}$alkyl, $C_1$-$C_{25}$alkyl substituted by E and/or interrupted with D, $C_7$-$C_{25}$arylalkyl, $C_6$-$C_{24}$aryl, $C_6$-$C_{24}$aryl which is substituted by G, $C_2$-$C_{20}$heteroaryl, or $C_2$-$C_{20}$heteroaryl which is substituted by G, $Ar^1$ and $Ar^{1'}$ are independently of each other

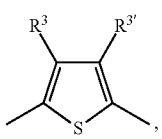

(XIa)

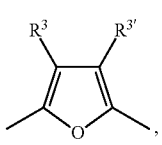

(XIb)

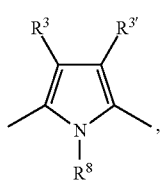 (XIc)
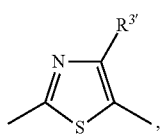 (XId)
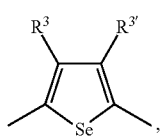 (IXe)
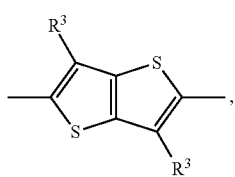 (IXf)
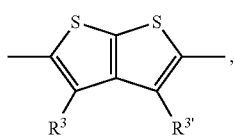 (XIg)
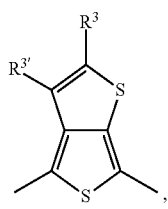 (XIh)
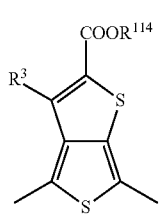 (XIi)
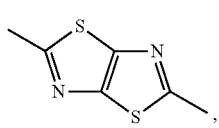 (XIj)
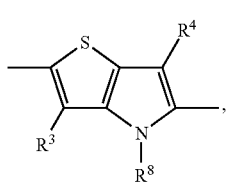 (XIk)
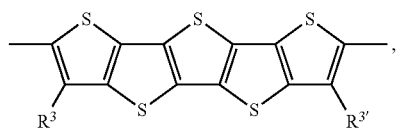 (XIl)
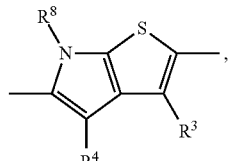 (XIm)
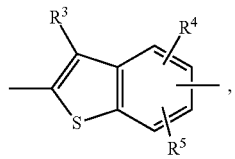 (XIn)
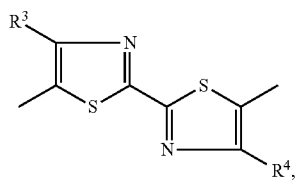 (XIo)
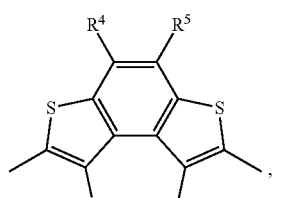 (XIp)
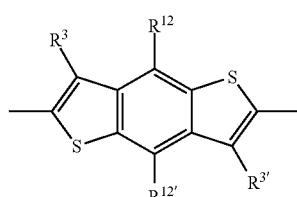 (XIq)
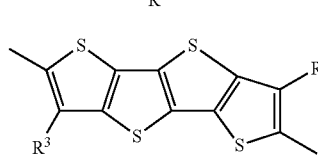 (XIr)
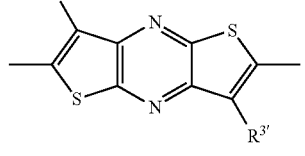 (XIs)
 (XIt)

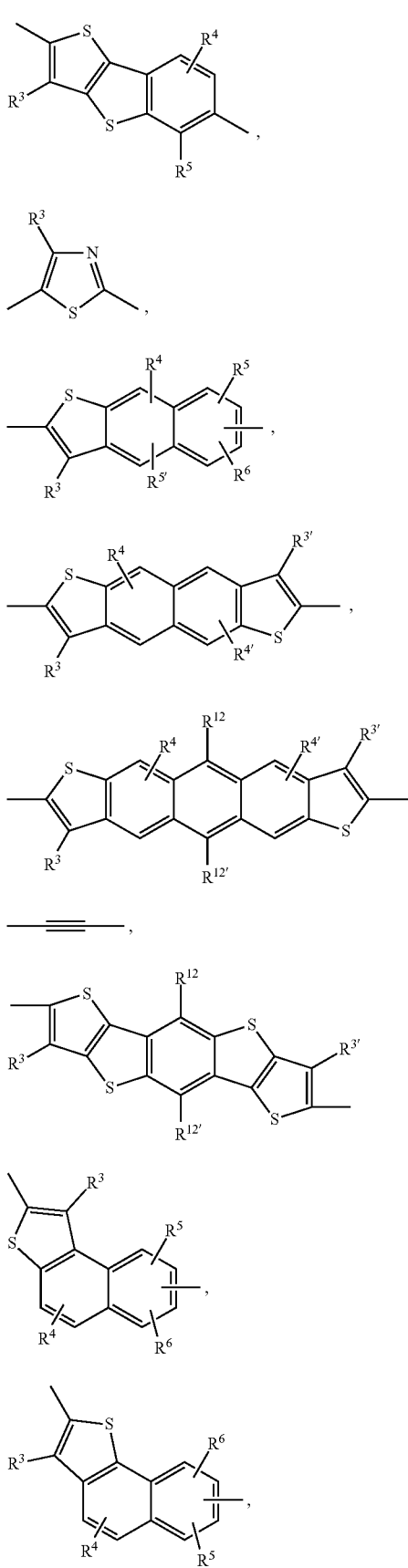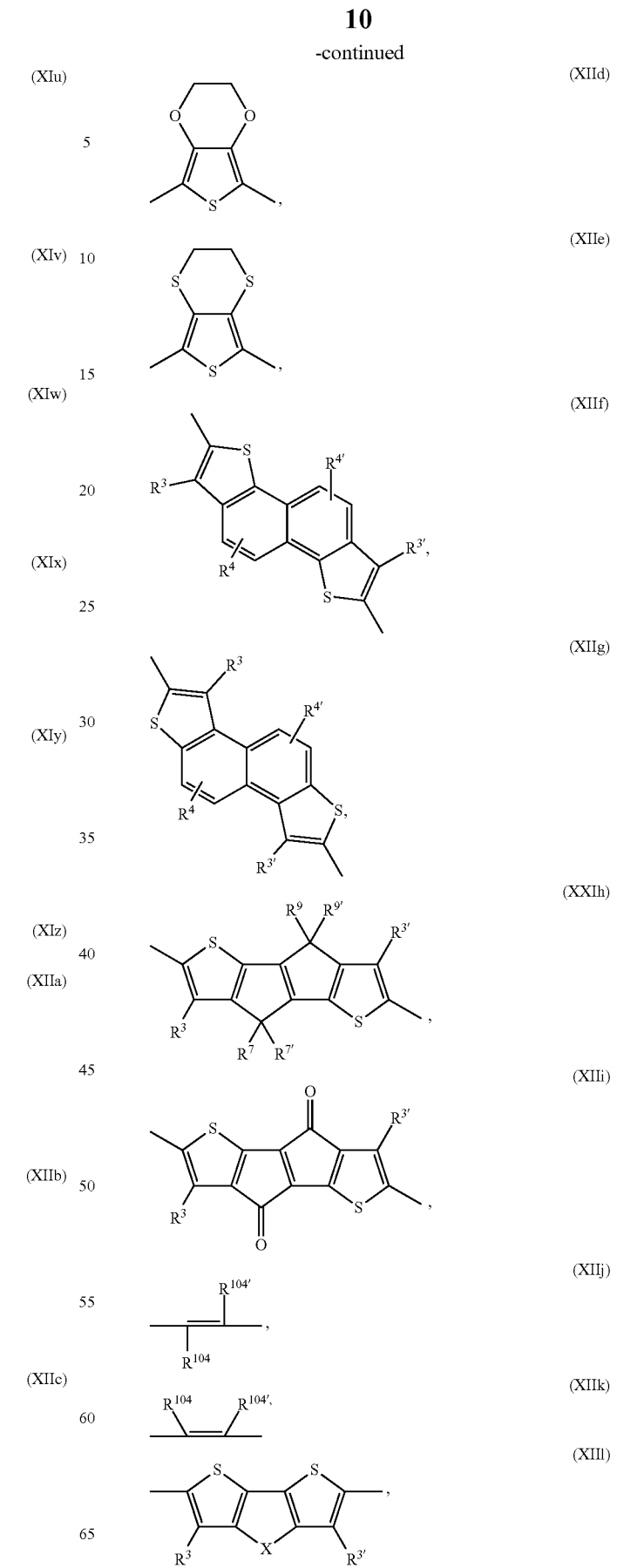

such as, for example,
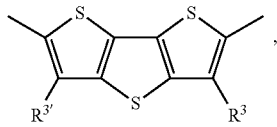 (XIIIa)
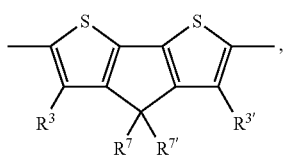 (XIIIb)
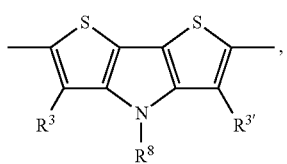 (XIIIc)
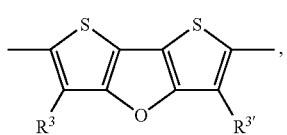 (XIIId)
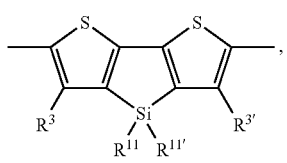 (XIIIe)
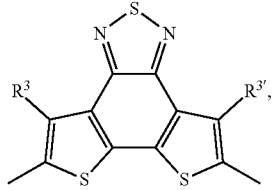 (XIIIf)
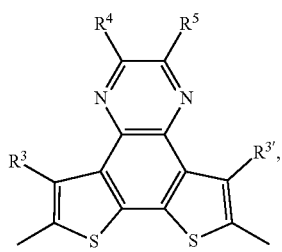 (XIIIg)
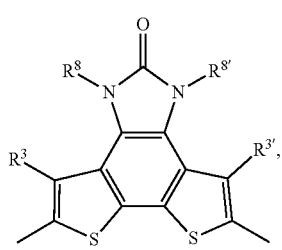 (XIIIh)
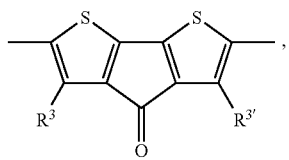 (XIIIi)
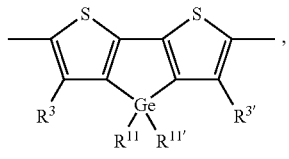 (XIIIj)
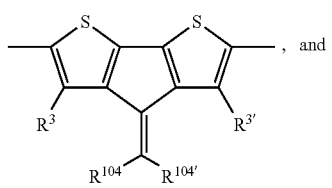 (XIIIk)
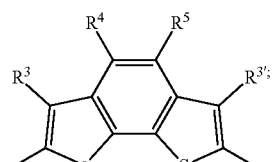 (XIIIl)
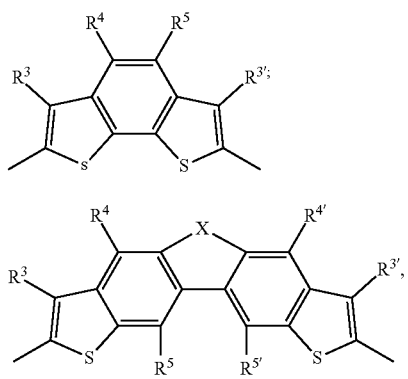 (XIV)
such as, for example,
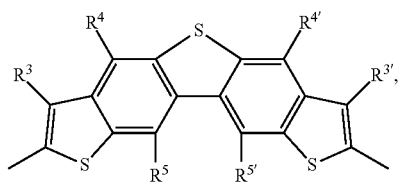 (XIVa)
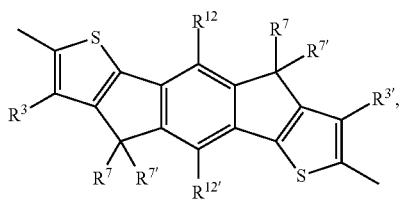 (XIVb)
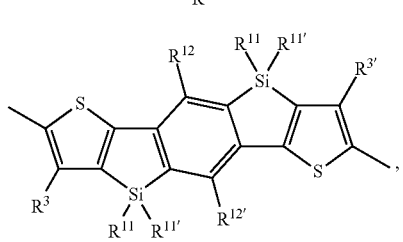 (XIVc)

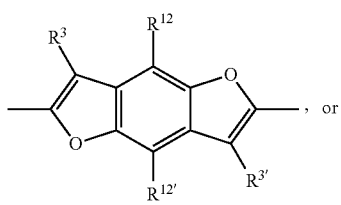
(XIVd)
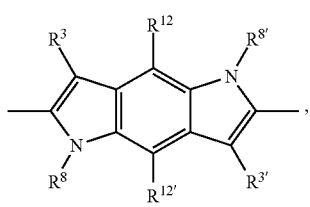
(XIVe)
wherein
X is —O—, —S—, —NR$^8$—, —Si(R$^{11}$)(R$^{11'}$)—, —Ge(R$^{11}$)(R$^{11'}$)—, —C(R$^7$)(R$^{7'}$)—, —C(=O)—, —C(=CR$^{104}$R$^{104'}$)—,
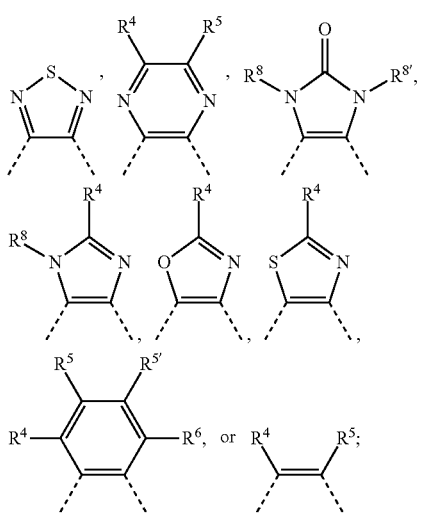
Ar$^2$, Ar$^{2'}$, Ar$^3$ and Ar$^{3'}$ have independently of each other the meaning of Ar$^1$, or are independently of each other
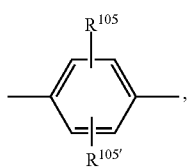
(XVa)
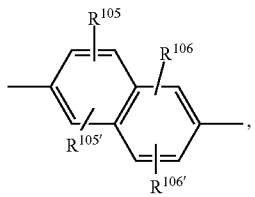
(XVb)
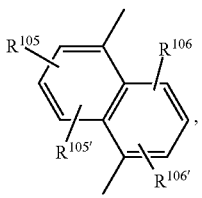
(XVc)
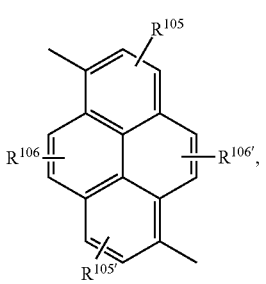
(XVd)
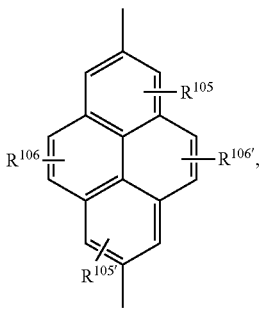
(XVe)
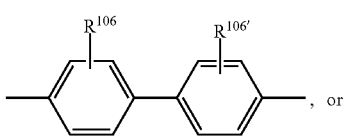
(XVf)
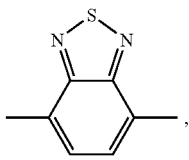
(XVg)
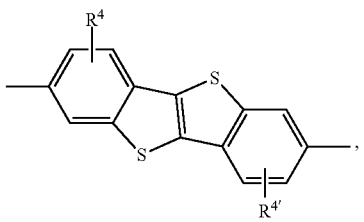
(XVh)
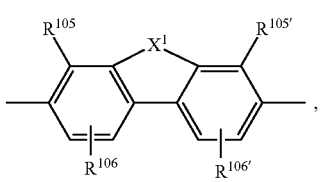
(XVI)

such as, for example,

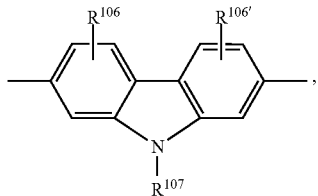

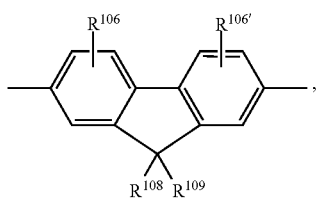

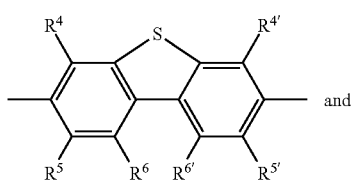
and

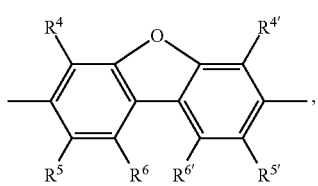

(XVII)

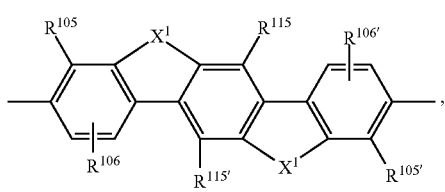

such as, for example,

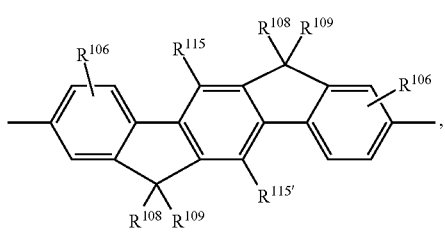

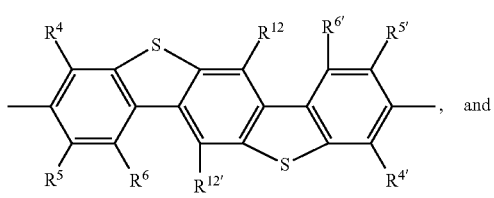
and

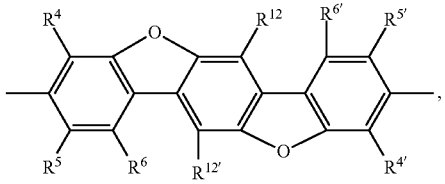

wherein $X^1$ is S, O, $NR^{107}$—, —$Si(R^{117})(R^{117'})$—, —$Ge(R^{117})(R^{117'})$—, —$C(R^{106})(R^{109})$—, —$C(=O)$—, —$C(=CR^{104}R^{104'})$—,

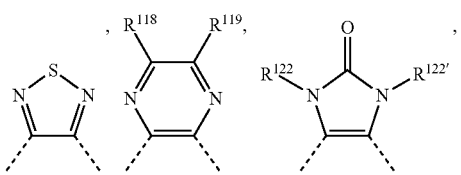

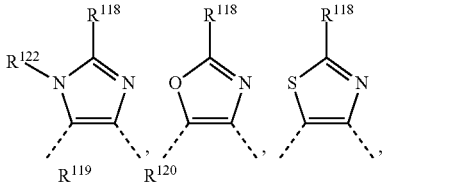

$R^3$ and $R^{3'}$ are independently of each other hydrogen, halogen, halogenated $C_1$-$C_{25}$alkyl, especially $CF_3$, cyano, $C_1$-$C_{25}$alkyl, especially $C_3$-$C_{25}$alkyl, which may optionally be interrupted by one or more oxygen or sulphur atoms; $C_7$-$C_{25}$arylalkyl, or $C_1$-$C_{25}$alkoxy;

$R^{104}$ and $R^{104'}$ are independently of each other hydrogen, cyano, $COOR^{103}$, a $C_1$-$C_{25}$alkyl group, or $C_6$-$C_{24}$aryl or $C_2$-$C_{20}$heteroaryl, $R^4$, $R^{4'}$, $R^5$, $R^{5'}$, $R^6$, and $R^{6'}$ are independently of each other hydrogen, halogen, halogenated $C_1$-$C_{25}$alkyl, especially $CF_3$, cyano, $C_1$-$C_{25}$alkyl, especially $C_3$-$C_{25}$alkyl, which may optionally be interrupted by one or more oxygen or sulphur atoms; $C_7$-$C_{25}$arylalkyl, or $C_1$-$C_{25}$alkoxy;

$R^7$, $R^{7'}$, $R^9$ and $R^{9'}$ are independently of each other hydrogen, $C_1$-$C_{25}$alkyl, especially $C_3$-$C_{25}$alkyl, which may optionally be interrupted by one, or more oxygen, or sulphur atoms; or $C_7$-$C_{25}$arylalkyl, $R^8$ and $R^{8'}$ are independently of each other hydrogen, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, especially $C_3$-$C_{25}$alkyl, which may optionally be interrupted by one or more oxygen or sulphur atoms; or $C_7$-$C_{25}$arylalkyl, $R^{11}$ and $R^{11'}$ are independently of each other $C_1$-$C_{25}$alkyl group, especially a $C_1$-$C_8$alkyl group, $C_7$-$C_{25}$arylalkyl, or a phenyl group, which can be substituted one to three times with $C_1$-$C_8$alkyl and/or $C_1$-$C_8$alkoxy;

$R^{12}$ and $R^{12'}$ are independently of each other hydrogen, halogen, cyano, $C_1$-$C_{25}$alkyl, especially $C_3$-$C_{25}$alkyl, which may optionally be interrupted by one, or more oxygen, or sulphur atoms, $C_1$-$C_{25}$alkoxy, $C_7$-$C_{25}$arylalkyl, or —=—$R^{13}$, wherein $R^{13}$ is a $C_1$-$C_{10}$alkyl group, or a tri($C_1$-$C_8$alkyl)silyl group;

$R^{104}$ and $R^{104'}$ are independently of each other hydrogen, $C_1$-$C_{18}$alkyl, $C_6$-$C_{10}$aryl, which may optionally be substituted by G, or $C_2$-$C_8$heteroaryl, which may optionally be substituted by G, $R^{105}$, $R^{105'}$, $R^{106}$ and $R^{106'}$ are independently of each other hydrogen, halogen, cyano, $C_1$-$C_{25}$alkyl, which may optionally be interrupted by one or more oxygen or sulphur atoms; $C_7$-$C_{25}$arylalkyl, or $C_1$-$C_{18}$alkoxy, $R^{107}$ is hydrogen, $C_7$-$C_{25}$arylalkyl, $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$perfluoroalkyl; $C_1$-$C_{25}$alkyl; especially $C_3$-$C_{25}$alkyl, which may be interrupted by —O—, or —S—; or —COOR$^{103}$; $R^{103}$ is as defined above;

$R^{108}$ and $R^{109}$ are independently of each other H, $C_1$-$C_{25}$alkyl, $C_1$-$C_{25}$alkyl which is substituted by E and/or interrupted by D, $C_7$-$C_{25}$arylalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, or $R^{108}$ and $R^{109}$ together form a group of formula =$CR^{110}R^{111}$, wherein $R^{110}$ and $R^{111}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^{108}$ and $R^{109}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, D is —CO—, —COO—, —S—, —O—, or —NR$^{112}$—, E is $C_1$-$C_8$thioalkoxy, $C_1$-$C_8$alkoxy, CN, —NR$^{112}$R$^{113}$, —CONR$^{112}$R$^{113}$, or halogen, G is E, or $C_1$-$C_{18}$alkyl, and $R^{112}$ and $R^{113}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{114}$ is $C_1$-$C_{25}$alkyl, especially $C_3$-$C_{25}$alkyl, which may optionally be interrupted by one, or more oxygen, or sulphur atoms, $R^{115}$ and $R^{115'}$ are independently of each other hydrogen, halogen, cyano, $C_1$-$C_{25}$alkyl, especially $C_3$-$C_{25}$alkyl, which may optionally be interrupted by one, or more oxygen, or sulphur atoms, $C_1$-$C_{25}$alkoxy, $C_7$-$C_{25}$arylalkyl, or —≡—R$^{116}$, wherein R$^{116}$ is a $C_1$-$C_{10}$alkyl group, or a tri($C_1$-$C_8$alkyl)silyl group;

$R^{117}$ and $R^{117'}$ are independently of each other $C_1$-$C_{25}$alkyl group, especially a $C_1$-$C_8$alkyl group, $C_7$-$C_{25}$arylalkyl, or a phenyl group, which can be substituted one to three times with $C_1$-$C_8$alkyl and/or $C_1$-$C_8$alkoxy;

$R^{118}$, $R^{119}$, $R^{120}$ and $R^{121}$ are independently of each other hydrogen, halogen, halogenated $C_1$-$C_{25}$alkyl, especially CF$_3$, cyano, $C_1$-$C_{25}$alkyl, especially $C_3$-$C_{25}$alkyl, which may optionally be interrupted by one or more oxygen or sulphur atoms; $C_7$-$C_{25}$arylalkyl, or $C_1$-$C_{25}$alkoxy;

$R^{122}$ and $R^{122'}$ are independently of each other hydrogen, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, especially $C_3$-$C_{25}$alkyl, which may optionally be interrupted by one or more oxygen or sulphur atoms; or $C_7$-$C_{25}$arylalkyl. Polymers, comprising a repeating unit of the formula (I), are preferred. The semiconducting polymers of the present invention are conjugated.

If Y is a group of formula

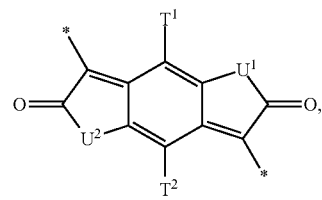

a is 1, a' is 1, b is 0, b' is 0, c is 0 and c' is 0; $T^1$ and $T^2$ are preferably a hydrogen atom, $U^1$ is preferably NR$^1$ and $U^2$ is preferably NR$^2$.

If Y is a group of formula

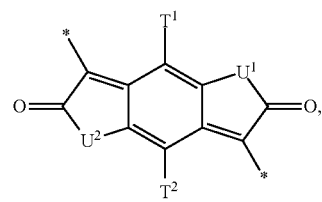

Ar$^1$ and Ar$^{1'}$ are preferably independently of each other a group of formula XIa, XIb, XIc, XIe, XIf, XII, XIp, XIr, XIs, XIx, XIIf, XIIg, XIIIa, XIIId, or XIIII, especially XIb, XIc, XIe, XIf, XII, XIp, XIr, XIs, XIx, XIIf, XIIg, XIIIa, XIIId, or XIIII, very especially XIf, Groups of formula

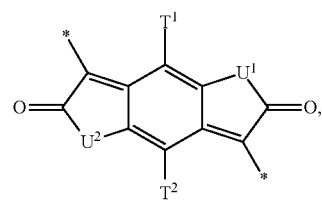

are preferred, wherein $T^1$ and $T^2$ are a hydrogen atom, $U^1$ is NR$^1$ and $U^2$ is NR$^2$.

$R^1$ and $R^2$ are preferably selected from hydrogen, a $C_1$-$C_{100}$alkyl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, or $C_2$-$C_{20}$heteroaryl; and/or can optionally be interrupted by —O—, —S—, —NR$^{39}$—, —COO—, —CO— or —OCO—, a $C_2$-$C_{100}$alkenyl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, or $C_2$-$C_{20}$heteroaryl; and/or can optionally be interrupted by —O—, —S—, —NR$^{39}$—, —COO—, —CO— or —OCO—, a $C_3$-$C_{100}$alkinyl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, or $C_2$-$C_{20}$heteroaryl; and/or can optionally be interrupted by —O—, —S—, —NR$^{39}$—, —COO—, —CO— or —OCO—, a $C_3$-$C_{12}$cycloalkyl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, or $C_2$-$C_{20}$heteroaryl; and/or can optionally be interrupted by —O—, —S—, —$NR^{39}$—, —COO—, —CO— or —OCO—, a $C_6$-$C_{24}$aryl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, or $C_2$-$C_{20}$heteroaryl;

a $C_2$-$C_{20}$heteroaryl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, or $C_2$-$C_{20}$heteroaryl;

a —CO—$C_1$-$C_{18}$alkyl group, a —CO—$C_5$-$C_{12}$cycloalkyl group, or —COO—$C_1$-$C_{18}$alkyl group.

In a preferred embodiment $Ar^1$ and $Ar^{1'}$ are independently of each other a group of formula (XIa), (XIb), (XIc), (XId), (XIe), (XIf), (XIg), (XIh), (XIi), (XIj), (XIk), (XIl), (XIm), (XIn), (XIo), (XIp), (XIq), (XIr), (XIs), (XIt), (XIu), (XIv), (XIw), (XIx), (XIy), (XIz), (XIIa), (XIIb), (XIIc), (XIId), (XIIe), (XIIf), (XIIg), (XIIh), (XIIi), (XIIj), (XIIk), (XIII), such as, for example, (XIIIa), (XIIIb), (XIIIc), (XIIId), (XIIIe), (XIIIf), (XIIIg), (XIIIh), (XIIIi), (XIIIj), (XIIIk); and (XIIIl), or (XIV), such as, for example, (XIVa). In preferred embodiment $Ar^1$ and $Ar^{1'}$ are independently of each other a group of formula (XIVb), (XIVc), (XIVd), or (XIVe), especially (XIVb), (XIVc), or (XIVd), very especially (XIVb), or (XIVc).

In a second aspect of the present invention, said object has been solved by compounds of formula (III), which are described in more detail below.

Advantageously, the polymer, or compound of the present invention, or an organic semiconductor material, layer or component, comprising the polymer, or compound of the present invention can be used in organic photovoltaics (solar cells), photodiodes, in an organic field effect transistor (OFET), as IR absorber, in thin film transistors (TFT), intergrated circuits (IC), radio frequency identification (RFID) tags, devices or components, organic light emitting diodes (OLED), organic light emitting transistors (OLET), flat panel displays, backlights of displays, laser diodes, photoconductors, photodetectors, electrophotographic devices, electrophotographic recording devices, organic memory devices, sensor devices, charge injection layers, charge transport layers or interlayers in polymer light emitting diodes (PLEDs), organic plasmon emitting diodes (OPEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

The polymers of this invention preferably have a weight average molecular weight of 4,000 Daltons or greater, especially 4,000 to 2,000,000 Daltons, more preferably 10,000 to 1,000,000 and most preferably 10,000 to 100,000 Daltons. Molecular weights are determined according to high-temperature gel permeation chromatography (HT-GPC) using polystyrene standards. The polymers of this invention preferably have a polydispersity of 1.01 to 10, more preferably 1.1 to 3.0, most preferred 1.5 to 2.5. The polymers of the present invention are preferably conjugated.

Oligomers of the present invention preferably have a weight average molecular weight below 4,000 Daltons.

In an embodiment of the present invention the polymer is a polymer of formula

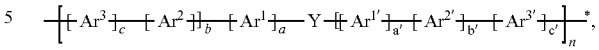

wherein n is usually in the range of 4 to 1000, especially 4 to 200, very especially 5 to 150.

$U^1$ is preferably O or $NR^1$; more preferably $NR^1$.
$U^2$ is preferably O or $NR^1$; more preferably $NR^1$.

Preferably $T^1$ and $T^2$ are independently of each other hydrogen, halogen, cyano, —$COOR^{103}$, —$OCOR^{103}$, $OR^{103}$, $C_1$-$C_{25}$alkyl, which may be substituted by E and/or interrupted by D, $C_6$-$C_{24}$aryl, $C_6$-$C_{24}$aryl which is substituted by G, $C_2$-$C_{20}$heteroaryl, or $C_2$-$C_{20}$heteroaryl which is substituted by G;

More preferably, $T^1$ and $T^2$ are independently of each other hydrogen, halogen, cyano, —$COOR^{103}$, —$OCOR^{103}$, —$OR^{103}$, or $C_1$-$C_{25}$alkyl, which may be substituted by E and/or interrupted by D; more preferably hydrogen, halogen, cyano, —$OR^{103}$, $C_1$-$C_{25}$alkyl. Most preferred $T^1$ and $T^2$ are hydrogen, or $C_1$-$C_{25}$alkyl, especially hydrogen.

In the definition of $R^1$ and $R^2$ a silyl group or a siloxanyl group means —$SiR^{161}R^{162}R^{163}$, or —O—$SiR^{161}R^{162}R^{163}$.

$R^{161}$, $R^{162}$ and $R^{163}$ are independently of each other hydrogen, $C_1$-$C_{25}$alkyl, $C_3$-$C_{12}$cycloalkyl, which might optionally be substituted with $C_1$-$C_4$alkyl; $C_1$-$C_{25}$haloalkyl, $C_2$-$C_{25}$alkenyl, —O—$SiR^{164}R^{165}R^{166}$, —(O—$SiR^{164}R^{165}$)$_d$—$R^{166}$, $C_1$-$C_{25}$alkoxy, $C_3$-$C_{24}$(hetero)aryloxy, $NR^{167}R^{168}$, halogen, $C_1$-$C_{25}$acyloxy, phenyl, phenyl, which is substituted 1 to 3 times by $C_1$-$C_{24}$ alkyl, halogen, cyano or $C_1$-$C_{25}$alkoxy; preferably hydrogen, $C_1$-$C_{25}$alkyl, $C_3$-$C_{12}$cycloalkyl, which might optionally be substituted with $C_1$-$C_4$alkyl; $C_1$-$C_{25}$haloalkyl, $C_2$-$C_{25}$alkenyl, —O—$SiR^{164}R^{165}R^{166}$, —O—($SiR^{164}R^{165}$)$_d$—$R^{166}$ or phenyl; more preferably $C_1$-$C_8$alkyl, $C_5$-$C_6$cycloalkyl, which might optionally be substituted with $C_1$-$C_4$alkyl; $C_1$-$C_8$haloalkyl, $C_2$-$C_8$alkenyl, —O—$SiR^{164}R^{165}R^{166}$, —(O—$SiR^{164}R^{165}$)$_d$—$R^{166}$ or phenyl; most preferably $C_1$-$C_8$alkyl, $C_1$-$C_8$haloalkyl, especially $C_1$-$C_8$alkyl which is substituted one, or more times with fluorine atoms; —O—$SiR^{164}R^{165}R^{166}$ or —(O—$SiR^{164}R^{165}$)$_d$—$R^{166}$.

$R^{164}$, $R^{165}$ and $R^{166}$ are independently of each other hydrogen, $C_1$-$C_{25}$alkyl, $C_3$-$C_{12}$cycloalkyl, which might optionally be substituted with $C_1$-$C_4$alkyl; $C_1$-$C_{25}$haloalkyl, $C_2$-$C_{25}$alkenyl, —O—$SiR^{169}R^{170}R^{171}$, —(O—$SiR^{169}R^{170}$)$_d$—$R^{171}$, $C_1$-$C_{25}$alkoxy, $C_3$-$C_{24}$(hetero)aryloxy, $NR^{167}R^{168}$, halogen, $C_1$-$C_{25}$acyloxy, phenyl, phenyl, which is substituted 1 to 3 times by $C_1$-$C_{24}$ alkyl, halogen, cyano or $C_1$-$C_{25}$alkoxy; preferably hydrogen, $C_1$-$C_{25}$alkyl, $C_1$-$C_{25}$haloalkyl, $C_2$-$C_{25}$alkenyl, —O—$SiR^{169}R^{170}R^{171}$, —(O—$SiR^{169}R^{170}$)$_d$—$R^{171}$, or phenyl; more preferably $C_1$-$C_8$alkyl, $C_1$-$C_8$haloalkyl, $C_2$-$C_8$alkenyl, —O—$SiR^{169}R^{170}R^{171}$, —(O—$SiR^{169}R^{170}$)$_d$—$R^{171}$, or phenyl; most preferably $C_1$-$C_8$alkyl, $C_1$-$C_8$haloalkyl, especially $C_1$-$C_8$alkyl which is substituted one or more times with fluorine atoms; —O—$SiR^{169}R^{170}R^{171}$ or —(O—$SiR^{169}R^{170}$)$_d$—$R^{171}$.

$R^{169}$, $R^{170}$ and $R^{171}$ are independently of each other hydrogen, $C_1$-$C_{25}$alkyl, $C_3$-$C_{12}$cycloalkyl, which might optionally be substituted with $C_1$-$C_4$alkyl, $C_1$-$C_{25}$haloalkyl, $C_2$-$C_{25}$alkenyl, —O—$Si(CH_3)_3$, $C_1$-$C_{25}$alkoxy, $C_3$-$C_{24}$(hetero)aryloxy, $NR^{167}R^{168}$, halogen, $C_1$-$C_{25}$acyloxy, phenyl, phenyl, which is substituted 1 to 3 times by $C_1$-$C_{25}$alkyl, halogen, cyano, or $C_1$-$C_{25}$alkoxy; preferably hydrogen, $C_1$-$C_{25}$alkyl, $C_1$-$C_{25}$haloalkyl, $C_2$-$C_{25}$alkenyl, —O—Si (CH₃)₃, or phenyl; more preferably $C_1$-$C_8$alkyl, $C_1$-$C_8$haloalkyl, $C_2$-$C_8$alkenyl, —O—Si(CH₃)₃, or phenyl; most preferably $C_1$-$C_8$alkyl, $C_1$-$C_8$haloalkyl, especially $C_1$-$C_8$alkyl which is substituted one or more times with fluorine atoms; or —O—Si(CH₃)₃.

d is an integer from 1 to 50, preferably 1 to 40, even more preferably 1 to 30, still more preferably 1 to 20, more preferably 1 to 15, still more preferably 1 to 10 and even more preferably 1 to 5 and most preferably 1 to 3.

$R^{167}$ and $R^{168}$ are independently of each other hydrogen, $C_1$-$C_{25}$alkyl, $C_1$-$C_{25}$haloalkyl, $C_3$-$C_{25}$alkenyl, or phenyl; preferably $C_1$-$C_{25}$alkyl, $C_1$-$C_{25}$haloalkyl, or phenyl; most preferably $C_1$-$C_{25}$alkyl.

In a particularly preferred embodiment $R^{161}$, $R^{162}$ and $R^{163}$ are independently of each other $C_1$-$C_{25}$alkyl, especially $C_1$-$C_8$alkyl; $C_1$-$C_{25}$haloalkyl, especially $C_1$-$C_8$haloalkyl, such as, for example, —CF₃, —(CH₂)₂CF₃, —(CH₂)₂(CF₂)₅CF₃ and —(CH₂)₂(CF₂)₆CF₃; $C_2$-$C_{25}$alkenyl, especially $C_2$-$C_8$alkenyl; $C_3$-$C_{12}$cycloalkyl, especially $C_5$-$C_6$cycloalkyl, which might optionally be substituted with $C_1$-$C_4$alkyl; phenyl, —O—$SiR^{164}R^{165}R^{166}$, or —(O—$SiR^{164}R^{165})_d$—$R^{166}$. In case of a group —O—$SiR^{164}R^{165}R^{166}$ $R^{164}$, $R^{165}$ and $R^{166}$ are independently of each other $C_1$-$C_8$alkyl, $C_1$-$C_8$haloalkyl, $C_2$-$C_8$alkenyl, or phenyl. In case of a group —(O—$SiR^{164}R^{165})_d$—$R^{166}$ $R^{164}$ and $R^{165}$ are independently of each other $C_1$-$C_8$alkyl, $R^{166}$ is $C_1$-$C_8$alkyl, or phenyl and d is an integer of 2 to 5.

Examples of groups of formula —$SiR^{161}R^{162}R^{163}$, or —O—$SiR^{161}R^{162}R^{163}$ are shown below:

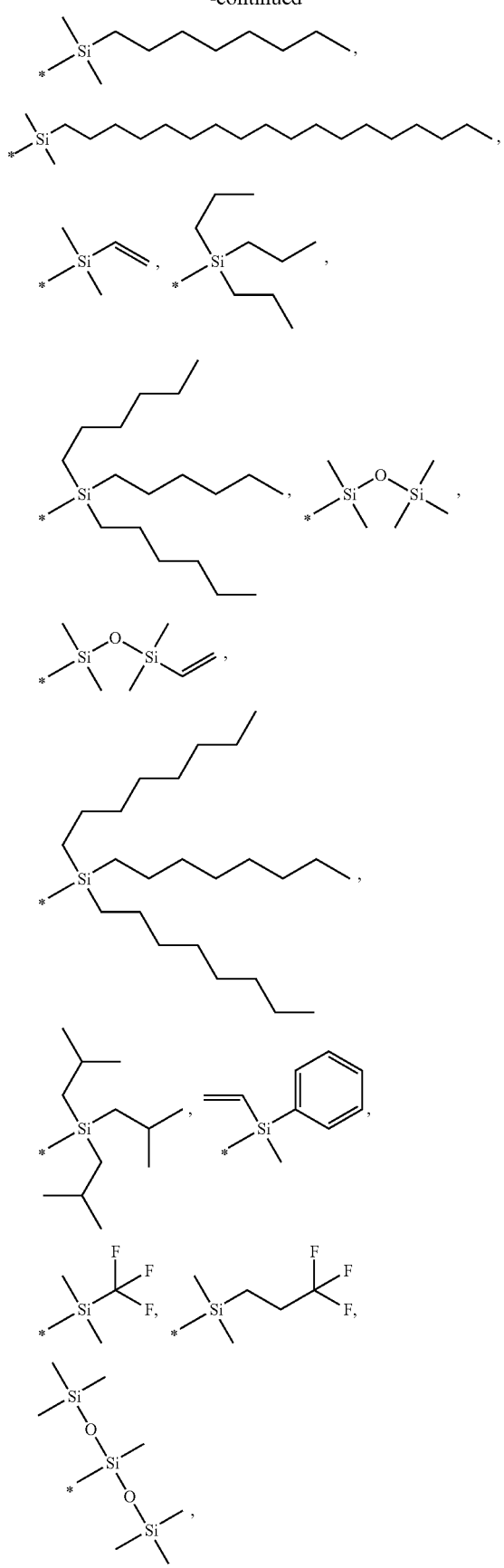

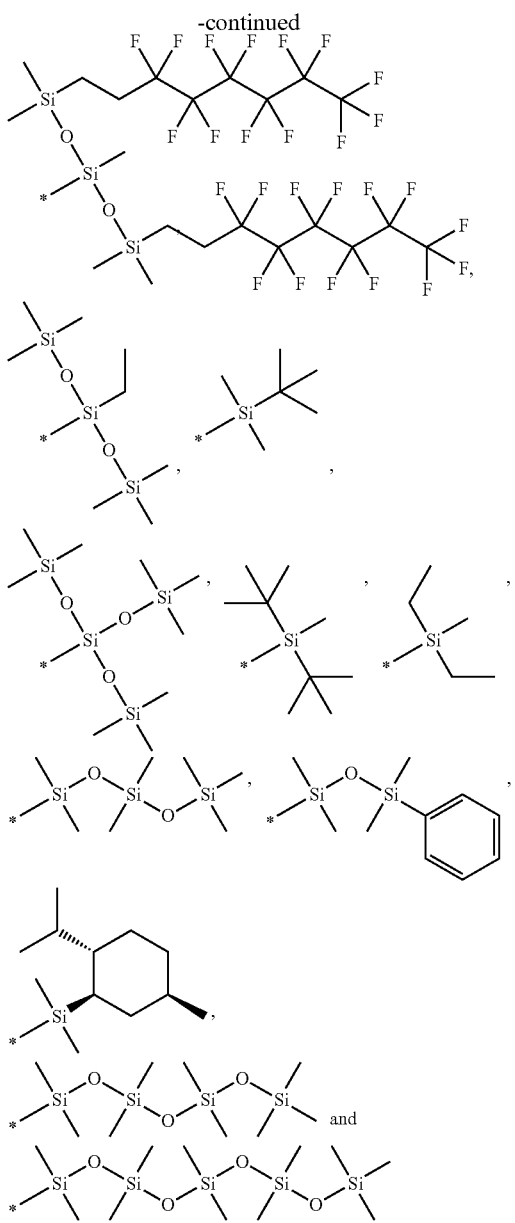

(*—indicates the bond to the carbon atom, to which the silyl group or siloxanyl group is connected).

$R^1$ and $R^2$ may be the same or different and are preferably selected from hydrogen, a $C_1$-$C_{100}$alkyl group which can optionally be substituted one or more times with $C_1$-$C_{12}$alkyl, $C_1$-$C_{12}$alkoxy, halogen, $C_5$-$C_{12}$cycloalkyl, cyano, $C_6$-$C_{24}$aryl, $C_2$-$C_{20}$heteroaryl and/or can optionally be interrupted by —O—, —S—, —COO— or —OCO—, a $C_2$-$C_{100}$alkenyl group which can optionally be substituted one or more times with $C_1$-$C_{12}$alkyl, $C_1$-$C_{12}$alkoxy, halogen, $C_5$-$C_{12}$cycloalkyl, cyano, $C_6$-$C_{24}$aryl, $C_2$-$C_{20}$heteroaryl and/or can optionally be interrupted by —O—, —S—, —COO— or —OCO—, a $C_3$-$C_{100}$alkinyl group which can optionally be substituted one or more times with $C_1$-$C_{12}$alkyl, $C_1$-$C_{12}$alkoxy, halogen, $C_5$-$C_{12}$cycloalkyl, cyano, $C_6$-$C_{24}$aryl, $C_2$-$C_{20}$heteroaryl and/or can optionally be interrupted by —O—, —S—, —COO— or —OCO—, a $C_4$-$C_{12}$cycloalkyl group which can optionally be substituted one or more times with $C_1$-$C_{12}$alkyl, $C_1$-$C_{12}$alkoxy, halogen, $C_5$-$C_{12}$cycloalkyl, cyano, $C_6$-$C_{24}$aryl, $C_2$-$C_{20}$heteroaryl and/or can optionally be interrupted by —O—, —S—, —COO— or —OCO—, a $C_6$-$C_{24}$aryl group which can optionally be substituted one or more times with $C_1$-$C_{12}$alkyl, $C_1$-$C_{12}$alkoxy, halogen, $C_5$-$C_{12}$cycloalkyl, cyano, $C_6$-$C_{24}$aryl, $C_2$-$C_{20}$heteroaryl, a $C_2$-$C_{20}$heteroaryl group which can optionally be substituted one or more times with $C_1$-$C_{12}$alkyl, $C_1$-$C_{12}$alkoxy, halogen, $C_5$-$C_{12}$cycloalkyl, cyano, $C_6$-$C_{24}$aryl, $C_2$-$C_{20}$heteroaryl, —CO—$C_1$-$C_{18}$alkyl, —CO—$C_5$-$C_{12}$cycloalkyl, and —COO—$C_1$-$C_{18}$alkyl.

More preferably $R^1$ and $R^2$ are selected from hydrogen, $C_1$-$C_{50}$alkyl, $C_1$-$C_{50}$haloalkyl, $C_7$-$C_{25}$arylalkyl, $C_2$-$C_{50}$alkenyl, $C_2$-$C_{50}$haloalkenyl, allyl, $C_5$-$C_{12}$cycloalkyl, phenyl, or naphthyl which can optionally be substituted one or more times with $C_1$-$C_{12}$alkyl or $C_1$-$C_{12}$alkoxy, —CO—$C_1$-$C_{18}$alkyl, —CO—$C_5$-$C_{12}$cycloalkyl and —COO—$C_1$-$C_{18}$alkyl. Even more preferably $R^1$ and $R^2$ are a $C_1$-$C_{50}$alkyl group. Still more preferably $R^1$ and $R^2$ are a $C_1$-$C_{36}$alkyl group, such as, for example, methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, especially n-dodecyl, tridecyl, tetradecyl, pentadecyl, hexadecyl, 2-ethylhexyl, 2-butyl-hexyl, 2-butyl-octyl, 2-hexyldecyl, 2-decyl-tetradecyl, heptadecyl, octadecyl, eicosyl, heneicosyl, docosyl, or tetracosyl. Preferably $R^1$ and $R^2$ have the same meaning.

Advantageously, the groups $R^1$ and $R^2$ can be represented by formula

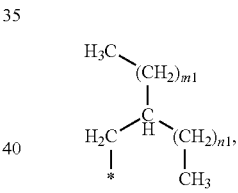

wherein $m1=n1+2$ and $m1+n1 \geq 24$. Chiral side chains, such as $R^1$, $R^2$, $R^{1'}$, $R^{2'}$, $R^{1''}$, $R^{2''}$, $R^{1*}$ and $R^{2*}$, can either be homochiral, or racemic, which can influence the morphology of the compounds.

Preferably, $R^{103}$ and $R^{103'}$ are independently of each other $C_1$-$C_{25}$alkyl, $C_1$-$C_{25}$alkyl substituted by halogen, $C_7$-$C_{25}$arylalkyl, or phenyl; more preferably $C_1$-$C_{25}$alkyl.

Preferably $Ar^1$ and $Ar^{1'}$ are independently of each other a group of formula XIa, XIb, XIc, XIe, XIf, XIl, XIp, XIr, XIs, XIx, XIIf, XIIg, XIIIa, XIIId, or XIIIl; more preferably a group of formula XIa, XIb, XIe, XIf, XIr, XIx, or XIIIa, still more preferably a group of formula XIa, XIb, or XIf, most preferred a group of formula XIa, or XIf, very especially XIa.

Preferably, $R^3$ and $R^{3'}$ are independently of each other hydrogen, halogen, $CF_3$, cyano, $C_1$-$C_{25}$alkyl or $C_1$-$C_{25}$alkoxy; more preferably $CF_3$, cyano or $C_1$-$C_{25}$alkyl; most preferred hydrogen, or $C_1$-$C_{25}$alkyl.

Preferably, $R^{104}$ and $R^{104'}$ are independently of each other hydrogen, cyano or a $C_1$-$C_{25}$alkyl group, more preferably hydrogen, or a $C_1$-$C_{25}$alkyl group, most preferred hydrogen.

Preferably, $R^4$, $R^{4'}$, $R^5$, $R^{5'}$, $R^6$ and $R^{6'}$ are independently of each other hydrogen, halogen, $CF_3$, cyano, $C_1$-$C_{25}$alkyl or $C_1$-$C_{25}$alkoxy, more preferably hydrogen, $CF_3$, cyano or $C_1$-$C_{25}$alkyl; most preferred hydrogen, or $C_1$-$C_{25}$alkyl.

Preferably $R^7$, $R^{7'}$, $R^9$ and $R^{9'}$ are independently of each other hydrogen, $C_1$-$C_{25}$alkyl, more preferably $C_4$-$C_{25}$alkyl.

Preferably, $R^8$ and $R^{8'}$ are independently of each other hydrogen, $C_1$-$C_{25}$alkyl, $C_1$-$C_{25}$alkyl, which may optionally be interrupted by one or more oxygen or sulphur atoms; or $C_7$-$C_{25}$arylalkyl, more preferably hydrogen, or $C_1$-$C_{25}$alkyl.

Preferably, $R^{11}$ and $R^{11'}$ are independently of each other a $C_1$-$C_{25}$alkyl group, especially a $C_1$-$C_8$alkyl group, or phenyl; more preferably a $C_1$-$C_8$alkyl group.

Preferably, $R^{12}$ and $R^{12'}$ are independently of each other hydrogen, $C_1$-$C_{25}$alkyl, $C_1$-$C_{25}$alkoxy, or —≡— $R^{13}$, wherein $R^{13}$ is a $C_1$-$C_{10}$alkyl group, or a tri($C_1$-$C_8$alkyl)silyl group, more preferably hydrogen, $C_1$-$C_{25}$alkyl, or $C_1$-$C_{25}$alkoxy.

Preferably, $Ar^2$, $Ar^{2'}$, $Ar^3$, $Ar^{3'}$, $Ar^4$ and $Ar^{4'}$ have independently of each other the meaning of $Ar^1$, or are independently of each other a group of formula XVa, XVb, XVc, XVIa, XVIb, XVIIa, or XVIIb, have more preferably independently of each other the meaning of $Ar^1$, or are independently of each other a group of formula XVa, XVb, XVc, XVIa, or XVIb. Among groups of formula XVa, XVb, XVc, XVIa, or XVIb, a group of formula XVa, or XVb is more preferred. If $Ar^2$, $Ar^{2'}$, $Ar^3$, $Ar^{3'}$, $Ar^4$ and $Ar^{4'}$ have the meaning of $Ar^1$, preferably the same preferences as for $Ar^1$ apply.

Preferably, $R^{105}$, $R^{105'}$, $R^{106}$ and $R^{106'}$ are independently of each other hydrogen, halogen, cyano, $C_1$-$C_{25}$alkyl or $C_1$-$C_{18}$alkoxy, more preferably $C_1$-$C_{25}$alkyl or $C_1$-$C_{18}$alkoxy, most preferred hydrogen, or $C_1$-$C_{25}$alkyl.

$R^{107}$ is preferably hydrogen, $C_1$-$C_{25}$alkyl, $C_1$-$C_{25}$alkyl, which may optionally be interrupted by one or more oxygen or sulphur atoms; or $C_7$-$C_{25}$arylalkyl, more preferably hydrogen, or $C_1$-$C_{25}$alkyl, most preferred $C_4$-$C_{25}$alkyl.

Preferably, $R^{108}$ and $R^{109}$ are independently of each other H, $C_1$-$C_{25}$alkyl, $C_1$-$C_{25}$alkyl which is substituted by E and/or interrupted by D, $C_7$-$C_{25}$arylalkyl, $C_2$-$C_{18}$alkenyl, or $C_7$-$C_{25}$aralkyl, or $R^{108}$ and $R^{109}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, D is —CO—, —COO—, —S— or —O—, E is $C_1$-$C_8$thioalkoxy, $C_1$-$C_8$alkoxy, CN or halogen, G is E, or $C_1$-$C_{18}$alkyl. More preferably, $R^{108}$ and $R^{109}$ are independently of each other H, $C_1$-$C_{25}$alkyl or $C_7$-$C_{25}$arylalkyl. Most preferred $R^{108}$ and $R^{109}$ are independently of each other H, or $C_1$-$C_{25}$alkyl.

D is preferably —CO—, —COO—, —S— or —O—, more preferably —COO—, —S— or —O—, most preferred —S— or —O—.

Preferably, E is $C_1$-$C_8$thioalkoxy, $C_1$-$C_8$alkoxy, CN, or halogen, more preferably $C_1$-$C_8$alkoxy, CN, or halogen, most preferred halogen, especially F.

Preferably, $R^{112}$ and $R^{113}$ are independently of each other H; $C_1$-$C_{18}$alkyl; or $C_1$-$C_{18}$alkyl which is interrupted by —O—, more preferably H, or $C_1$-$C_{18}$alkyl; most preferred $C_1$-$C_{18}$alkyl.

Y is preferably a group of formula

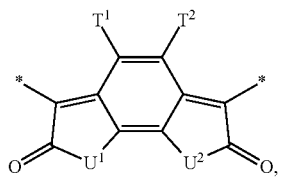

more preferably a group of formula

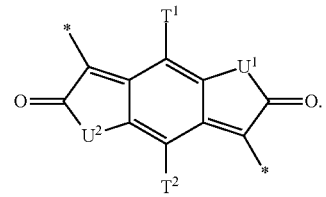

$U^1$ and $U^2$ are preferably O, more preferably $NR^1$. $T^1$ and $T^2$ are hydrogen, CN, or $COOR^{103}$, more preferably hydrogen.

In a preferred embodiment the present invention is directed to polymers comprising one or more (repeating) unit(s) of the formula

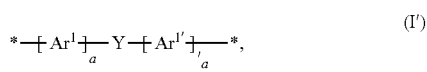

(I')

wherein Y is a group of formula

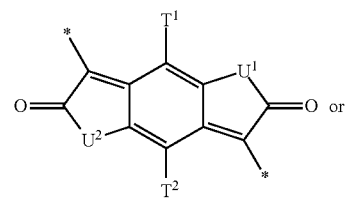 or

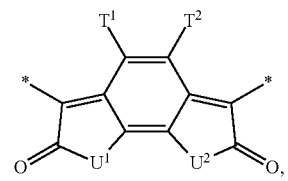

$U^1$ is O, S, or $NR^1$;

$U^2$ is O, S, or $NR^2$, $T^1$ and $T^2$ may be different, but are preferably the same and are preferably independently of each other hydrogen, halogen, cyano, —$COOR^{103}$, —$OCOR^{103}$, —$OR^{103}$, —$SR^{103}$, $C_1$-$C_{25}$alkyl, which may be substituted by E and/or interrupted by D; more preferably hydrogen, halogen, cyano, —$OR^{103}$, or $C_1$-$C_{25}$alkyl; most preferred hydrogen, or $C_1$-$C_{25}$alkyl, especially hydrogen;

$R^1$ and $R^2$ may be different, but are preferably the same are preferably selected from hydrogen, $C_1$-$C_{50}$alkyl, $C_1$-$C_{50}$haloalkyl, $C_7$-$C_{25}$arylalkyl, $C_2$-$C_{50}$alkenyl, $C_2$-$C_{50}$haloalkenyl, allyl, $C_5$-$C_{12}$cycloalkyl, phenyl and naphthyl, which can optionally be substituted one or more times with $C_1$-$C_{12}$alkyl or $C_1$-$C_{12}$alkoxy, —CO—$C_5$-$C_{12}$cycloalkyl and —COO—$C_1$-$C_{18}$alkyl; more preferably $C_1$-$C_{50}$alkyl; most preferred $C_1$-$C_{38}$alkyl group;

a is 1, 2, or 3, a' is 1, 2, or 3; wherein $Ar^1$ and $Ar^{1'}$ are as defined above; and $R^{103}$, D and E are as defined above.

In said embodiment Y is preferably a group of formula

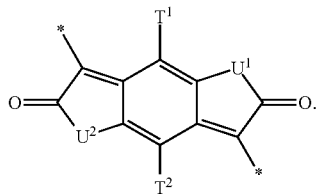

$U^1$ and $U^2$ may be different, but are preferably the same. $U^1$ is preferably O or $NR^1$; more preferably $NR^1$. $U^2$ is preferably O or $NR^1$; more preferably $NR^1$. Polymers, comprising a repeating unit of the formula (I'), are preferred.

$T^1$ and $T^2$ may be different, but are preferably the same. $T^1$ and $T^2$ are preferably independently of each other hydrogen, halogen, cyano, —$COOR^{103}$, —$OCOR^{103}$, —$OR^{103}$, —$SR^{103}$, $C_1$-$C_{25}$alkyl, which may be substituted by E and/or interrupted by D; more preferably hydrogen, halogen, cyano, —$OR^{103}$, or $C_1$-$C_{25}$alkyl; most preferred hydrogen, or $C_1$-$C_{25}$alkyl, very especially hydrogen.

$R^1$ and $R^2$ may be different, but are preferably the same. More preferably $R^1$ and $R^2$ are selected from hydrogen, $C_1$-$C_{50}$alkyl, $C_1$-$C_{50}$haloalkyl, $C_7$-$C_{25}$arylalkyl, $C_2$-$C_{50}$alkenyl, $C_2$-$C_{50}$haloalkenyl, allyl, $C_5$-$C_{12}$cycloalkyl, phenyl, or naphthyl which can optionally be substituted one or more times with $C_1$-$C_{12}$alkyl or $C_1$-$C_{12}$alkoxy, —CO—$C_5$-$C_{12}$cycloalkyl and —COO—$C_1$-$C_{18}$alkyl. More preferably $R^1$ and $R^2$ are $C_1$-$C_{50}$alkyl group. Most preferred $R^1$ and $R^2$ are a $C_1$-$C_{38}$alkyl group.

a and a' may be different, but are preferably the same. a and a' are preferably 1, or 2, more preferably 1.

$Ar^1$ and $Ar^{1'}$ may be different, but are preferably the same. Preferably, $Ar^1$ and $Ar^{1'}$ are independently of each a group of formula XIa, XIb, XIc, XIe, XIf, XIl, XIp, XIr, XIs, XIx, XIIf, XIIg, XIIIa, XIIId, or XIIIl (as defined above). More preferably, $Ar^1$ and $Ar^{1'}$ are a group of formula XIa, XIb, XIe, XIf, XIr, XIx, or XIIIa. Still more preferably $Ar^1$ and $Ar^{1'}$ are a group of formula XIa, XIb, or XIf. Most preferred $Ar^1$ and $Ar^{1'}$ are a group of formula XIa, or XIf, especially XIa.

In a further preferred embodiment the present invention is directed to polymers, comprising one or more (repeating) unit(s) of the formula

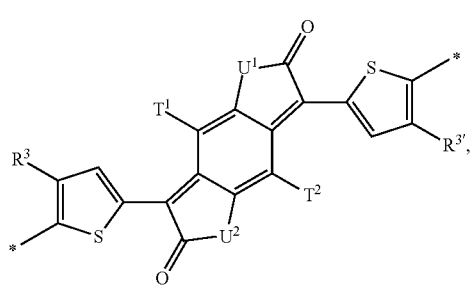
(Ia)

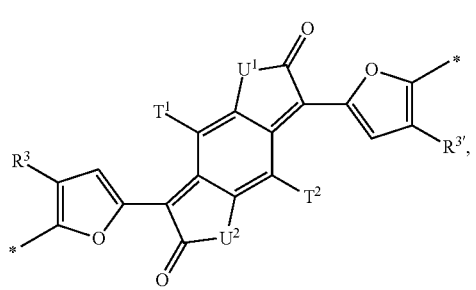
(Ib)

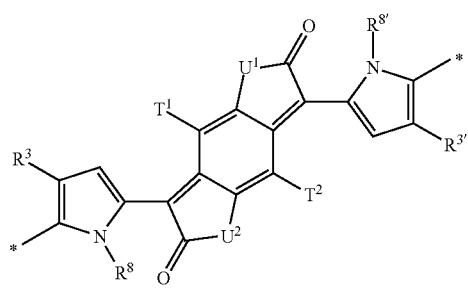
(Ic)

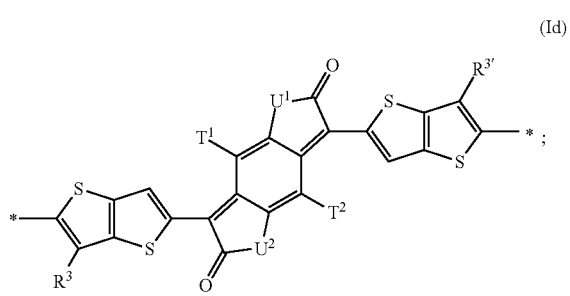
(Id)

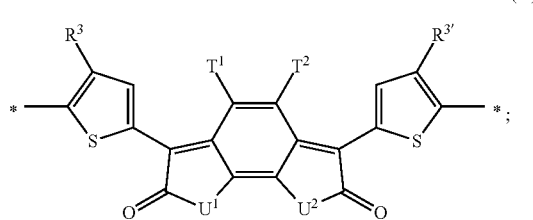
(Ie)

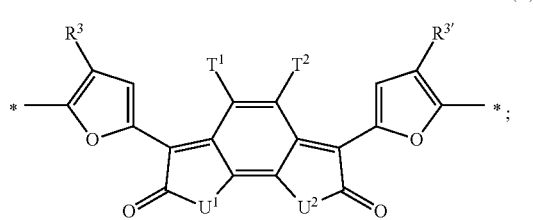
(If)

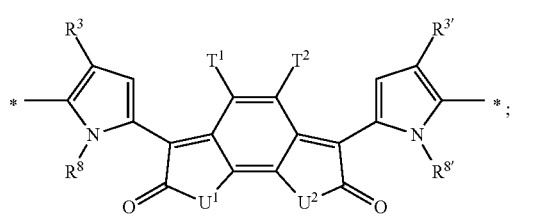
(Ig)

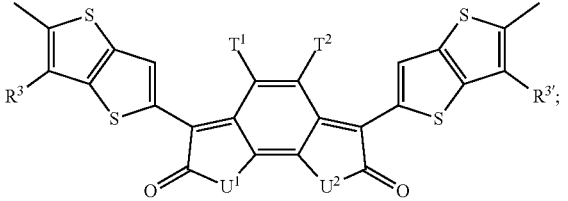
(Ih)

-continued (Ii)

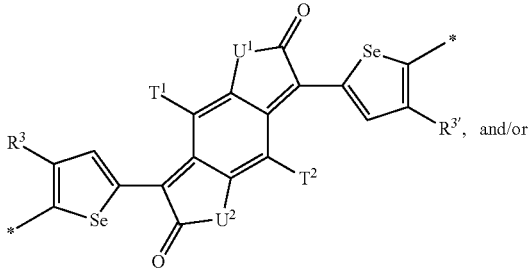

, and/or (Ij)

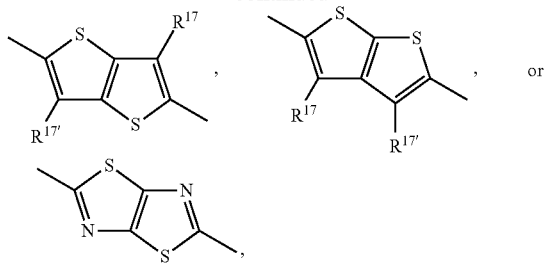

wherein $U^1$ is O, or $NR^1$; preferably $NR^1$;

$U^2$ is O, or $NR^2$; preferably $NR^2$;

$T^1$ and $T^2$ are independently of each other hydrogen, or $C_1$-$C_{25}$alkyl, especially hydrogen;

$R^1$ and $R^2$ may be the same or different and are selected from a $C_1$-$C_{38}$alkyl group, especially $C_8$-$C_{36}$alkyl group;

$R^3$ and $R^{3'}$ are independently of each other hydrogen or $C_1$-$C_{25}$alkyl; and $R^8$ and $R^{8'}$ are independently of each other hydrogen or $C_1$-$C_{25}$alkyl, especially $C_1$-$C_{25}$alkyl. Polymers, comprising a repeating unit of the formula (Ia), (Ib), (Ic), (Id), (Ie), (If), (Ig), (Ih), (Ii), or (Ij), especially (Ia), (Ib), (Id), (Ie) or (Ih); are preferred.

Repeating unit(s) of the formula (Ia), (Ib), (Id), (Ie), (If), or (Ih), especially (Ia), (Ib), or (Id), are preferred; repeating unit(s) of the formula (Ia), (Ib), (Id), (Ie) or (Ih), especially (Ia), or (Id), are more preferred; repeating unit(s) of the formula (Ia) are most preferred. In another preferred embodiment repeating) unit(s) of the formula (Ii) are preferred.

Preferably $U^1$ and $U^2$ are the same.

Preferably $T^1$ and $T^2$ are the same.

In another embodiment the present invention is directed to polymers, comprising (repeating) unit(s) of the formula *—[A]—* and *—[COM$^1$]—*, wherein A is a repeating unit of formula (I), and —COM$^1$- is a repeating unit, which has the meaning of $Ar^2$, wherein $Ar^2$ are as defined above, or a group of formula *—[Ar$^{14}$]$_s$—[Ar$^{15}$]$_t$—[Ar$^{16}$]$_u$—[Ar$^{17}$]$_v$*, s is 1, t is 1, u is 0, or 1, v is 0, or 1, and $Ar^{14}$, $Ar^{15}$, $Ar^{16}$ and $Ar^{17}$ are independently of each other a group of formula

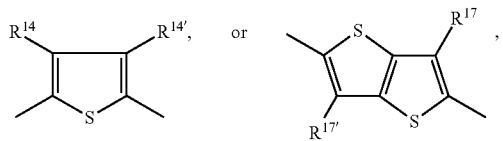

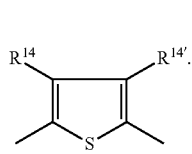

wherein one of $X^5$ and $X^6$ is N and the other is $CR^{14}$, and $R^{14}$, $R^{14'}$, $R^{17}$ and $R^{17'}$ are independently of each other H, or a $C_1$-$C_{25}$alkyl group.

Preferably $Ar^{14}$, $Ar^{15}$, $Ar^{16}$ and $Ar^{17}$ are independently of each other a group of formula

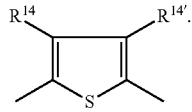

most preferably

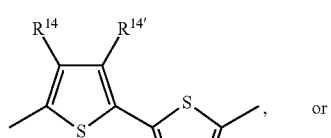

Examples of repeating units —COM$^1$- are groups of formula XIa, XIb, XIc, XIe, XIf, XII, XIp, XIr, XIs, XIx, XIIf, XIIg, XIIIa, XIIId, XIIII, XVa, XVb, XVc, XVIa, XVIb, XVIIa, or XVIIb. Among these groups of formula XIa, XIb, XIe, XIf, XIr, XIx, XIIIa, XVa, XVb, XVc, XVIa, or XVIb are preferred, groups of formula XIa, XIb, XIf, XVa, or XVb are more preferred, groups of formula XIa, XIf, or XVa are still more preferred. Groups of formula XIa are most preferred. Additional examples of repeating units —COM$^1$- are groups of formula XIVb, XIVc, or XIVd, especially XIVb.

Examples of a group of formula *—[Ar$^{14}$]$_k$—[Ar$^{15}$]$_l$—[Ar$^{16}$]$_r$—[Ar$^{17}$]$_z$*, are

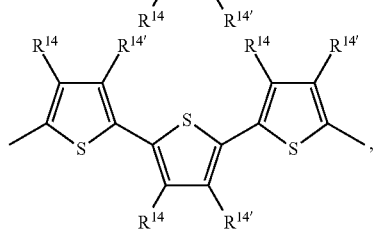

-continued

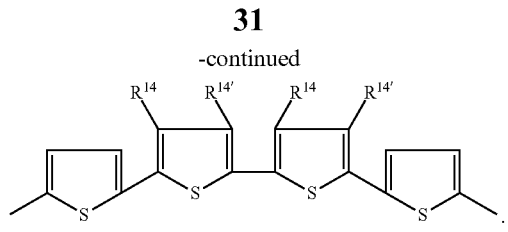

In a particularly preferred embodiment the repeating unit —COM¹— is a group of formula

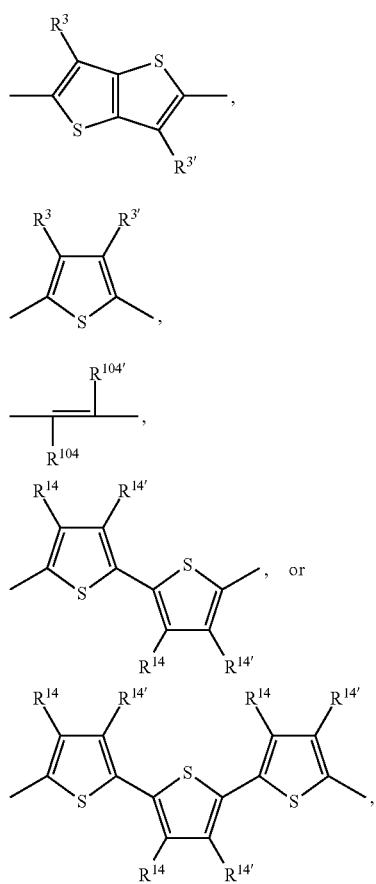

where $R^3$ and $R^{3'}$ are independently of each other hydrogen, or $C_1$-$C_{25}$alky, $R^{104}$ and $R^{104'}$ preferably are independently of each other hydrogen, cyano or a $C_1$-$C_{25}$alkyl group, and $R^{14}$ and $R^{14'}$ are independently of each other H, or a $C_1$-$C_{25}$alkyl group, especially a $C_6$-$C_{25}$alkyl, which may optionally be interrupted by one or more oxygen atoms.

In another preferred embodiment the repeating unit —COM¹- is a group of formula

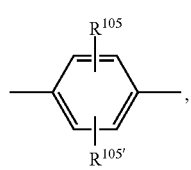
(XVa)

(XVb)

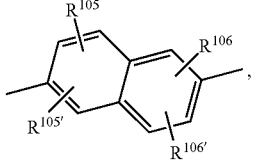
(XVIa)

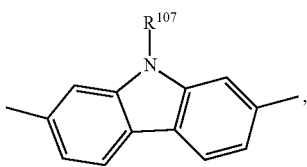
(XIr)

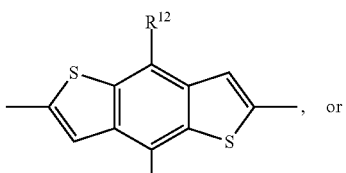
, or

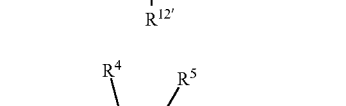
(XIII)

wherein $R^4$ and $R^5$ are independently of each other hydrogen, or $C_1$-$C_{25}$alkyl;

$R^{12}$ and $R^{12'}$ are H, or a $C_1$-$C_{25}$alkyl group;

$R^{105}$, $R^{105'}$, $R^{106}$ and $R^{106'}$ are independently of each other hydrogen, halogen, cyano, $C_1$-$C_{25}$alkyl or $C_1$-$C_{25}$alkoxy, especially hydrogen or $C_1$-$C_{25}$alkyl; and $R^{107}$ is $C_1$-$C_{25}$alkyl.

In a preferred embodiment of the present invention the polymer is a copolymer, comprising repeating units of formula $$*\!-\!\!+\!\!A\!\!+\!\!+\!\!COM^1\!\!+\!\!-\!\!*, \quad (VII)$$

especially a copolymer of formula $$\!\!+\!\!+\!\!A\!\!+\!\!+\!\!COM^1\!\!+\!\!]\!\!-\!\!*, \quad (VII')$$

wherein A and COM¹ are as defined above; n is number which results in a molecular weight of 4,000 to 2,000,000 Daltons, more preferably 10,000 to 1,000,000 and most preferably 10,000 to 100,000 Daltons. n is usually in the range of 4 to 1000, especially 4 to 200, very especially 5 to 150.

In a preferred embodiment the present invention is directed to polymers, wherein A is a repeating unit of formula (Ia), (Ib), (Id), or (Ii), especially (Ia), (Ib), or (Id), very especially (Ia), or (Id) (as defined in claim 3); and $$*\!-\!\!\left[\text{COM}^1\right]\!-\!*$$

is a group of formula

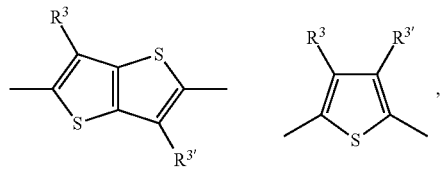

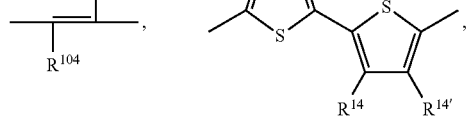, or

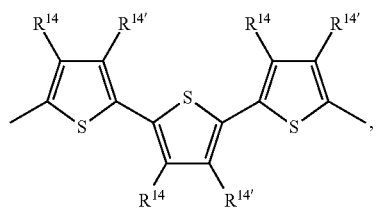, where $R^3$ and $R^{3'}$ are independently of each other hydrogen, or $C_1$-$C_{25}$alky, $R^{104}$ and $R^{104'}$ are independently of each other hydrogen, cyano or a $C_1$-$C_{25}$alkyl group, and $R^{14}$ and $R^{14'}$ are independently of each other H, or a $C_1$-$C_{25}$alkyl group, especially a $C_6$-$C_{25}$alkyl, which may optionally be interrupted by one or more oxygen atoms.

In another preferred embodiment the present invention is directed to polymers, wherein A is a repeating unit of formula (Ia), (Ib), (Id), or (Ii), especially (Ia), (Ib), or (Id), very especially (Ia), or (Id) (as defined in claim 3), and $$*\!-\!\!\left[\text{COM}^1\right]\!-\!*$$

is a group of formula

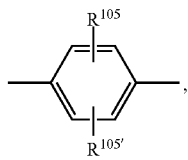 (XVa)

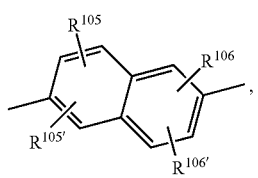 (XVb)

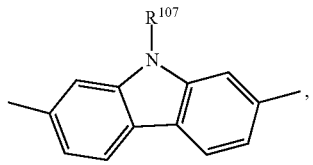 (XVIa)

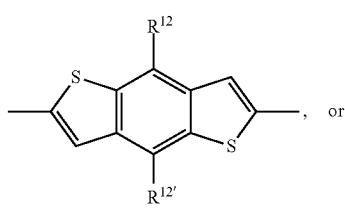 (XIr)

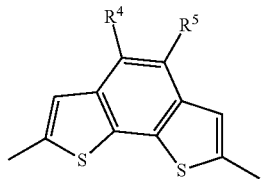 (XIII)

, or wherein $R^4$ and $R^5$ are independently of each other hydrogen, or $C_1$-$C_{25}$alkyl;

$R^{12}$ and $R^{12'}$ are H, or a $C_1$-$C_{25}$alkyl group;

$R^{105}$, $R^{105'}$, $R^{106}$ and $R^{106'}$ are independently of each other hydrogen, halogen, cyano, $C_1$-$C_{25}$alkyl or $C_1$-$C_{25}$alkoxy, especially hydrogen or $C_1$-$C_{25}$alkyl; and $R^{107}$ is $C_1$-$C_{25}$alkyl.

Among the polymers of formula I the following polymers are preferred:

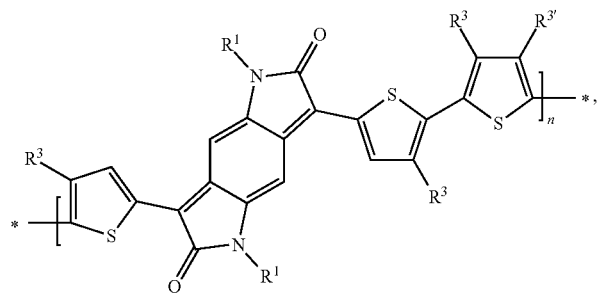 (Ia-1)

-continued
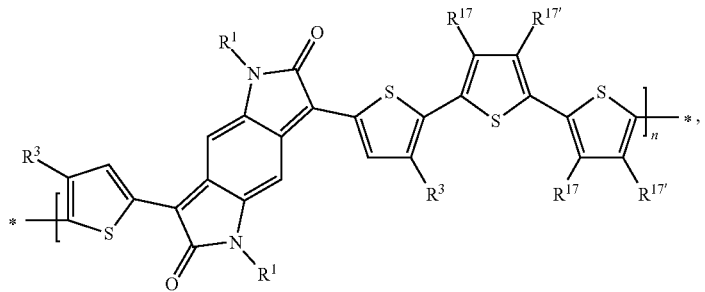
(Ia-2)
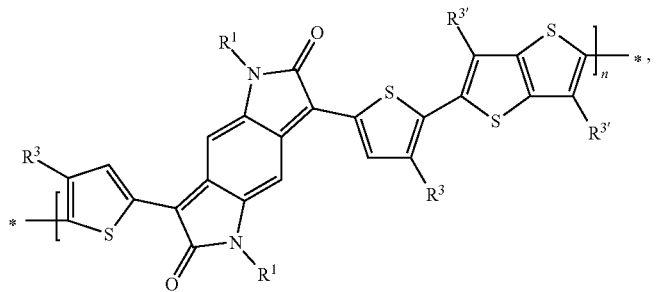
(Ia-3)
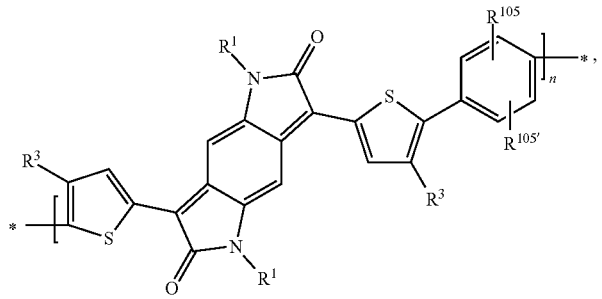
(Ia-4)
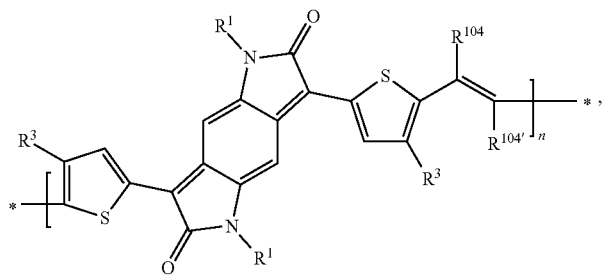
(Ia-5)
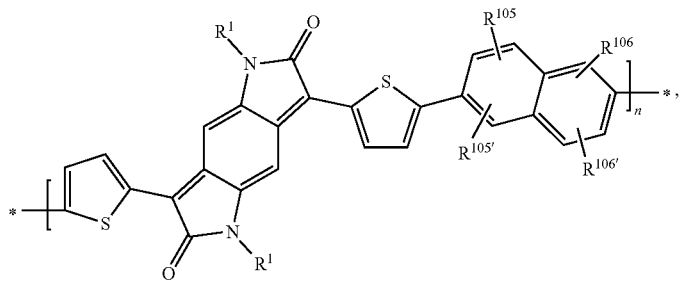
(Ia-6)

-continued
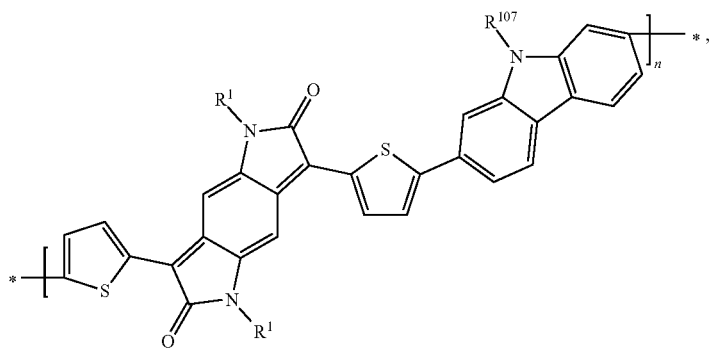 (Ia-7)
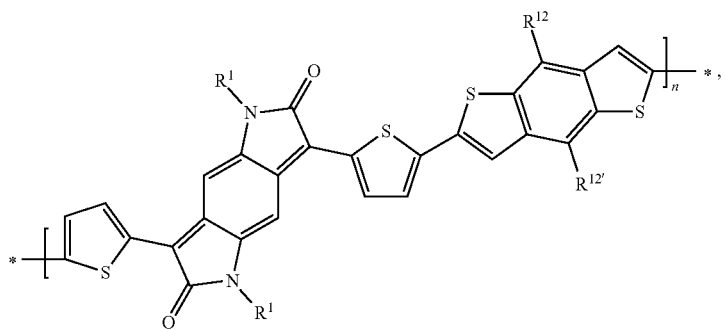 (Ia-8)
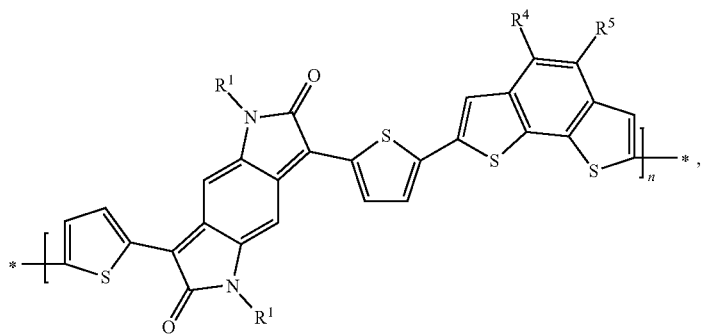 (Ia-9)
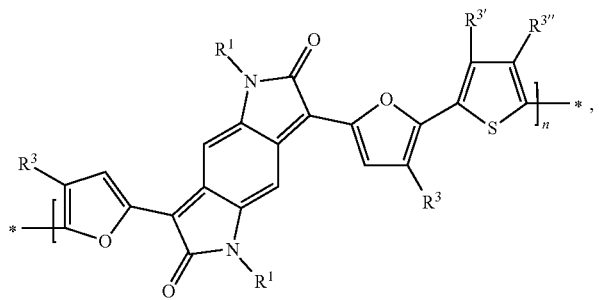 (Ia-10)
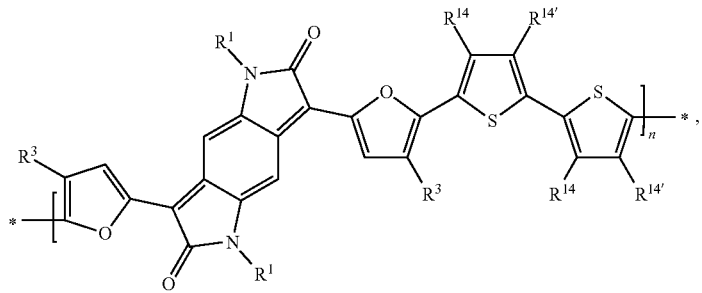 (Ia-11)

-continued
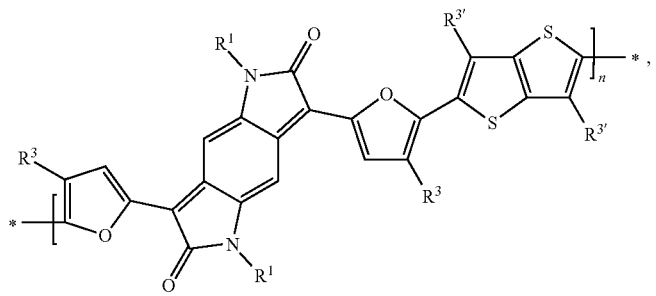
(Ia-12)
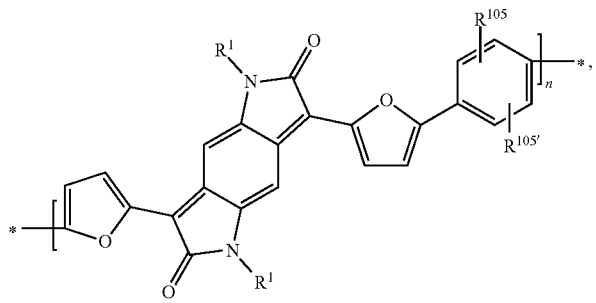
(Ia-13)
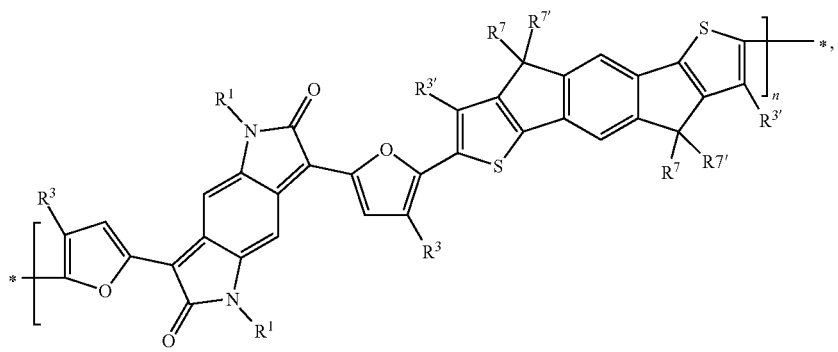
(Ia-14)
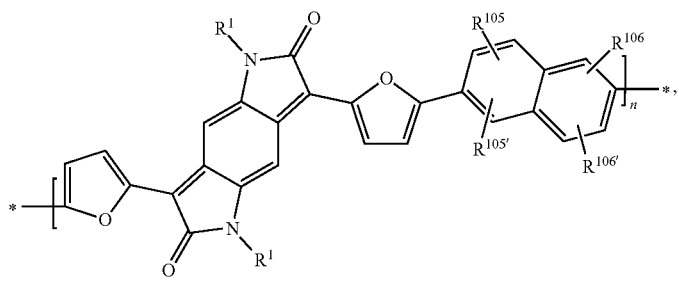
(Ia-15)
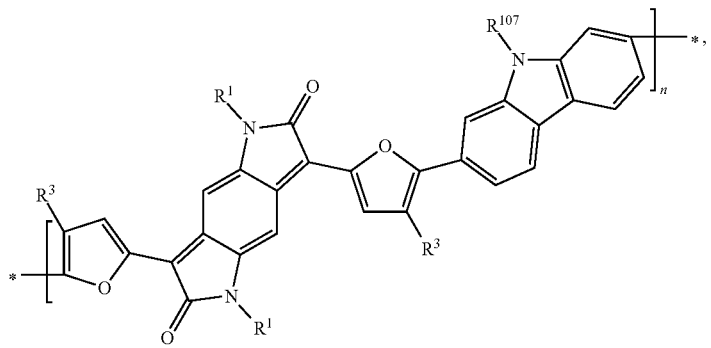
(Ia-16)

-continued
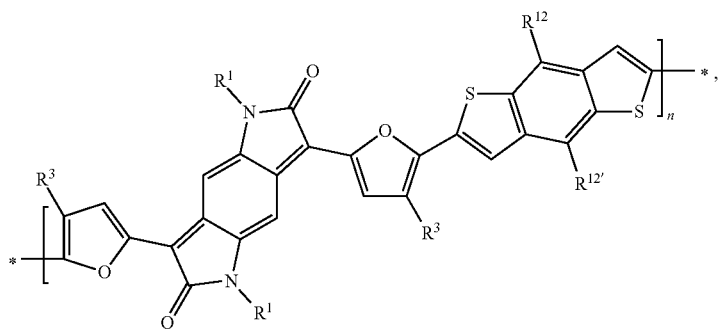
(Ia-17)
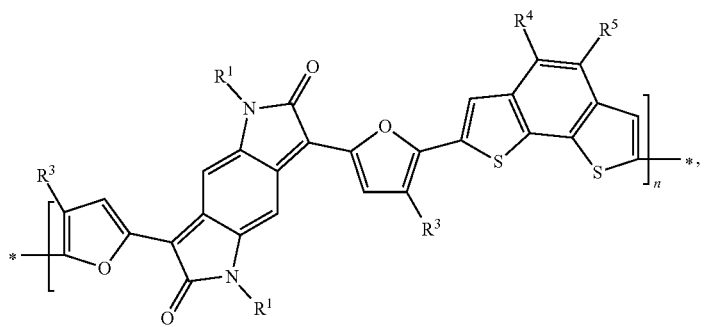
(Ia-18)
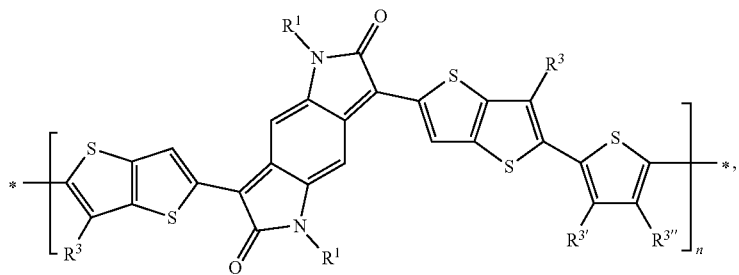
(Ia-19)
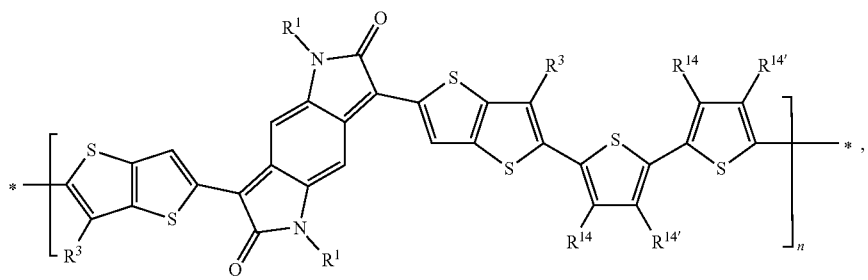
(Ia-20)
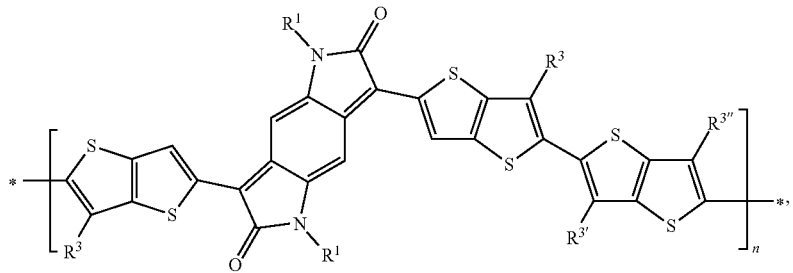
(Ia-21)

-continued
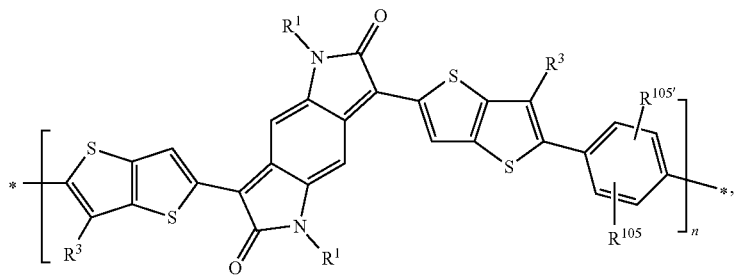
(Ia-22)
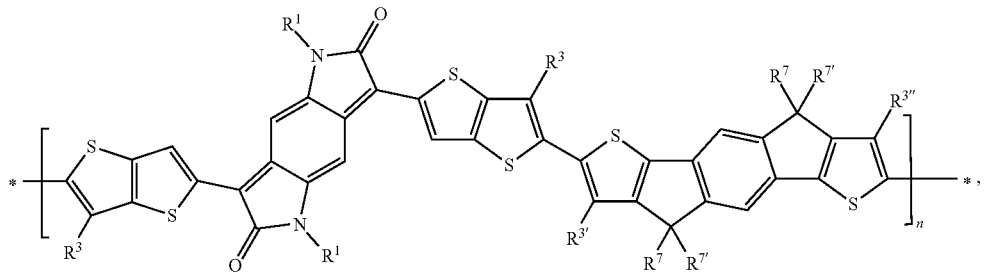
(Ia-23)
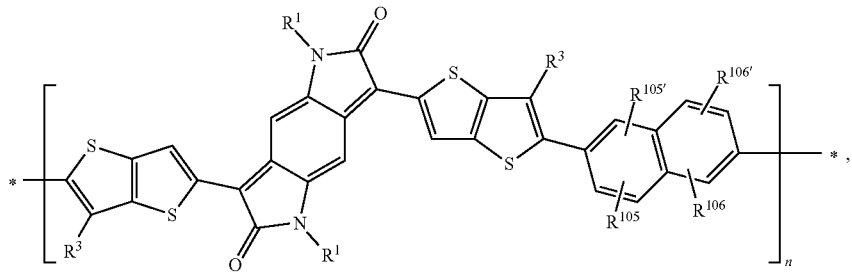
(Ia-24)
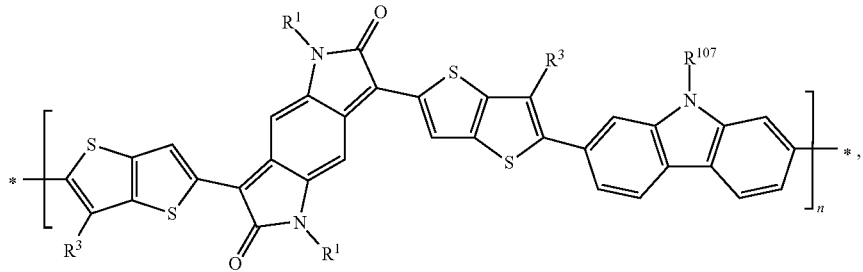
(Ia-25)
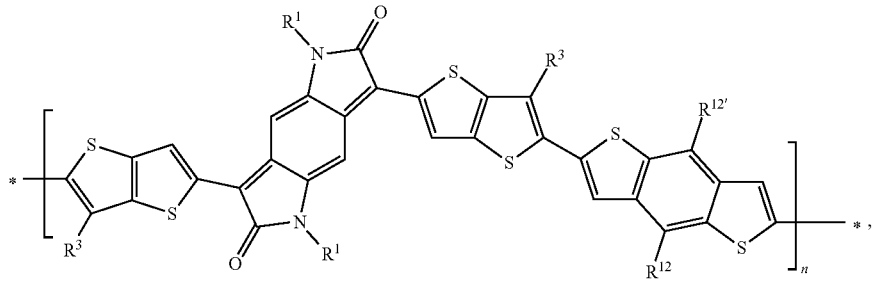
(Ia-26)

-continued

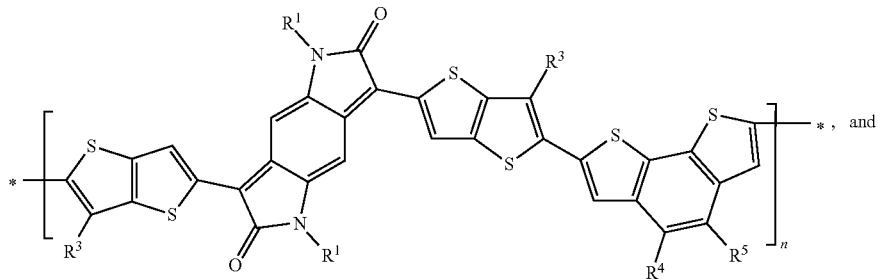

(Ia-27)

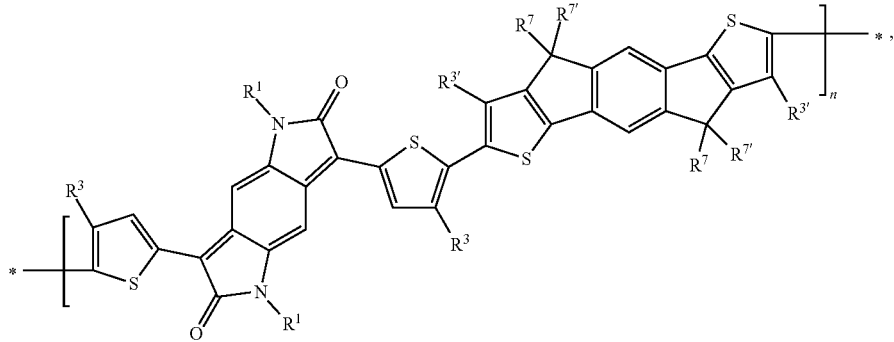

(Ia-28)

wherein
n is 4 to 1000, especially 4 to 200, very especially 5 to 100,
$R^1$ is a $C_1$-$C_{38}$alkyl group, especially $C_8$-$C_{36}$alkyl group,
$R^3$, $R^{3''}$ and $R^{3'}$ are independently of each other hydrogen, halogen, cyano, $C_1$-$C_{25}$alkyl or $C_1$-$C_{25}$alkoxy, especially hydrogen or $C_1$-$C_{25}$alkyl;
$R^4$ and $R^5$ are independently of each other hydrogen, or $C_1$-$C_{25}$alkyl;
$R^{12}$ and $R^{12'}$ are H, or a $C_1$-$C_{25}$alkyl group;
$R^7$ and $R^{7'}$ are independently of each other
$R^{14}$ and $R^{14'}$ are independently of each other independently of each other hydrogen, halogen, cyano, $C_1$-$C_{25}$alkyl or $C_1$-$C_{25}$alkoxy, especially hydrogen or $C_1$-$C_{25}$alkyl;
$R^{17}$ and $R^{17'}$ are independently of each other H, or a $C_1$-$C_{25}$alkyl group;

$R^{103}$ is $C_1$-$C_{25}$alkyl,
$R^{104}$ and $R^{104'}$ are independently of each other hydrogen, cyano, COOR$^{103}$, $C_1$-$C_{25}$alkyl, especially hydrogen or cyano;
$R^{105}$, $R^{105'}$, $R^{106}$ and $R^{106'}$ are independently of each other hydrogen, halogen, cyano, $C_1$-$C_{25}$alkyl or $C_1$-$C_{25}$alkoxy, especially hydrogen or $C_1$-$C_{25}$alkyl; and
$R^{107}$ is $C_1$-$C_{25}$alkyl.

According to an embodiment of the present invention polymers of formula (Ia-1), (Ia-2), (Ia-3), (Ia-4), (Ia-5), (Ia-6), (Ia-7), (Ia-8) and (Ia-9) are preferred. According to another embodiment of the present invention polymers of formula (Ia-10), (Ia-11), (Ia-12), (Ia-13), (Ia-14), (Ia-15), (Ia-16), (Ia-17), (Ia-18), (Ia-19), (Ia-20), (Ia-21), (Ia-22), (Ia-23), (Ia-24), (Ia-25), (Ia-26), (Ia-27), and (Ia-27) are preferred. Examples of particular preferred polymers are shown below:

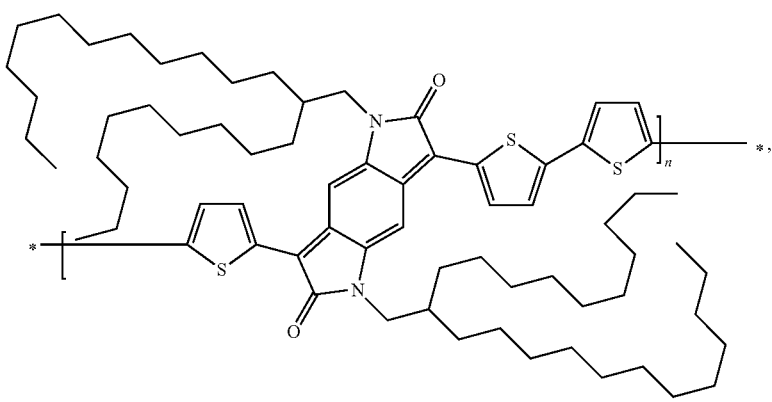

(P-1)

-continued
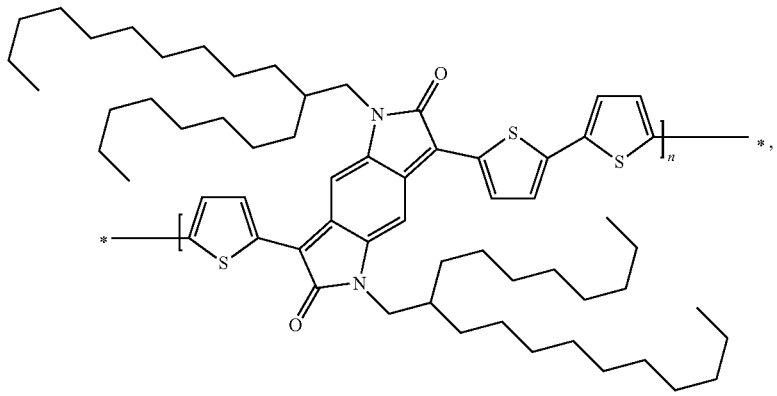
(P-2)
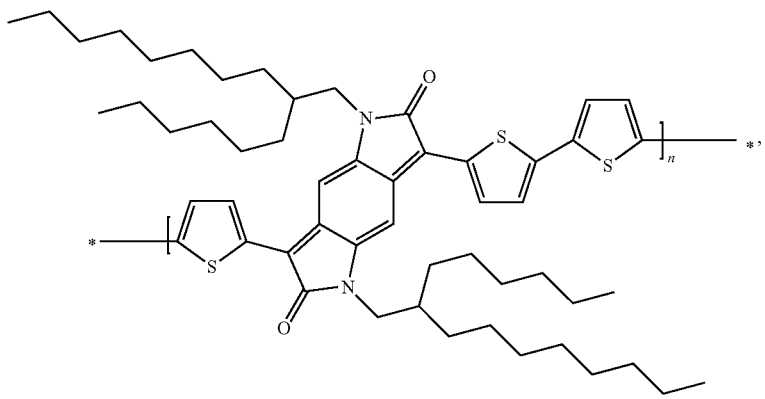
(P-3)
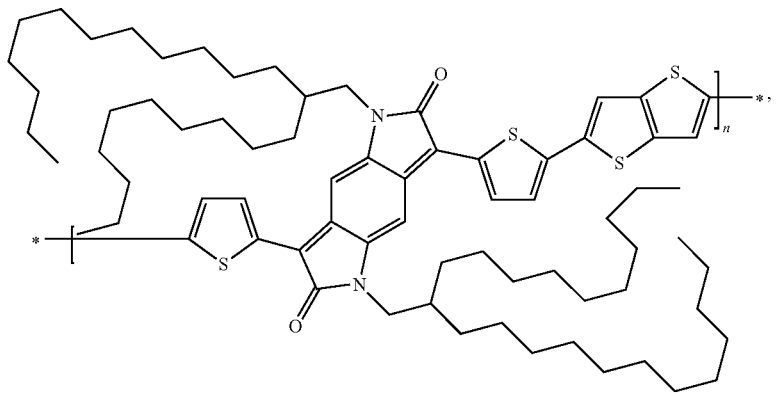
(P-4)
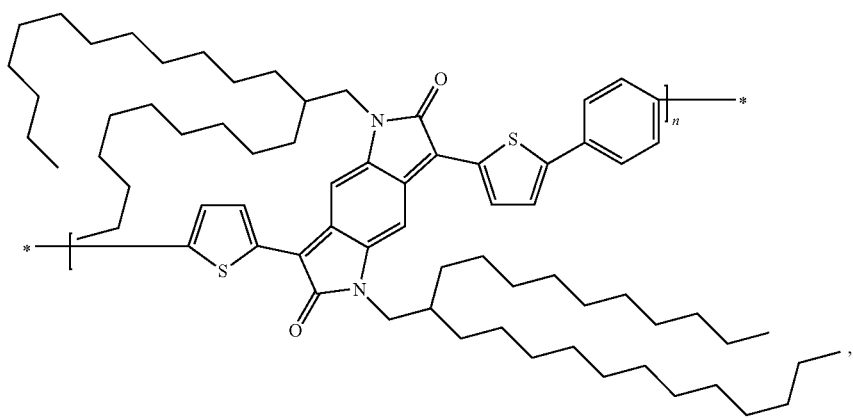
(P-5)

-continued
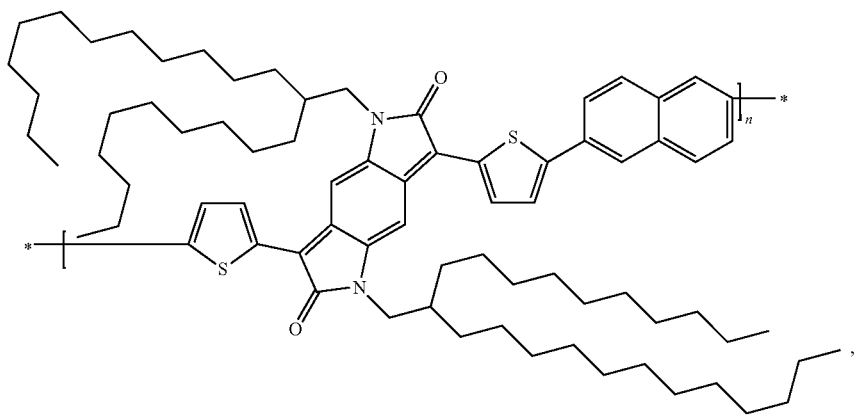
(P-6)
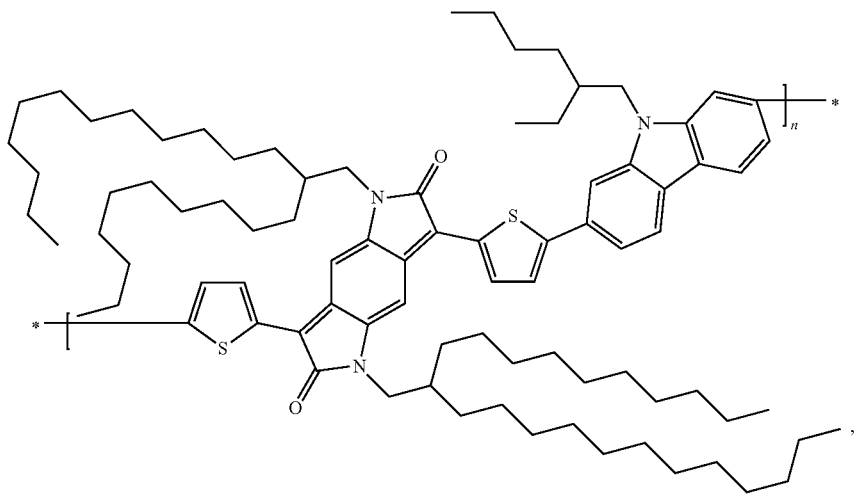
(P-7)
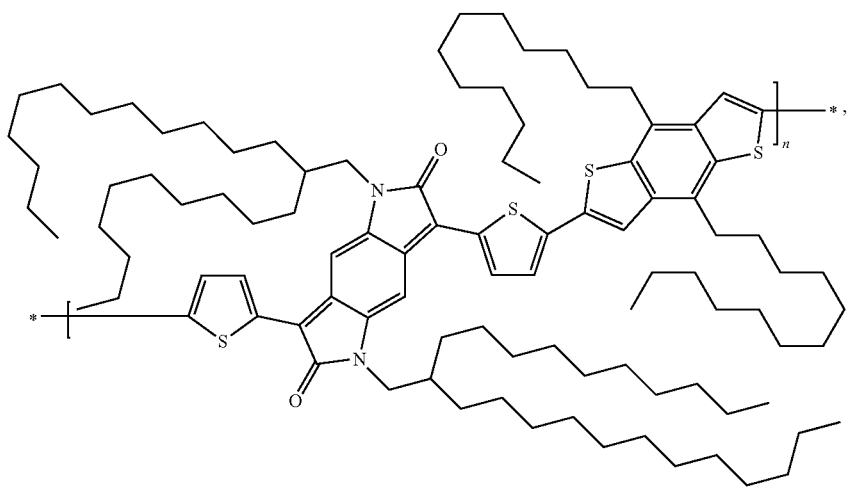
(P-8)

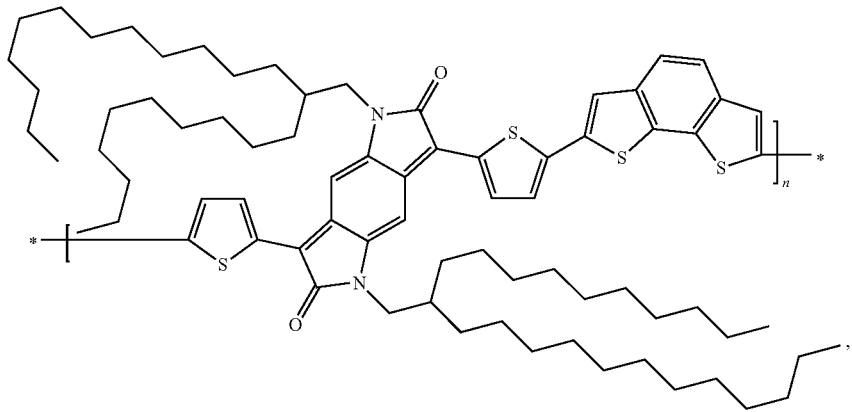
(P-9)
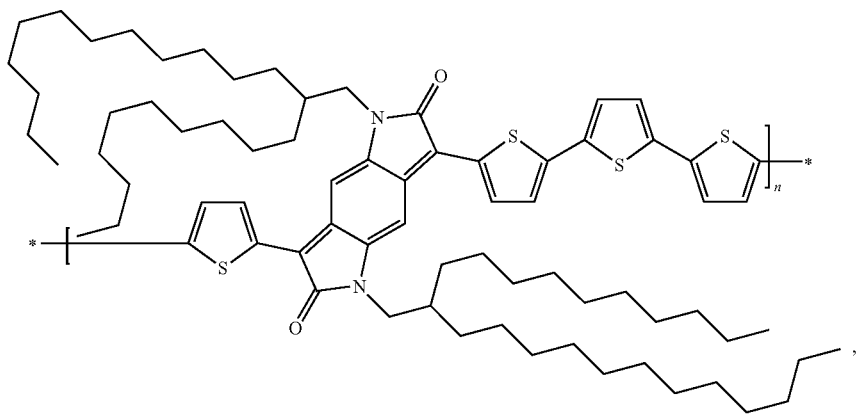
(P-10)
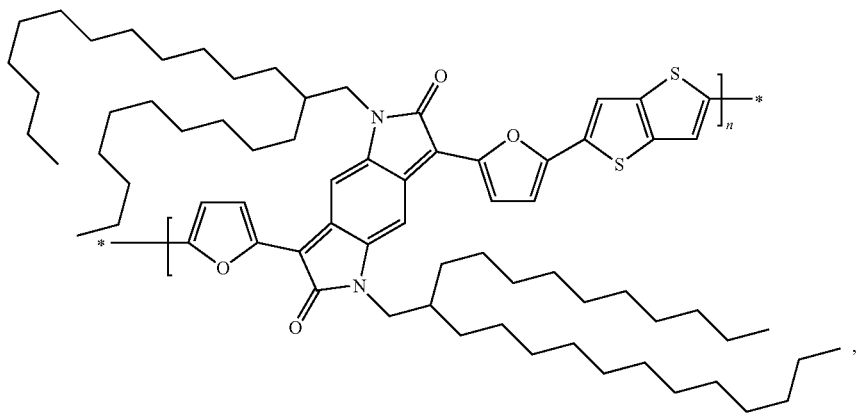
(P-11)
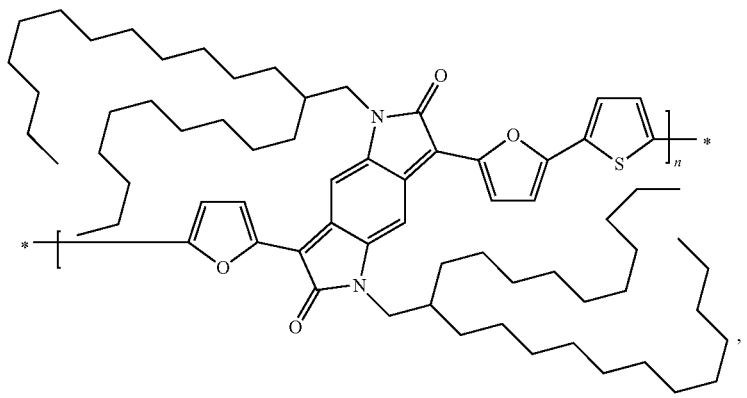
(P-12)

-continued (P-13)

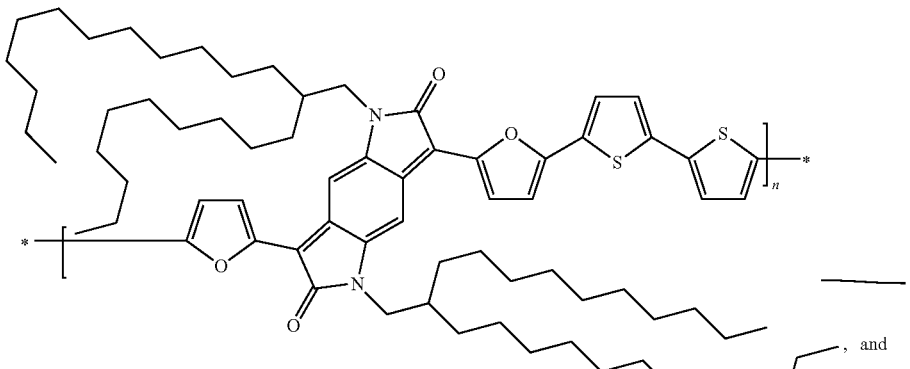

, and (P14)

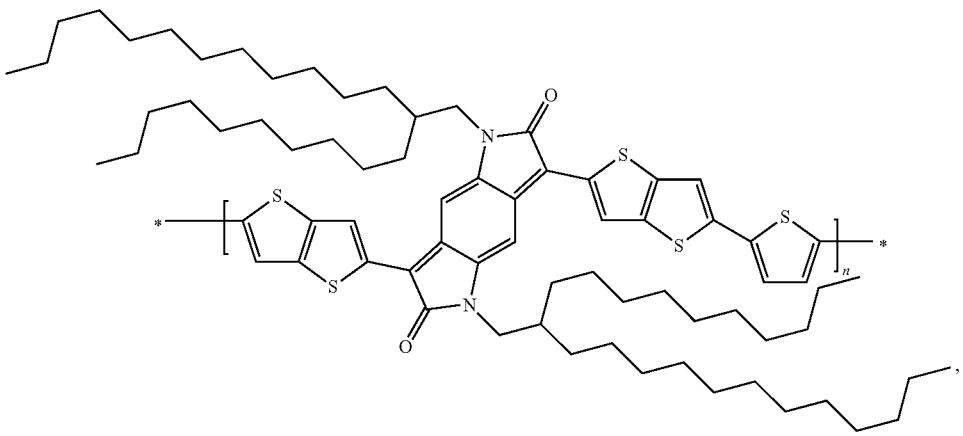

, wherein n is usually in the range of 4 to 1000, especially 4 to 200, very especially 5 to 150.

The polymers of the present invention can comprise more than 2 different repeating units, such as, for example, repeating units A, B and D, which are different from each other. If the polymers comprise repeating units of the formula ─(─A-D*─)─ and ─(─B-D*─)─, they are preferably (random) copolymers of formula *─(─A-D*─)$_x$─(─B-D*─)$_y$─*, wherein x=0.995 to 0.005, y=0.005 to 0.995, especially x=0.2 to 0.8, y=0.8 to 0.2, and wherein x+y=1. A is a repeating unit of formula (I), D* is a repeating unit —COM$^1$- and B is a repeating unit —COM$^1$-, or a repeating unit of formula (I); with the proviso that A, B and D* are different from each other.

Copolymers of formula VII can be obtained, for example, by the Suzuki reaction. The condensation reaction of an aromatic boronate and a halogenide, especially a bromide, commonly referred to as the "Suzuki reaction", is tolerant of the presence of a variety of organic functional groups as reported by N. Miyaura and A. Suzuki in Chemical Reviews, Vol. 95, pp. 457-2483 (1995). Preferred catalysts are 2-dicyclohexylphosphino-2',6'-di-alkoxybiphenyl/palladium(11)acetates, tri-alykl-phosphonium salts/palladium (0) derivatives and trialkylphosphine/palladium (0) derivatives. Especially preferred catalysts are 2-dicyclohexylphosphino-2',6'-di-methoxybiphenyl (sPhos)/palladium(II)acetate and, tri-tert-butylphosphonium tetrafluoroborate ((t-Bu)$_3$P*HBF4)/tris (dibenzylideneacetone)dipalladium (0) (Pd$_2$(dba)$_3$) and tri-tert-butylphosphine (t-Bu)$_3$P/tris(dibenzylideneacetone) dipalladium (0) (Pd$_2$(dba)$_3$). This reaction can be applied to preparing high molecular weight polymers and copolymers.

To prepare polymers corresponding to formula VII a dihalogenide of formula X$^{10}$-A-X$^{10}$ is reacted with an (equimolar) amount of a diboronic acid or diboronate corresponding to formula X$^{11}$─(─COM$^1$─)─X$^{11}$; or a dihalogenide of formula X$^{10}$─(─COM$^1$─)─X$^{10}$ is reacted with an (equimolar) amount of a diboronic acid or diboronate corresponding to formula X$^{11}$-A-X$^{11}$, wherein X$^{10}$ is halogen, especially Br, or I; and X$^{11}$ is independently in each occurrence —B(OH)$_2$, —B(OY$^1$)$_2$,

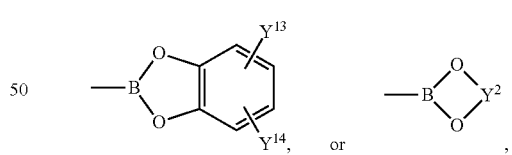

wherein Y$^1$ is independently in each occurrence a C$_1$-C$_{10}$alkyl group and Y$^2$ is independently in each occurrence a C$_2$-C$_{10}$alkylene group, such as —CY$^3$Y$^4$—CY$^5$Y$^6$—, or —CY$^7$Y$^8$—CY$^{10}$Y$^{12}$—, wherein Y$^3$, Y$^4$, Y$^5$, Y$^6$, Y$^7$, Y$^8$, Y$^9$, Y$^{10}$, Y$^{11}$ and Y$^{12}$ are independently of each other hydrogen, or a C$_1$-C$_{10}$alkyl group, especially —C(CH$_3$)$_2$C(CH$_3$)$_2$—, —CH$_2$C(CH$_3$)$_2$CH$_2$—, or —C(CH$_3$)$_2$CH$_2$C(CH$_3$)$_2$—, and Y$^{13}$ and Y$^{14}$ are independently of each other hydrogen, or a C$_1$-C$_{10}$alkyl group, under the catalytic action of Pd and triphenylphosphine. The reaction is typically conducted at about 0° C. to 180° C. in an aromatic hydrocarbon solvent such as toluene, xylene. Other solvents such as dimethylformamide, dioxane, dimethoxyethan and tetrahydrofuran can also be used alone, or in mixtures with an aromatic hydrocarbon. An aqueous base, preferably sodium carbonate or bicarbonate, potassium phosphate, potassium carbonate or bicarbonate is used as activation agent for the boronic acid, boronate and as the HBr scavenger. A polymerization reaction may take 0.2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein). Other variations of reaction conditions are given by T. I. Wallow and B. M. Novak in J. Org. Chem. 59 (1994) 5034-5037; and M. Remmers, M. Schulze, and G. Wegner in Macromol. Rapid Commun. 17 (1996) 239-252. Control of molecular weight is possible by using either an excess of dibromide, diboronic acid, or diboronate, or a chain terminator.

According to the process described in WO2010/136352 the polymerisation is carried out in presence of a) a catalyst/ligand system comprising a palladium catalyst and an organic phosphine or phosphonium compound, b) a base, c) a solvent or a mixture of solvents, characterized in that the organic phosphine is a trisubstituted phosphine of formula

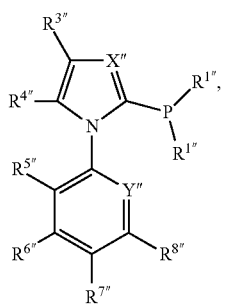

(VI)

or phosphonium salt thereof, wherein X" independently of Y" represents a nitrogen atom or a C—R$^{2''}$ group and Y" independently of X" represents a nitrogen atom or a C—R$^{9''}$ group, R$^{1''}$ for each of the two R$^{1''}$ groups independently of the other represents a radical selected from the group $C_1$-$C_{24}$-alkyl, $C_3$-$C_{20}$-cycloalkyl, which includes especially both monocyclic and also bi- and tri-cyclic cycloalkyl radicals, $C_5$-$C_{14}$-aryl, which includes especially the phenyl, naphthyl, fluorenyl radical, $C_2$-$C_{13}$-heteroaryl, wherein the number of hetero atoms, selected from the group N, O, S, may be from 1 to 2, wherein the two radicals R$^{1''}$ may also be linked to one another, and wherein the above-mentioned radicals R$^{1''}$ may themselves each be mono- or poly-substituted independently of one another by substituents selected from the group hydrogen, $C_1$-$C_{20}$-alkyl, $C_2$-$C_{20}$-alkenyl, $C_3$-$C_8$-cycloalkyl, $C_2$-$C_9$-hetero-alkyl, $C_2$-$C_9$-heteroaryl, wherein the number of hetero atoms from the group N, O, S may be from 1 to 4, $C_1$-$C_{20}$-alkoxy, hydroxy, amino of the forms NH—($C_1$-$C_{20}$-alkyl), NH—($C_5$-$C_{10}$-aryl), N($C_1$-$C_{20}$-alkyl)$_2$, N($C_1$-$C_{20}$-alkyl)($C_5$-$C_{10}$-aryl), N($C_5$-$C_{10}$-aryl)$_2$, N($C_1$-$C_{20}$-alkyl/$C_5$-$C_{10}$-aryl)$_3^+$, NH—CO—$C_1$-$C_{20}$-alkyl, NH—CO—carboxylato of the forms COOH and COOQ (wherein Q represents either a monovalent cation or $C_1$-$C_8$-alkyl), $C_1$-$C_6$-acyloxy, sulfinato, sulfonato of the forms SO$_3$H and SO$_3$Q' (wherein Q' represents either a monovalent cation, $C_1$-$C_{20}$-alkyl, or $C_5$-$C_{10}$-aryl), tri-$C_1$-$C_6$-alkylsilyl, wherein two of the mentioned substituents may also be bridged with one another, R$^{2''}$-R$^{9''}$ represent a hydrogen, alkyl, alkenyl, cycloalkyl, aromatic or heteroaromatic aryl, O-alkyl, NH-alkyl, N-(alkyl)$_2$, O-(aryl), NH-(aryl), N-(alkyl)(aryl), O—CO-alkyl, O—CO-aryl, F, Si(alkyl)$_3$, CF$_3$, CN, CO$_2$H, COH, SO$_3$H, CONH$_2$, CONH(alkyl), CON(alkyl)$_2$, SO$_2$(alkyl), SO(alkyl), SO(aryl), SO$_2$(aryl), SO$_3$(alkyl), SO$_3$(aryl), S-alkyl, S-aryl, NH—CO(alkyl), CO$_2$(alkyl), CONH$_2$, CO(alkyl), NHCOH, NHCO$_2$(alkyl), CO(aryl), CO$_2$(aryl) radical, wherein two or more adjacent radicals, each independently of the other (s), may also be linked to one another so that a condensed ring system is present and wherein in R$^{2''}$ to R$^{9''}$ alkyl represents a hydrocarbon radical having from 1 to 20 carbon atoms which may in each case be linear or branched, alkenyl represents a mono- or poly-unsaturated hydrocarbon radical having from 2 to 20 carbon atoms which may in each case be linear or branched, cycloalkyl represents a hydrocarbon having from 3 to 20 carbon atoms, aryl represents a 5- to 14-membered aromatic radical, wherein from one to four carbon atoms in the aryl radical may also be replaced by hetero atoms from the group nitrogen, oxygen and sulfur so that a 5- to 14-membered heteroaromatic radical is present, wherein the radicals R$^{2''}$ to R$^{9''}$ may also carry further substituents as defined for R$^{1''}$.

The organic phosphines and their synthesis are described in WO2004101581.

Preferred organic phosphines are selected from trisubstituted phosphines of formula

| Cpd. | R$^{1''}$ | R$^{5''}$ | R$^{6''}$ | R$^{3''}$ | R$^{4''}$ |
|---|---|---|---|---|---|
| A-1 | H$_3$C—C(CH$_3$)$_2$—CH$_3$ | H | H | H | H |
| A-2 | cyclohexyl | H | H | H | H |
| A-3 | phenyl | H | H | H | H |
| A-4 | adamantyl | H | H | H | H |
| A-5 | cyclohexyl | —OCH$_3$ | H | H | H |
| A-6 | cyclohexyl | 1) | 1) | H | H |
| A-7 | H$_3$C—C(CH$_3$)$_2$—CH$_3$ | 1) | 1) | H | H |
| A-8 | phenyl | 1) | 1) | H | H |
| A-9 | adamantyl | 1) | 1) | H | H |
| A-10 | cyclohexyl | H | H | 2) | 2) |
| A-11 | H$_3$C—C(CH$_3$)$_2$—CH$_3$ | H | H | 2) | 2) |
| A-12 | phenyl | H | H | 2) | 2) |
| A-13 | adamantyl | H | H | 2) | 2) |

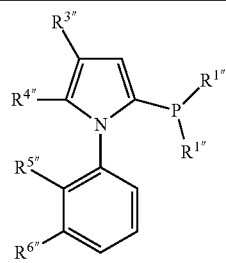

| Cpd. | R¹" | R⁵" | R⁶" | R³" | R⁴" |
|------|-----|-----|-----|-----|-----|
| 1) R⁵" and R⁶" together form a ring | | | | | |
| 2) R³" and R⁴" together form a ring | | | | | |

Examples of preferred catalysts include the following compounds:

palladium(II) acetylacetonate, palladium(0) dibenzylidene-acetone complexes, palladium(II) propionate, Pd₂(dba)₃: [tris(dibenzylideneacetone) dipalladium(0)], Pd(dba)₂: [bis(dibenzylideneacetone) palladium(0)], Pd(PR₃)₂, wherein PR₃ is a trisubstituted phosphine of formula VI, Pd(OAc)₂: [palladium(II) acetate], palladium(II) chloride, palladium(II) bromide, lithium tetra-chloropalladate(II), PdCl₂(PR₃)₂; wherein PR₃ is a trisubstituted phosphine of formula VI; palladium(0) diallyl ether complexes, palladium (II) nitrate, PdCl₂(PhCN)₂: [dichlorobis(benzonitrile) palladium(II)], PdCl₂(CH₃CN): [dichlorobis(acetonitrile) palladium(II)], and PdCl₂(COD): [dichloro(1,5-cyclooctadiene) palladium (II)].

Especially preferred are PdCl₂, Pd₂(dba)₃, Pd(dba)₂, Pd(OAc)₂, or Pd(PR₃)₂. Most preferred are Pd₂(dba)₃ and Pd(OAc)₂.

The palladium catalyst is present in the reaction mixture in catalytic amounts. The term "catalytic amount" refers to an amount that is clearly below one equivalent of the (hetero) aromatic compound(s), preferably 0.001 to 5 mol-%, most preferably 0.001 to 1 mol-%, based on the equivalents of the (hetero)aromatic compound(s) used.

The amount of phosphines or phosphonium salts in the reaction mixture is preferably from 0.001 to 10 mol-%, most preferably 0.01 to 5 mol-%, based on the equivalents of the (hetero)aromatic compound(s) used. The preferred ratio of Pd:phosphine is 1:4.

The base can be selected from all aqueous and nonaqueous bases and can be inorganic, or organic. It is preferable that at least 1.5 equivalents of said base per functional boron group is present in the reaction mixture. Suitable bases are, for example, alkali and alkaline earth metal hydroxides, carboxylates, carbonates, fluorides and phosphates such as sodium and potassium hydroxide, acetate, carbonate, fluoride and phosphate or also metal alcoholates. It is also possible to use a mixture of bases. The base is preferably a lithium salt, such as, for example, lithium alkoxides (such as, for example, lithium methoxide and lithium ethoxide), lithium hydroxide, carboxylate, carbonate, fluoride and/or phosphate.

The at present most preferred base is aqueous LiOHxH2O (monohydrate of LiOH) and (waterfree) LiOH.

The reaction is typically conducted at about 0° C. to 180° C., preferably from 20 to 160° C., more preferably from 40 to 140° C. and most preferably from 40 to 120° C. A polymerization reaction may take 0.1, especially 0.2 to 100 hours.

In a preferred embodiment of the present invention the solvent is THF, the base is Li—OH*H₂O and the reaction is conducted at reflux temperature of THF (about 65° C.).

The solvent is for example selected from toluene, xylenes, anisole, THF, 2-methyltetrahydrofuran, dioxane, chlorobenzene, fluorobenzene or solvent mixtures comprising one or more solvents like e.g. THF/toluene and optionally water. Most preferred is THF, or THF/water.

Advantageously, the polymerisation is carried out in presence of
a) palladium(II) acetate, or Pd₂(dba)₃, (tris(dibenzylideneacetone)dipalladium(0)) and an organic phosphine A-1 to A-13,
b) LiOH, or LiOHxH2O; and
c) THF, and optionally water. If the monohydrate of LiOH is used, no water needs to be added.

Most preferred the polymerisation is carried out in presence of
a) palladium(II) acetate, or Pd₂(dba)₃ (tris(dibenzylideneacetone)dipalladium(0)) and

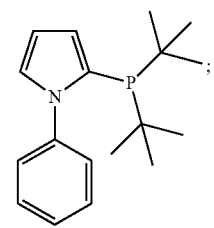 [SMILES: CC(C)(C)P(c1cccn1-c1ccccc1)C(C)(C)C]

b) LiPHxH₂O; and
c) THF. The palladium catalyst is present in an amount of preferably about 0.5 mol-%, based on the equivalents of the (hetero)aromatic compound(s) used. The amount of phosphines or phosphonium salts in the reaction mixture is preferably about 2 mol-%, based on the equivalents of the (hetero) aromatic compound(s) used. The preferred ratio of Pd:phosphine is about 1:4.

Preferably the polymerization reaction is conducted under inert conditions in the absence of oxygen. Nitrogen and more preferably argon are used as inert gases.

The process described in WO2010/136352 is suitable for large-scale applications, is readily accessible and convert starting materials to the respective polymers in high yield, with high purity and high selectivity. The process can provide polymers having weight average molecular weights of at least 10,000, more preferably at least 20,000, most preferably at least 30,000. The at present most preferred polymers have a weight average molecular weight of 30,000 to 80,000 Daltons. Molecular weights are determined according to high-temperature gel permeation chromatography (HT-GPC) using polystyrene standards. The polymers preferably have a polydispersibility of 1.01 to 10, more preferably 1.1 to 3.0, most preferred 1.5 to 2.5.

If desired, a monofunctional aryl halide or aryl boronate, such as, for example,

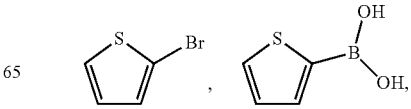

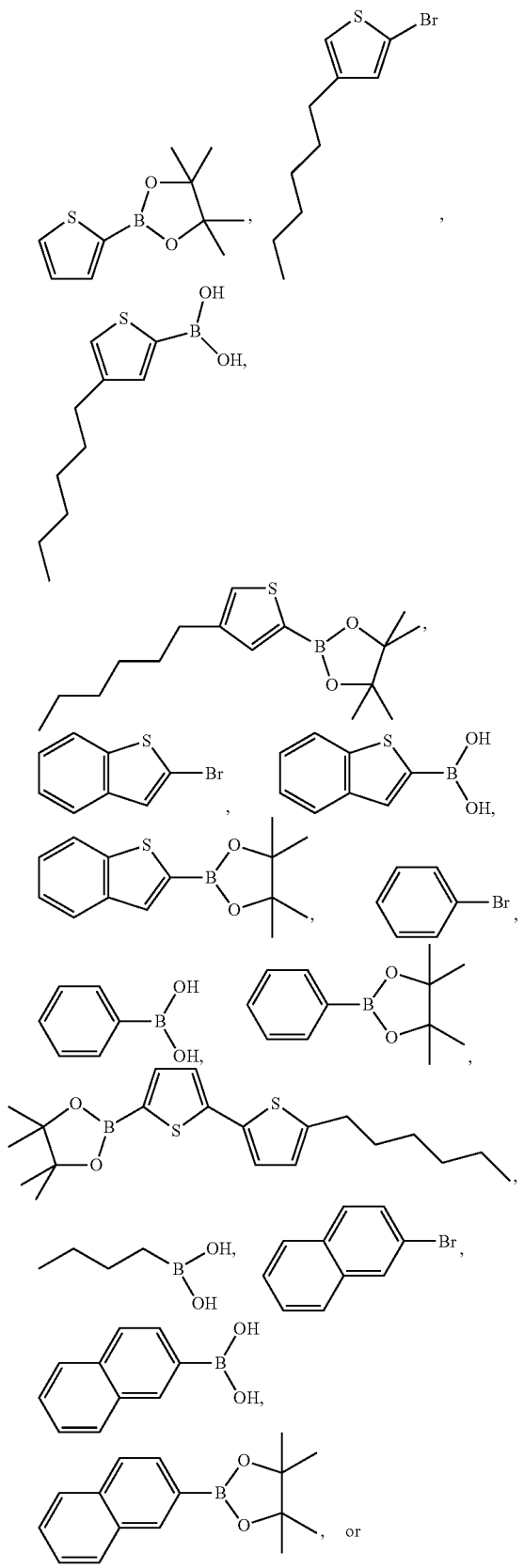

($X^2$ is Br, I, —B(OH)$_2$, —B(OY$^1$)$_2$, $$\begin{matrix} & Y^{13} \\ -B\begin{matrix}O\\O\end{matrix}\begin{matrix}\\ \\Y^{14}\end{matrix}, & -B\begin{matrix}O\\O\end{matrix}Y^2 \end{matrix}$$

—BF$_4$Na, or —BF$_4$K) may be used as a chain-terminator in such reactions, which will result in the formation of a terminal aryl group.

It is possible to control the sequencing of the monomeric units in the resulting copolymer by controlling the order and composition of monomer feeds in the Suzuki reaction.

The polymers of the present invention can also be synthesized by the Stille coupling (see, for example, Babudri et al, J. Mater. Chem., 2004, 14, 11-34; J. K. Stille, Angew. Chemie Int. Ed. Engl. 1986, 25, 508). To prepare polymers corresponding to formula VII a dihalogenide of formula $X^{10}$-A-$X^{10}$ is reacted with a compound of formula $X^{11'}$—COM$^1$-$X^{11'}$, or a dihalogenide of formula $X^{10}$—COM$^1$-$X^{10}$ is reacted with a compound of formula $X^{11'}$-A-$X^{11'}$, wherein $X^{11'}$ is a group —SnR$^{207}$R$^{208}$R$^{209}$ and $X^{10}$ is as defined above, in an inert solvent at a temperature in range from 0° C. to 200° C. in the presence of a palladium-containing catalyst, wherein R$^{207}$, R$^{208}$ and R$^{209}$ are identical or different and are H or C$_1$-C$_6$alkyl, wherein two radicals optionally form a common ring and these radicals are optionally branched or unbranched. It must be ensured here that the totality of all monomers used has a highly balanced ratio of organotin functions to halogen functions. In addition, it may prove advantageous to remove any excess reactive groups at the end of the reaction by end-capping with monofunctional reagents. In order to carry out the process, the tin compounds and the halogen compounds are preferably introduced into one or more inert organic solvents and stirred at a temperature of from 0 to 200° C., preferably from 30 to 170° C. for a period of from 1 hour to 200 hours, preferably from 5 hours to 150 hours. The crude product can be purified by methods known to the person skilled in the art and appropriate for the respective polymer, for example repeated re-precipitation or even by dialysis.

Suitable organic solvents for the process described are, for example, ethers, for example diethyl ether, dimethoxyethane, diethylene glycol dimethyl ether, tetrahydrofuran, dioxane, dioxolane, diisopropyl ether and tert-butyl methyl ether, hydrocarbons, for example hexane, isohexane, heptane, cyclohexane, benzene, toluene and xylene, alcohols, for example methanol, ethanol, 1-propanol, 2-propanol, ethylene glycol, 1-butanol, 2-butanol and tert-butanol, ketones, for example acetone, ethyl methyl ketone and isobutyl methyl ketone, amides, for example dimethylformamide (DMF), dimethylacetamide and N-methylpyrrolidone, nitriles, for example acetonitrile, propionitrile and butyronitrile, and mixtures thereof.

The palladium and phosphine components should be selected analogously to the description for the Suzuki variant.

Alternatively, the polymers of the present invention can also be synthesized by the Negishi reaction using a zinc reagent A-(ZnX$^{12}$)$_2$, wherein $X^{12}$ is halogen and halides, and COM$^1$-(X$^{23}$)$_2$, wherein $X^{23}$ is halogen or triflate, or using A-(X$^{23}$)$_2$ and COM$^1$-(ZnX$^{23}$)$_2$. Reference is, for example, made to E. Negishi et al., Heterocycles 18 (1982) 117-22.

Alternatively, the polymers of the present invention can also be synthesized by the Hiyama reaction using a organo-silicon reagent A-(SiR$^{210}$R$^{211}$R$^{212}$)$_2$, wherein R$^{210}$, R$^{211}$ and R$^{212}$ are identical or different and are halogen, or C$_1$-C$_6$alkyl, and COM$^1$-(X$^{23}$)$_2$, wherein $X^{23}$ is halogen or triflate, or using A-(X$^{23}$)$_2$ and COM$^1$-(SiR$^{210}$R$^{211}$R$^{212}$)$_2$. Reference is, for example, made to T. Hiyama et al., Pure Appl. Chem. 66 (1994) 1471-1478 and T. Hiyama et al., Synlett (1991) 845-853.

Homopolymers of the type $(A)_n$ can be obtained via Yamamoto coupling of dihalides $X^{10}$-A-$X^{10}$, where $X^{10}$ is halogen, preferably bromide. Alternatively homopolymers of the type $(A)_n$ can be obtained via oxidative polymerization of units $X^{10}$-A-$X^{10}$, where $X^{10}$ is hydrogen, e.g. with $FeCl_3$ as oxidizing agent.

The compounds of the formula

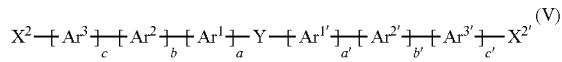

are intermediates in the production of the polymers of the present invention, are new and form a further subject of the present invention. a, a', b, b', c, c', Y, $Ar^1$, $Ar^{1'}$, $Ar^2$, $Ar^{2'}$, $Ar^3$ and $Ar^{3'}$ are as defined above, and $X^2$ and $X^{2'}$ are independently of each other halogen, especially Br, or J, $ZnX^{12}$, —$SnR^{207}R^{208}R^{209}$, wherein $R^{207}$, $R^{208}$ and $R^{209}$ are identical or different and are H or $C_1$-$C_8$alkyl, wherein two radicals optionally form a common ring and these radicals are optionally branched or unbranched and $X^{12}$ is a halogen atom, very especially I, or Br; or —$OS(O)_2CF_3$, —$OS(O)_2$-aryl, especially

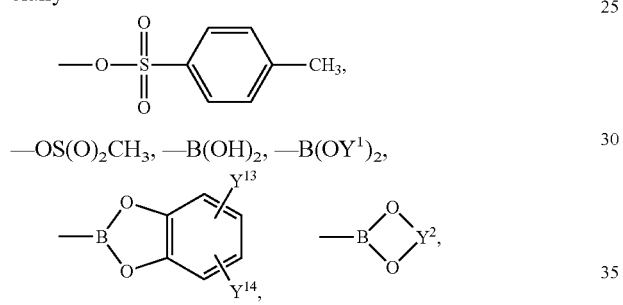

—$OS(O)_2CH_3$, —$B(OH)_2$, —$B(OY^1)_2$,

—$BF_4Na$, or —$BF_4K$, wherein $Y^1$ is independently in each occurrence a $C_1$-$C_{10}$alkyl group and $Y^2$ is independently in each occurrence a $C_2$-$C_{10}$alkylene group, such as —$CY^3Y^4$—$CY^5Y^6$—, or —$CY^7Y^8$—$CY^9Y^{10}$—$CY^{11}Y^{12}$—, wherein $Y^3$, $Y^4$, $Y^5$, $Y^6$, $Y^7$, $Y^8$, $Y^8$, $Y^9$, $Y^{10}$, $Y^{11}$ and $Y^{12}$ are independently of each other hydrogen, or a $C_1$-$C_{10}$alkyl group, especially —$C(CH_3)_2C(CH_3)_2$—, —$C(CH_3)_2CH_2C(CH_3)_2$—, or —$CH_2C(CH_3)_2CH_2$—, and $Y^{13}$ and $Y^{14}$ are independently of each other hydrogen, or a $C_1$-$C_{10}$alkyl group. $X^2$ and $X^{2'}$ are preferably the same.

Y is preferably a group of formula

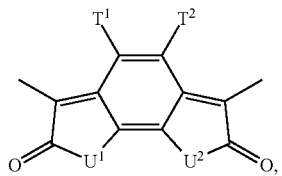

more preferably a group of formula

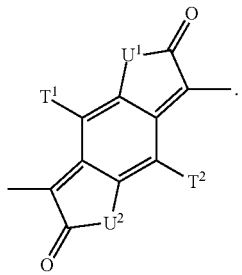

$U^1$ and $U^2$ are preferably O, more preferably $NR^1$. $T^1$ and $T^2$ are preferably hydrogen. Examples of compounds of formula V are shown below:

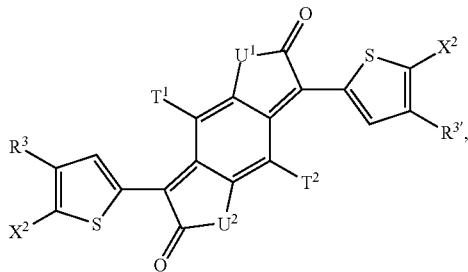
(Va)

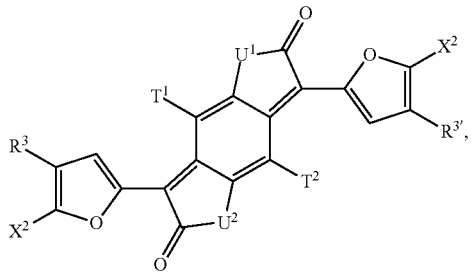
(Vb)

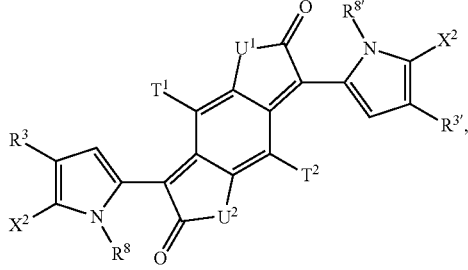
(Vc)

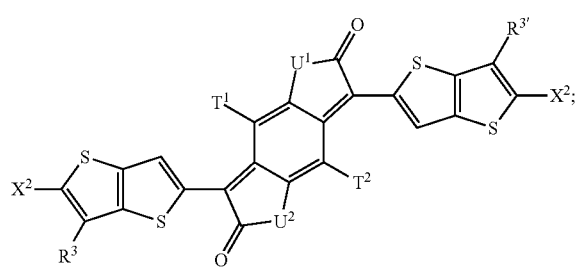
(Vd)

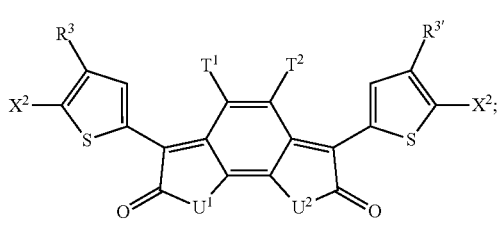
(Ve)

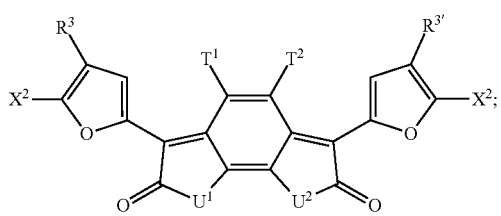
(Vf)

-continued

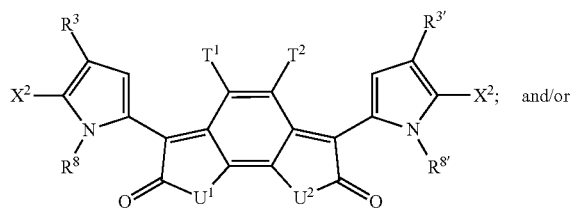
(Vg)

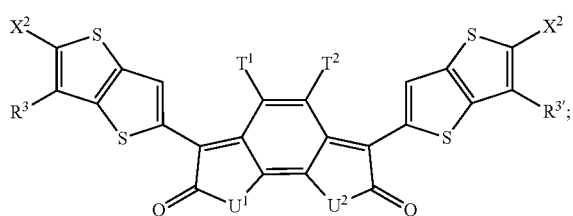
(Vh)

wherein $X^2$ is as defined above, $U^1$ is O, or $NR^1$;

$U^2$ is O, or $NR^2$;

$T^1$ and $T^2$ are independently of each other hydrogen, or $C_1$-$C_{25}$alkyl, especially hydrogen;

$R^1$ and $R^2$ may be the same or different and are selected from a $C_1$-$C_{38}$alkyl group, especially $C_8$-$C_{36}$alkyl group;

$R^3$ and $R^{3'}$ are independently of each other hydrogen or $C_1$-$C_{25}$alkyl; and $R^8$ and $R^{8'}$ are independently of each other hydrogen or $C_1$-$C_{25}$alkyl, especially $C_1$-$C_{25}$alkyl.

Among the compounds of formula V the following compounds are preferred:

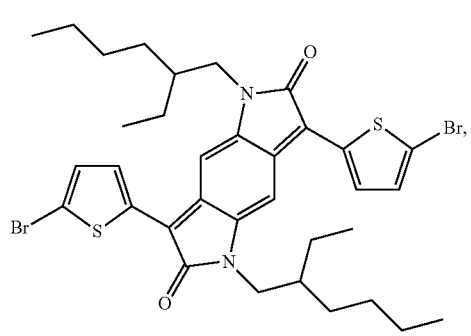
(I-1)

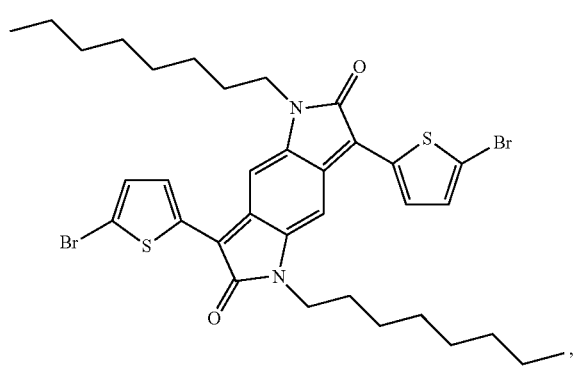
(I-2)

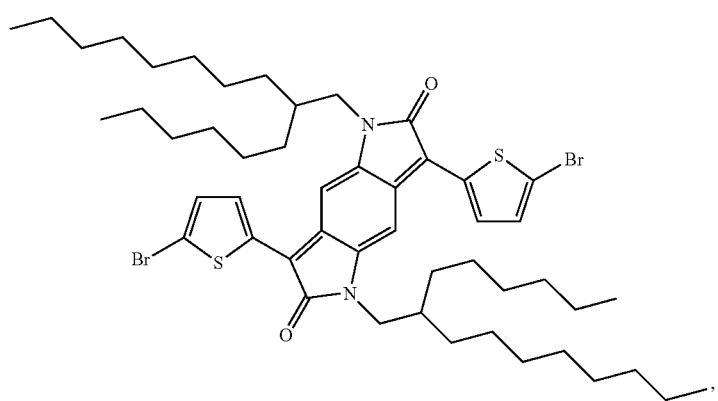
(I-3)

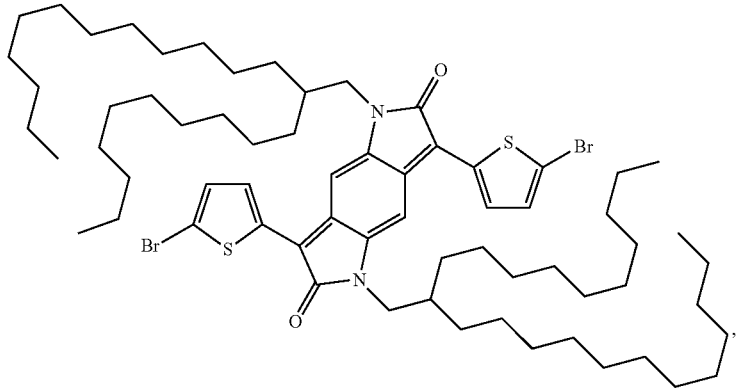
(I-4)
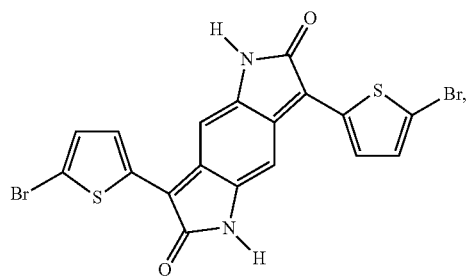
(I-5)
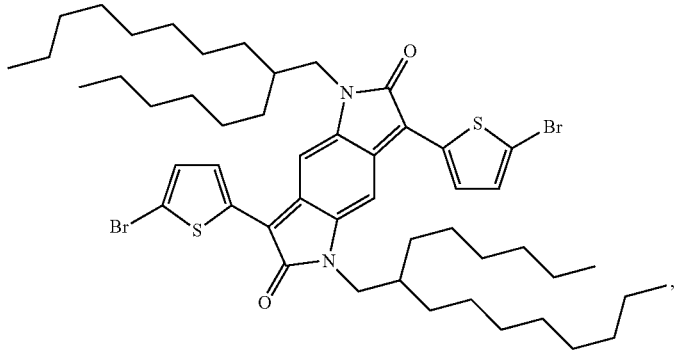
(I-6)
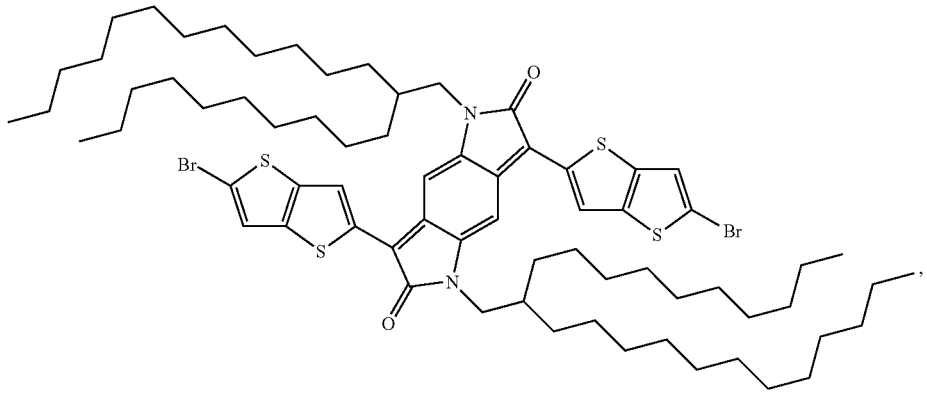
(I-7)

-continued
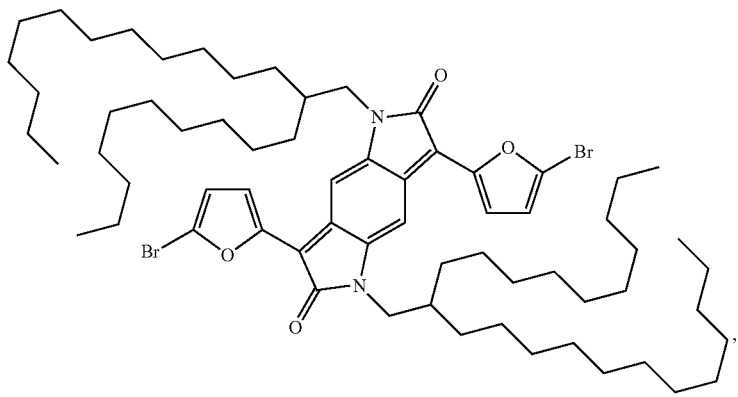
(I-8)
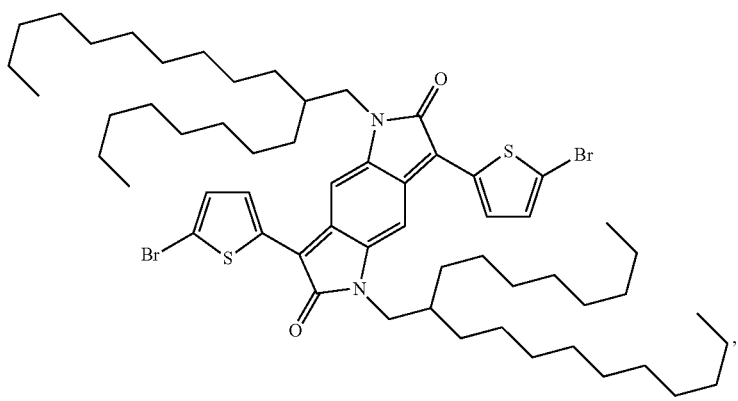
(I-9)
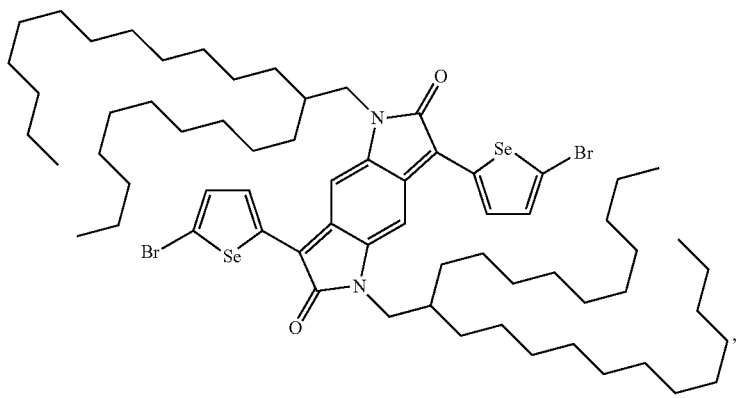
(I-10)
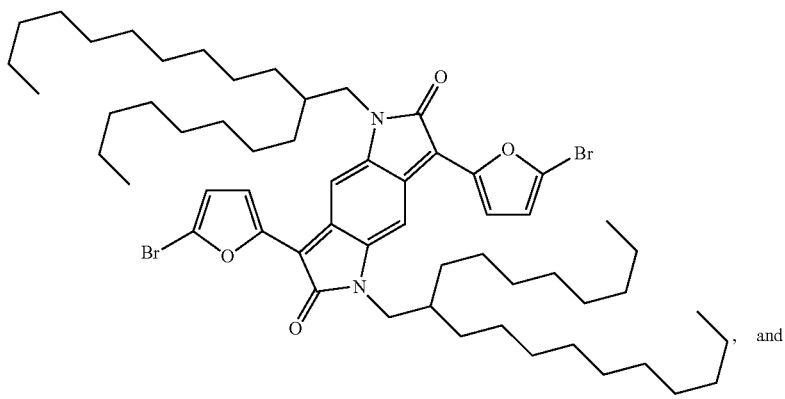
(I-11)
and -continued (I-12)

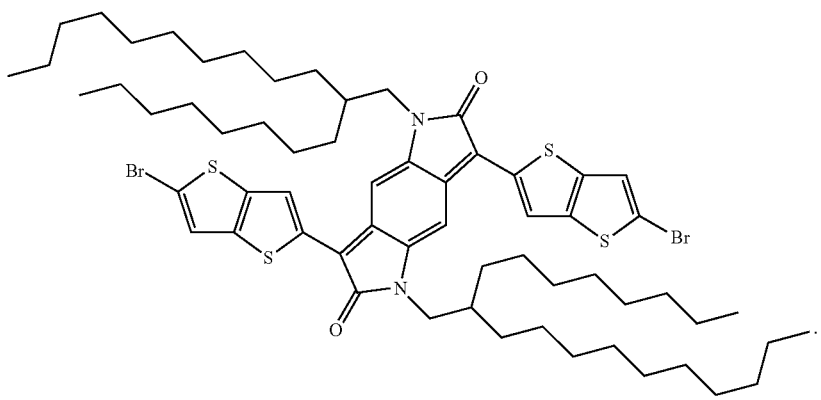

The polymers, wherein R¹ and/or R² are hydrogen can be obtained by using a protecting group which can be removed after polymerization. Reference is made, for example, to EP-A-0648770, EP-A-0648817, EP-A-0742255, EP-A-0761772, WO98/32802, WO98/45757, WO98/58027, WO99/01511, WO00/17275, WO00/39221, WO00/63297 and EP-A-1086984, which describe the basic procedural method. Conversion of the pigment precursor into its pigmentary form is carried out by means of fragmentation under known conditions, for example thermally, optionally in the presence of an additional catalyst, for example the catalysts described in WO00/36210.

An example of such a protecting group is group of formula

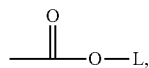

wherein L is any desired group suitable for imparting solubility.

L is preferably a group of formula

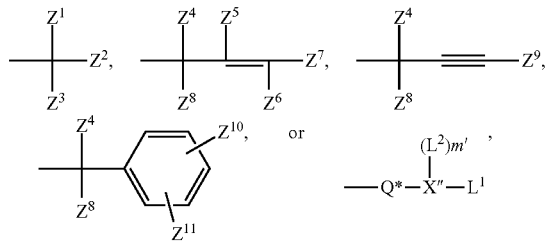

wherein $Z^1$, $Z^2$ and $Z^3$ are independently of each other $C_1$-$C_6$alkyl, $Z^4$ and $Z^8$ are independently of each other $C_1$-$C_6$alkyl, $C_1$-$C_6$alkyl interrupted by oxygen, sulfur or $N(Z^{12})_2$, or unsubstituted or $C_1$-$C_6$alkyl-, $C_1$-$C_6$alkoxy-, halo-, cyano- or nitro-substituted phenyl or biphenyl, $Z^6$, $Z^6$ and $Z^7$ are independently of each other hydrogen or $C_1$-$C_6$alkyl, $Z^9$ is hydrogen, $C_1$-$C_8$alkyl or a group of formula

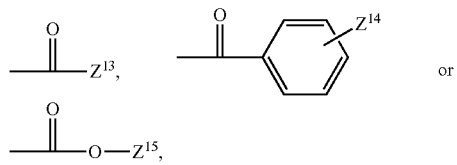

$Z^{10}$ and $Z^{11}$ are each independently of the other hydrogen, $C_1$-$C_6$alkyl, $C_1$-$C_6$alkoxy, halogen, cyano, nitro, $N(Z^{12})_2$, or unsubstituted or halo-, cyano-, nitro-, $C_1$-$C_6$alkyl- or $C_1$-$C_6$alkoxy-substituted phenyl, $Z^{12}$ and $Z^{13}$ are $C_1$-$C_6$alkyl, $Z^{14}$ is hydrogen or $C_1$-$C_6$alkyl, and $Z^{15}$ is hydrogen, $C_1$-$C_6$alkyl, or unsubstituted or $C_1$-$C_6$alkyl-substituted phenyl, Q* is p,q-$C_2$-$C_6$alkylene unsubstituted or mono- or poly-substituted by $C_1$-$C_6$alkoxy, $C_1$-$C_6$alkylthio or $C_2$-$C_{12}$dialkylamino, wherein p and q are different position numbers, X" is a hetero atom selected from the group consisting of nitrogen, oxygen and sulfur, m' being the number 0 when X" is oxygen or sulfur and m being the number 1 when X" is nitrogen, and $L^1$ and $L^2$ are independently of each other unsubstituted or mono- or poly-$C_1$-$C_{12}$alkoxy-, —$C_1$-$C_{12}$alkylthio-, —$C_2$-$C_{24}$dialkylamino-, —$C_6$-$C_{12}$aryloxy-, —$C_6$-$C_{12}$arylthio-, —$C_7$-$C_{24}$alkylarylamino- or —$C_{12}$-$C_{24}$diarylamino-substituted $C_1$-$C_6$alkyl or [-(p',q'-$C_2$-$C_6$alkylene)-Z—]$_{n'}$—$C_1$-$C_6$alkyl, n' being a number from 1 to 1000, p' and q' being different position numbers, each Z independently of any others being a hetero atom oxygen, sulfur or $C_1$-$C_{12}$alkyl-substituted nitrogen, and it being possible for $C_2$-$C_6$alkylene in the repeating [—$C_2$-$C_6$alkylene-Z—] units to be the same or different, and $L_1$ and $L_2$ may be saturated or unsaturated from one to ten times, may be uninterrupted or interrupted at any location by from 1 to 10 groups selected from the group consisting of —(C═O)— and —$C_6H_4$—, and may carry no further substituents or from 1 to 10 further substituents selected from the group consisting of halogen, cyano and nitro. Most preferred L is a group of formula

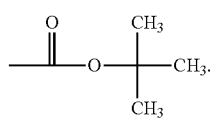

The synthesis of the compounds of formula H-A-H can be done in analogy to the methods described in C. Greenhalgh et al., Dyes and Pigments 1 (1980) 103-120 and G Hallas et al. Dyes and Pigments 48 (2001) 121-132.

In the context of the present invention, the terms halogen, $C_1$-$C_{25}$alkyl ($C_1$-$C_{18}$alkyl), $C_2$-$C_{25}$alkenyl ($C_2$-$C_{18}$alkenyl), $C_{2-25}$ alkynyl ($C_{2-18}$ alkynyl), aliphatic groups, aliphatic hydrocarbon groups, alkylene, alkenylene, cycloaliphatic hydrocarbon groups, cycloalkyl, cycloalkenyl groups, $C_1$-$C_{25}$alkoxy ($C_1$-$C_{18}$alkoxy), $C_1$-$C_{18}$perfluoroalkyl, carbamoyl groups, $C_6$-$C_{24}$aryl ($C_6$-$C_{18}$aryl), $C_7$-$C_{25}$aralkyl and heteroaryl are each defined as follows unless stated otherwise:

Halogen is fluorine, chlorine, bromine and iodine.

$C_1$-$C_{25}$alkyl ($C_1$-$C_{18}$alkyl) is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, octadecyl, eicosyl, heneicosyl, docosyl, tetracosyl or pentacosyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethyl-propyl, n-hexyl, n-heptyl, n-octyl, 1,1,3,3-tetramethylbutyl and 2-ethylhexyl. $C_1$-$C_4$alkyl is typically methyl, ethyl, n-propyl, isopropyl, n-butyl, sec.-butyl, isobutyl, tert.-butyl.

$C_2$-$C_{25}$alkenyl ($C_2$-$C_{18}$alkenyl) groups are straight-chain or branched alkenyl groups, such as e.g. vinyl, allyl, methallyl, isopropenyl, 2-butenyl, 3-butenyl, isobutenyl, n-penta-2,4-dienyl, 3-methyl-but-2-enyl, n-oct-2-enyl, n-dodec-2-enyl, isododecenyl, n-dodec-2-enyl or n-octadec-4-enyl.

$C_{2-25}$ alkynyl ($C_{2-18}$ alkynyl) is straight-chain or branched and preferably $C_{2-8}$ alkynyl, which may be unsubstituted or substituted, such as, for example, ethynyl, 1-propyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl, or 1-tetracosyn-24-yl.

Aliphatic groups can, in contrast to aliphatic hydrocarbon groups, be substituted by any acyclic substituents, but are preferably unsubstituted. Preferred substituents are $C_1$-$C_8$alkoxy or $C_1$-$C_8$alkylthio groups as exemplified further below. The term "aliphatic group" comprises also alkyl groups wherein certain non-adjacent carbon atoms are replaced by oxygen, like —$CH_2$—O—$CH_2$—$CH_2$—O—$CH_3$. The latter group can be regarded as methyl substituted by —O—$CH_2$—$CH_2$—O—$CH_3$.

An aliphatic hydrocarbon group having up to 25 carbon atoms is a linear or branched alkyl, alkenyl or alkynyl (also spelled alkinyl) group having up to 25 carbon atoms as exemplified above.

Alkylene is bivalent alkyl, i.e. alkyl having two (instead of one) free valencies, e.g. trimethylene or tetramethylene.

Alkenylene is bivalent alkenyl, i.e. alkenyl having two (instead of one) free valencies, e.g. —$CH_2$—CH=CH—$CH_2$—.

Aliphatic groups can, in contrast to aliphatic hydrocarbon groups, be substituted by any acyclic substituents, but are preferably unsubstituted. Preferred substituents are $C_1$-$C_8$alkoxy or $C_1$-$C_8$alkylthio groups as exemplified further below. The term "aliphatic group" comprises also alkyl groups wherein certain non-adjacent carbon atoms are replaced by oxygen, like —$CH_2$—O—$CH_2$—$CH_2$—O—$CH_3$. The latter group can be regarded as methyl substituted by —O—$CH_2$—$CH_2$—O—$CH_3$.

A cycloaliphatic hydrocarbon group is a cycloalkyl or cycloalkenyl group which may be substituted by one or more aliphatic and/or cycloaliphatic hydrocarbon groups.

A cycloaliphatic-aliphatic group is an aliphatic group substituted by a cycloaliphatic group, wherein the terms "cycloaliphatic" and "aliphatic" have the meanings given herein and wherein the free valency extends from the aliphatic moiety. Hence, a cycloaliphatic-aliphatic group is for example a cycloalkyl-alkyl group.

A cycloalkyl-alkyl group is an alkyl group substituted by a cycloalkyl group, e.g. cyclohexyl-methyl.

A "cycloalkenyl group" means an unsaturated alicyclic hydrocarbon group containing one or more double bonds, such as cyclopentenyl, cyclopentadienyl, cyclohexenyl and the like, which may be unsubstituted or substituted by one or more aliphatic and/or cycloaliphatic hydrocarbon groups and/or condensed with phenyl groups.

For example, a cycloalkyl or cycloalkenyl group, in particular a cyclohexyl group, can be condensed one or two times with phenyl which can be substituted one to three times with $C_1$-$C_4$-alkyl. Examples of such condensed cyclohexyl groups are groups of the formulae:

(XXIa)

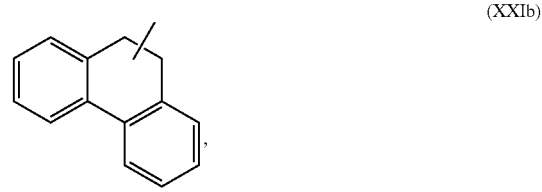

(XXIb)

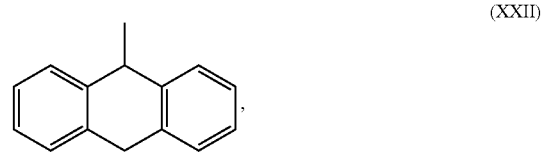

(XXII)

in particular

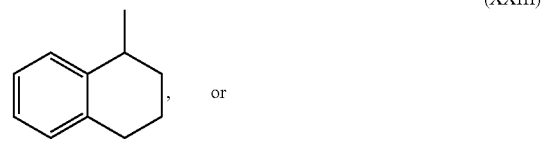

(XXIII)

or

(XXIV)

which can be substituted in the phenyl moieties one to three times with $C_1$-$C_4$-alkyl.

A bivalent group of the formula XII wherein $R^{28}$ and $R^{27}$ together represent alkylene or alkenylene which may be both bonded via oxygen and/or sulfur to the thienyl residue and which may both have up to 25 carbon atoms, is e.g. a group of the formula

(XXIX)

, or

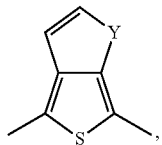

(XXX)

wherein A represents linear or branched alkylene having up to 25 carbon atoms, preferably ethylene or propylene which may be substituted by one or more alkyl groups, and Y represents oxygen or sulphur. For example, the bivalent group of the formula —Y-A-O— represents —O—CH$_2$—CH$_2$—O— or —O—CH$_2$—CH$_2$—CH$_2$—O—.

A group of the formula XI wherein two groups R$^{22}$ to R$^{26}$ which are in the neighborhood of each other, together represent alkylene or alkenylene having up to 8 carbon atoms, thereby forming a ring, is e.g. a group of the formula

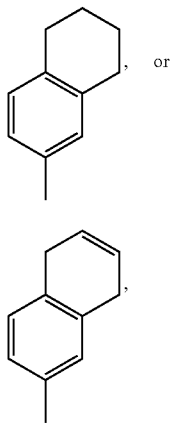

(XXXII)

or (XXXIII)

wherein in the group of the formula XXXII R$^{23}$ and R$^{24}$ together represent 1,4-butylene and in the group of the formula XXXIII R$^{23}$ and R$^{24}$ together represent 1,4-but-2-enylene.

C$_1$-C$_{25}$alkoxy groups (C$_1$-C$_{18}$alkoxy groups) are straight-chain or branched alkoxy groups, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy. Examples of C$_1$-C$_8$alkoxy are methoxy, ethoxy, n-propoxy, isopropoxy, n-butoxy, sec.-butoxy, isobutoxy, tert.-butoxy, n-pentoxy, 2-pentoxy, 3-pentoxy, 2,2-dimethylpropoxy, n-hexoxy, n-heptoxy, n-octoxy, 1,1,3,3-tetramethylbutoxy and 2-ethylhexoxy, preferably C$_1$-C$_4$alkoxy such as typically methoxy, ethoxy, n-propoxy, isopropoxy, n-butoxy, sec.-butoxy, isobutoxy, tert.-butoxy. The term "alkylthio group" means the same groups as the alkoxy groups, except that the oxygen atom of the ether linkage is replaced by a sulfur atom.

C$_1$-C$_{18}$perfluoroalkyl, especially C$_1$-C$_4$perfluoroalkyl, is a branched or unbranched radical such as for example —CF$_3$, —CF$_2$CF$_3$, —CF$_2$CF$_2$CF$_3$, —CF(CF$_3$)$_2$, —(CF$_2$)$_3$CF$_3$, and —C(CF$_3$)$_3$.

The term "carbamoyl group" is typically a C$_{1-18}$carbamoyl radical, preferably C$_{1-8}$carbamoyl radical, which may be unsubstituted or substituted, such as, for example, carbamoyl, methylcarbamoyl, ethylcarbamoyl, n-butylcarbamoyl, tert-butylcarbamoyl, dimethylcarbamoyloxy, morpholinocarbamoyl or pyrrolidinocarbamoyl.

A cycloalkyl group is typically C$_3$-C$_{12}$cycloalkyl, such as, for example, cyclopentyl, cyclohexyl, cycloheptyl, cyclooctyl, cyclononyl, cyclodecyl, cycloundecyl, cyclododecyl, preferably cyclopentyl, cyclohexyl, cycloheptyl, or cyclooctyl, which may be unsubstituted or substituted. The cycloalkyl group, in particular a cyclohexyl group, can be condensed one or two times by phenyl which can be substituted one to three times with C$_1$-C$_4$-alkyl, halogen and cyano. Examples of such condensed cyclohexyl groups are:

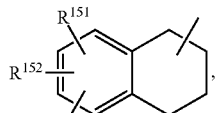

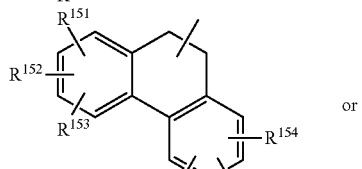

or

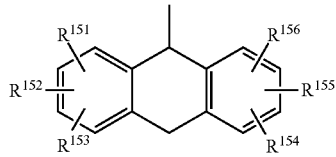

in particular

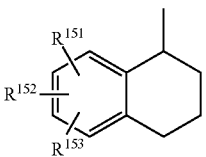 or 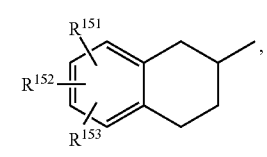

wherein R$^{151}$, R$^{152}$, R$^{153}$, R$^{154}$, R$^{155}$ and R$^{156}$ are independently of each other C$_1$-C$_8$-alkyl, C$_1$-C$_8$-alkoxy, halogen and cyano, in particular hydrogen.

C$_6$-C$_{24}$aryl (C$_6$-C$_{18}$aryl) is typically phenyl, indenyl, azulenyl, naphthyl, biphenyl, as-indacenyl, s-indacenyl, acenaphthylenyl, fluorenyl, phenanthryl, fluoranthenyl, triphenlenyl, chrysenyl, naphthacen, picenyl, perylenyl, pentaphenyl, hexacenyl, pyrenyl, or anthracenyl, preferably phenyl, 1-naphthyl, 2-naphthyl, 4-biphenyl, 9-phenanthryl, 2- or 9-fluorenyl, 3- or 4-biphenyl, which may be unsubstituted or substituted. Examples of C$_6$-C$_{12}$aryl are phenyl, 1-naphthyl, 2-naphthyl, 3- or 4-biphenyl, 2- or 9-fluorenyl or 9-phenanthryl, which may be unsubstituted or substituted.

C$_7$-C$_{25}$aralkyl is typically benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl, ω-phenyl-octadecyl, ω-phenyl-eicosyl or ω-phenyl-docosyl, preferably C$_7$-C$_{18}$aralkyl such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl or ω-phenyl-octadecyl, and particularly preferred C$_7$-C$_{12}$aralkyl such as benzyl, 2-benzyl-2-propyl, β-phenyl-ethyl, α,α-dimethylbenzyl, ω-phenyl-butyl, or ω,ω-dimethyl-ω-phenyl-butyl, in which both the aliphatic hydrocarbon group and aromatic hydrocarbon group may be unsubstituted or substituted. Preferred examples are benzyl, 2-phenylethyl, 3-phenylpropyl, naphthylethyl, naphthylmethyl, and cumyl.

Heteroaryl is typically C$_2$-C$_{20}$heteroaryl, i.e. a ring with five to seven ring atoms or a condensed ring system, wherein nitrogen, oxygen or sulfur are the possible hetero atoms, and is typically an unsaturated heterocyclic group with five to 30 atoms having at least six conjugated ic-electrons such as thienyl, benzo[b]thienyl, dibenzo[b,d]thienyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, pyrimidinyl, phenanthrolinyl, phenazinyl, isothiazolyl, phenothiazinyl, isoxazolyl, thienothienyl, furazanyl or phenoxazinyl, which can be unsubstituted or substituted.

Possible substituents of the above-mentioned groups are $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, a carbamoyl group, a nitro group or a silyl group, especially $C_1$-$C_8$alkyl, $C_1$-$C_8$alkoxy, $C_1$-$C_8$alkylthio, halogen, halo-$C_1$-$C_8$alkyl, or a cyano group.

$C_1$-$C_{10}$alkyl interrupted by one or more O is, for example, $(CH_2CH_2O)_{1-9}$—$R^x$, where $R^x$ is H or $C_1$-$C_{10}$alkyl, $CH_2$—$CH(OR^{y'})$—$CH_2$—O—$R^y$, where $R^y$ is $C_1$-$C_{10}$alkyl, and $R^{y'}$ embraces the same definitions as $R^y$ or is H.

If a substituent, such as, for example $R^3$, occurs more than one time in a group, it can be different in each occurrence.

A mixture containing a polymer of the present invention results in a semi-conducting layer comprising a polymer of the present invention (typically 5% to 99.9999% by weight, especially 20 to 85% by weight) and at least another material. The other material can be, but is not restricted to a fraction of the same polymer of the present invention with different molecular weight, another polymer of the present invention, a semi-conducting polymer, organic small molecules, carbon nanotubes, a fullerene derivative, inorganic particles (quantum dots, quantum rods, quantum tripods, $TiO_2$, ZnO etc.), conductive particles (Au, Ag etc.), insulator materials like the ones described for the gate dielectric (PET, PS etc.).

The polymers of the present invention can be blended with compounds of formula III according to the present invention, or small molecules described, for example, in WO2009/047104, WO2010108873 (PCT/EP2010/053655), WO09/047104, U.S. Pat. No. 6,690,029, WO2007082584, and WO2008107089:

WO2007082584:

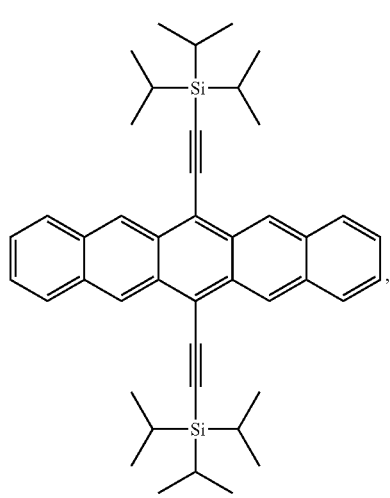
(I1)

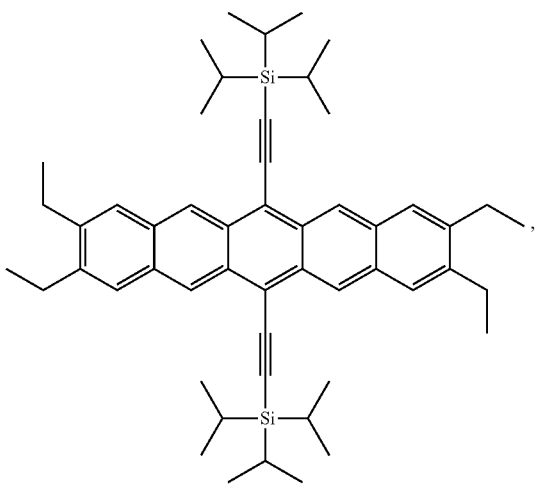
(I2)

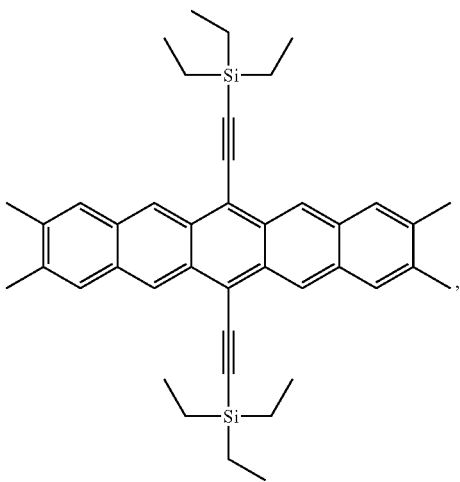
(I3)

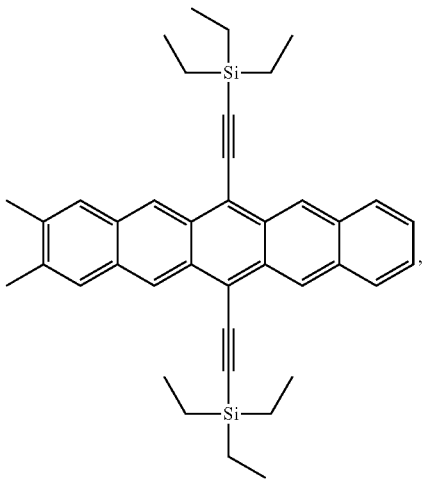
(I4)

(I5)
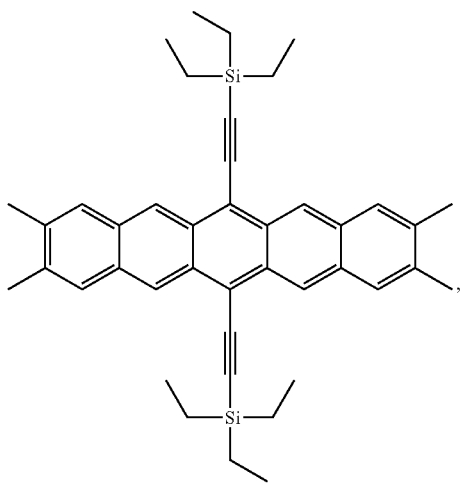

(I6)
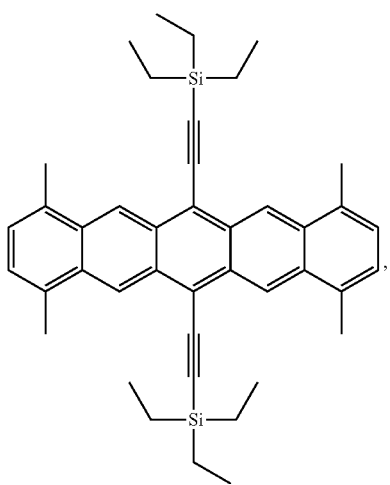

(I7)
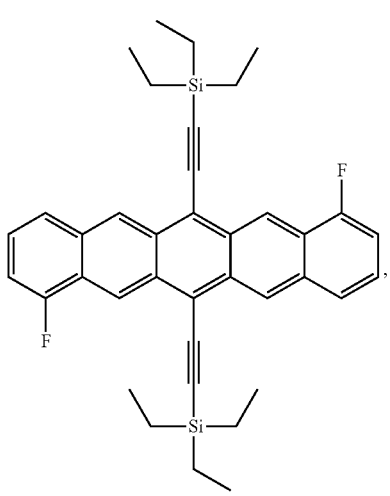

(I8)
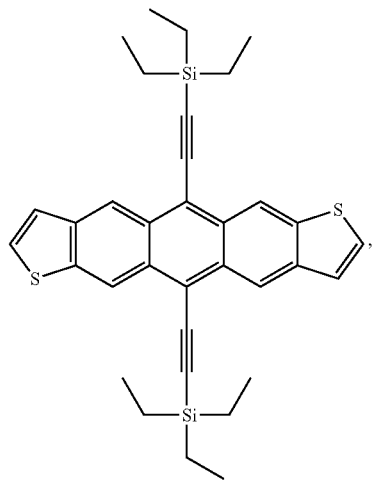

(I9)
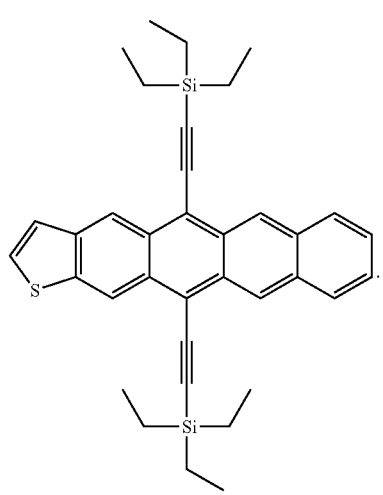

WO2008107089:

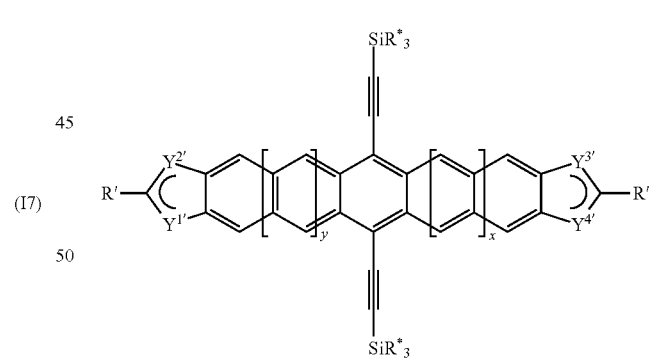

wherein one of $Y^{1'}$ and $Y^{2'}$ denotes —CH= or =CH— and the other denotes —X*—,
one of $Y^{3'}$ and $Y^{4'}$ denotes —CH= or =CH— and the other denotes —X*—,
X* is —O—, —S—, —Se— or —NR'''—,
R* is cyclic, straight-chain or branched alkyl or alkoxy having 1 to 20 C-atoms, or aryl having 2-30 C-atoms, all of which are optionally fluorinated or perfluorinated,
R' is H, F, Cl, Br, I, CN, straight-chain or branched alkyl or alkoxy having 1 to 20 C-atoms and optionally being fluorinated or perfluorinated, optionally fluorinated or perfluorinated aryl having 6 to 30 C-atoms, or $CO_2R''$, with R'' being H, optionally fluorinated alkyl having 1 to 20 C-atoms, or optionally fluorinated aryl having 2 to 30 C-atoms, R''' is H or cyclic, straight-chain or branched alkyl with 1 to 10 C-atoms, y is 0, or 1, x is 0, or 1

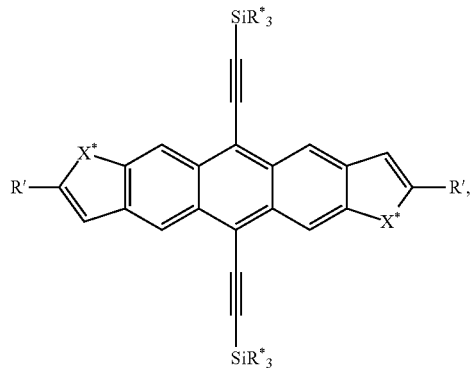
A1

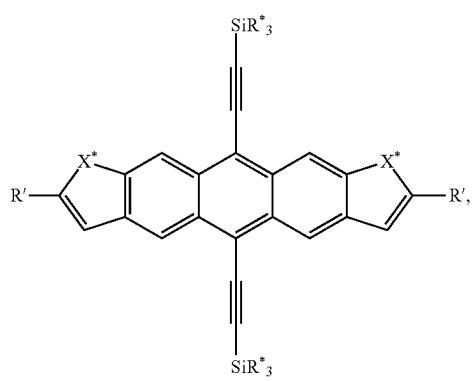
A2

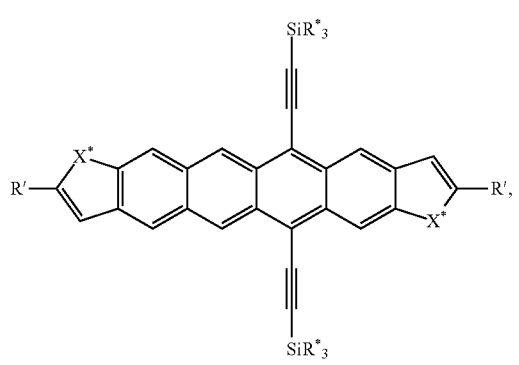
B1

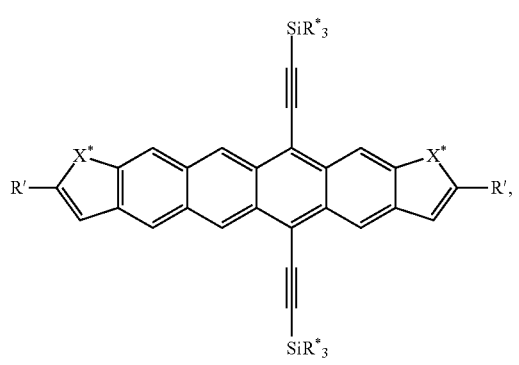
B2

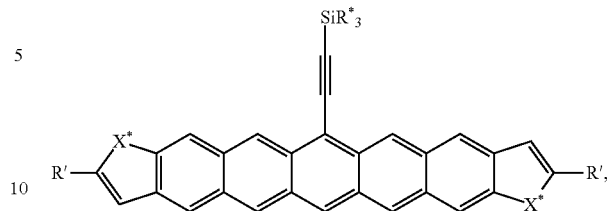
C1

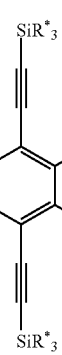
C2

The polymer can contain a small molecule, or a mixture of two, or more small molecule compounds.

Accordingly, the present invention also relates to an organic semiconductor material, layer or component, comprising a polymer according to the present invention.

The polymers of the invention can be used as the semiconductor layer in semiconductor devices. Accordingly, the present invention also relates to semiconductor devices, comprising a polymer of the present invention, or an organic semiconductor material, layer or component. The semiconductor device is especially an organic photovoltaic (PV) device (solar cell), a photodiode, or an organic field effect transistor.

The polymers of the invention can be used alone or in combination as the organic semiconductor layer of the semiconductor device. The layer can be provided by any useful means, such as, for example, vapor deposition (for materials with relatively low molecular weight) and printing techniques. The compounds of the invention may be sufficiently soluble in organic solvents and can be solution deposited and patterned (for example, by spin coating, dip coating, slot die coating, ink jet printing, gravure printing, flexo printing, offset printing, screen printing, microcontact (wave)-printing, drop or zone casting, or other known techniques).

The polymers of the invention can be used in integrated circuits comprising a plurality of OTFTs, as well as in various electronic articles. Such articles include, for example, radio-frequency identification (RFID) tags, backplanes for flexible displays (for use in, for example, personal computers, cell phones, or handheld devices), smart cards, memory devices, sensors (e.g. light-, image-, bio-, chemo-, mechanical- or temperature sensors), especially photodiodes, or security devices and the like.

A further aspect of the present invention is an organic semiconductor material, layer or component comprising one or more polymers, or compounds of the present invention. A further aspect is the use of the polymers or materials of the present invention in an organic photovoltaic (PV) device (solar cell), a photodiode, or an organic field effect transistor (OFET). A further aspect is an organic photovoltaic (PV) device (solar cell), a photodiode, or an organic field effect transistor (OFET) comprising a polymer or material of the present invention.

The polymers of the present invention are typically used as organic semiconductors in form of thin organic layers or films, preferably less than 30 microns thick. Typically the semiconducting layer of the present invention is at most 1 micron (=1 µm) thick, although it may be thicker if required. For various electronic device applications, the thickness may also be less than about 1 micron thick. For example, for use in an OFET the layer thickness may typically be 100 nm or less. The exact thickness of the layer will depend, for example, upon the requirements of the electronic device in which the layer is used.

For example, the active semiconductor channel between the drain and source in an OFET may comprise a layer of the present invention.

An OFET device according to the present invention preferably comprises:
a source electrode,
a drain electrode,
a gate electrode,
a semiconducting layer,
one or more gate insulator layers, and
optionally a substrate, wherein the semiconductor layer comprises one or more polymers of the present invention.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

Preferably the OFET comprises an insulator having a first side and a second side, a gate electrode located on the first side of the insulator, a layer comprising a polymer of the present invention located on the second side of the insulator, and a drain electrode and a source electrode located on the polymer layer.

The OFET device can be a top gate device or a bottom gate device.

Suitable structures and manufacturing methods of an OFET device are known to the person skilled in the art and are described in the literature, for example in WO03/052841.

The gate insulator layer may comprise for example a fluoropolymer, like e.g. the commercially available Cytop 809M®, or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC25® (available from Acros, catalogue number 12380). Other suitable fluoropolymers and fluorosolvents are known in prior art, like for example the perfluoropolymers Teflon AF® 1600 or 2400 (from DuPont), or Fluoro-pel® (from Cytonix) or the perfluorosolvent FC 43® (Acros, No. 12377).

The semiconducting layer comprising a polymer of the present invention may additionally comprise at least another material. The other material can be, but is not restricted to another polymer of the present invention, a semi-conducting polymer, a polymeric binder, organic small molecules different from a polymer of the present invention, carbon nanotubes, a fullerene derivative, inorganic particles (quantum dots, quantum rods, quantum tripods, $TiO_2$, ZnO etc.), conductive particles (Au, Ag etc.), and insulator materials like the ones described for the gate dielectric (PET, PS etc.). As stated above, the semiconductive layer can also be composed of a mixture of one or more polymers of the present invention and a polymeric binder. The ratio of the polymers of the present invention to the polymeric binder can vary from 5 to 95 percent. Preferably, the polymeric binder is a semicristalline polymer such as polystyrene (PS), high-density polyethylene (HDPE), polypropylene (PP) and polymethylmethacrylate (PMMA). With this technique, a degradation of the electrical performance can be avoided (cf. WO2008/001123A1).

The polymers of the present invention are advantageously used in organic photovoltaic (PV) devices (solar cells). Accordingly, the invention provides PV devices comprising a polymer according to the present invention. A device of this construction will also have rectifying properties so may also be termed a photodiode. Photoresponsive devices have application as solar cells which generate electricity from light and as photodetectors which measure or detect light.

The PV device comprise in this order:
(a) a cathode (electrode),
(b) optionally a transition layer, such as an alkali halogenide, especially lithium fluoride,
(c) a photoactive layer,
(d) optionally a smoothing layer,
(e) an anode (electrode),
(f) a substrate.

The photoactive layer comprises the polymers of the present invention. Preferably, the photoactive layer is made of a conjugated polymer of the present invention, as an electron donor and an acceptor material, like a fullerene, particularly a functionalized fullerene PCBM, as an electron acceptor. As stated above, the photoactive layer may also contain a polymeric binder. The ratio of the polymers of formula I to the polymeric binder can vary from 5 to 95 percent. Preferably, the polymeric binder is a semicristalline polymer such as polystyrene (PS), high-density polyethylene (HDPE), polypropylene (PP) and polymethylmethacrylate (PMMA).

For heterojunction solar cells the active layer comprises preferably a mixture of a polymer of the present invention and a fullerene, such as [60]PCBM (=6,6-phenyl-$C_{61}$-butyric acid methyl ester), or [70]PCBM, in a weight ratio of 1:1 to 1:3. The fullerenes useful in this invention may have a broad range of sizes (number of carbon atoms per molecule). The term fullerene as used herein includes various cage-like molecules of pure carbon, including Buckminsterfullerene ($C_{60}$) and the related "spherical" fullerenes as well as carbon nanotubes. Fullerenes may be selected from those known in the art ranging from, for example, $C_{20}$-$C_{1000}$. Preferably, the fullerene is selected from the range of $C_{60}$ to $C_{96}$. Most preferably the fullerene is $C_{60}$ or $C_{70}$, such as [60]PCBM, or [70]PCBM. It is also permissible to utilize chemically modified fullerenes, provided that the modified fullerene retains acceptor-type and electron mobility characteristics. The acceptor material can also be a material selected from the group consisting of any semi-conducting polymer, such as, for example, a polymer of the present invention, provided that the polymers retain acceptor-type and electron mobility characteristics, organic small molecules, carbon nanotubes, inorganic particles (quantum dots, quantum rods, quantum tripods, $TiO_2$, ZnO etc.).

The photoactive layer is made of a polymer of the present invention as an electron donor and a fullerene, particularly functionalized fullerene PCBM, as an electron acceptor. These two components are mixed with a solvent and applied as a solution onto the smoothing layer by, for example, the spin-coating method, the drop casting method, the Langmuir-Blodgett ("LB") method, the ink jet printing method and the dripping method. A squeegee or printing method could also be used to coat larger surfaces with such a photoactive layer.

Instead of toluene, which is typical, a dispersion agent such as chlorobenzene is preferably used as a solvent. Among these methods, the vacuum deposition method, the spin-coating method, the ink jet printing method and the casting method are particularly preferred in view of ease of operation and cost.

In the case of forming the layer by using the spin-coating method, the casting method and ink jet printing method, the coating can be carried out using a solution and/or dispersion prepared by dissolving, or dispersing the composition in a concentration of from 0.01 to 90% by weight in an appropriate organic solvent such as benzene, toluene, xylene, tetrahydrofurane, methyltetrahydrofurane, N,N-dimethylformamide, acetone, acetonitrile, anisole, dichloromethane, dimethylsulfoxide, chlorobenzene, 1,2-dichlorobenzene and mixtures thereof.

The photovoltaic (PV) device can also consist of multiple junction solar cells that are processed on top of each other in order to absorb more of the solar spectrum. Such structures are, for example, described in App. Phys. Let. 90, 143512 (2007), Adv. Funct. Mater. 16, 1897-1903 (2006) and WO2004/112161.

A so called 'tandem solar cell' comprise in this order:

(a) a cathode (electrode), (b) optionally a transition layer, such as an alkali halogenide, especially lithium fluoride, (c) a photoactive layer, (d) optionally a smoothing layer, (e) a middle electrode (such as Au, Al, ZnO, $TiO_2$ etc.)

(f) optionally an extra electrode to match the energy level, (g) optionally a transition layer, such as an alkali halogenide, especially lithium fluoride, (h) a photoactive layer, (i) optionally a smoothing layer, (j) an anode (electrode), (k) a substrate.

The PV device can also be processed on a fiber as described, for example, in US20070079867 and US 20060013549.

Due to their excellent self-organising properties the materials or films comprising the polymers of the present invention can also be used alone or together with other materials in or as alignment layers in LCD or OLED devices, as described for example in US2003/0021913.

It is another object of the present invention to provide compounds, which show high efficiency of energy conversion, excellent field-effect mobility, good on/off current ratios and/or excellent stability, when used in organic field effect transistors, organic photovoltaics (solar cells) and photodiodes.

In a further embodiment the present invention relates to compounds of the formula $A^1$-Y-$[A^3$-$Y^{15}]_o$-$[A^4$-$Y^{16}]_p$-$[A^5$-$Y^{17}]_q$-$A^2$ (III), wherein Y, $Y^{15}$, $Y^{16}$ and $Y^{17}$ are independently of each other a group of formula

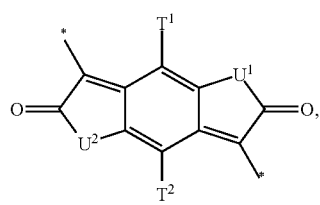

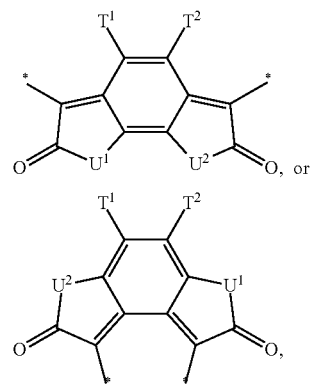

o is 0, or 1, p is 0, or 1, q is 0, or 1;

$A^1$ and $A^2$ are independently of each other a group of formula $[Ar^1]_a$-$[Ar^2]_b$-$[Ar^3]_c$-$R^{10}$, $A^3$, $A^4$ and $A^5$ are independently of each other a group of formula *-$[Ar^4]_k$-$[Ar^5]_l$-$[Ar^6]_r$-$[Ar^7]_z$-*, k is 1, 2, or 3; l is 0, 1, 2, or 3; r is 0, 1, 2, or 3; z is 0, 1, 2, or 3;

$R^{10}$ is hydrogen, halogen, cyano, $C_1$-$C_{25}$alkyl, $C_1$-$C_{25}$alkyl which is substituted one or more times by E and/or interrupted one or more times by D,

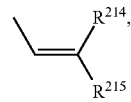

COO—$C_1$-$C_{18}$alkyl, $C_4$-$C_{18}$cycloalkyl group, $C_4$-$C_{18}$cycloalkyl group, which is substituted by G, $C_2$-$C_{18}$alkenyl, $C_2$-$C_{18}$alkynyl, $C_1$-$C_{18}$thioalkoxy, $C_1$-$C_{18}$alkoxy, $C_1$-$C_{18}$alkoxy which is substituted by E and/or interrupted by D, $C_7$-$C_{25}$aralkyl, $C_7$-$C_{25}$aralkyl, which is substituted by G, or a group of formulae IVa to IVm, (IVa)

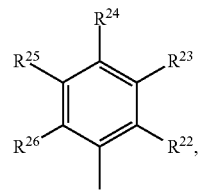

(IVb)

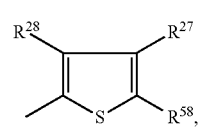

(IVc)

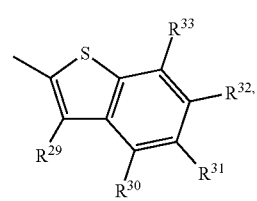

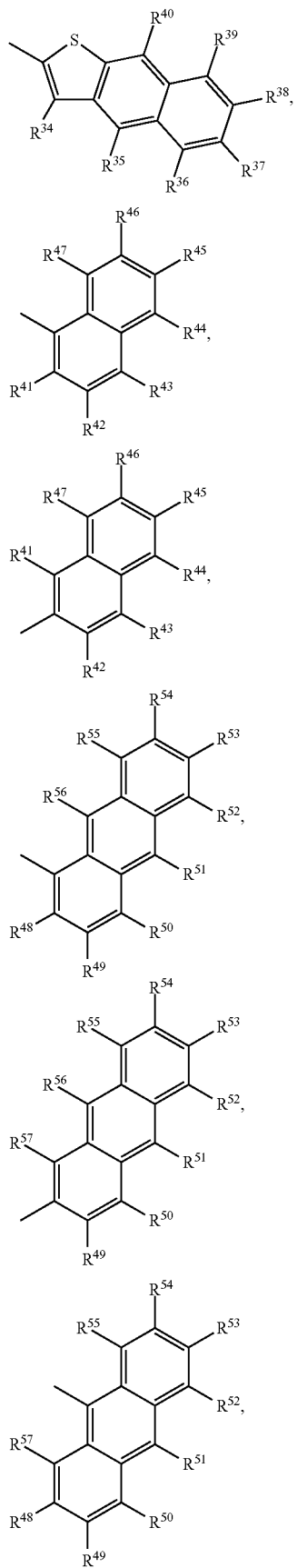
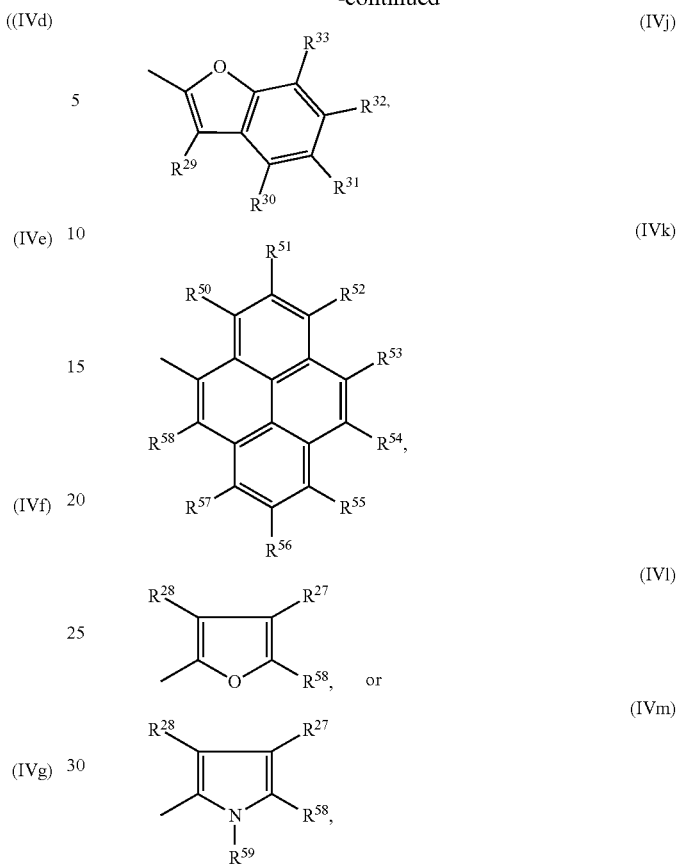

wherein $R^{22}$ to $R^{26}$ and $R^{29}$ to $R^{58}$ represent independently of each other H, halogen, cyano, $C_1$-$C_{25}$alkyl, $C_1$-$C_{25}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, a $C_4$-$C_{18}$cycloalkyl group, a $C_4$-$C_{18}$cycloalkyl group, which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, $R^{27}$ and $R^{28}$ are independently of each other hydrogen, $C_1$-$C_{25}$alkyl, halogen, cyano or $C_7$-$C_{25}$aralkyl, or $R^{27}$ and $R^{28}$ together represent alkylene or alkenylene which may be both bonded via oxygen and/or sulfur to the thienyl residue and which may both have up to 25 carbon atoms, $R^{59}$ is hydrogen, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, especially $C_3$-$C_{25}$alkyl, which may optionally be interrupted by one or more oxygen or sulphur atoms; or $C_7$-$C_{25}$arylalkyl, D is —CO—, —COO—, —S—, —O—, or —$NR^{112}$—,
E is $C_1$-$C_8$thioalkoxy, $C_1$-$C_8$alkoxy, CN, —$NR^{112}R^{113}$, —$CONR^{112}R^{113}$, or halogen,
G is E, or $C_1$-$C_{18}$alkyl, and
$R^{112}$ and $R^{113}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—;

$R^{214}$ and $R^{215}$ are independently of each other hydrogen, $C_1$-$C_{18}$alkyl, $C_6$-$C_{24}$aryl, $C_2$-$C_{20}$heteroaryl, —CN or $COOR^{216}$;

$R^{216}$ is $C_1$-$C_{25}$alkyl, $C_1$-$C_{25}$haloalkyl, $C_7$-$C_{25}$arylalkyl, $C_6$-$C_{24}$aryl or $C_2$-$C_{20}$heteroaryl;

Ar⁴, Ar⁵, Ar⁶ and Ar⁷ have independently of each other the meaning of Ar¹, or are independently of each other a group of formula XVa, XVb, XVc, XVd, XVe, XVf, or XVg, XVI, or XVII (as defined in claim 1), and a, b, c, Ar¹, Ar², Ar³, T¹, T², U¹ and U² are as defined above.

U¹ and U² are preferably O, more preferably NR¹. T¹ and T² are preferably hydrogen.

Among the compounds of the formula III compounds of formula

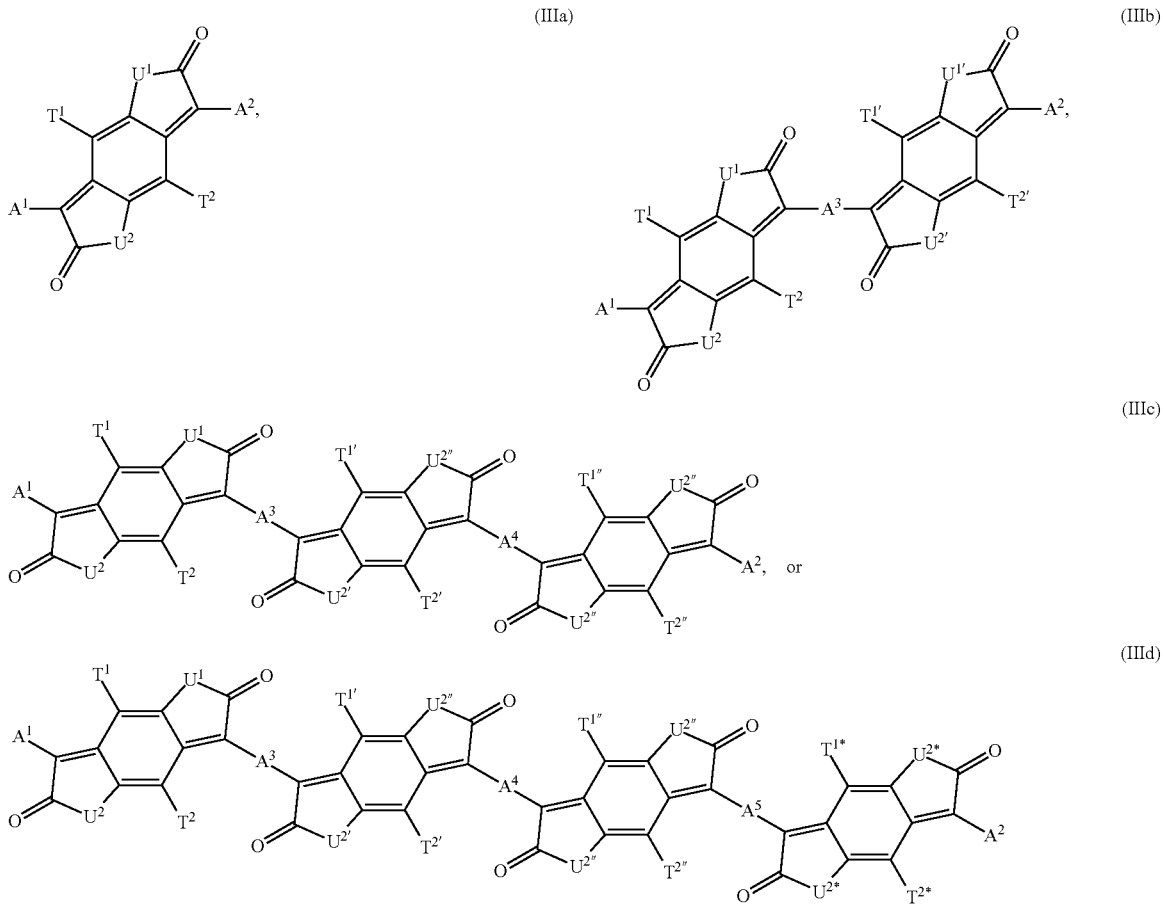

Y is preferably a group of formula

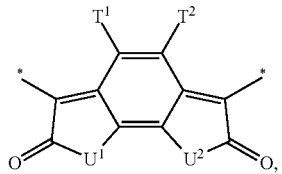

more preferably a group of formula

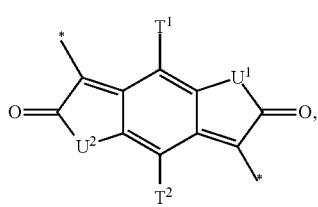

are more preferred, wherein
A¹, A², A³, A⁴, A⁵, T¹, T², U¹ and U² are as defined above,
T¹', T²', T¹'', T²'', T¹''' and T²''' independently of each other have the meaning of T¹, and
U¹', U²', U¹'', U²'', U¹''' and U²''' independently of each other have the meaning of U¹.

More preferred are compounds of the formula IIIa, IIIb and IIIc, even more preferred are compounds of the formula IIIa and IIIb, and most preferred are compounds of the formula IIIa.

Compounds of the formula R¹⁰—[Ar¹]ₐ—Y—[Ar¹']ₐ'—R¹⁰' (III') are more preferred, wherein Y is a group of formula

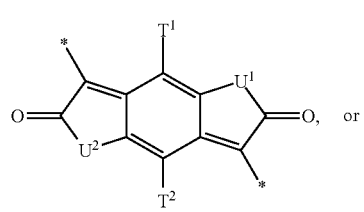

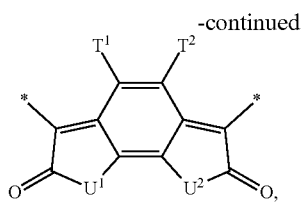

especially

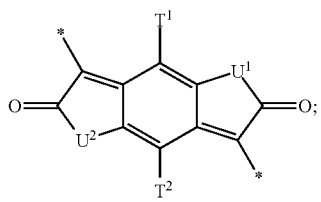

$U^1$ is O, S, or $NR^1$;
$U^2$ is O, S, or $NR^2$;
a is 1, 2, or 3, a' is 1, 2, or 3; wherein $R^{10'}$ has the meaning of $R^{10}$, $R^{10}$, $T^1$, $T^2$, $R^1$, $R^2$, $Ar^1$ and $Ar^{1'}$ are as defined above.
For $R^{10'}$ the same preferences apply as for $R^{10}$. For $T^1$, $T^2$, $R^1$, $R^2$, $Ar^1$ and $Ar^{1'}$ the same preferences apply as in case of the polymers according to the present invention.

In said embodiment Y is preferably a group of formula

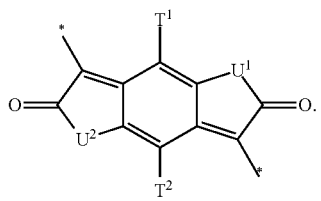

$U^1$ and $U^2$ may be different, but are preferably the same. $U^1$ is preferably O or $NR^1$; more preferably $NR^1$. $U^2$ is preferably O or $NR^1$; more preferably $NR^1$.

$T^1$ and $T^2$ may be different, but are preferably the same. $T^1$ and $T^2$ are preferably independently of each other hydrogen, halogen, cyano, —$COOR^{103}$, —$OCOR^{103}$, —$OR^{103}$, —$SR^{103}$, $C_1$-$C_{25}$alkyl, which may be substituted by E and/or interrupted by D; more preferably hydrogen, halogen, cyano, —$OR^{103}$, or $C_1$-$C_{25}$alkyl; most preferred hydrogen, or $C_1$-$C_{25}$alkyl, especially hydrogen.

$R^1$ and $R^2$ may be different, but are preferably the same. More preferably $R^1$ and $R^2$ are selected from hydrogen, $C_1$-$C_{50}$alkyl, $C_1$-$C_{50}$haloalkyl, $C_7$-$C_{25}$arylalkyl, $C_2$-$C_{50}$alkenyl, $C_2$-$C_{50}$haloalkenyl, allyl, $C_5$-$C_{12}$cycloalkyl, phenyl, or naphthyl which can optionally be substituted one or more times with $C_1$-$C_{12}$alkyl or $C_1$-$C_{12}$alkoxy, —CO—$C_5$-$C_{12}$cycloalkyl and —COO—$C_1$-$C_{18}$alkyl. More preferably $R^1$ and $R^2$ are $C_1$-$C_{50}$alkyl group. Most preferred $R^1$ and $R^2$ are a $C_1$-$C_{38}$alkyl group.

a and a' may be different, but are preferably the same. a is 1, 2, or 3, a' is 1, 2, or 3.

$Ar^1$ and $Ar^{1'}$ may be different, but are preferably the same. Preferably, $Ar^1$ and $Ar^{1'}$ are independently of each a group of formula XIa, XIb, XIc, XIe, XIf, XIl, XIp, XIr, XIs, XIx, XIIf, XIIg, XIIIa, XIIId, or XIIII. More preferably, $Ar^1$ and $Ar^{1'}$ are a group of formula XIa, XIb, XIe, XIf, XIr, XIx, or XIIIa. Still more preferably $Ar^1$ and $Ar^{1'}$ are a group of formula XIa, XIb, or XIf. Most preferred $Ar^1$ and $Ar^{1'}$ are a group of formula XIa, or XIf, especially XIa.

Among the compounds of formula IIIa compounds of formula

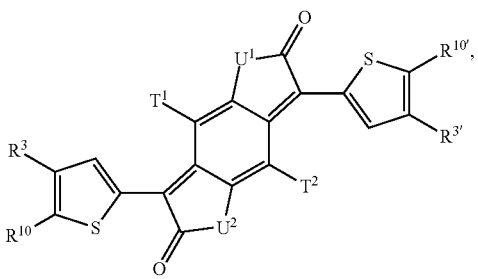

(IIIa)

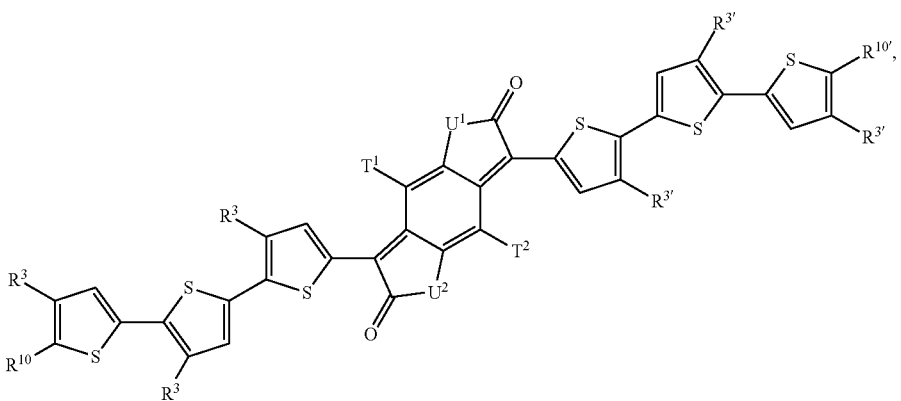

(IIIb)

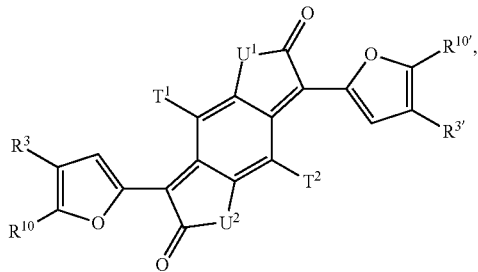
(IIIc)
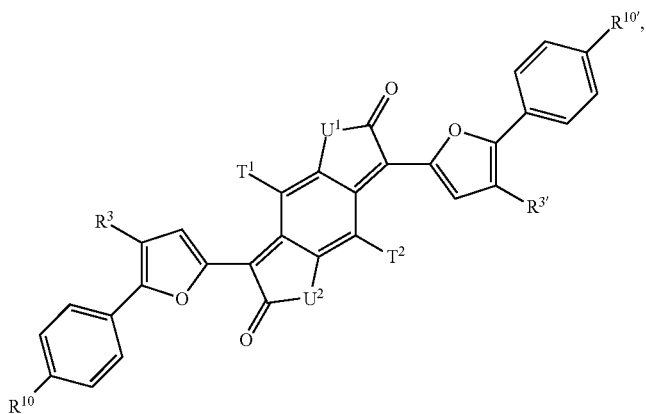
(IIId)
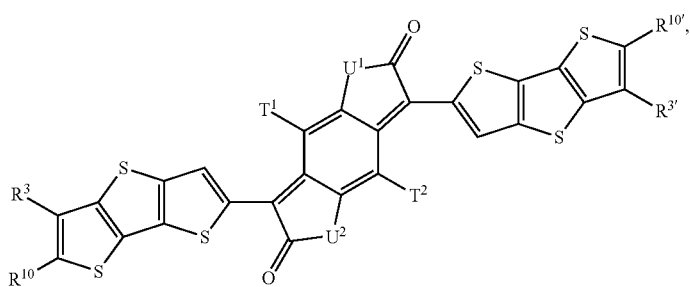
(IIIe)
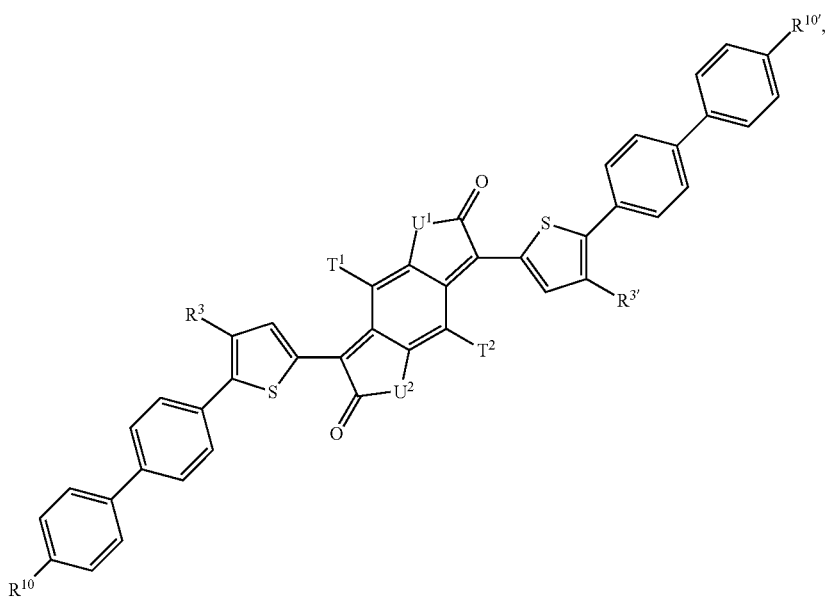
(IIIf)

-continued
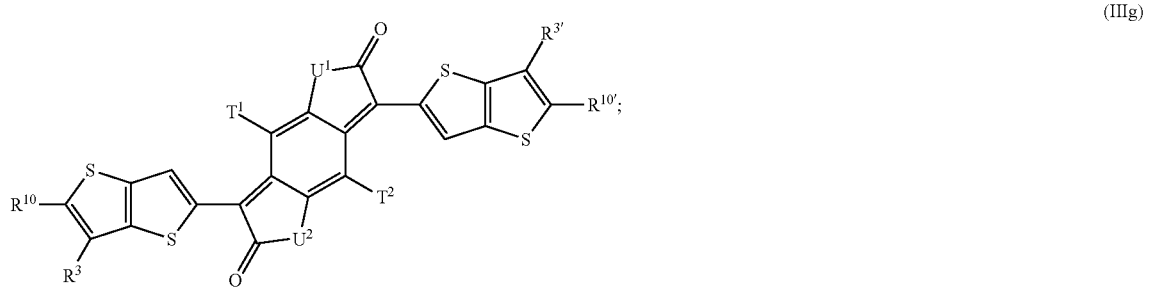
(IIIg)
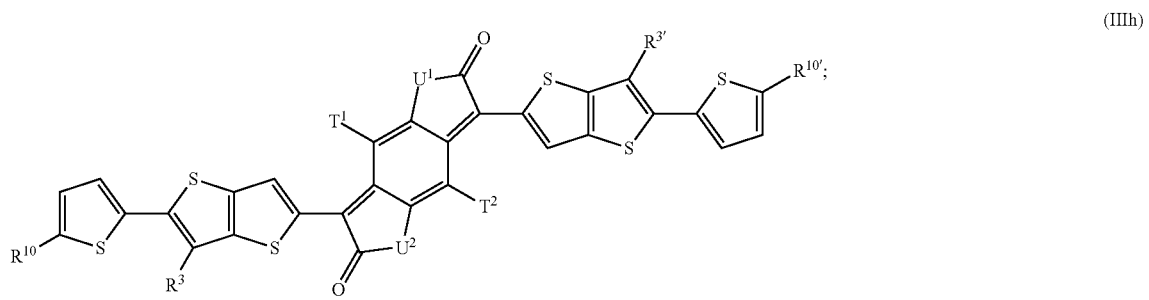
(IIIh)
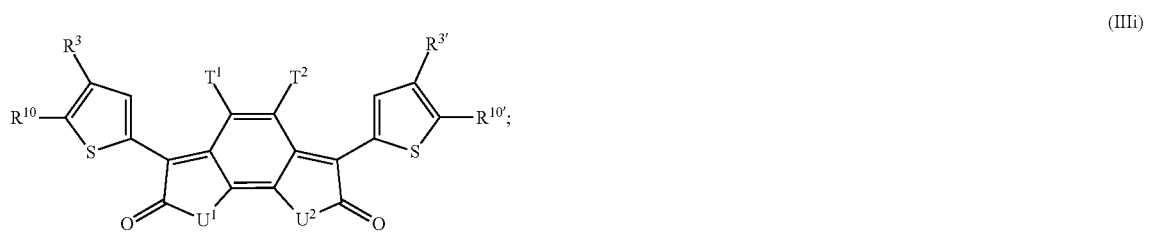
(IIIi)
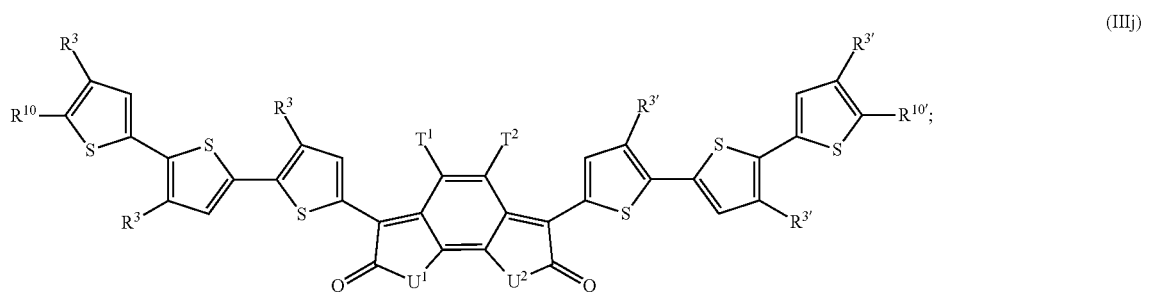
(IIIj)
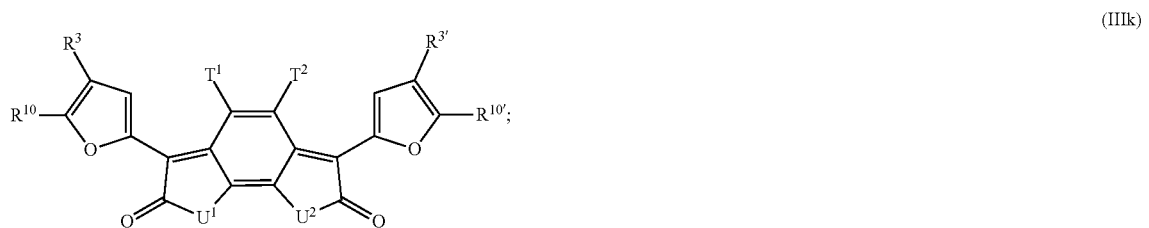
(IIIk)
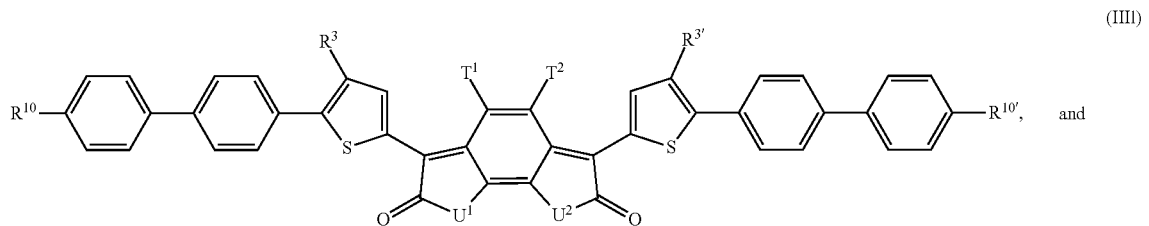
(IIIl) and (IIIm)

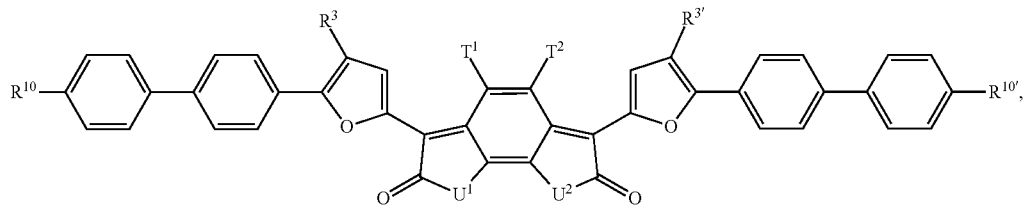

(IIIn)

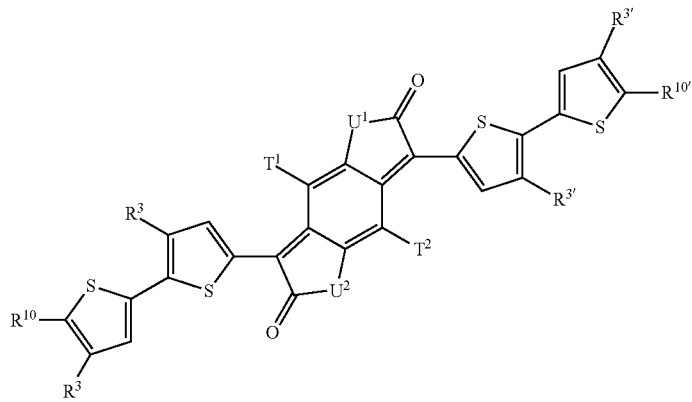

are more preferred, wherein $R^{10}$ and $R^{10'}$ are as defined above, $U^1$ is O, or $NR^1$, preferably $NR^1$; $U^2$ is O, or $NR^2$, preferably $NR^2$;

$T^1$ and $T^2$ are independently of each other hydrogen, or $C_1$-$C_{25}$alkyl, especially hydrogen;

$R^1$ and $R^2$ may be the same or different and are selected from a $C_1$-$C_{38}$alkyl group, especially a $C_8$-$C_{36}$alkyl group;

$R^3$ and $R^{3'}$ are independently of each other hydrogen, halogen, cyano or $C_1$-$C_{25}$alkyl, especially hydrogen or $C_1$-$C_{25}$alkyl; and $R^8$ and $R^{8'}$ are independently of each other hydrogen or $C_1$-$C_{25}$alkyl, especially $C_1$-$C_{25}$alkyl.

In said embodiment compounds of the formula (IIIa), (IIIb), (IIIc), (IIId), (IIIf), (IIIg), (IIIh) and (IIIm) are even more preferred.

Examples of specific compounds are shown below:

(B-1)

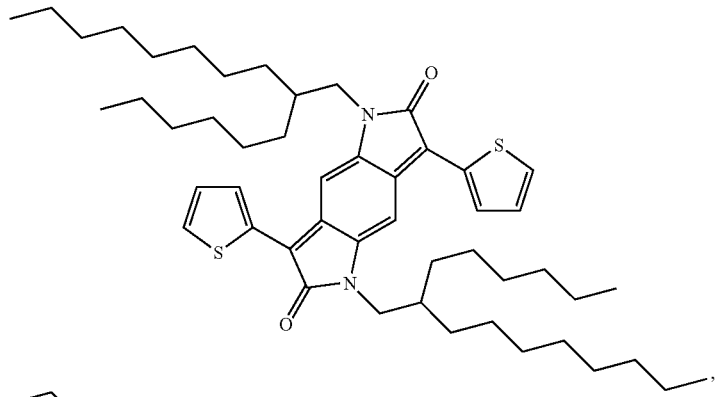

(B-2)

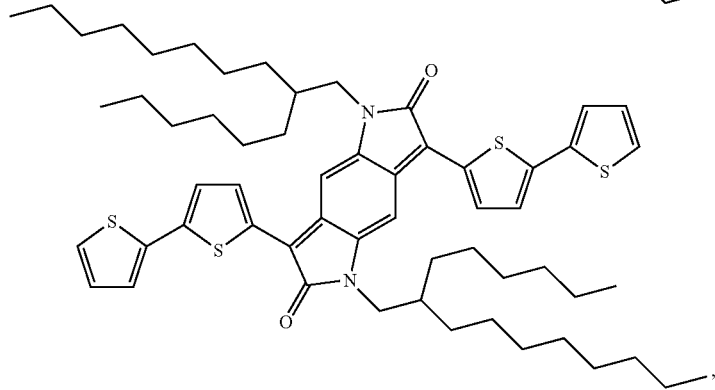

-continued
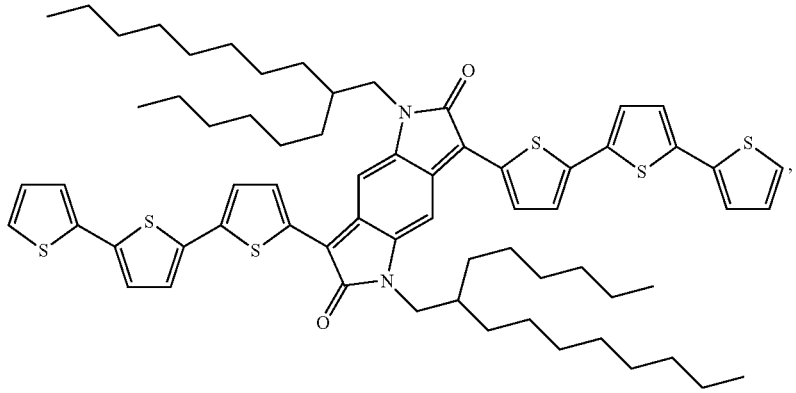
(B-3)
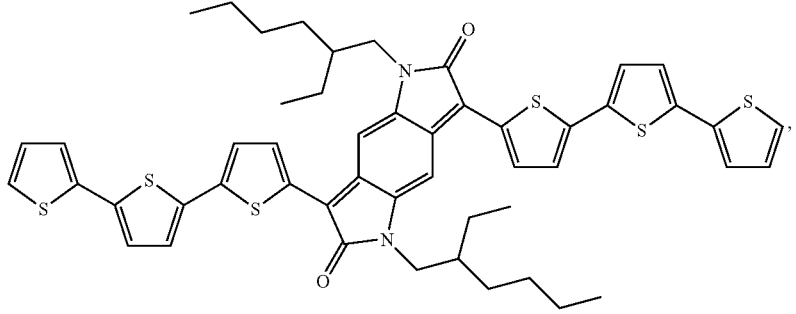
(B-4)
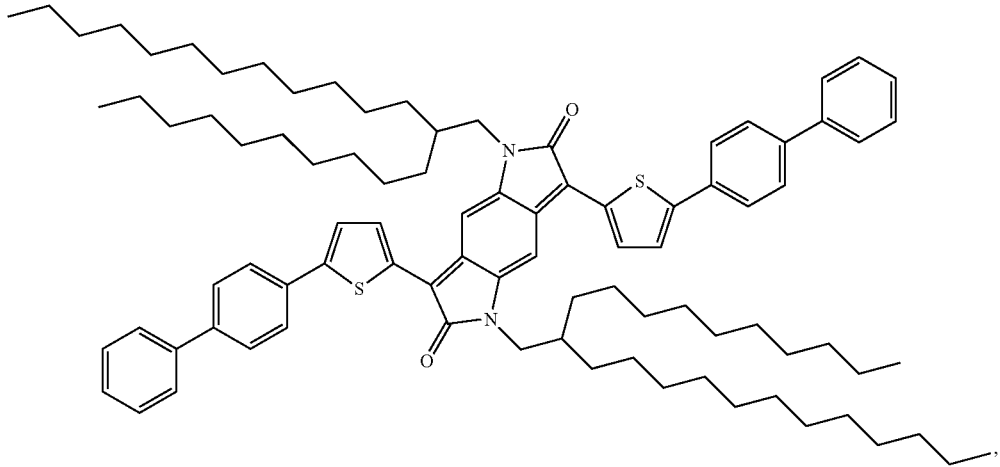
(B-5)
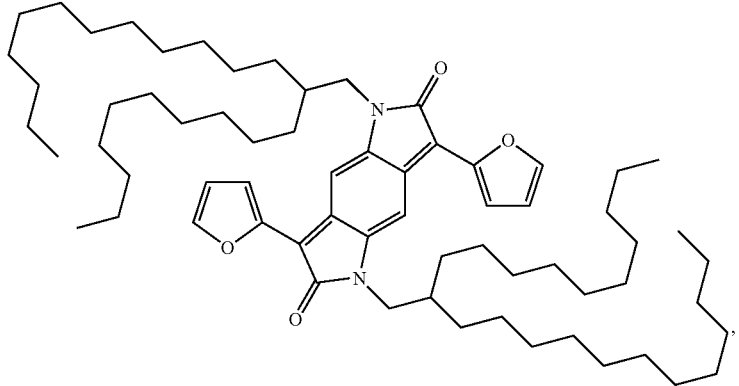
(B-6)

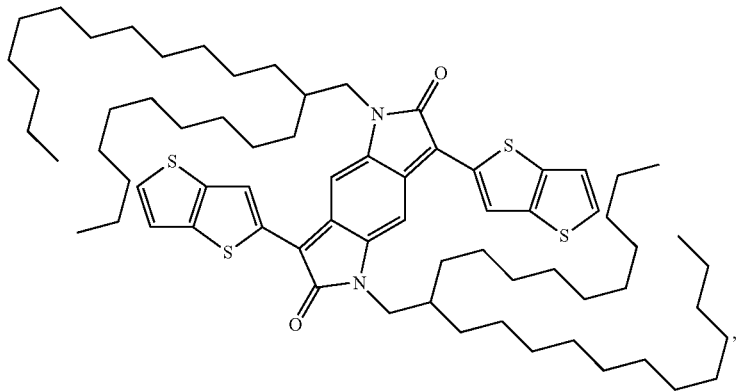
(B-7)
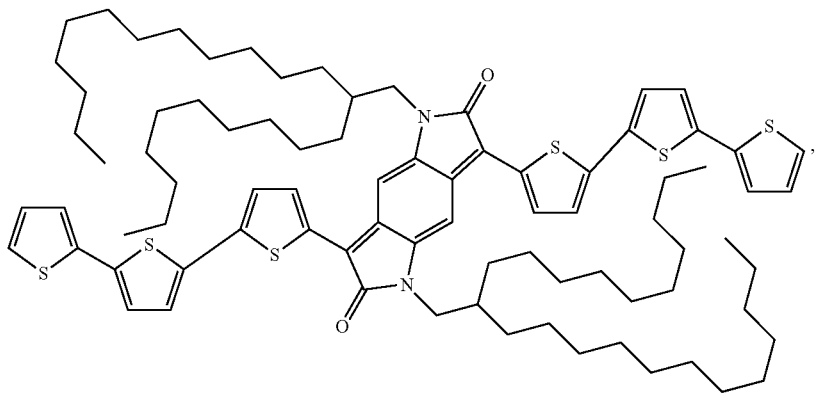
(B-8)
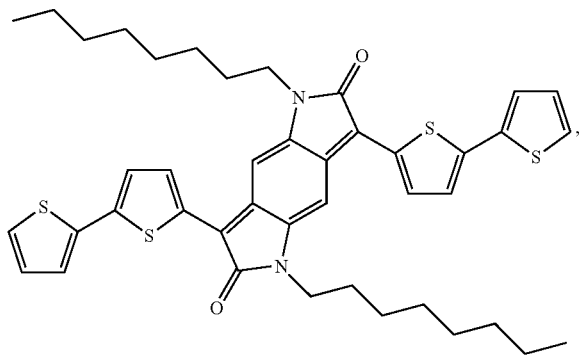
(B-9)
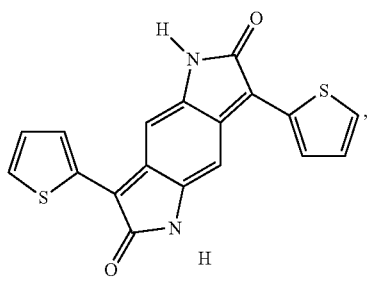
(B-10)
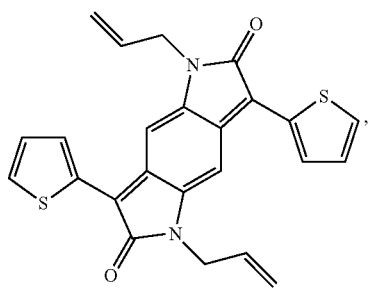
(B-11)

-continued
(B-12)
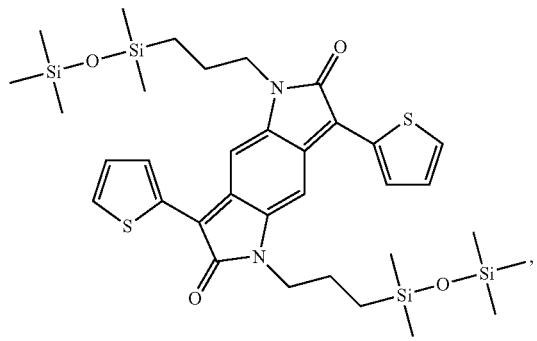
(B-13)
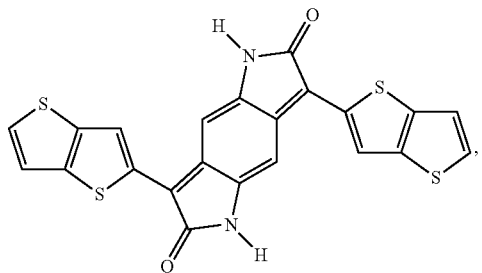
(B-14)
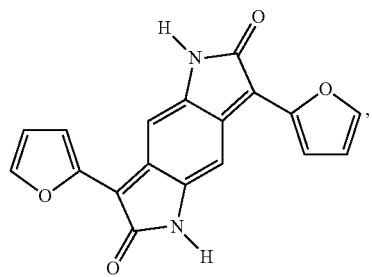
(B-15)
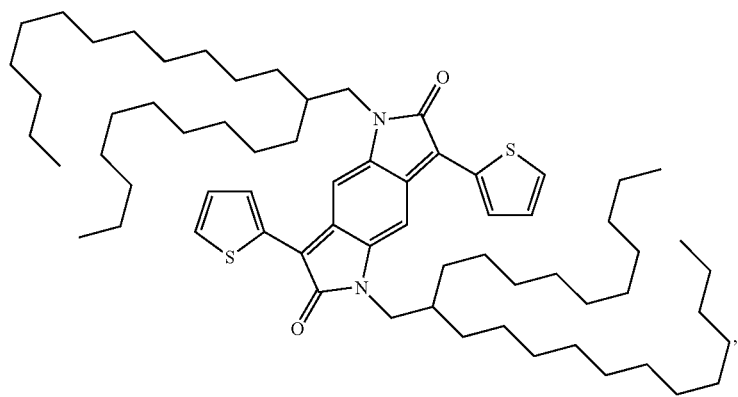
(B-16)
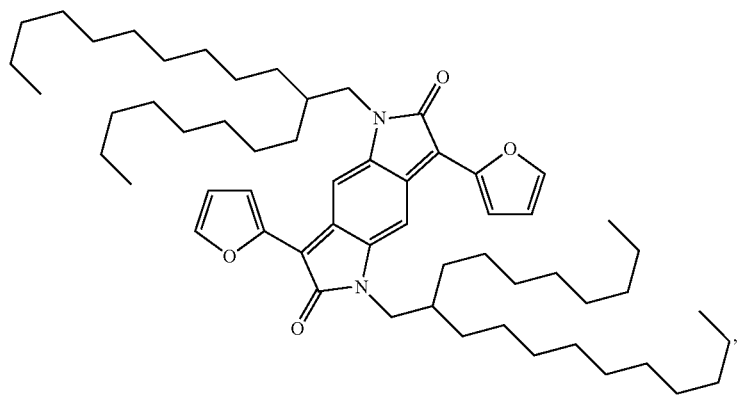

-continued
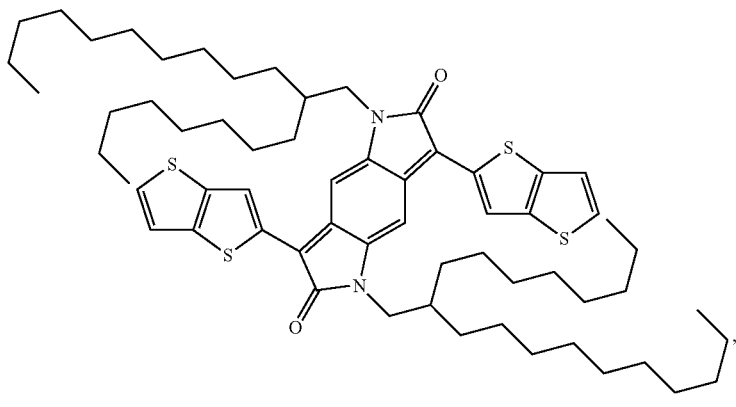
(B-17)
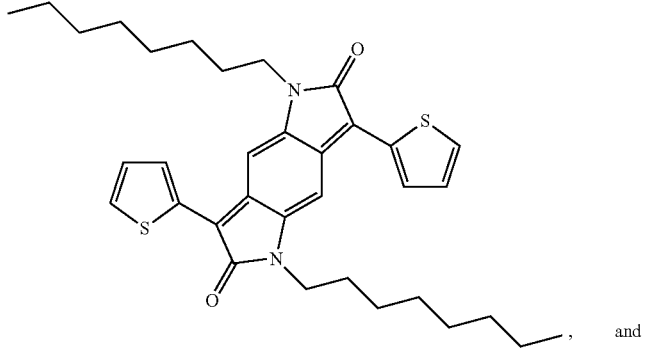
(B-18)
, and
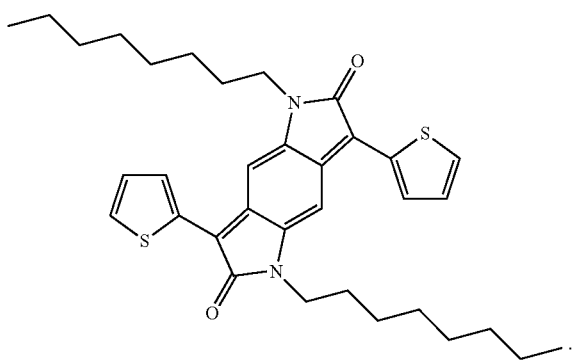
(B-19)
.
In another preferred embodiment the present invention is directed to compounds of formula
(IIIb)
wherein
A¹ and A² are independently of each other a group of formula
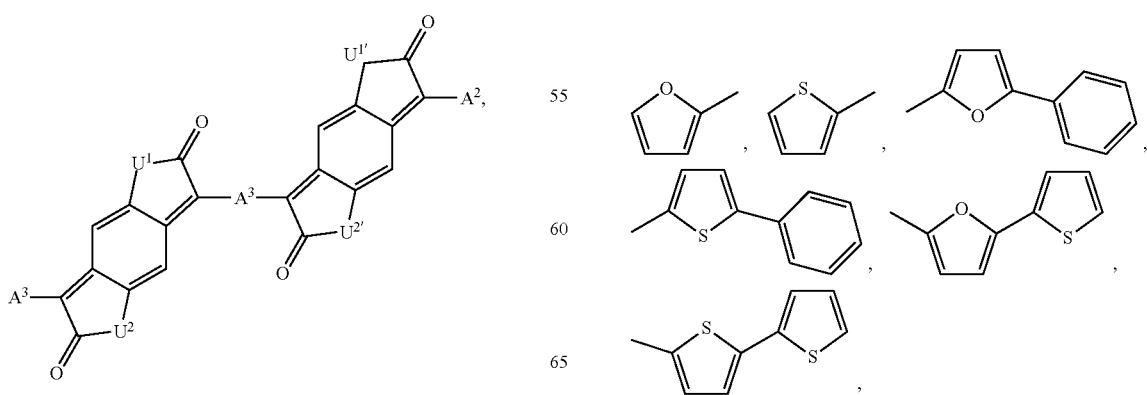

-continued
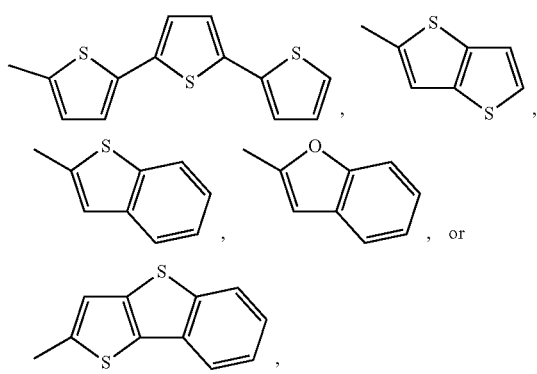
$A^3$ is a group of formula
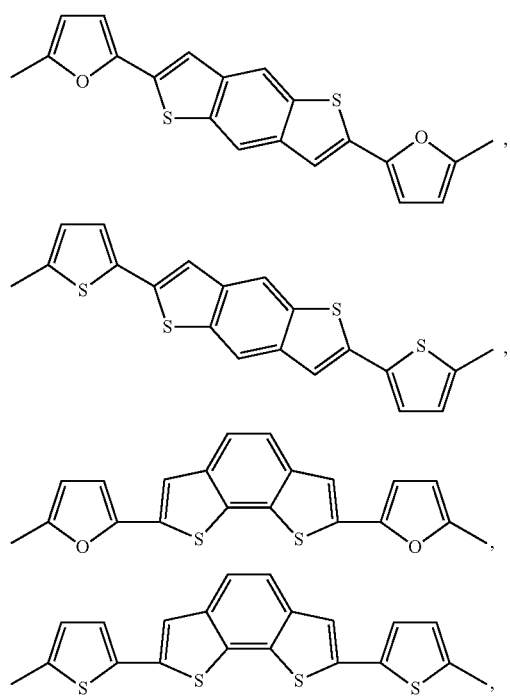
-continued
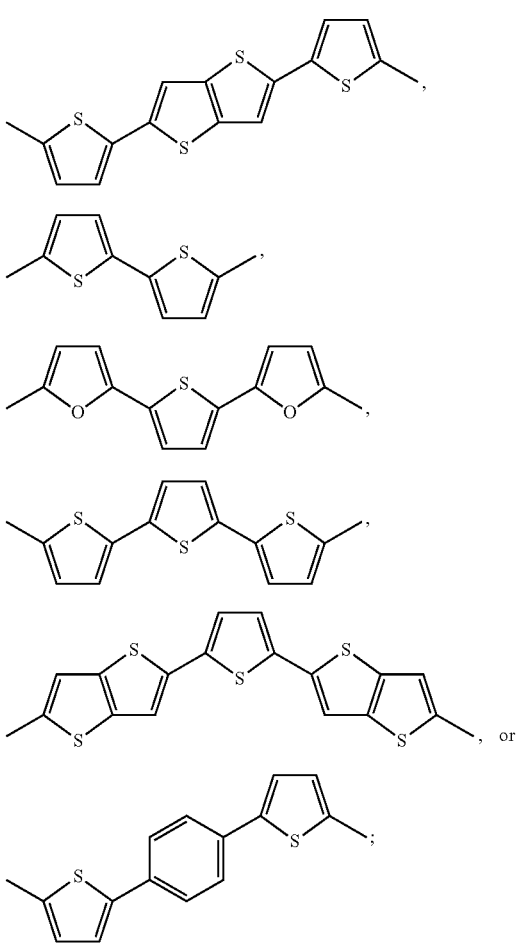
and
$U^1$, $U^2$, $U^{1'}$ and $U^{2'}$ independently of each other $NR^1$, wherein $R^1$ is a $C_1$-$C_{38}$alkyl group, especially a $C_8$-$C_{36}$alkyl group.
Examples of compounds of formula IIIb are shown below:
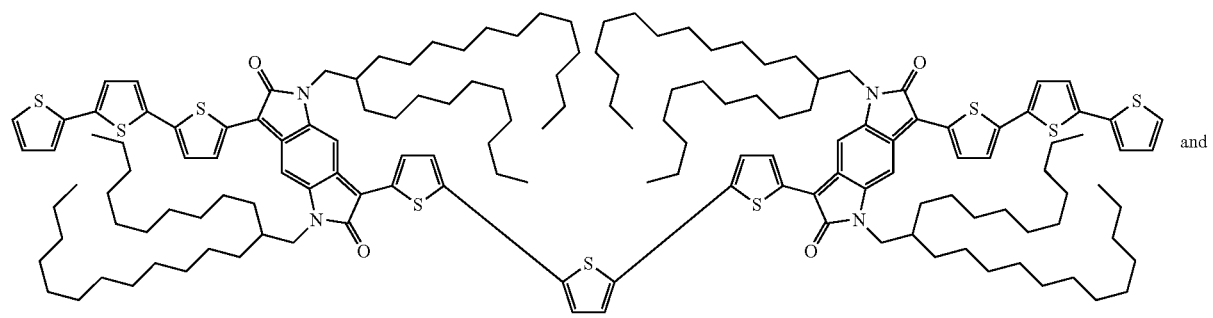
(C-1)
and (C-2)

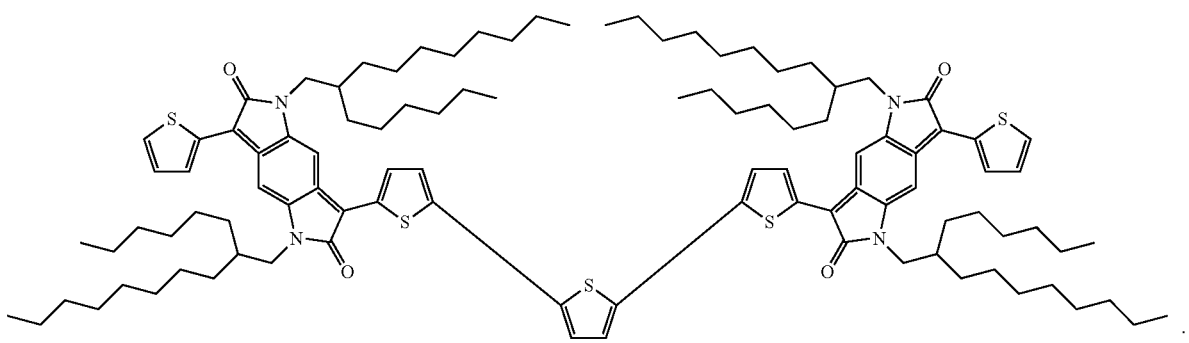

A process for the preparation of a compound of formula (IIIa')

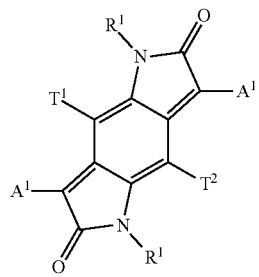

comprises reacting one to three, preferably two equivalents of a ketoamide of formula

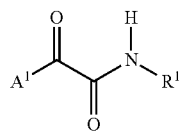

with one equivalent of a 1,4-cyclohexanedion of the formula

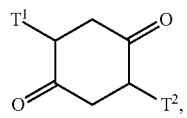

especially

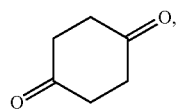

in the presence of a base, such as, for example, such as, for example, NaH, NaOH, KOH, an amine, such as, for example, triethylamine; $Na_2CO_3$, $K_2CO_3$, butyllithium, sodium methoxide, sodium ethoxide, especially NaH, NaOH, KOH, sodium methoxide or sodium ethoxide; in a suitable solvent, such as, for example, tetrahydrofurane, dimethylformamide, ethanol, methanol, isopropanol, dimethylacetamide, dioxane, especially tetrahydrofurane, methanol, ethanol, or isopropanol; to get an intermediate product of the formula (IX)

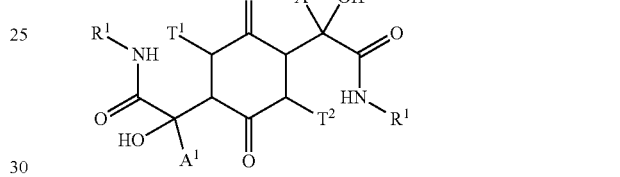

which is then treated with an acid, such as, for example, sulfuric acid, to get a compound of formula (IIIa'), wherein $R^1$, $R^2$, $T^1$, $T^2$, and $A^1$ are as defined above. The intermediate product of the formula (IX), which might spontaneously dehydrate, or cyclize during the reaction, or work up to a mixture containing at least one of the following compounds (IX) to (IXg):

(IX)

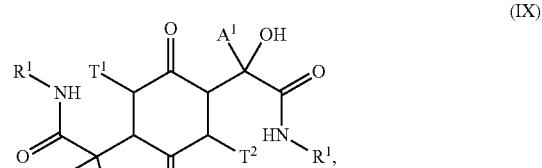

(IXa)

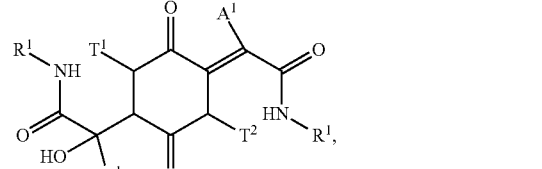

(IXb)

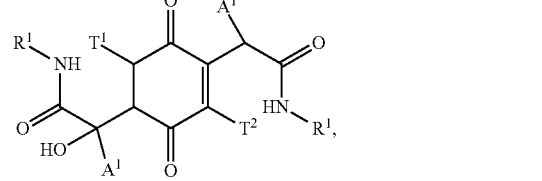

-continued

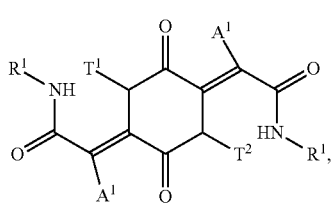
(IXc)

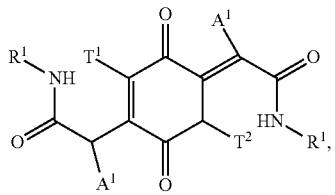
(IXd)

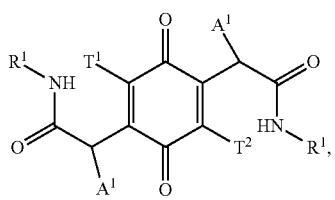
(IXe)

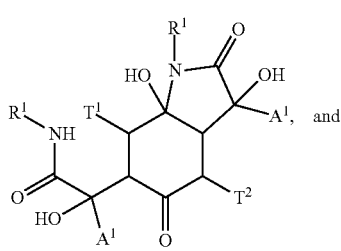
(IXf) and

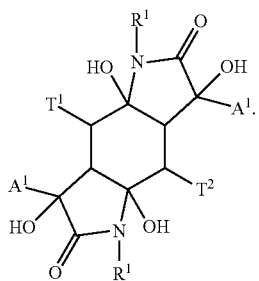
(IXg)

The first reaction step can be done preferably under a nitrogen atmosphere in a temperature range from −50 to 100° C., preferably from −30 to 100° C. and more preferably from −30 to 60° C. in a time range from 0.1 to 24 hours, preferably from 1 to 12 hours. The amount of the base used can be catalytically or in the range of one to four equivalents calculated on the equivalents of the 1,4-cyclohexanedione, preferably 1.5 to 2.5 equivalents, more preferably 2 to 2.5 equivalents. The work up can be done by quenching the reaction by the addition of water, or by the addition of water containing an acid, such as, for example, acetic acid, or ammoniumhydrochloride. The reaction mixture is then extracted by a suitable solvent, such as, for example, ethyl acetate, diethylether, methylene chloride, chloroform, toluene, or butylacetate.

In the second reaction step the intermediate mixture obtained in the first step is treated with an acid, such as, for example, sulfuric acid, methanesulfonic acid, trifluoromethanesulfonic acid, p-toluenesulfonicacid, acetic acid, trifluoroacetic acid, phosphoric acid, HCl, HBr, HF, HI, or by the addition of thionyl chloride, especially with sulfuric acid, HCl or trifluoroacetic acid together with a suitable solvent, such as, for example, methylene chloride, chloroform, ethylacetate, water or just the neat acid to get a compound of formula (IIIa'). The second reaction step is preferably done in a temperature range from −20° C. to 100° C., more preferably from 0° C. to 80° C., most preferred from 20° C. to 40° C.; in a time range from 0.1 to 24 hours, preferably from 1 to 12 hours. Additional solvents, such as, for example, ethyl acetate, toluene, diethyl ether, methylene chloride, chloroform, chlorobenzene, xylene, or butyl acetate; can be added for work up. Advantage reaction conditions are described in the Examples that follow.

Compounds of formula

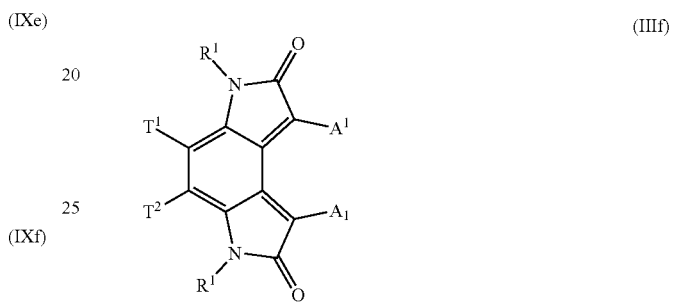
(IIIf)

are side products in the process for the preparation of compounds of formula IIIa'.

Compounds of formula

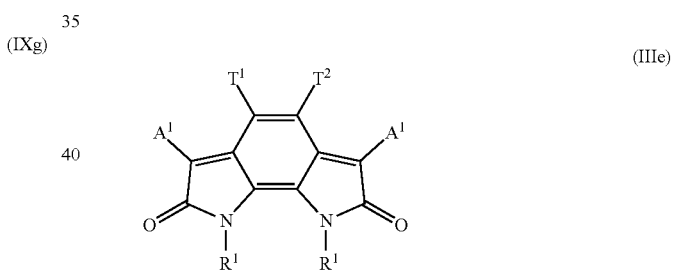
(IIIe)

can be prepared according to the above described process for compounds of formula (IIIa') by using instead of the 1,4-cyclohexanedione of the formula

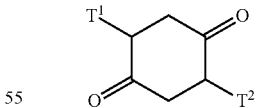

a 1,2-cyclohexanedione of the formula

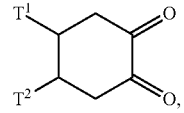

especially

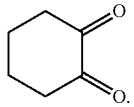

After the first step an intermediate of formula

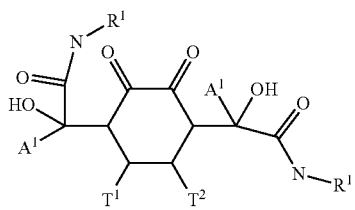

(VIII)

is obtained (including similar derivatives by dehydration and cyclization as shown above in case of the compound of formula (IX)) which in a second step on treatment with an acid results in the compound of formula (VIII). The process also includes two reaction steps. The first step is done under basic conditions, the second step is done under acidic conditions.

Reference is made to WO2009/047104 and PCT/EP2012/061777 with respect to the preparation of the compounds of formula III.

In addition, the present invention is directed to a process for the preparation of a compound of formula (IIIa'), wherein a 1,4-cyclohexanedion of the formula

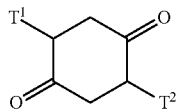

is used as starting material.

Compounds of the formula

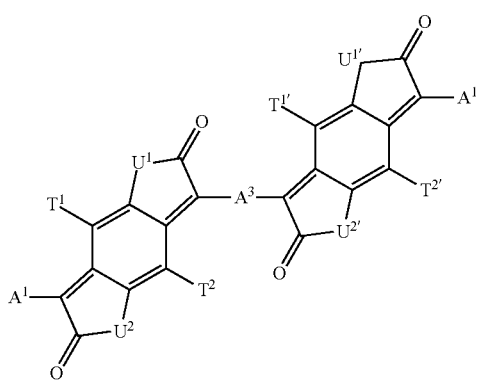

(IIIb)

($U^1$=$U^{1'}$=$U^2$=$U^{2'}$=$NR^1$, $A^3$ is a group of formula *—[$Ar^4$]$_k$—[$Ar^5$]$_l$—[$Ar^6$]$_r$—[$Ar^7$]$_z$*, $Ar^4$ is $Ar^7$, k is 1, or 2, z is 1, or 2) may be prepared by reacting a compound of formula

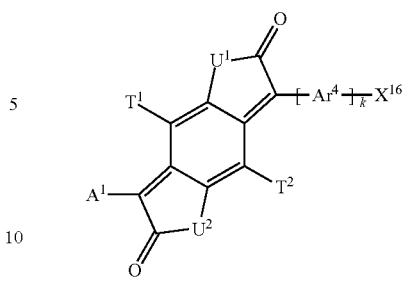

with a compound of formula $X^{16'}$—[$Ar^5$]$_r$—[$Ar^6$]$_r$—$X^{16'}$, wherein $X^{16'}$ is —B(OH)$_2$, —B(OH)$_3^-$, —BF$_3$, —B(OY$^1$)$_2$,

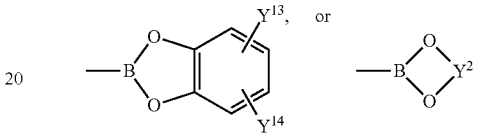

and $X^{16}$ is halogen, such as, for example, Br, or I.

The Suzuki reaction is typically conducted at about 0° C. to 180° C. in an aromatic hydrocarbon solvent such as toluene, xylene. Other solvents such as dimethylformamide, dioxane, dimethoxyethan and tetrahydrofuran can also be used alone, or in mixtures with an aromatic hydrocarbon. An aqueous base, preferably sodium carbonate or bicarbonate, potassium phosphate, potassium carbonate or bicarbonate is used as activation agent for the boronic acid, boronate and as the HBr scavenger. A condensation reaction may take 0.2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein). Other variations of reaction conditions are given by T. I. Wallow and B. M. Novak in J. Org. Chem. 59 (1994) 5034-5037; and M. Remmers, M. Schulze, and G. Wegner in Macromol. Rapid Commun. 17 (1996) 239-252.

In the above Suzuki coupling reactions the halogen $X^{16}$ on the halogenated reaction partner can be replaced with the $X^{16'}$ moiety and at the same time the $X^{16'}$ moiety of the other reaction partner is replaced by $X^{16}$.

In an additional embodiment the present invention is directed to compounds of formula $A^{1''}$—Y-$A^3$-$Y^{15}$—[$A^4$-$Y^{16}$]$_p$—[$A^5$-$Y^{17}$]$_q$$A^{2''}$ (XX), wherein $A^{1''}$ and $A^{2''}$ are independently of each other a group of formula —[$Ar^1$]$_a$—[$Ar^2$]$_b$—[$Ar^3$]$_c$—$X^3$, $X^3$ is independently in each occurrence halogen, very especially I, or Br; ZnX$^{12}$, —SnR$^{207}$R$^{209}$R$^{209}$, wherein R$^{207}$, R$^{208}$ and R$^{209}$ are identical or different and are H or C$_6$alkyl, wherein two radicals optionally form a common ring and these radicals are optionally branched or unbranched and X$^{12}$ is a halogen atom, very especially I, or Br; —OS(O)$_2$CF$_3$, —OS(O)$_2$-aryl, especially

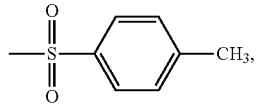

—OS(O)₂CH₃, —B(OH)₂, —B(OH)₃—, —BF₃, —B(OY¹)₂,

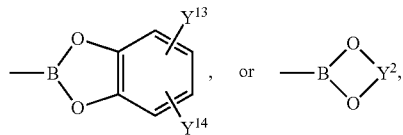

wherein Y¹ is independently in each occurrence a $C_1$-$C_{12}$alkyl group and Y² is independently in each occurrence a $C_2$-$C_{10}$alkylene group, such as —CY³Y⁴—CY⁵Y⁶—, or —CY⁷Y⁸—CY⁹Y¹⁰—CY¹¹Y¹²—, wherein Y³, Y⁴, Y⁵, Y⁶, Y⁷, Y⁸, Y⁹, Y¹⁰, Y¹¹ and Y¹² are independently of each other hydrogen, or a $C_1$-$C_{12}$alkyl group, especially —C(CH₃)₂C(CH₃)₂—, or —C(CH₃)₂CH₂C(CH₃)₂—, —CH₂C(CH₃)₂CH₂—, and Y¹³ and Y¹⁴ are independently of each other hydrogen, or a $C_1$-$C_{12}$alkyl group; a, b, c, p, q, Ar¹, Ar², Ar³, Y, Y¹⁵, Y¹⁶, Y¹⁷, A³, A⁴ and A⁵ are as defined above.

The compound of formula (XX) is preferably a compound of formula A¹''—Y-A³-Y¹⁵-A²'' (XXa). The compounds of the formula (XX), especially (XXa) are intermediates in the production of polymers, i.e the compounds of the formula (XX) can be used in the production of the polymers, comprising repeating units of formula (X).

Accordingly, the present invention is also directed to polymers comprising repeating units of formula

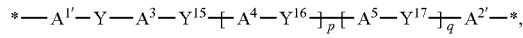
(X)

wherein

A¹' and A²' are independently of each other a group of formula

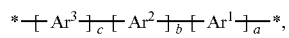

wherein a, b, c, p, q, Ar¹, Ar², Ar³, Y, Y¹⁵, Y¹⁶, Y¹⁷, A³, and A⁵ are as defined above. The polymers of the present invention may be used in the production of semiconductor devices. Accordingly, the present invention is also directed to semiconductor devices comprising a polymer of the present invention.

Advantageously, the compound of formula III, or an organic semiconductor material, layer or component, comprising the compound of formula III can be used in organic photovoltaics (solar cells) and photodiodes, or in an organic field effect transistor (OFET).

A mixture containing the compound of formula III results in a semi-conducting layer comprising the compound of formula III (typically 0.1% to 99.9999% by weight, more specifically 1% to 99.9999% by weight, even more specifically 5% to 99.9999% by weight, especially 20 to 85% by weight) and at least another material. The other material can be, but is not restricted to another compound of formula III, a polymer of the present invention, a semiconducting polymer, a non-conductive polymer, organic small molecules, carbon nanotubes, a fullerene derivative, inorganic particles (quantum dots, quantum rods, quantum tripods, TiO₂, ZnO etc.), conductive particles (Au, Ag etc.), insulator materials like the ones described for the gate dielectric (PET, PS etc.).

Accordingly, the present invention also relates to an organic semiconductor material, layer or component, comprising a compound of formula III and to a semiconductor device, comprising a compound of formula III and/or an organic semiconductor material, layer or component.

The semiconductor is preferably an organic photovoltaic (PV) device (solar cell), a photodiode, or an organic field effect transistor. The structure and the components of the OFET device has been described in more detail above.

Accordingly, the invention provides organic photovoltaic (PV) devices (solar cells) comprising a compound of the formula III.

The structure of organic photovoltaic devices (solar cells) is, for example, described in C. Deibel et al. Rep. Prog. Phys. 73 (2010) 096401 and Christoph Brabec, Energy Environ. Sci 2. (2009) 347-303.

The PV device comprise in this order:
(a) a cathode (electrode),
(b) optionally a transition layer, such as an alkali halogenide, especially lithium fluoride,
(c) a photoactive layer,
(d) optionally a smoothing layer,
(e) an anode (electrode),
(f) a substrate.

The photoactive layer comprises the compounds of the formula III. Preferably, the photoactive layer is made of a compound of the formula III, as an electron donor and an acceptor material, like a fullerene, particularly a functionalized fullerene PCBM, as an electron acceptor. As stated above, the photoactive layer may also contain a polymeric binder. The ratio of the small molecules of formula III to the polymeric binder can vary from 5 to 95 percent. Preferably, the polymeric binder is a semicristalline polymer such as polystyrene (PS), high-density polyethylene (HDPE), polypropylene (PP) and polymethylmethacrylate (PMMA).

The fullerenes useful in this invention may have a broad range of sizes (number of carbon atoms per molecule). The term fullerene as used herein includes various cage-like molecules of pure carbon, including Buckminsterfullerene ($C_{60}$) and the related "spherical" fullerenes as well as carbon nanotubes. Fullerenes may be selected from those known in the art ranging from, for example, $C_{20}$-$C_{1000}$. Preferably, the fullerene is selected from the range of $C_{69}$ to $C_{96}$. Most preferably the fullerene is $C_{69}$ or $C_{70}$, such as [60]PCBM, or [70]PCBM. It is also permissible to utilize chemically modified fullerenes, provided that the modified fullerene retains acceptor-type and electron mobility characteristics. The acceptor material can also be a material selected from the group consisting of another compounds of formula III, or any semi-conducting polymer, such as, for example, a polymer of formula I, provided that the polymers retain acceptor-type and electron mobility characteristics, organic small molecules, carbon nanotubes, inorganic particles (quantum dots, quantum rods, quantum tripods, TiO₂, ZnO etc.).

The photoactive layer is made of a compound of the formula III, as an electron donor and a fullerene, particularly functionalized fullerene PCBM, as an electron acceptor. These two components are mixed with a solvent and applied as a solution onto the smoothing layer by, for example, the spin-coating method, the drop casting method, the Langmuir-Blodgett ("LB") method, the ink jet printing method and the dripping method. A squeegee or printing method could also be used to coat larger surfaces with such a photoactive layer. Instead of toluene, which is typical, a dispersion agent such as chlorobenzene is preferably used as a solvent. Among these methods, the vacuum deposition method, the spin-coating method, the ink jet printing method and the casting method are particularly preferred in view of ease of operation and cost.

In the case of forming the layer by using the spin-coating method, the casting method and ink jet printing method, the coating can be carried out using a solution and/or dispersion prepared by dissolving, or dispersing the composition in a concentration of from 0.01 to 90% by weight in an appropriate organic solvent such as benzene, toluene, xylene, tetrahydrofurane, methyltetrahydrofurane, N,N-dimethylformamide, acetone, acetonitrile, anisole, dichloromethane, dimethylsulfoxide, chlorobenzene, 1,2-dichlorobenzene and mixtures thereof.

The photovoltaic (PV) device can also consist of multiple junction solar cells that are processed on top of each other in order to absorb more of the solar spectrum. Such structures are, for example, described in App. Phys. Let. 90, 143512 (2007), Adv. Funct. Mater. 16, 1897-1903 (2006) and WO2004/112161.

A so called 'tandem solar cell' comprise in this order:
(a) a cathode (electrode),
(b) optionally a transition layer, such as an alkali halogenide, especially lithium fluoride,
(c) a photoactive layer,
(d) optionally a smoothing layer,
(e) a middle electrode (such as Au, Al, ZnO, $TiO_2$ etc.)
(f) optionally an extra electrode to match the energy level,
(g) optionally a transition layer, such as an alkali halogenide, especially lithium fluoride,
(h) a photoactive layer,
(i) optionally a smoothing layer,
(j) an anode (electrode),
(k) a substrate.

The PV device can also be processed on a fiber as described, for example, in US20070079867 and US20060013549.

Due to their excellent self-organising properties the materials or films comprising the compounds of the formula III can also be used alone or together with other materials in or as alignment layers in LCD or OLED devices, as described for example in US200310021913.

An OFET device according to the present invention preferably comprises:
a source electrode,
a drain electrode,
a gate electrode,
a semiconducting layer,
one or more gate insulator layers, and
optionally a substrate, wherein the semiconductor layer comprises a compound of formula III.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

Preferably the OFET comprises an insulator having a first side and a second side, a gate electrode located on the first side of the insulator, a layer comprising a compound of formula III located on the second side of the insulator, and a drain electrode and a source electrode located on the polymer layer.

In a preferred embodiment, the deposition of at least one compound of the general formula III (and if appropriate further semiconductor materials) is carried out by a gas phase deposition process (physical vapor deposition, PVD). PVD processes are performed under high-vacuum conditions and comprise the following steps: evaporation, transport, deposition. It has been found that, surprisingly, the compounds of the general formula III are suitable particularly advantageously for use in a PVD process, since they essentially do not decompose and/or form undesired by-products. The material deposited is obtained in high purity. In a specific embodiment, the deposited material is obtained in the form of crystals or comprises a high crystalline content. In general, for the PVD, at least one compound of the general formula III is heated to a temperature above its evaporation temperature and deposited on a substrate by cooling below the crystallization temperature. The temperature of the substrate in the deposition is preferably within a range from about 20 to 250° C., more preferably from 50 to 200° C.

The resulting semiconductor layers generally have a thickness which is sufficient for ohmic contact between source and drain electrodes. The deposition can be effected under an inert atmosphere, for example under nitrogen, argon or helium. The deposition is effected typically at ambient pressure or under reduced pressure. A suitable pressure range is from about $10^{-7}$ to 1.5 bar.

The compound of the formula III is preferably deposited on the substrate in a thickness of from 10 to 1000 nm, more preferably from 15 to 250 nm. In a specific embodiment, the compound of the formula III is deposited at least partly in crystalline form. For this purpose, especially the above-described PVD process is suitable. Moreover, it is possible to use previously prepared organic semiconductor crystals. Suitable processes for obtaining such crystals are described by R. A. Laudise et al. in "Physical Vapor Growth of Organic SemiConductors", Journal of Crystal Growth 187 (1998), pages 449-454, and in "Physical Vapor Growth of Centimeter-sized Crystals of α-Hexathiophene", Journal of Crystal Growth 1982 (1997), pages 416-427, which are incorporated here by reference.

In addition, the polymers and compounds of the present invention may be used as IR absorbers.

Accordingly, the polymers and compounds of the present invention can be used inter alia for security printing, invisible and/or IR readable bar codes, the laser-welding of plastics, the curing of surface-coatings using IR radiators, the drying and curing of print, the fixing of toners on paper or plastics, optical filters for plasma display panels, laser marking of paper or plastics, the heating of plastics preforms, and for heat shielding applications.

In a further aspect, the invention provides a printing ink formulation for security printing, comprising at least one polymer, or compound of the present invention, such as, for example, a polymer P-1, or P-2.

In a further aspect, the invention provides a security document, comprising a substrate and at least at least one polymer, or compound of the present invention. The security document may be a bank note, a passport, a check, a voucher, an ID- or transaction card, a stamp and a tax label.

In a further aspect, the invention provides a security document, obtainable by a printing process, wherein a printing ink formulation is employed that comprises at least one polymer, or compound of the present invention.

Advantageously, the polymers, or compounds of the present invention, such as, for example, polymer P-1, or P-2, may be used in a printing ink formulation for security printing.

In security printing, the polymers, or compounds of the present invention are added to a printing ink formulation. Suitable printing inks are water-based, oil-based or solvent-based printing inks, based on pigment or dye, for inkjet printing, flexographic printing, screen printing, intaglio printing, offset printing, laser printing or letterpress printing and for use in electrophotography. Printing inks for these printing processes usually comprise solvents, binders, and also various additives, such as plasticizers, antistatic agents or waxes. Printing inks for offset printing and letterpress printing are usually formulated as high-viscosity paste printing inks, whereas printing inks for flexographic printing and intaglio printing are usually formulated as liquid printing inks with comparatively low viscosity.

The printing ink formulation, especially for security printing, according to the invention preferably comprises
 a) at least one polymer, or compound of the present invention, such as, for example, a polymer P-1, or P-2,
 b) a polymeric binder,
 c) a solvent,
 d) optionally at least one colorant, and
 e) optionally at least one further additive.

Suitable components of printing inks are conventional and are well known to those skilled in the art. Examples of such components are described in "Printing Ink Manual", fourth edition, Leach R. H. et al. (eds.), Van Nostrand Reinhold, Wokingham, (1988). Details of printing inks and their formulation are also disclosed in "Printing Inks"-Ullmann's Encyclopedia of Industrial Chemistry, Sixth Edition, 1999 Electronic Release. A formulation of an IR-absorbing intaglio ink formulation is described in US 20080241492 A1. The disclosure of the afore-mentioned documents is incorporated herein by reference.

The printing ink formulation according to the invention contains in general from 0.0001 to 25% by weight, preferably from 0.001 to 15% by weight, in particular from 0.01 to 5% by weight, based on the total weight of the printing ink formulation, of component a).

The printing ink formulation according to the invention contains in general from 5 to 74% by weight, preferably from 10 to 60% by weight, more preferably from 15 to 40% by weight, based on the total weight of the printing ink formulation, of component b).

Suitable polymeric binders b) for the printing ink formulation according to the invention are for example selected from natural resins, phenol resin, phenol-modified resins, alkyd resins, polystyrene homo- and copolymers, terpene resins, silicone resins, polyurethane resins, urea-formaldehyde resins, melamine resins, polyamide resins, polyacrylates, polymethacrylates, chlorinated rubber, vinyl ester resins, acrylic resins, epoxy resins, nitrocellulose, hydrocarbon resins, cellulose acetate, and mixtures thereof.

The printing ink formulation according to the invention can also comprise components that form a polymeric binder by a curing process. Thus, the printing ink formulation according to the invention can also be formulated to be energy-curable, e.g. able to be cured by UV light or EB (electron beam) radiation. In this embodiment, the binder comprises one or more curable monomers andoligomers. Corresponding formulations are known in the art and can be found in standard textbooks such as the series "Chemistry & Technology of UV & EB Formulation for Coatings, Inks & Paints", published in 7 volumes in 1997-1998 by John Wiley & Sons in association with SITA Technology Limited.

Suitable monomers and oligomers (also referred to as prepolymers) include epoxy acrylates, acrylated oils, urethane acrylates, polyester acrylates, silicone acrylates, acrylated amines, and acrylic saturated resins. Further details and examples are given in "Chemistry & Technology of UV & EB Formulation for Coatings, Inks & Paints", Volume II: Prepolymers & Reactive Diluents, edited by G Webster.

If a curable polymeric binder is employed, it may contain reactive diluents, i.e. monomers which act as a solvent and which upon curing are incorporated into the polymeric binder. Reactive monomers are typically chosen from acrylates or methacrylates, and can be monofunctional or multifunctional. Examples of multifunctional monomers include polyester acrylates or methacrylates, polyol acrylates or methacrylates, and polyether acrylates or methacrylates.

In the case of printing ink formulations to be cured by UV radiation, it is usually necessary to include at least one photoinitiator to initiate the curing reaction of the monomers upon exposure to UV radiation. Examples of useful photoinitiators can be found in standard textbooks such as "Chemistry & Technology of UV & EB Formulation for Coatings, Inks & Paints", Volume III, "Photoinitiators for Free Radical Cationic and Anionic Polymerisation", 2nd edition, by J. V. Crivello & K. Dietliker, edited by G. Bradley and published in 1998 by John Wiley & Sons in association with SITA Technology Limited. It may also be advantageous to include a sensitizer in conjunction with the photoinitiator in order to achieve efficient curing.

The printing ink formulation according to the invention contains in general from 1 to 94.9999% by weight, preferably from 5 to 90% by weight, in particular from 10 to 85% by weight, based on the total weight of the printing ink formulation, of a solvent c).

Suitable solvents are selected from water, organic solvents and mixtures thereof. For the purpose of the invention, reactive monomers which also act as solvents are regarded as part of the afore-mentioned binder component b).

Examples of solvents comprise water; alcohols, e.g. ethanol, 1-propanol, 2-propanol, ethylene glycol, propylene glycol, diethylene glycol and ethoxy propanol; esters, e.g. ethyl acetate, isopropyl acetate, n-propyl acetate and n-butyl acetate; hydrocarbons, e.g. toluene, xylene, mineral oils and vegetable oils, and mixtures thereof.

The printing ink formulation according to the invention may contain an additional colorant d). Preferably, the printing ink formulation contains from 0 to 25% by weight, more preferably from 0.1 to 20% by weight, in particular from 1 to 15% by weight, based on the total weight of the printing ink formulation, of a colorant d).

Suitable colorants d) are selected conventional dyes and in particular conventional pigments. The term "pigment" is used in the context of this invention comprehensively to identify all pigments and fillers, examples being colour pigments, white pigments, and inorganic fillers. These include inorganic white pigments, such as titanium dioxide, preferably in the rutile form, barium sulfate, zinc oxide, zinc sulfide, basic lead carbonate, antimony trioxide, lithopones (zinc sulfide+barium sulfate), or coloured pigments, examples being iron oxides, carbon black, graphite, zinc yellow, zinc green, ultramarine, manganese black, antimony black, manganese violet, Paris blue or Schweinfurt green. Besides the inorganic pigments the printing ink formulation of the invention may also comprise organic colour pigments, examples being sepia, gamboge, Cassel brown, toluidine red, para red, Hansa yellow, indigo, azo dyes, anthraquinonoid and indigoid dyes, and also dioxazine, quinacridone, phthalocyanine, isoindolinone, and metal complex pigments. Also suitable are synthetic white pigments with air inclusions to increase the light scattering, such as the Rhopaque® dispersions. Suitable fillers are, for example, aluminosilicates, such as feldspars, silicates, such as kaolin, talc, mica, magnesite, alkaline earth metal carbonates, such as calcium carbonate, in the form for example of calcite or chalk, magnesium carbonate, dolomite, alkaline earth metal sulfates, such as calcium sulfate, silicon dioxide, etc.

The printing ink formulation according to the invention may contain at least one additive e). Preferably, the printing ink formulation contains from 0 to 25% by weight, more preferably from 0.1 to 20% by weight, in particular from 1 to 15% by weight, based on the total weight of the printing ink formulation, of at least one component e).

Suitable additives (component e)) are selected from plasticizers, waxes, siccatives, antistatic agents, chelators, antioxidants, stabilizers, adhesion promoters, surfactants, flow control agents, defoamers, biocides, thickeners, etc. and combinations thereof. These additives serve in particular for fine adjustment of the application-related properties of the printing ink, examples being adhesion, abrasion resistance, drying rate, or slip.

In particular, the printing ink formulation for security printing according to the invention preferably contains
a) 0.0001 to 25% by weight of at least one polymer, or compound of the present invention, such as, for example, a polymer P-1, or P-2,
b) 5 to 74% by weight of at least one polymeric binder,
c) 1 to 94.9999% by weight of at least one a solvent,
d) 0 to 25% by weight of at least one colorant, and
e) 0 to 25% by weight of at least one further additive,
wherein the sum of components a) to e) adds up to 100%.

The printing ink formulations according to the invention are advantageously prepared in a conventional manner, for example by mixing the individual components.

Primers can be applied prior to the printing ink formulation according to the invention. By way of example, the primers are applied in order to improve adhesion to the substrate. It is also possible to apply additional printing lacquers, e.g. in the form of a covering to protect the printed image.

The following examples are included for illustrative purposes only and do not limit the scope of the claims. Unless otherwise stated, all parts and percentages are by weight.

Weight-average molecular weight (Mw) and polydispersity (MwMn=PD) are determined by Heat Temperature Gel Permeation Chromatography (HT-GPC) [*Apparatus*: GPC PL220 from Polymer laboratories (Church Stretton, UK; now Varian) yielding the responses from refractive index (RI), *Chromatographic conditions*: Column: 3 "PLgel Olexis" column from Polymer Laboratories (Church Stretton, UK); with an average particle size of 13 ìm (dimensions 300×8 mm I.D.) Mobile phase: 1,2,4-trichlorobenzene purified by vacuum distillation and stabilised by butylhydroxytoluene (BHT, 200 mg/l), Chromatographic temperature: 150° C.; Mobile phase flow: 1 ml/min; Solute concentration: about 1 mg/ml; Injection volume: 200 ìl; Detection: RI, *Procedure of molecular weight calibration*: Relative calibration is done by use of a set of 10 polystyrene calibration standards obtained from Polymer Laboratories (Church Stretton, UK) spanning the molecular weight range from 1'930'000 Da-5'050 Da, i.e., PS 1'930'000, PS 1'460'000, PS 1'075'000, PS 560'000, PS 330'000, PS 96'000, PS 52'000, PS 30'300, PS 10'100, PS 5'050 Da. A polynomic calibration is used to calculate the molecular weight.

All polymer structures given in the examples below are idealized representations of the polymer products obtained via the polymerization procedures described. If more than two components are copolymerized with each other sequences in the polymers can be either alternating or random depending on the polymerisation conditions.

EXAMPLES

Example 1

Synthesis of Compound 6

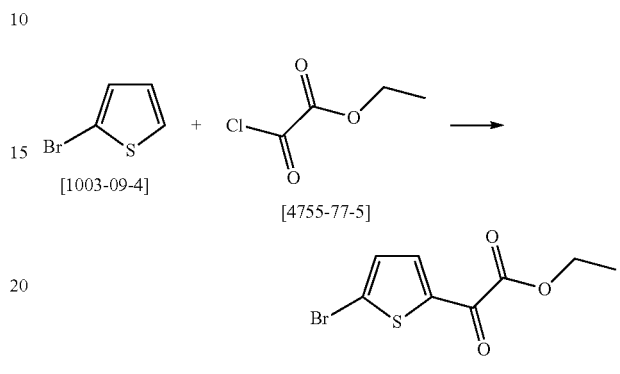

a) 9.77 g AlCl$_3$ is suspended in 50 ml methylene chloride and then 5 g of ethyl chlorooxoacetate [4755-77-5] are added dropwise at −20° C. under nitrogen. Then 6.09 g of 2-bromothiophene [1003-09-4] are added dropwise at −20° C. under stirring. After 1 h of stirring the reaction mixture is poured on ice-water and the compound 1 is extracted with ethyl acetate. The product is purified by column chromatography. $^1$H-NMR data (ppm, CDCl$_3$): 7.83 1H d, 7.11 1H d, 4.35 2H q, 1.37 3H t:

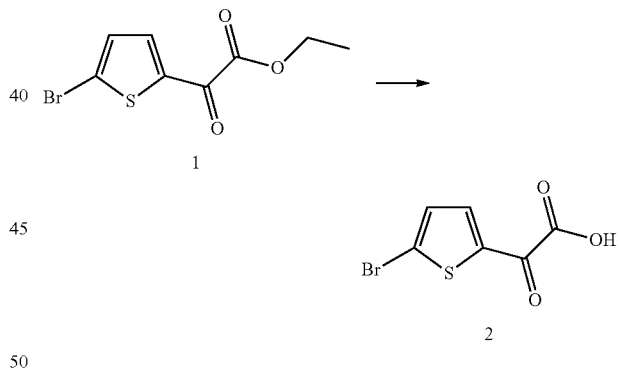

b) 9.07 g of the product 1 are suspended in 120 ml of ethanol and heated to 70° C. At 60° C. a solution of NaOH (2.07 g) in water (2.07 g) is added and the reaction mixture is stirred at 60° C. until no more starting material is detected. Then the reaction mixture is acidified at 20° C. with conc. HCl to give compound 2. $^1$H-NMR data (ppm, CDCl$_3$): 9.65 1H very broad s, 8.18 1H d, 7.14 1H d;

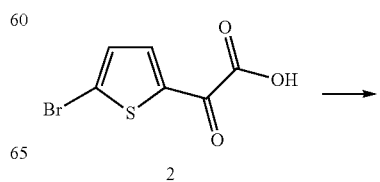

-continued

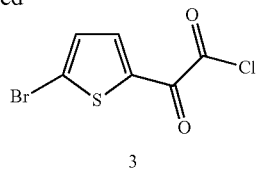

c) Compound 2 is heated for 1 hour at 40° C. in excess thionyl chloride. Then the excess thionyl chloride is distilled off under reduced pressure to get compound 3. $^1$H-NMR data (ppm, CDCl$_3$): 7.80 1H d, 7.18 1H d;

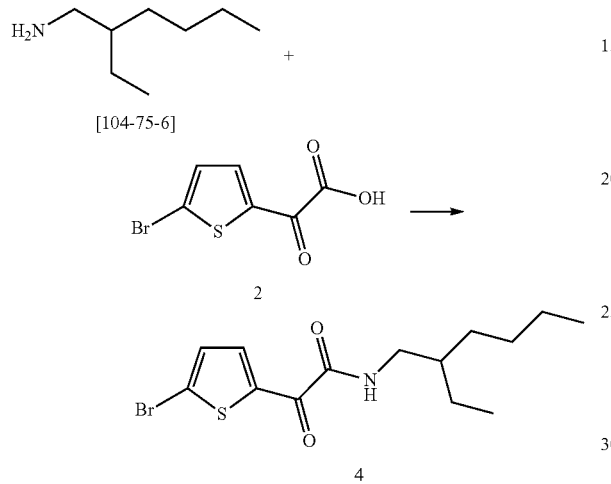

d) 10 g of compound 2 are dissolved in 50 ml of dry dimethylacetamide and cooled to −5° C. Then 5.51 g of thionyl chloride are added dropwise. After stirring for 10 minutes 5.44 g of 2-ethyl-1-hexylamine are added dropwise over 30 minutes. At the end the reaction mixture is warmed to room temperature and stirred for an additional 1 hour. The reaction mixture is quenched by the addition of water and the product is extracted with ethylacetate. After drying the organic phase and evaporation of the solvent, the product is purified by chromatography over silica gel to give compound 4. $^1$H-NMR data (ppm, CDCl$_3$): 7.99 1H d, 7.18 1H m, 7.09 1H d, 3.25 2H t, 1.47 1H m, 1.34-1.23 8H m, 0.85 3H t, 0.83 3H t.

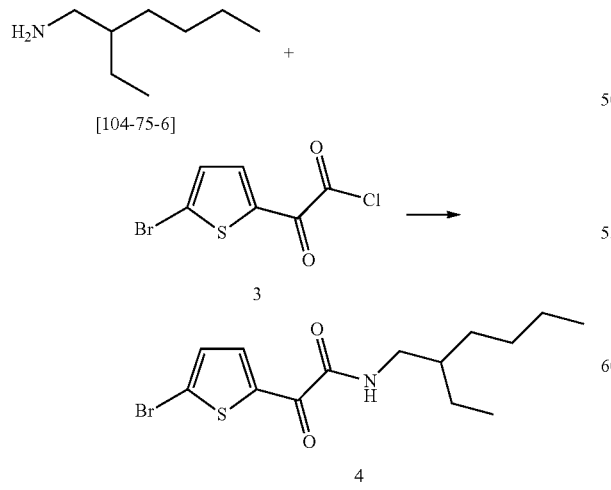

d') alternatively 2-Ethyl-1-hexylamine [104-75-6] and one equivalent of compound 3 are reacted 1 hour together with 1 equivalent of triethylamine at room temperature in methylene chloride to give compound 4. Compound 4 is purified by column chromatography.

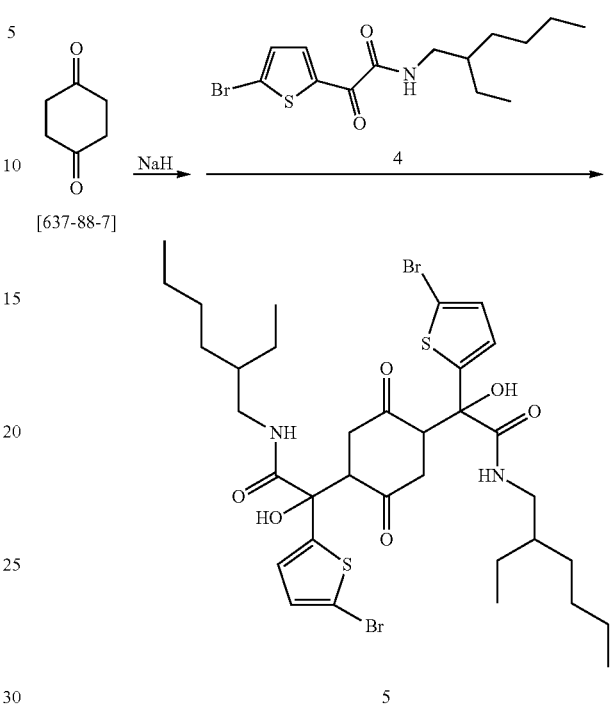

e) 360 mg of sodium hydride (60% in mineral oil) are placed in a reaction flask under nitrogen. Then 15 ml of dry tetrahydrofurane are added at −30° C., followed by the addition of a solution of 460 mg of 1,4-Cyclohexanedione [637-88-7] in 15 ml of dry tetrahydrofurane at −30° C. The reaction mixture is stirred for 30 minutes at −30° C. Then a solution of compound 4 in 15 ml of dry tetrahydrofurane is added drop wise at −30° C. The reaction mixture is stirred for another 30 minutes at −30° C. and then 1 hour at 0° C. The reaction is quenched by the addition of water, and the product is extracted with ethyl acetate. A mixture of several compounds is obtained as shown by HPLC-MS, where two compounds contained show the correct mass of 804 with area % of 50.81% and 25.37% respectively, which corresponds to 2 stereo isomers of compound 5. This mixture of compounds is directly used in the next reaction.

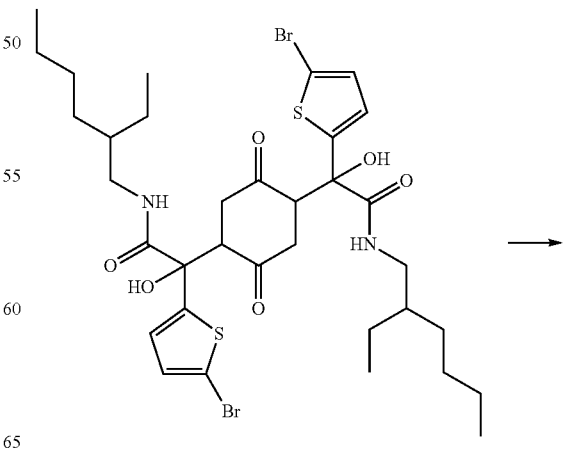

-continued

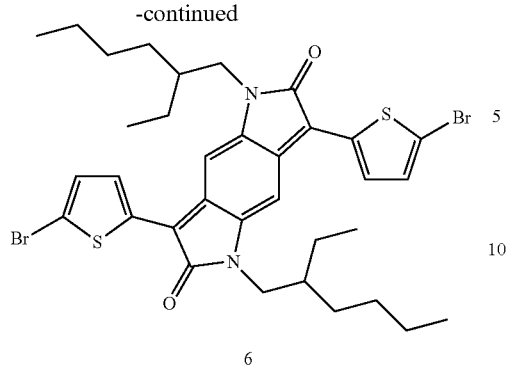
6 f) 3.20 g of compound 5 (mixture containing stereo isomers) is dissolved in 20 ml methylene chloride at room temperature, and then 0.25 ml of concentrated sulphuric acid are added drop wise under stirring. The reaction mixture quickly turns to dark violet. The reaction mixture is stirred for another hour at room temperature. The reaction mixture is washed with water, dried and evaporated. Compound 6 [=Cpd. 1-1] is obtained after column chromatography over silica gel. $^1$H-NMR data (ppm, CDCl$_3$): 7.62 2H d, 7.05 2H d, 6.33 2H s, 3.54-3.38 4H m, 1.67 2H m, 1.42-1.26 16H m, 0.91 6H t, 0.87 6H t;

Example 2

Synthesis of Compound 9

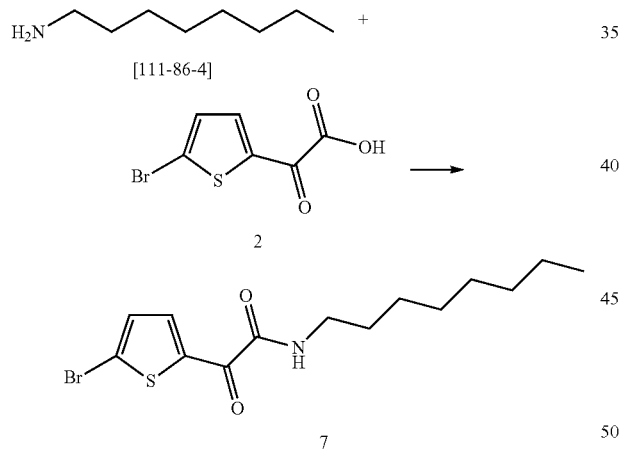

a) Compound 7 is obtained in analogy to compound 4 starting from compound [111-86-4] and compound 2. $^1$H-NMR data (ppm, CDCl$_3$): 7.99 1H d, 7.20 1H m, 7.09 1H d, 3.29 2H dxt, 1.51 2H m, 1.38-1.14 12H m. 0.80 3H t:

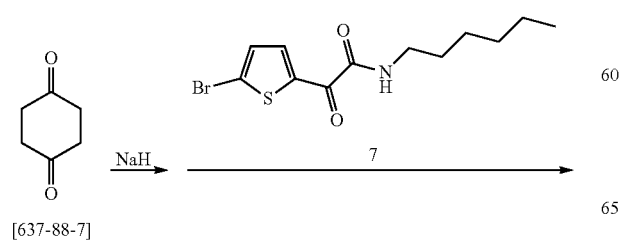

-continued

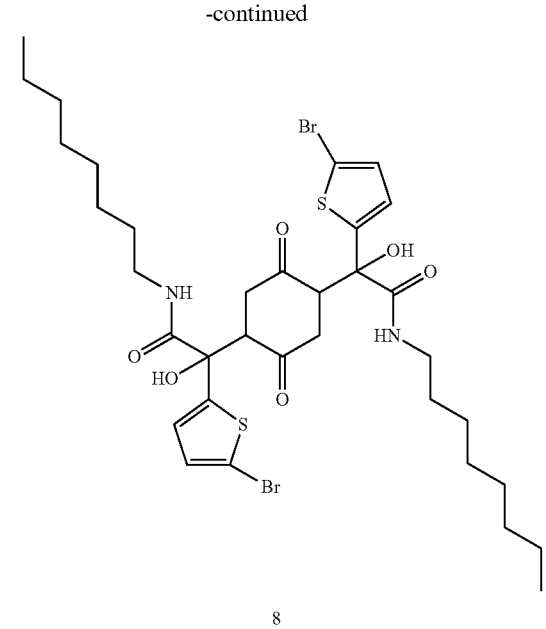
8 b) Compound 8 is obtained in analogy to compound 5 starting from compound [637-88-7] and compound 7. Compound 8 is used directly in the synthesis of compound 9 without purification.

c) Compound 9 [=Cpd. 1-2] is obtained in analogy to compound 6 starting from compound compound 8. $^1$H-NMR data (ppm, CDCl$_3$): 7.68 2H d, 7.13 2H d, 6.42 2H s, 3.66 4H t, 1.67 2H m, 1.53 2H m, 1.48-1.21 16H m, 0.86 6H t;
Example 3
Synthesis of Compound 12
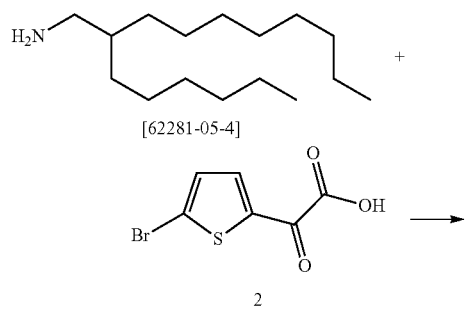
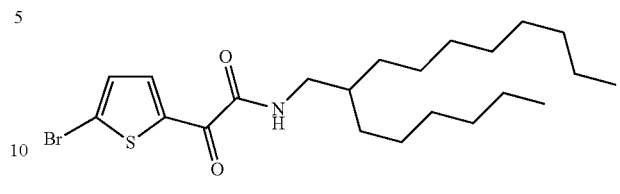
a) Compound 10 is obtained in analogy to compound 4 starting from compound [62281-05-4] and compound 2. $^1$H-NMR data (ppm, CDCl$_3$): 7.99 1H d, 7.18 1H m, 7.09 1H d, 3.23 2H t, 1.52 1H m, 1.35-1.15 24H m, 0.81 3H t, 0.78 3H t;
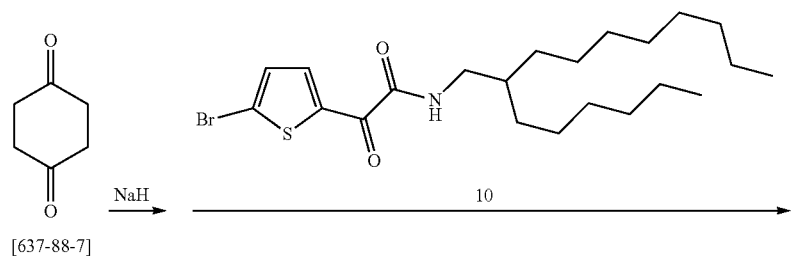
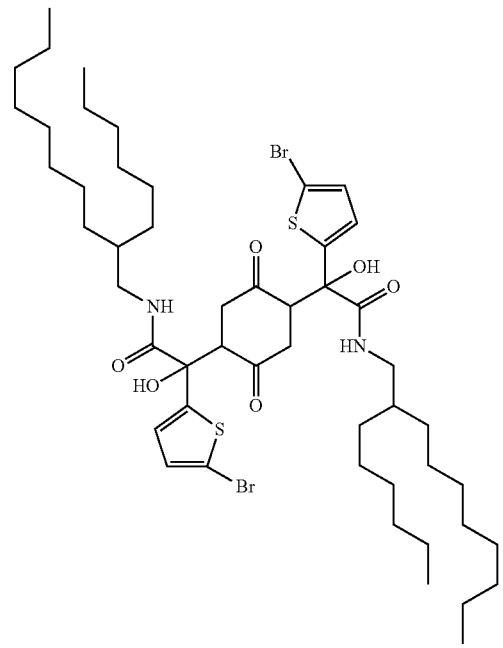

b) Compound 11 is obtained in analogy to compound 5 starting from compound [637-88-7] and compound 10. Compound 11 is used directly in the synthesis of compound 12 without purification.

c) Compound 12 [=Cpd. 1-3] is obtained in analogy to compound 6 starting from compound 11. $^1$H-NMR data (ppm, CDCl$_3$): 7.62 2H d, 7.05 2H d, 6.35 2H s, 3.45 4H d, 1.72 2H m, 1.40-1.12 48H m, 0.80 6H t, 0.79 6H t;

Example 4

Synthesis of Compound 15

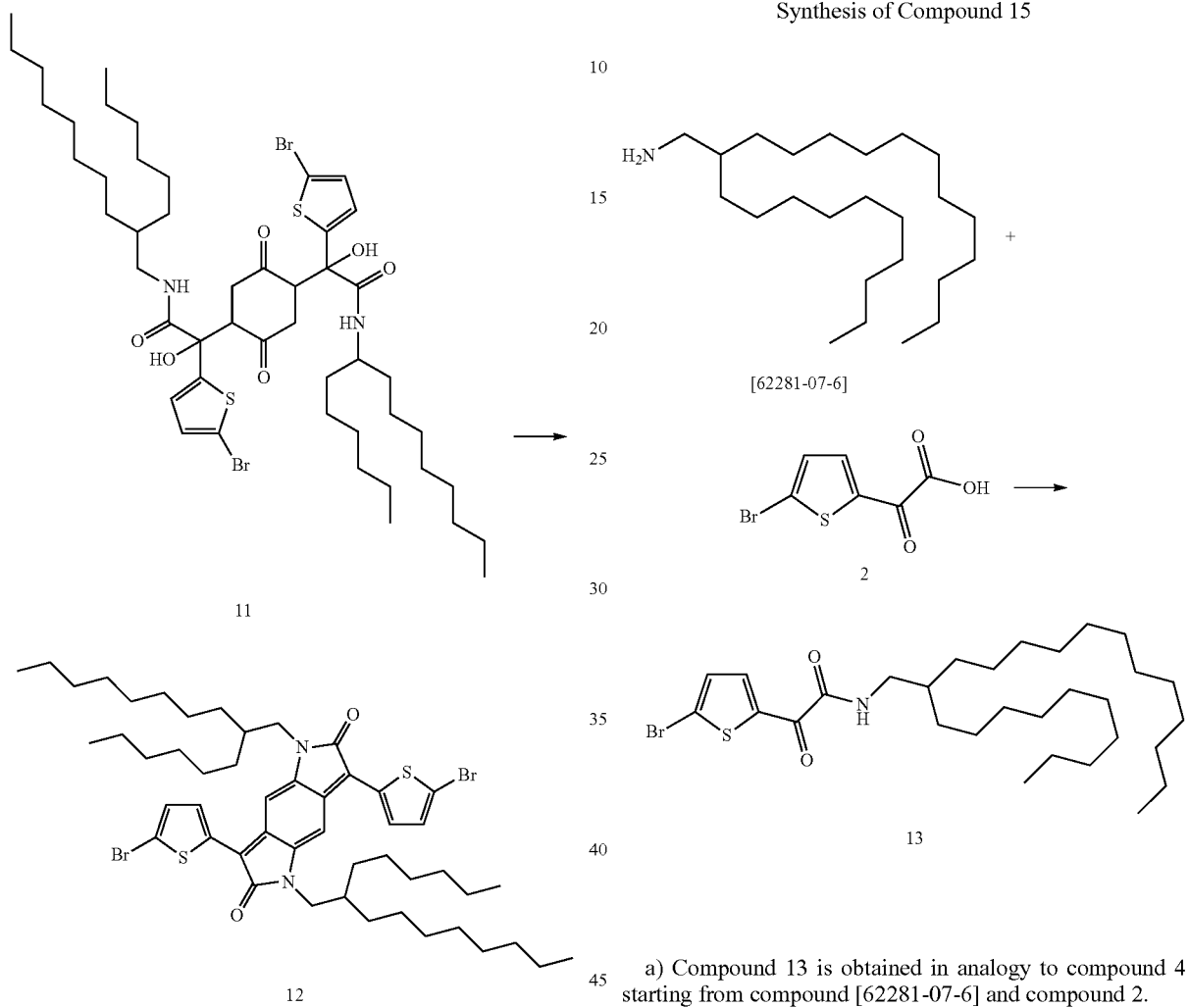

a) Compound 13 is obtained in analogy to compound 4 starting from compound [62281-07-6] and compound 2.
$^1$H-NMR data (ppm, CDCl$_3$): 8.08 1H d, 7.27 1H dxd, 7.18 1H d, 3.32 2H t, 1.61 1H m, 1.38-1.25 40H m, 0.90 6H t.

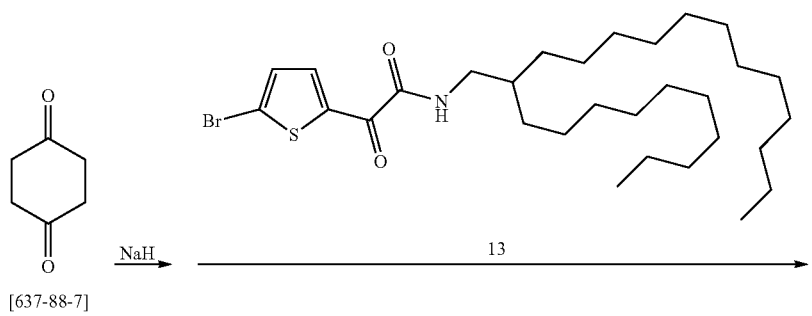

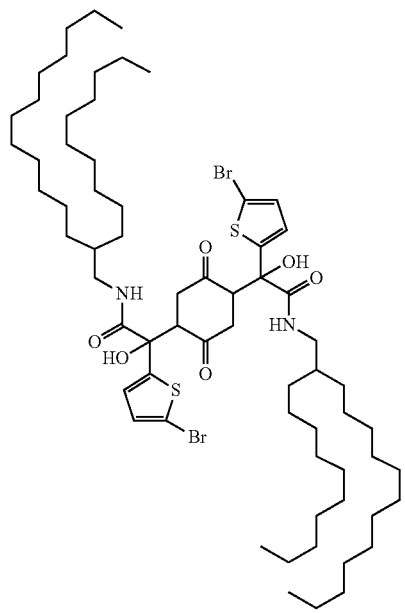
14
[b)] Compound 14 is obtained in analogy to compound 5 starting from compound [637-88-7] and compound 13. Compound 14 is used directly in the synthesis of compound 15 without purification.
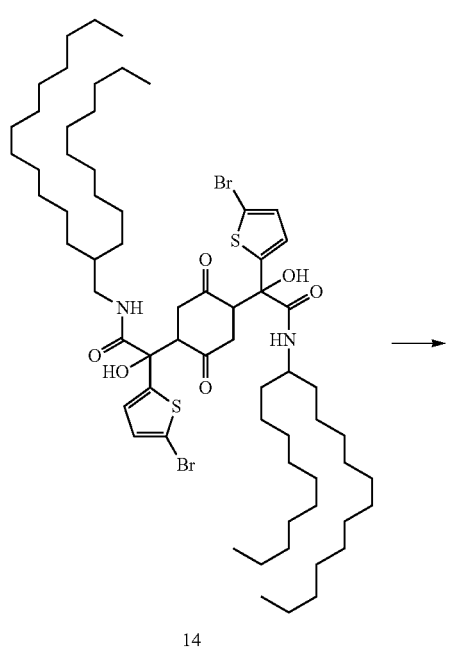
14
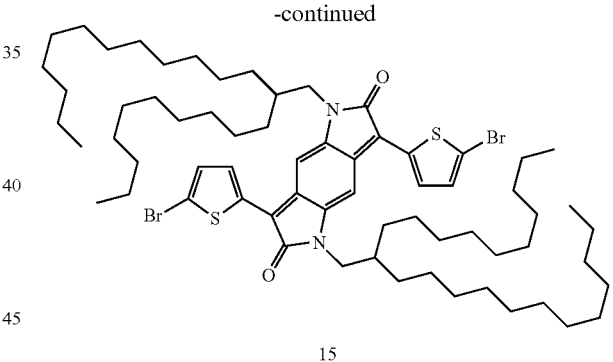
15
c) Compound 15 [=Cpd. 1-4] is obtained in analogy to compound 6 starting from compound 14. $^1$H-NMR data (ppm, CDCl$_3$): 7.62 2H d, 7.05 2H d, 6.36 2H s, 3.46 4H d, 1.73 2H m, 1.40-1.12 80H m, 0.80 6H t, 0.79 6H t.
Example 5
Synthesis of Compound 18
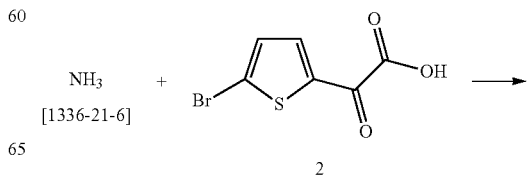

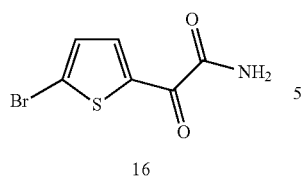

a) Compound 16 is obtained in analogy to compound 4 starting from ammonium hydroxide [1336-21-6] and compound 2.

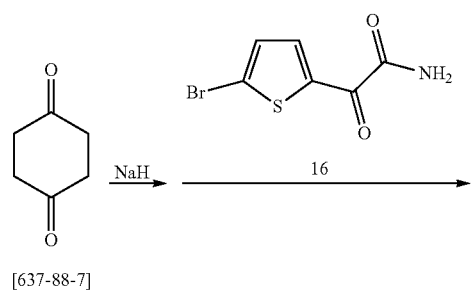

[637-88-7]

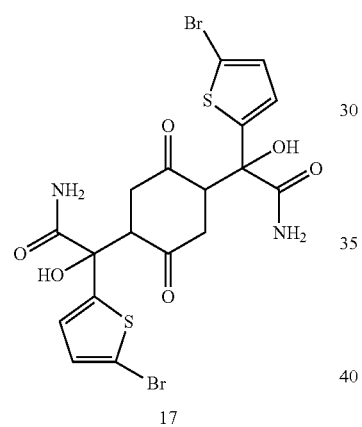

17 b) Compound 17 is obtained in analogy to compound 5 starting from compound [637-88-7] and compound 16. Compound 17 is used directly in the synthesis of compound 18 without purification.

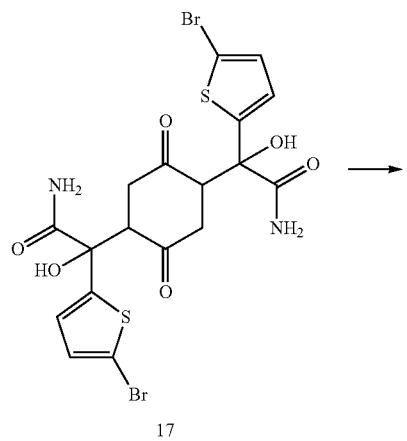

17 c) Compound 18 [=Cpd. 1-5] is obtained in analogy to compound 6 starting from compound 17.

Example 6

Synthesis of Compound 24

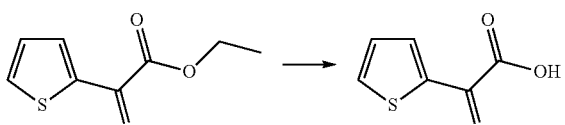

a) Compound 19 is obtained in analogy to compound 1 starting from thiophene [110-02-1] and ethyl-chlorooxoacetate [4755-77-5].

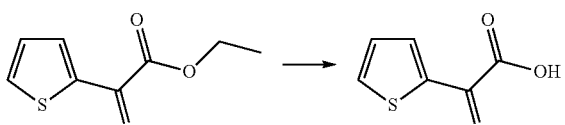

b) Compound 20 is obtained in analogy to compound 2 by hydrolysis of compound 19.

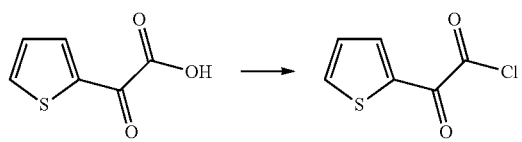

c) Compound 21 is obtained in analogy to compound 3 from compound 20.
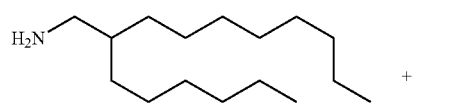
[62281-05-4]
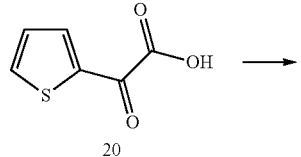
20
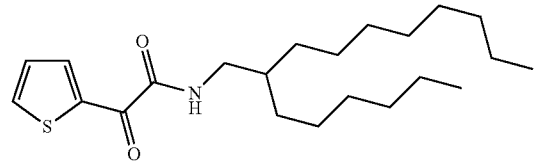
22
d) Compound 22 is obtained in analogy to compound 4 from compound 20 and the amine [62281-05-4].
¹H-NMR data (ppm, CDCl₃): 8.33 1H d, 7.75 1H d, 7.19 1H dxd, 7.11 1H dxd, 3.24 2H t, 1.53 1H m, 1.35-1.15 24H m, 0.81 6H t.
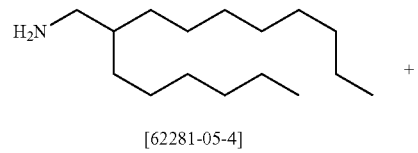
[62281-05-4]
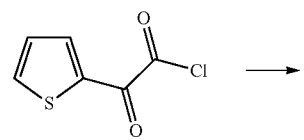
21
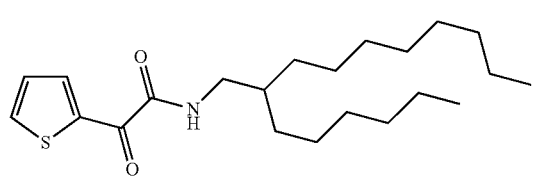
22
d') Alternatively compound 22 is obtained in analogy to compound 4 from compound 21 and the amine [62281-05-4] via procedure d'.
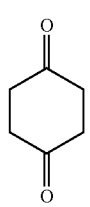
[637-88-7]
NaH
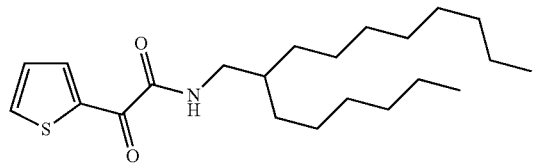
22
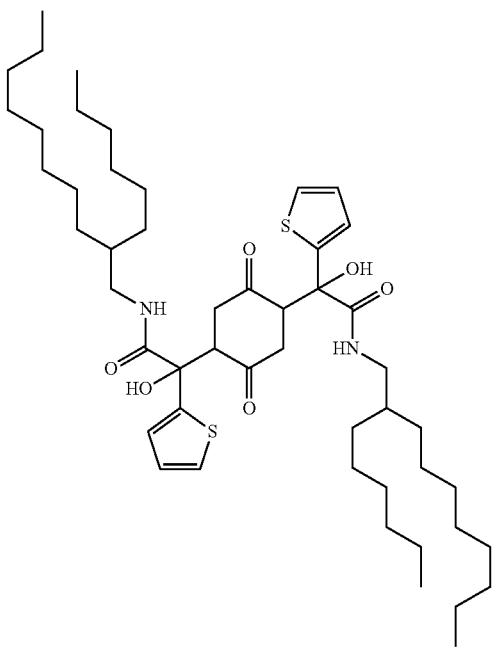
23 e) Compound 23 is obtained in analogy to compound 5 starting from compound [637-88-7] and compound 22. Compound 23 is used directly in the synthesis of compound 24 without purification.
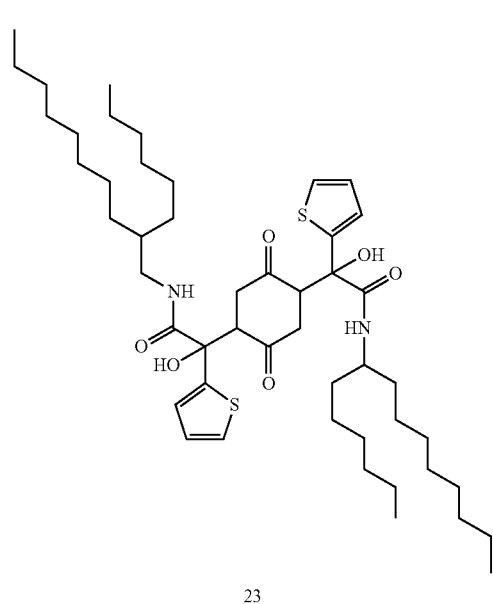
23
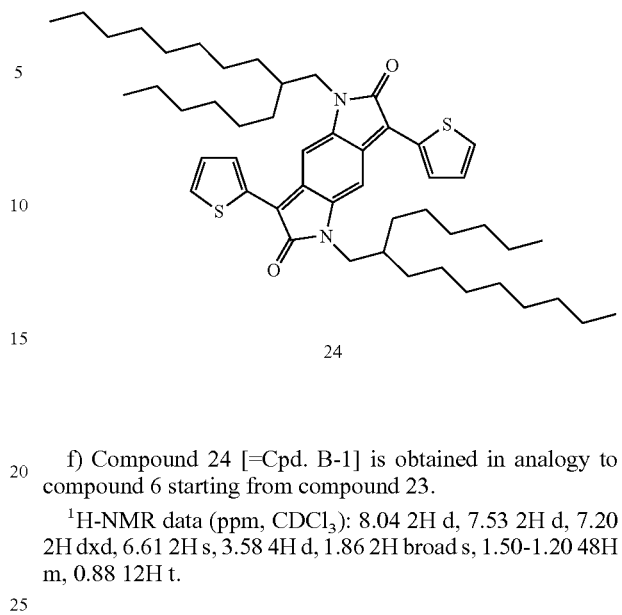
24
f) Compound 24 [=Cpd. B-1] is obtained in analogy to compound 6 starting from compound 23.
$^1$H-NMR data (ppm, CDCl$_3$): 8.04 2H d, 7.53 2H d, 7.20 2H dxd, 6.61 2H s, 3.58 4H d, 1.86 2H broad s, 1.50-1.20 48H m, 0.88 12H t.
Example 7
Synthesis of Compound 25
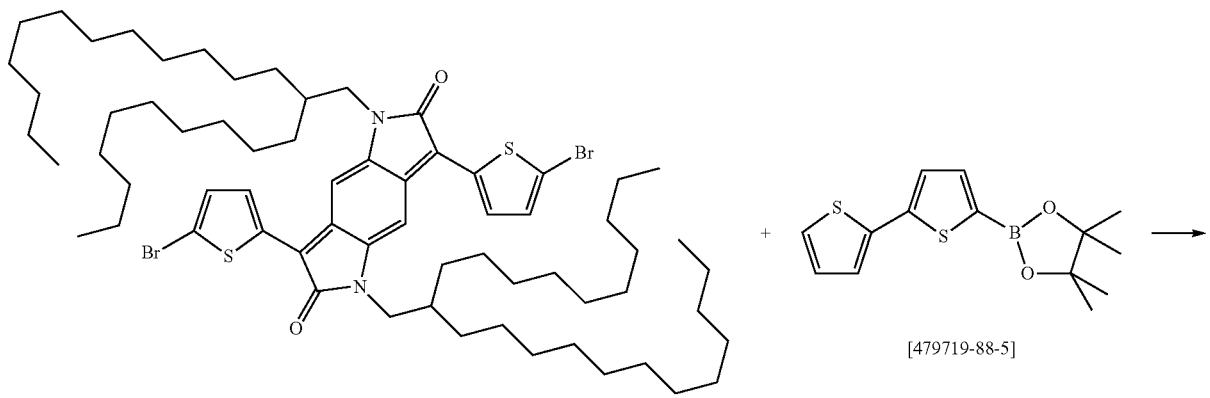
15
[479719-88-5]
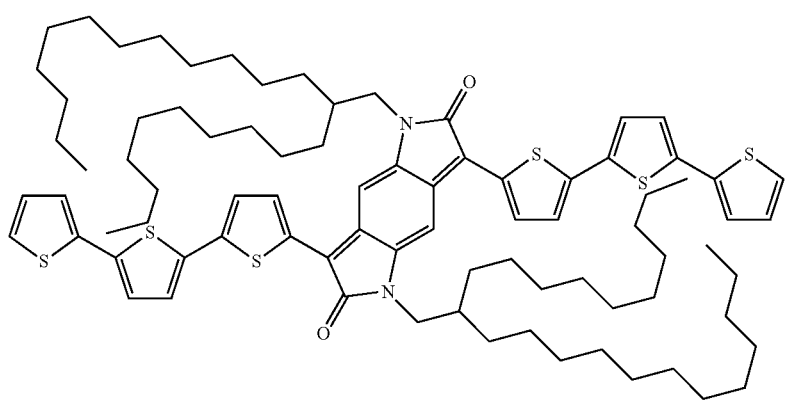
25

0.5 g of compound 15, 0.272 g of bithiophene-boronic acid pinacol ester [479719-88-5], 4 mg palladium(II)acetate and 19 mg of 2-(di-tert-butyl-phsophino)-1-phenyl-1H-pyrrole [672937-61-0] are placed in a reactor under argon. 20 ml of degassed tetrahydrofurane is added and the mixture is heated to reflux. Then 107 mg of lithium hydroxyde monohydrate are added. The reaction is stirred 2 hours at reflux. The color changes from violet to green. Then the reaction mixture is poured on water and the product is extracted with methylene chloride. The organic phase is dried and evaporated. Compound 25 [=Cpd. B-8] is obtained after purification by chromatography over silica gel. $^1$H-NMR data (ppm, CDCl$_3$): 7.81 2H d, 7.14 2H d, 7.06 4H d, 7.01 2H d, 6.96-6.91 4H m, 6.35 2H s, 3.45 4H d, 1.71 2H m, 1.40-1.10 80H m, 0.78 6H t, 0.77 6H t;

Example 8

Synthesis of Compound 26

0.7 g of compound 12, 0.54 g of bithiophene-boronic acid pinacol ester [479719-88-5], 13 mg of Pd$_2$(dba)$_3$ [51364-51-3] and 13 mg of tri-tert-butyl-phosphino-tetra-fluoroborate are placed in a reactor under argon. Then 14 ml of degassed tetrahydrofurane are added and the reaction mixture is stirred some minutes at 45° C. Then a degassed solution of 776 mg of K$_3$PO$_4$ in 1.4 ml of water is added, and the reaction mixture is then stirred for 1 hour at reflux. The color of the reaction mixture is turning from violet to green. The reaction mixture is poured into methanol. The resulting solid is filtered and washed with methanol and water. The solid is then dissolved in hot 1,2-dichlorobenzene and mixed with silica gel. The cooled slurry is then filtered and washed with 1,2-dichlorobenzene. The silica powder is then added to a Soxhlet cartridge and compound 26 [=Cpd. B-3] is obtained by Soxhlet extraction with chloroform. Finally the product is purified by recrystallization from chloroform. $^1$H-NMR data (ppm, CDCl$_3$): 7.86 2H d, 7.15 2H d, 7.12 2H d, 7.11-7.08 4H

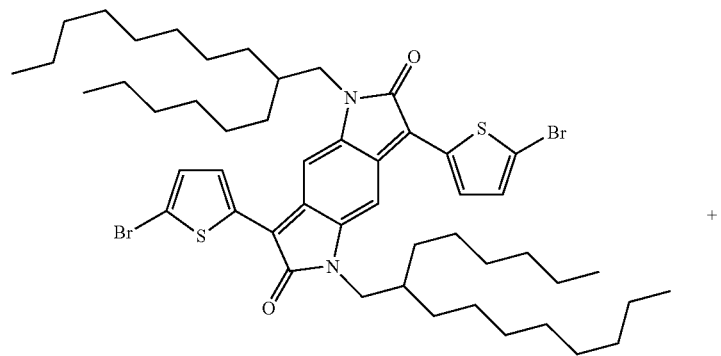

12

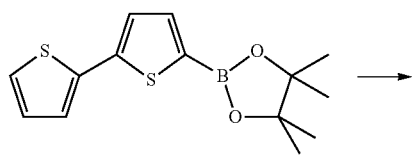

[479719-88-5]

+

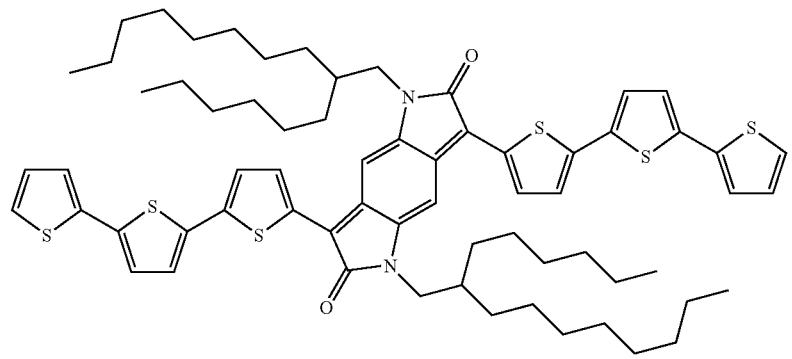

26 m, 6.95 2H dxd, 6.47 2H s, 3.51 4H d, 1.77 2H m, 1.40-1.12 48H m, 0.77 6H t, 0.75 6H t;

Example 9

Synthesis of Compound 27

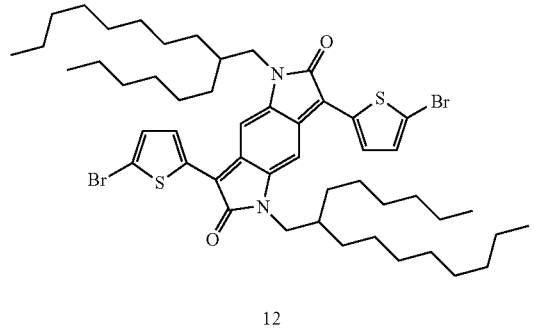

12

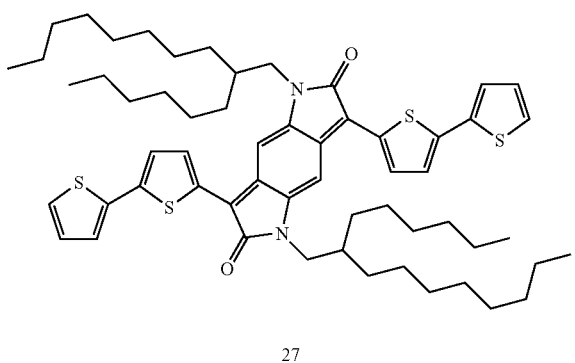

27

Compound 27 is synthesized in analogy to compound 26 starting from compound 12 and thiopheneboronicacid-pinacolester [193978-23-3]. Compound 27 [=Cpd. B-2] is then obtained after purification by chromatography over silica gel. $^1$H-NMR data (ppm, CDCl$_3$): 7.85 2H d, 7.22-7.19 4H m, 7.15 2H d, 6.97 2H dxd, 6.47 2H s, 3.49 4H d, 1.76 2H m, 1.40-1.12 48H m, 0.78 6H t, 0.77 6H t;

Example 10

Synthesis of Polymer 28

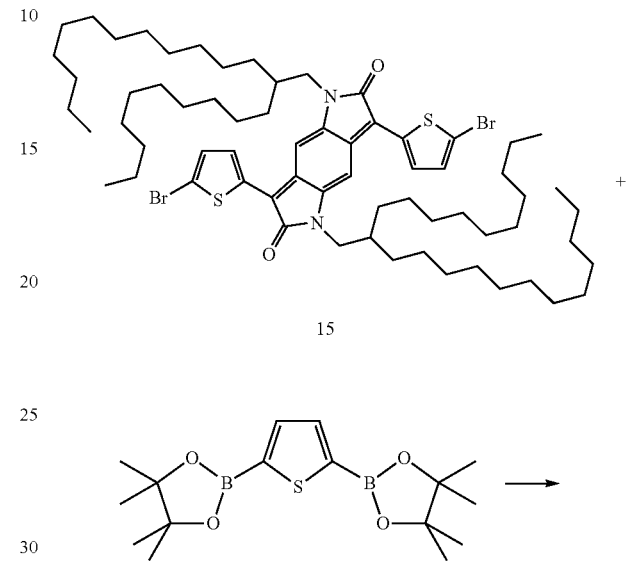

28

0.8 g of the dibromo compound 15, 0.228 g of the bis-boronicacidester compound [175361-81-6], 0.8 mg palladium(II)acetate, and 4.6 mg of 2-(Di-tert-butyl-phosphino)-1-phenylindole [740815-37-6] are placed in a reactor. The reactor is degassed with Argon and then 12 ml of degassed tetrahydrofurane are added. The reaction mixture is heated to reflux, and then 170 mg of lithium hydroxide monohydrate are added. The reaction mixture is refluxed for another two hours. The dark solution is then poured on a mixture of ethanol-water where the polymer precipitates. The mixture is filtered and the polymer is washed with water. Then the polymer is dissolved in chloroform and washed three times with water. The polymer is then precipitated by adding acetone, filtered and dried. The polymer 28 [=Polymer P-1] is then Soxhlet fractionated with THF (HT-GPC: Mw 102293, PD 4.33) and chloroform (HT-GPC: Mw 121263, PD 4.18).

Example 11

Synthesis of Compound 12

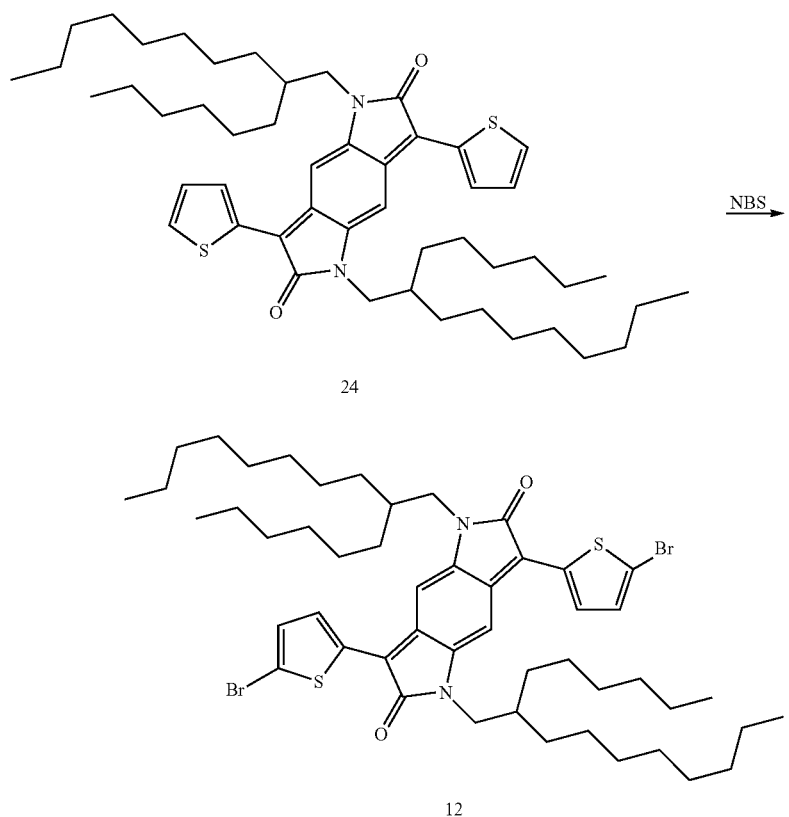

1 g of compound 24 is dissolved in CHCl$_3$. Then 2 equivalents of N-bromo-succinimid and 0.035 equivalents of 70% perchloric acid are added and the reaction mixture is stirred for 4 h at 0° C. The organic phase is washed with water, dried and evaporated. The product 12 [=Cpd. 1-6] is purified by column chromatography on silica gel. $^1$H-NMR data (ppm, CDCl$_3$): 7.62 2H d, 7.05 2H d, 6.35 2H s, 3.45 4H d, 1.72 2H m, 1.40-1.12 48H m, 0.80 6H t, 0.79 6H t;

Example 12

Synthesis of Compound 34

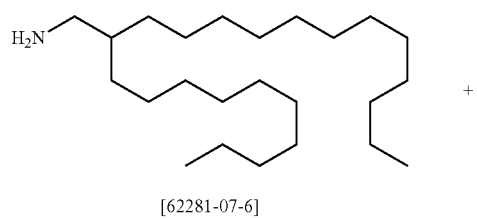

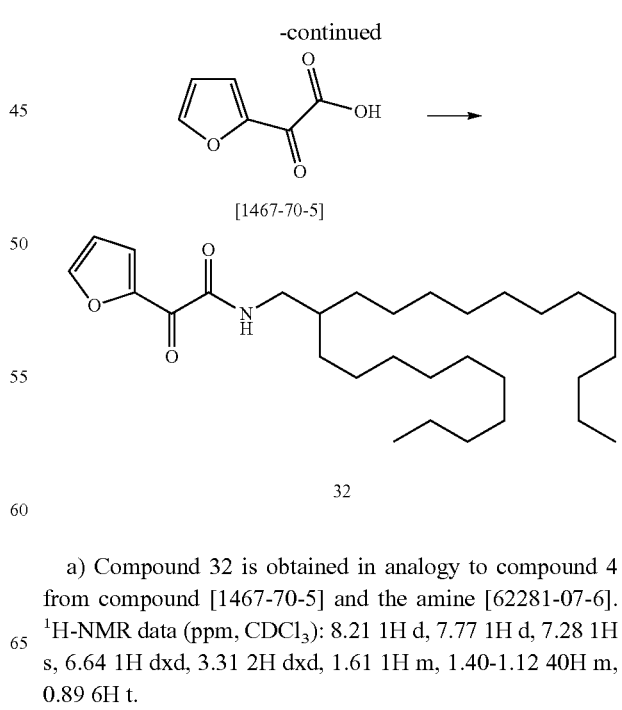

a) Compound 32 is obtained in analogy to compound 4 from compound [1467-70-5] and the amine [62281-07-6]. $^1$H-NMR data (ppm, CDCl$_3$): 8.21 1H d, 7.77 1H d, 7.28 1H s, 6.64 1H dxd, 3.31 2H dxd, 1.61 1H m, 1.40-1.12 40H m, 0.89 6H t.

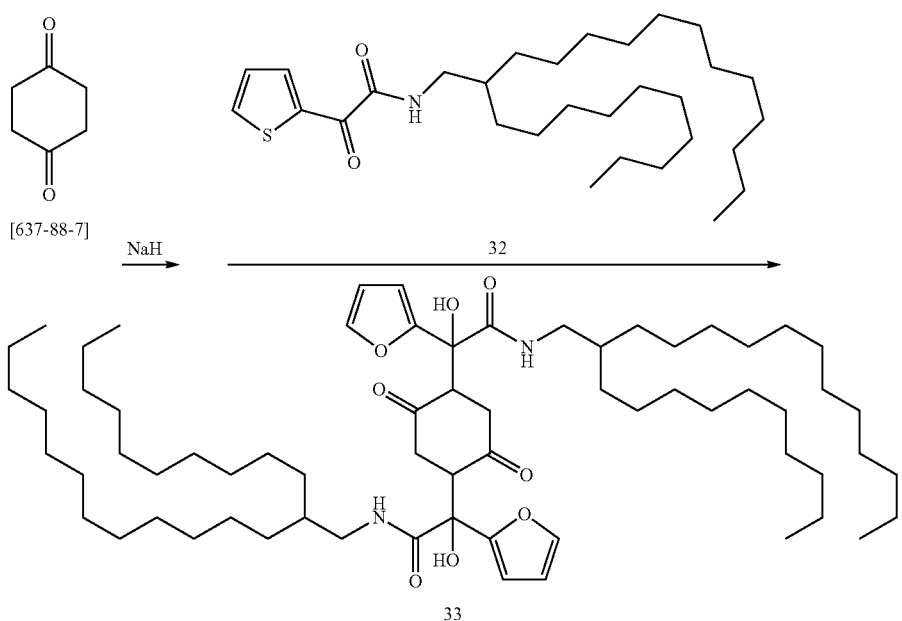
b) Compound 33 is obtained in analogy to compound 5 starting from compound [637-88-7] and compound 32. Compound 33 is used directly in the synthesis of compound 34 without purification.
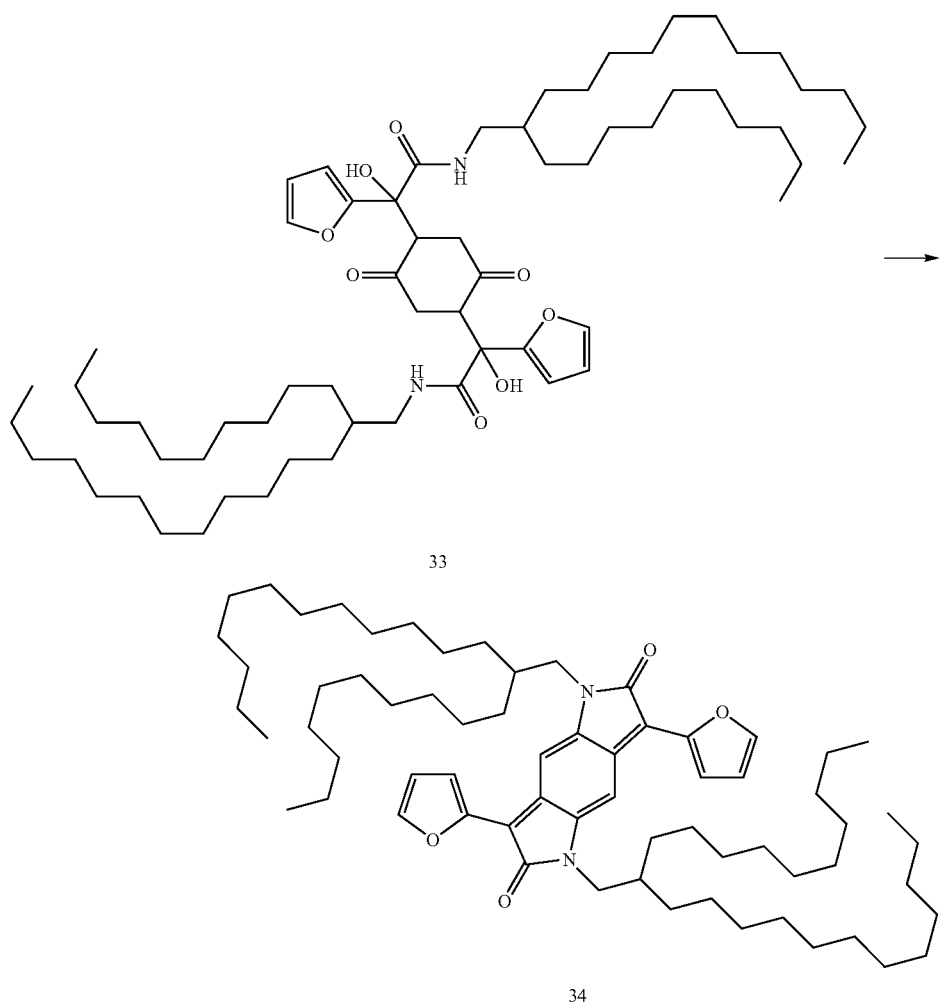 [SMILES: CCCCCCCCCCCCC(CCCCCCCCCC)CNC(=O)C(O)(c1ccco1)C1CC(=O)C(C(O)(C(=O)NCC(CCCCCCCCCC)CCCCCCCCCCCC)c2ccco2)CC1=O ; CCCCCCCCCCCCC(CCCCCCCCCC)CN1C(=O)C(c2ccco2)=c2cc3c(cc21)=C(c1ccco1)C(=O)N3CC(CCCCCCCCCC)CCCCCCCCCCCC]

c) Compound 34 [=Cpd. B-6] is obtained in analogy to compound 6 starting from compound 33.

Example 13

Synthesis of Compound 35 a) Compound 36 is obtained in analogy to compound 1 starting from thienothiophene [251-41-2] and ethyl-chlorooxoacetate [4755-77-5]. $^1$H-NMR data (ppm, CDCl$_3$): 8.39 1H s, 7.74 1H d, 7.36 1H d, 4.44 2H q, 1.46 3H t.

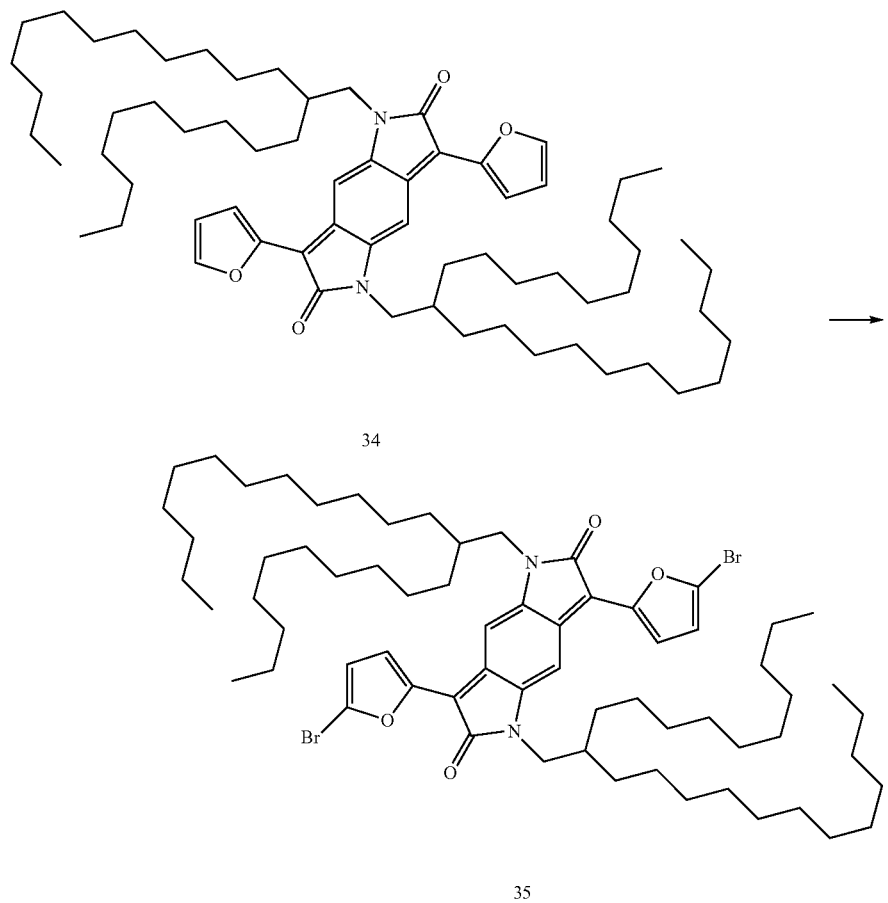

Compound 35 [=Cpd. 1-8] is obtained in analogy to example 11 starting from compound 34 but without adding perchloric acid.

Example 14

Synthesis of Compound 41

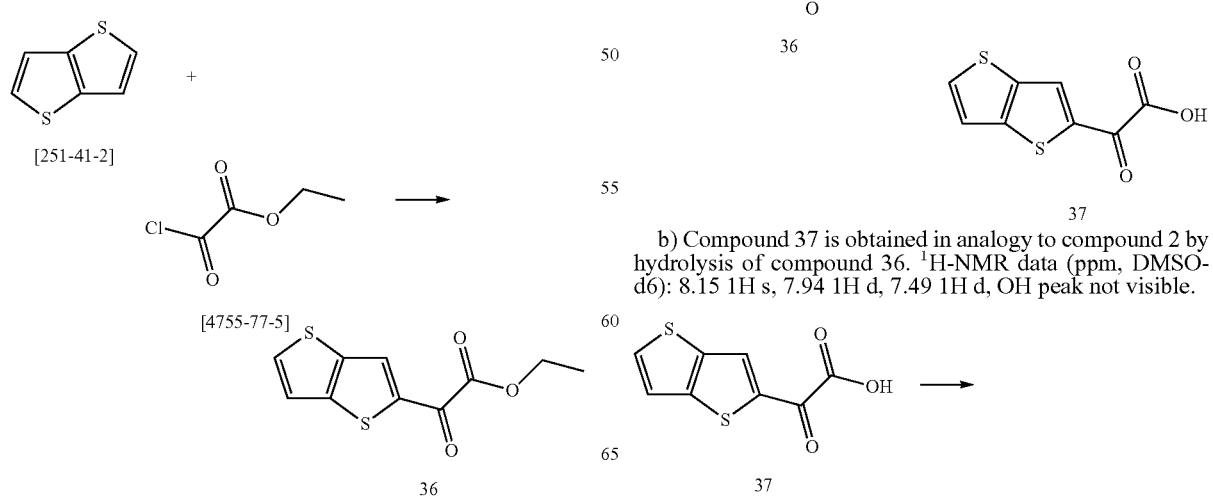

b) Compound 37 is obtained in analogy to compound 2 by hydrolysis of compound 36. $^1$H-NMR data (ppm, DMSO-d6): 8.15 1H s, 7.94 1H d, 7.49 1H d, OH peak not visible.

d) Compound 39 is obtained in analogy to compound 4 from compound 37 and the amine [62281-07-6].
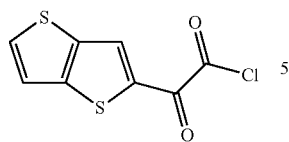
c) Compound 38 is obtained in analogy to compound 3 from compound 37.
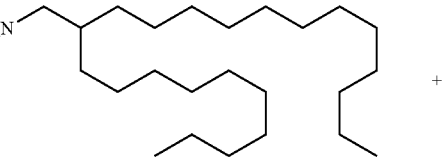
[62281-07-6]
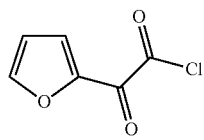
38
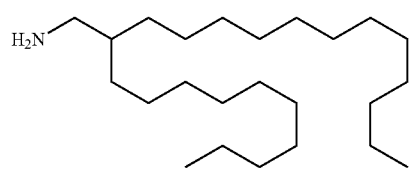
37
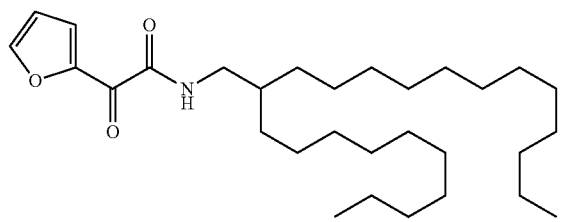
39
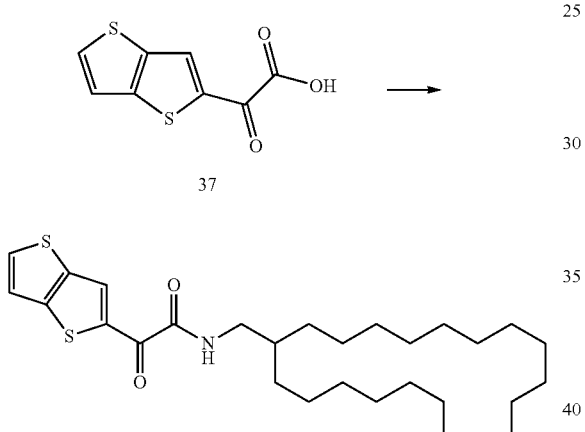
39
d') Alternatively compound 39 is obtained in analogy to compound 4 from compound 38 and the amine [62281-07-6] via procedure d'.
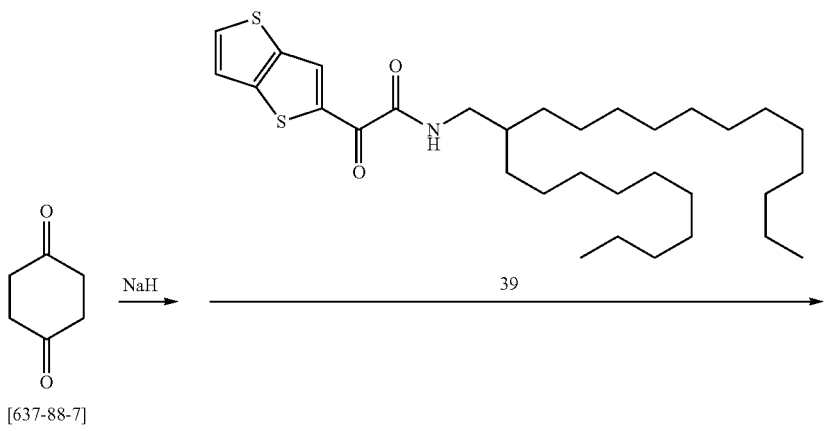
[637-88-7]

-continued
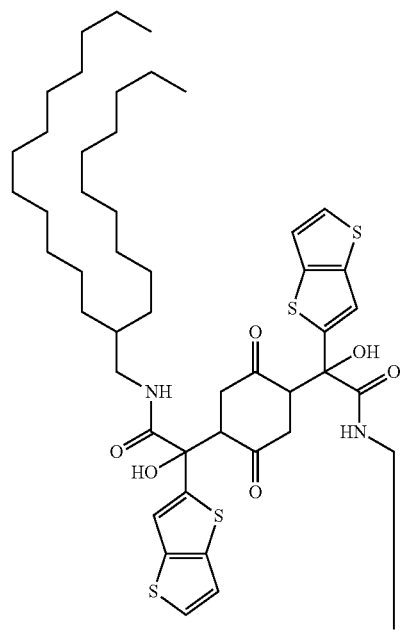
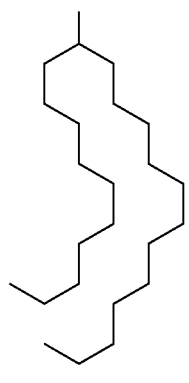
40
e) Compound 40 is obtained in analogy to compound 5 starting from compound [637-88-7] and compound 39. Compound 40 is used directly in the synthesis of compound 41 without purification.

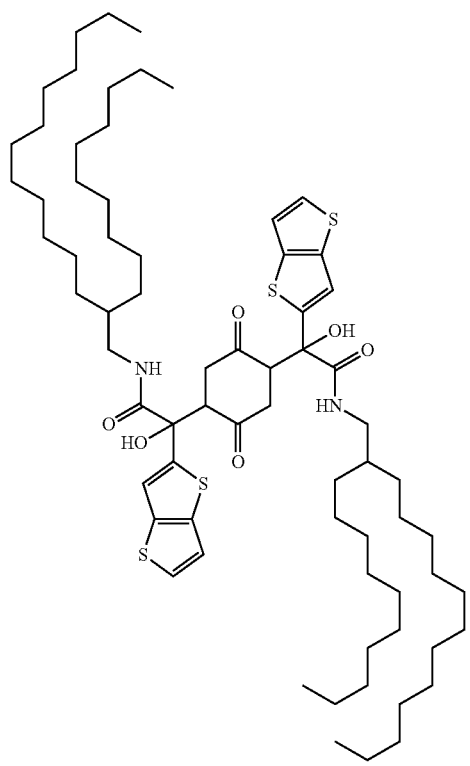
40
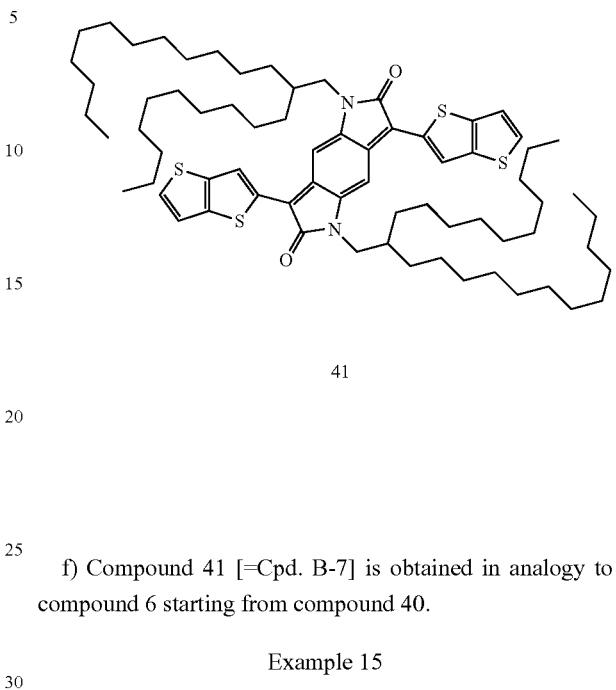
41
f) Compound 41 [=Cpd. B-7] is obtained in analogy to compound 6 starting from compound 40.
Example 15
Synthesis of Compound 42
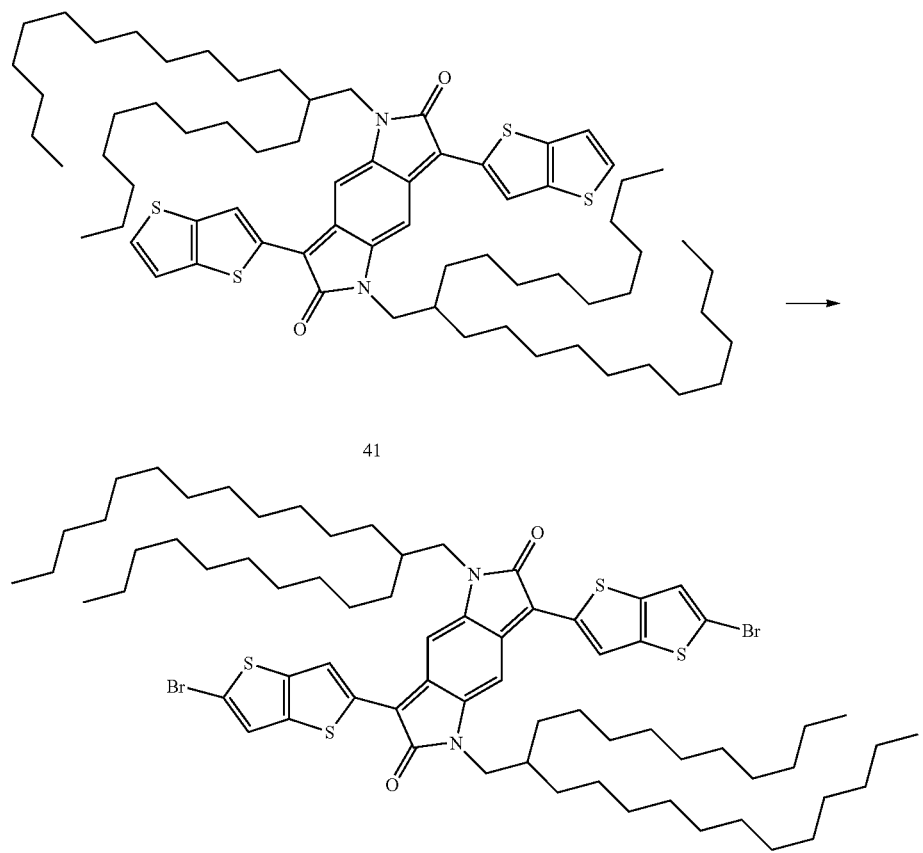
41
42

Compound 42 [=Cpd. 1-7] is obtained in analogy to example 11 starting from compound 41.
Example 16
Synthesis of Compound 44
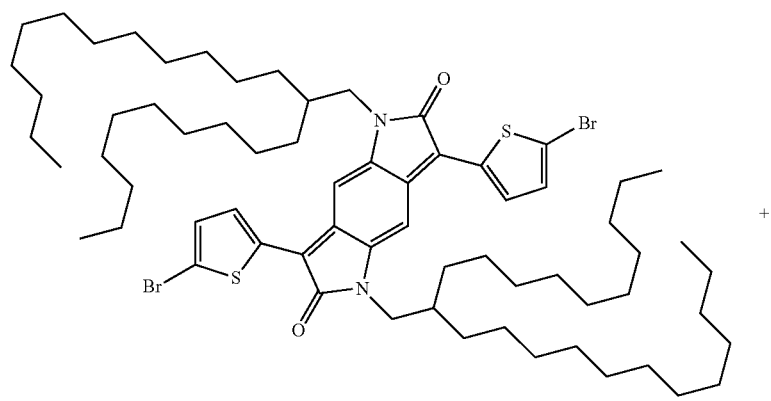
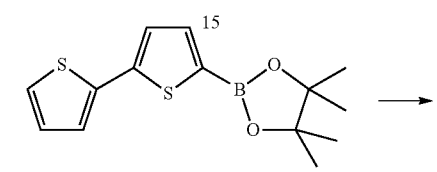
[479719-88-5]
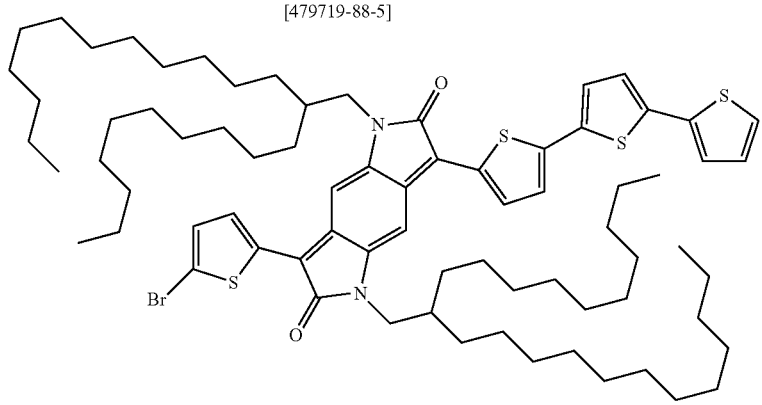
43
a) Compound 43 is obtained in analogy to compound 25 starting from compound 15 by using only 1 equivalent of compound [479719-88-5].
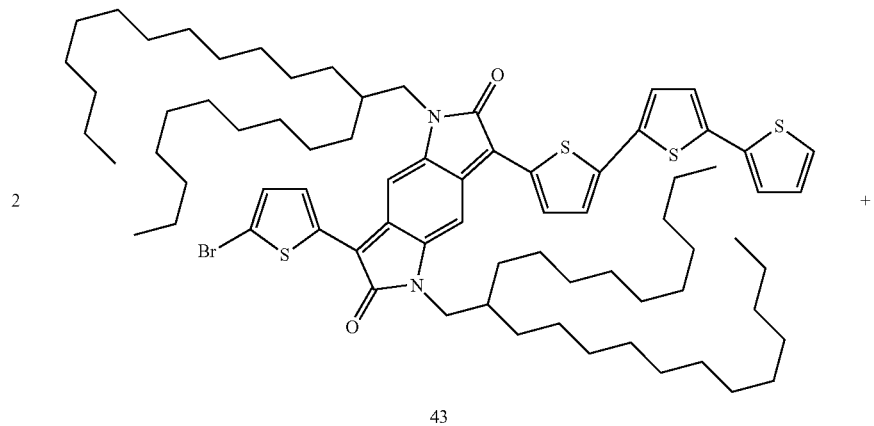
43

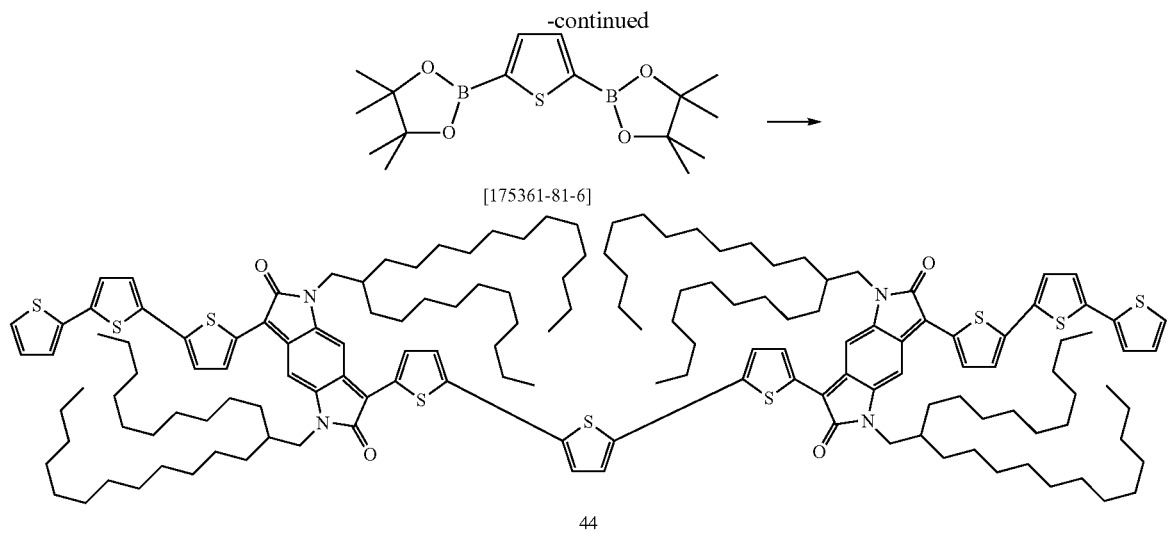

b) Compound 44 [=Cpd. C-1] is obtained in analogy to the method of compound 25 starting from two equivalents of compound 43 and 1 equivalent of compound [175361-81-6]. The ligand used is 2-(di-tert-butylphosphino)-1-phenylindole instead of 2-(di-tert-butyl-phsophino)-1-phenyl-1H-pyrrole [672937-61-0]

Application Example 1

Application of the Semiconducting Polymer 28

The semiconductor thin film is prepared by spin-coating the polymer of the formula 28 obtained in example 10 in a 0.5% (w/w) solution in chloroform. The spin coating is accomplished at a spinning speed of 3000 rpm (rounds per minute) for about 20 seconds in ambient conditions. The devices are evaluated as deposited and after being annealed at 100° C. for 15 minutes.

Transistor Performance

The transistor behavior is measured on an automated transistor prober (TP-10, CSEM Zürich) and showed clear transistor behavior.

Application Example 2

Photovoltaic Application of the Semiconducting Polymer 28 [=Polymer P-1]

The solar cell has the following structure: Al electrode/LiF layer/organic layer, including compound of the invention/[poly(3,4-ethylenedioxy-thiophene) (PEDOT)/poly(styrene-sulfonic acid) (PSS)]/ITO electrode/glass substrate. The solar cells are made by spin coating a layer of the PEDOT-PSS on a pre-patterned ITO on glass substrate. Then a 1:1 mixture of the polymer of formula 28 (1% by weight): [70]PCBM (a substituted $C_{20}$ fullerene) is spin coated (organic layer). LiF and Al are sublimed under high vacuum through a shadow-mask.

Solar Cell Performance

The solar cell is measured under a solar light simulator. Then with the External Quantum Efficiency (EQE) graph the current is estimated under AM1.5 conditions.

The OPV performance of Polymer P-1 is shown in the table below:

| Example | Semiconductor | $J_{sc}$, mA/cm$^2$ | Voc, V | FF, % | η, % |
|---|---|---|---|---|---|
| 11 | Polymer P-1 | −1.73 | 0.66 | 66.4 | 0.75 |

Example 17

Synthesis of Polymer 48 [=Polymer P-2]

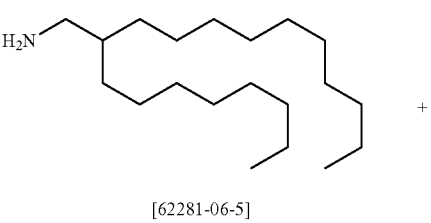

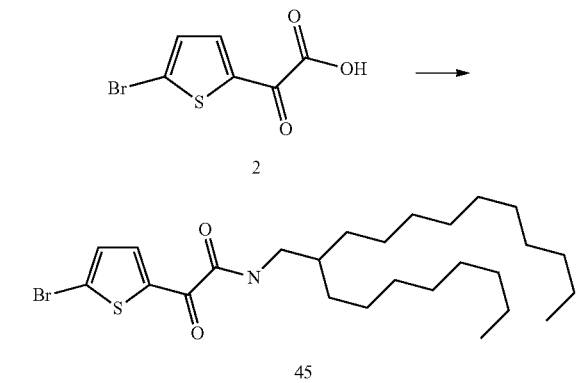

a) Compound 45 is obtained according to compound 4 starting from compound [62281-06-5] and compound 2.
$^1$H-NMR data (ppm, CDCl$_3$): 8.08 1H d, 7.26 1H dxd, 7.19 1H d, 3.32 2H t, 1.61 1H broad s, 1.38-1.25 32H m, 0.90 6H t.

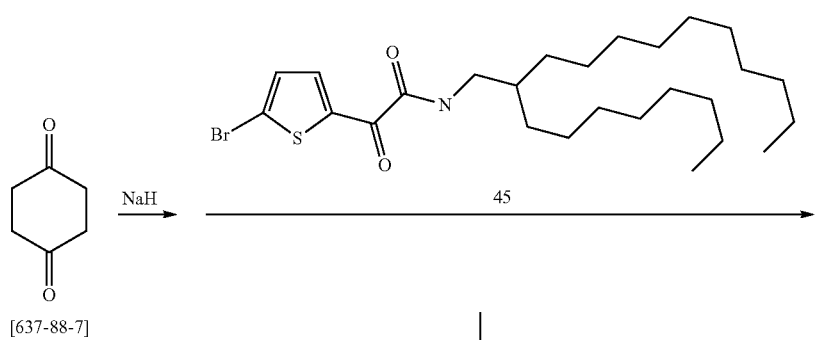
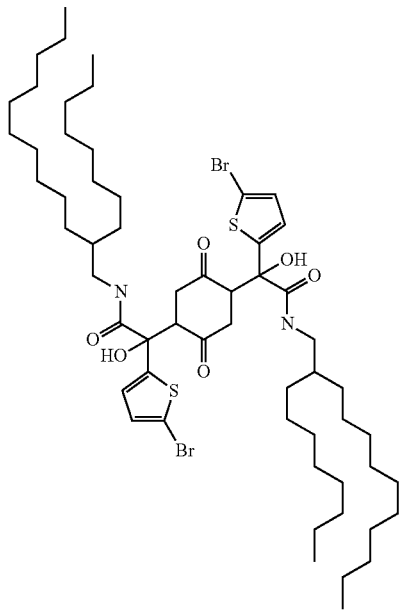
46
b) Compound 46 is obtained according to compound 5 starting from compound [637-88-7] and compound 45. Compound 46 is used directly in the synthesis of compound 47 without purification.
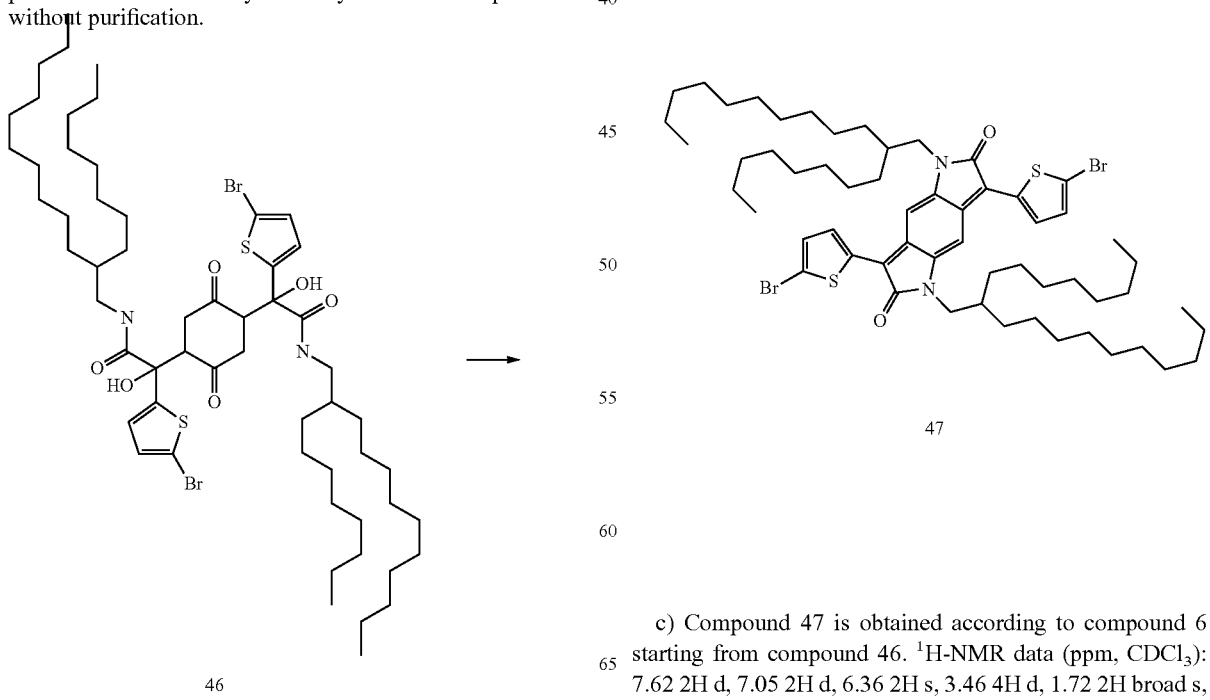
c) Compound 47 is obtained according to compound 6 starting from compound 46. $^1$H-NMR data (ppm, CDCl$_3$): 7.62 2H d, 7.05 2H d, 6.36 2H s, 3.46 4H d, 1.72 2H broad s, 1.40-1.12 64H m, 0.79 12H t.

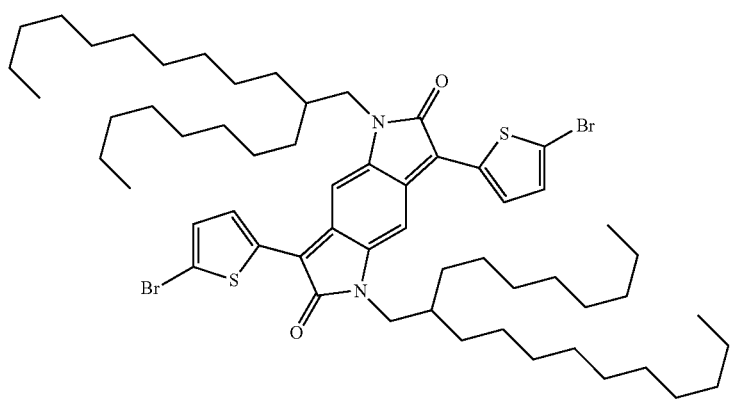

47

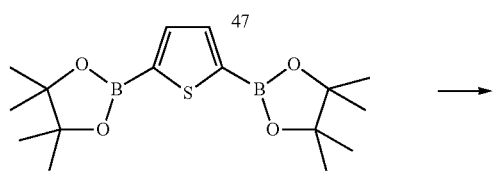

[175361-81-6]

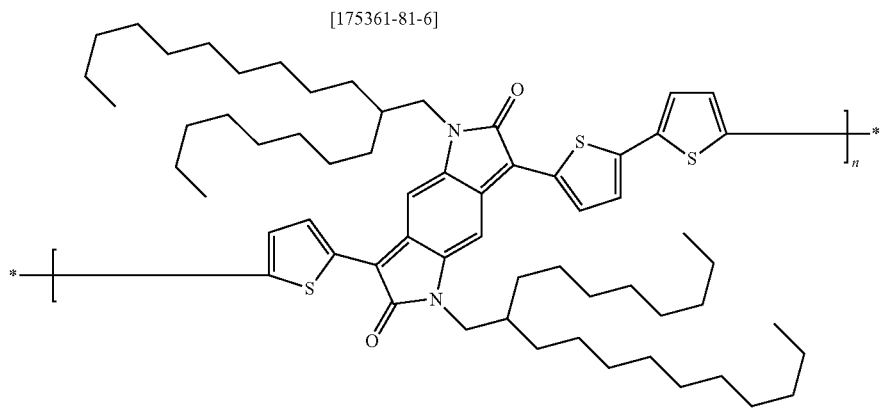

48 d) Polymer 48 [=polymer P-2] is synthesized according to the method of compound 28 starting from compound 47 and thiophene-di-boronicacid-pinacolester [175361-81-6] in a 1:1 ratio. The product is fractionated in a Soxhlet apparatus with tetrahydrofurane and chloroform. The chloroform fraction gives the following HT-GPC result: Mw 79192, PD 4.41.

Example 18

Synthesis of Compound 50 [=Cpd. C-2]

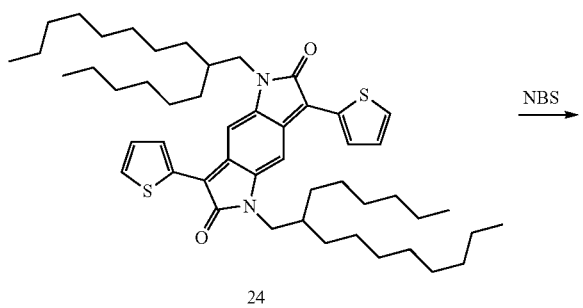

24

NBS →

-continued

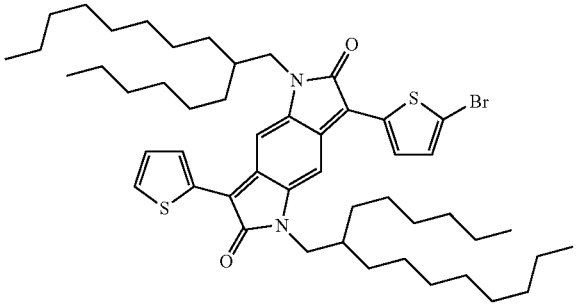

49 a) 0.7 g of compound 24 is dissolved in $CHCl_3$. Then 1 equivalent of N-bromo-succinimid is added and the reaction mixture is stirred for 1 h at −10° C. and for 1 hour at 0° C. The organic phase is washed with water, dried and evaporated. The product is purified by column chromatography on silica gel. $^1$H-NMR data (ppm, $CDCl_3$): 7.97 1H d, 7.62 1H d, 7.46 1H d, 7.13 1H dxd, 7.06 1H d, 6.54 1H s, 6.36 1H s, 3.49 4H d, 1.76 2H broad s, 1.45-1.15 48H m, 0.80 12H t.

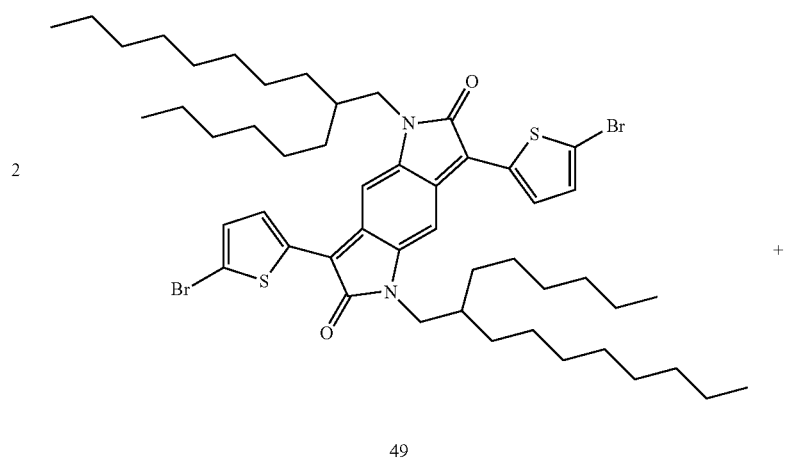

49

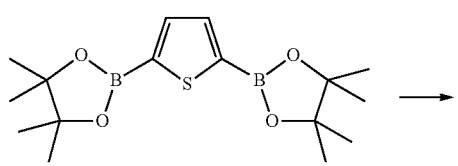

[175361-81-6]

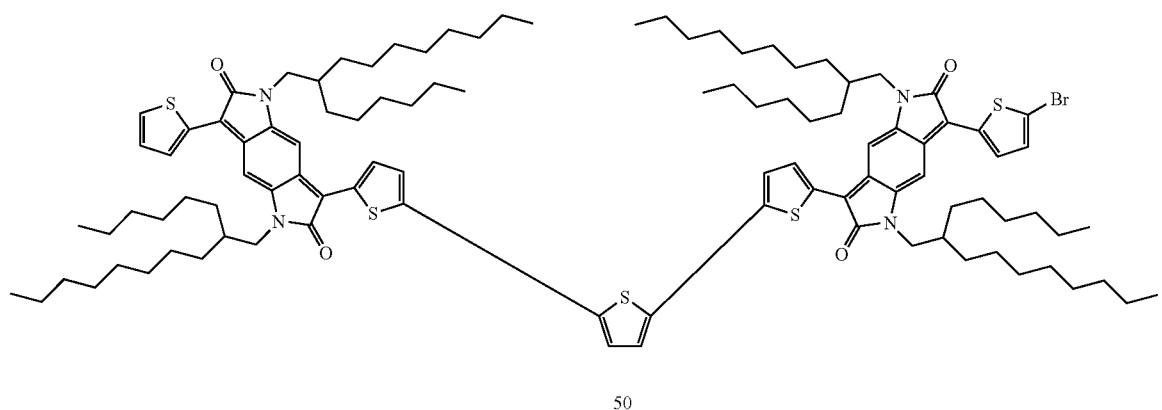

50 b) 308 mg of the monobromo compound 49 [=Cpd. 1-3], 58.9 mg of the bis-boronicacidester compound [175361-81-6], 0.4 mg palladium(II)acetate, and 2.4 mg of 2-(Di-tert-butyl-phosphino)-1-phenylindole [740815-37-6] are placed in a reactor. The reactor is degassed with Argon and then 5 ml of degassed tetrahydrofurane are added. The reaction mixture is heated to reflux, and then 88 mg of lithium hydroxide monohydrate are added. The reaction mixture is refluxed for another two hours. The dark solution is then poured on water and the product is extracted with chloroform. The product is purified by chromatography over silicagel to give the compound 50 [=cpd. C-2]. $^1$H-NMR data (ppm, CDCl$_3$): 8.03 2H d, 7.91 2H d, 7.50 2H d, 7.21 2H d, 7.18 2H dxd, 7.17 2H s, 6.53 2H s, 6.48 2H s, 3.59 4H d, 3.52 4H d, 1.82 4H broad s, 1.50-1.15 96H m, 0.86 24H t.

Example 19
Synthesis of Polymer 51 [=Polymer P-4]
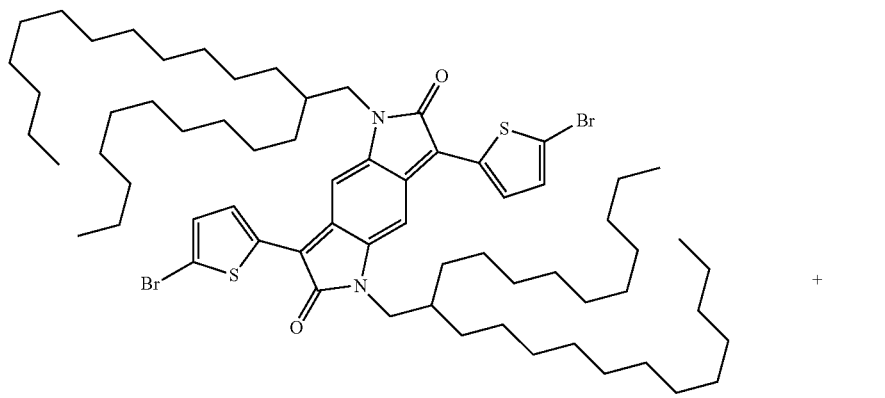
15
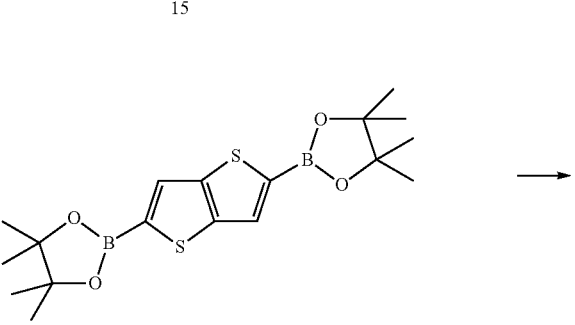
[924894-85-9]
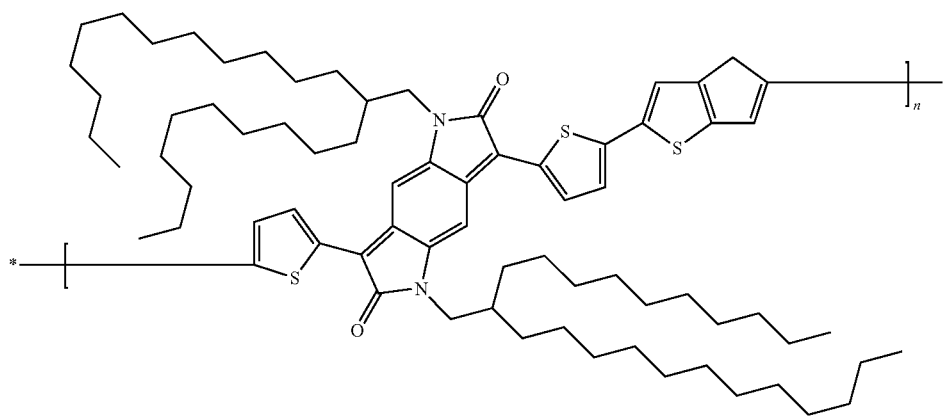
51
Polymer 51 [=polymer P-4] is synthesized according to the method of compound 28 starting from compound 15 and thieno-thiophene-di-boronicacid-pinacolester [924894-85-9] in a 1:1 ratio. The product is fractionated in a Soxhlet apparatus with tetrahydrofurane and chloroform.

Example 20
Synthesis of Polymer 52 [=Polymer P-5]
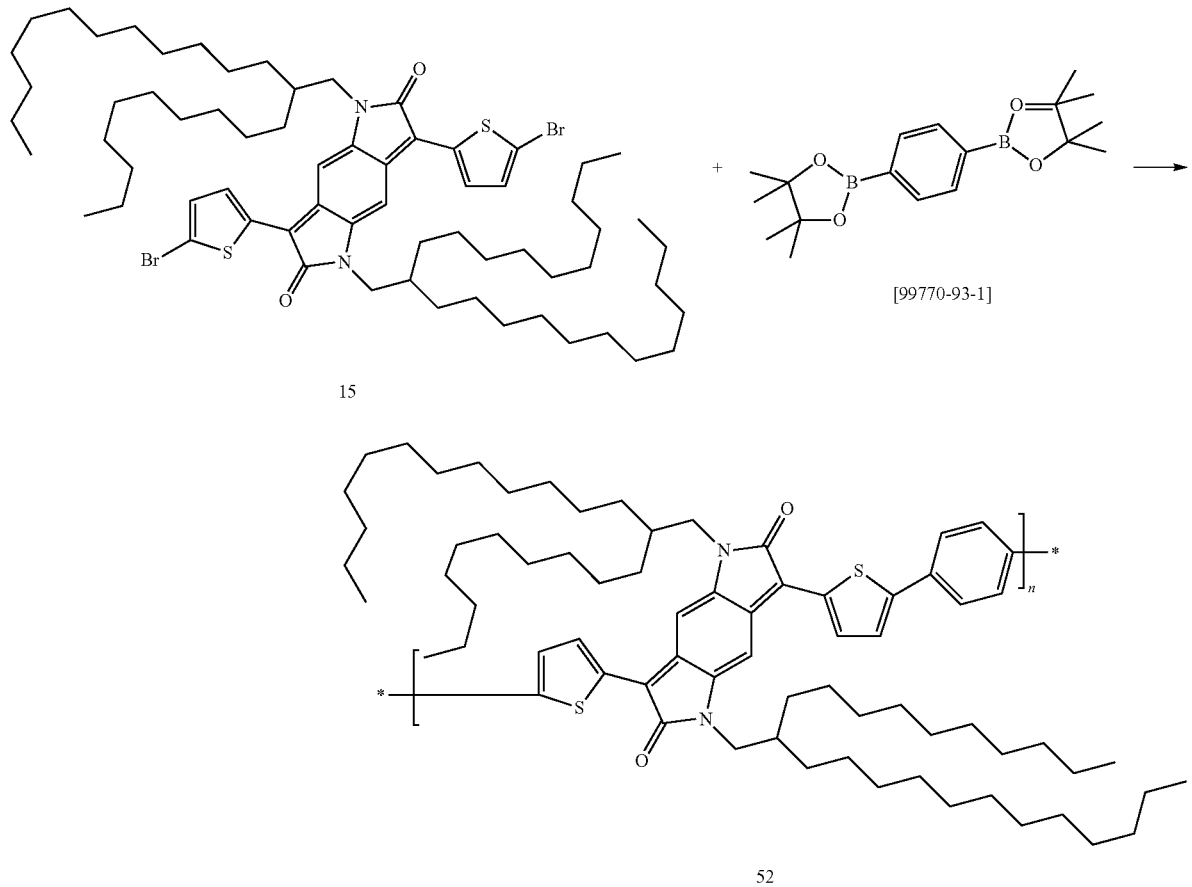
Polymer 52 [=polymer P-5] is synthesized according to the method of compound 28 starting from compound 15 and phenyl-di-boronicacid-pinacolester [99770-93-1] in a 1:1 ratio. The product is fractionated in a Soxhlet apparatus with tetrahydrofurane and chloroform.
Example 21
Synthesis of Polymer 53 [=Polymer P-6]
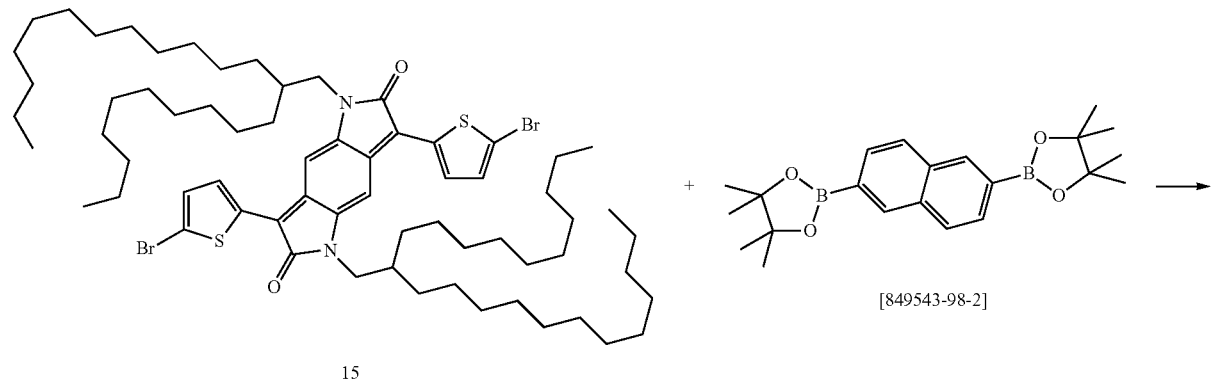

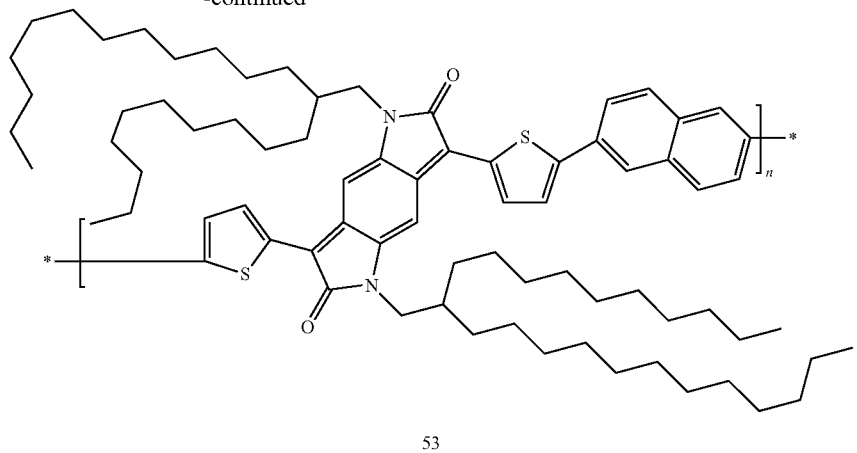
53
Compound 53 [=polymer P-6] is synthesized according to the method of compound 28 starting from compound 15 and 2,6-naphthyl-di-boronicacid-pinacolester [849543-98-2] in a 1:1 ratio. The product is fractionated in a Soxhlet apparatus with tetrahydrofurane and chloroform.
Example 22
Synthesis of Polymer 54 [=Polymer P-7]
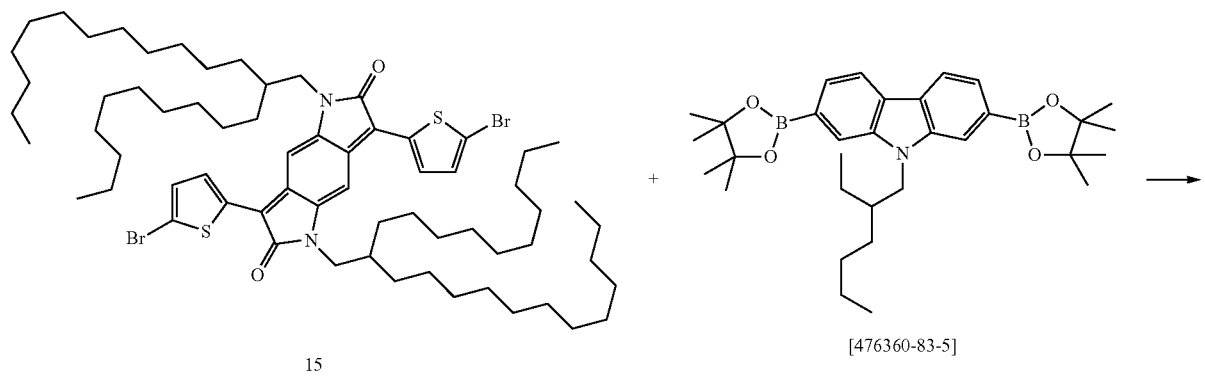
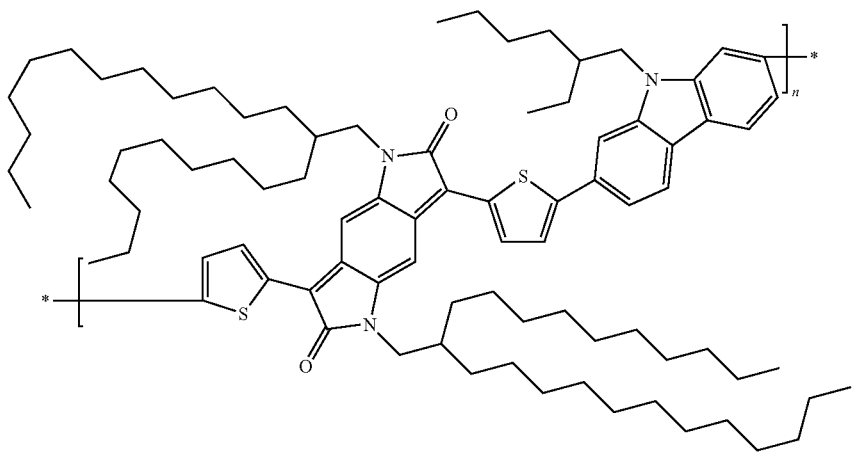
54

Polymer 54 [=polymer P-7] is synthesized according to the method of compound 28 starting from compound 15 and carbazol-di-boronicacid-pinacolester [476360-83-5] in a 1:1 ratio. The product is fractionated in a Soxhlet apparatus with tetrahydrofurane and chloroform.

Example 23

Synthesis of Polymer 55 [=Polymer P-8]

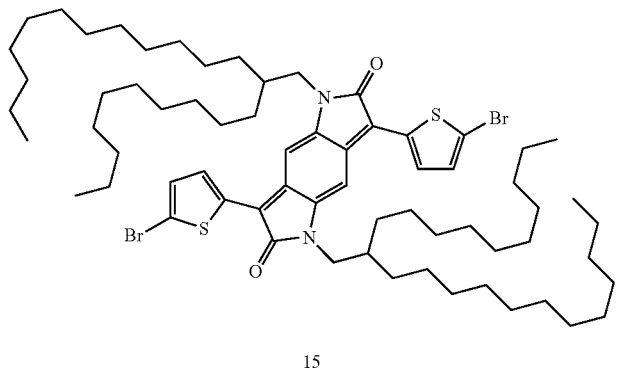

15

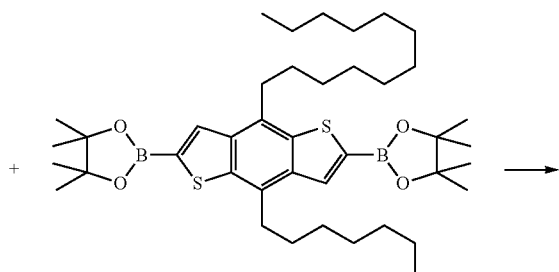

[1295502-42-9]

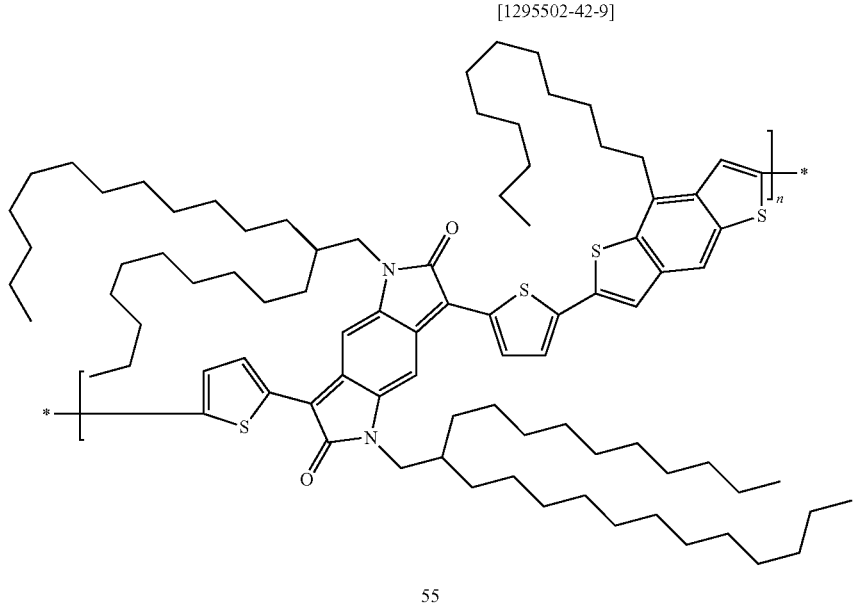

55

Polymer 55 [=polymer P-8] is synthesized according to the method of compound 28 starting from compound 15 and benzodithiophene-di-boronicacid-pinacolester [1295502-42-9] in a 1:1 ratio. The product is fractionated in a Soxhlet apparatus with tetrahydrofurane and chloroform.

Example 24

Synthesis of Polymer 56 [=Polymer P-9]

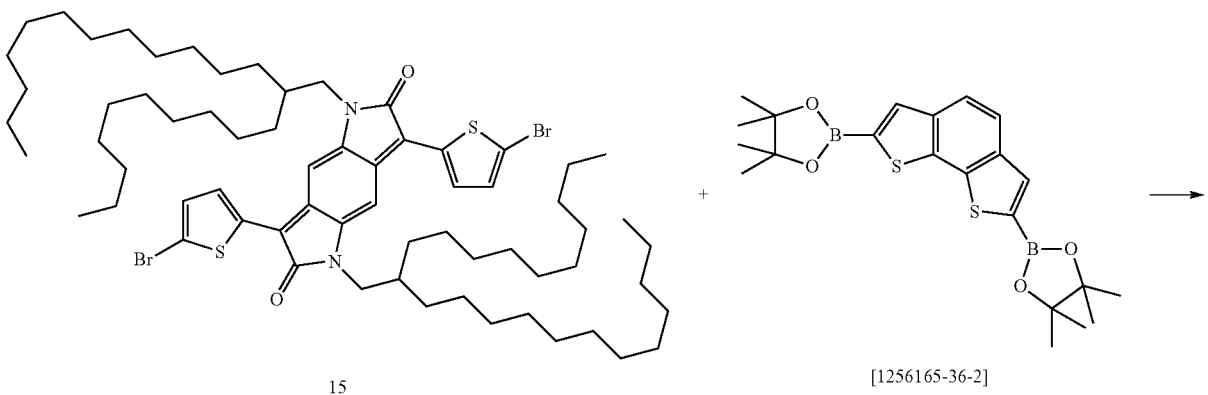

15

[1256165-36-2]

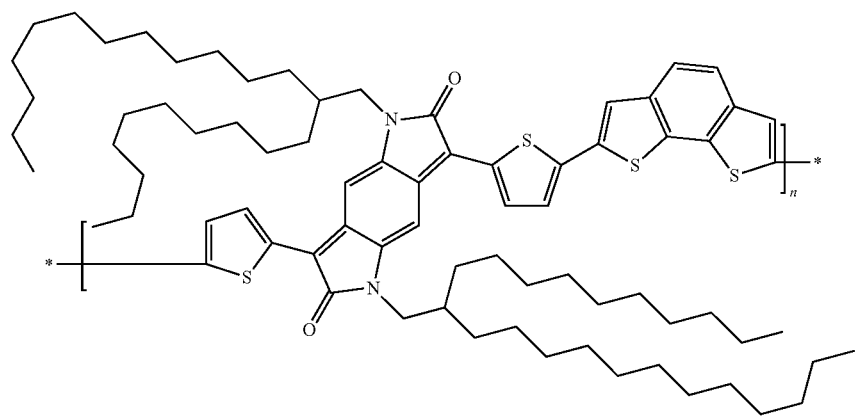
56
Polymer 56 [=polymer P-9] is synthesized according to the method of compound 28 starting from compound 15 and benzodithiophene-di-boronicacid-pinacolester [1256165-36-2] in a 1:1 ratio. The product is fractionated in a Soxhlet apparatus with tetrahydrofurane and chloroform.
Example 25
Synthesis of Polymer 57 [=Polymer P-10]
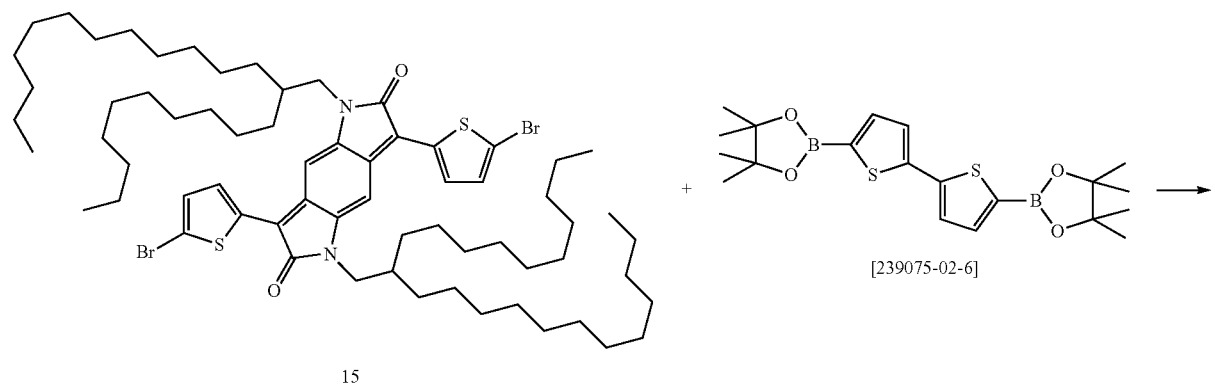
15
[239075-02-6]
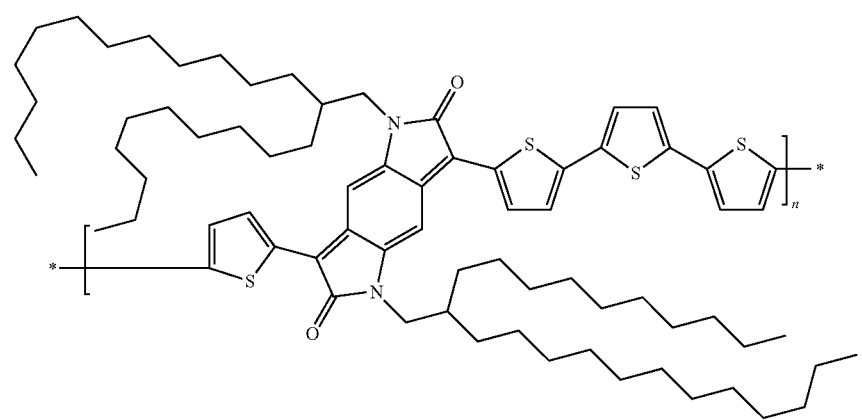
57

Polymer 57 [=polymer P-10] is synthesized according to the method of compound 28 starting from compound 15 and bi-thiophene-di-boronicacid-pinacolester [239075-02-6] in a 1:1 ratio. The product is fractionated in a Soxhlet apparatus with tetrahydrofurane and chloroform.

Example 26

Synthesis of Compound 58 [=Compound B-18]

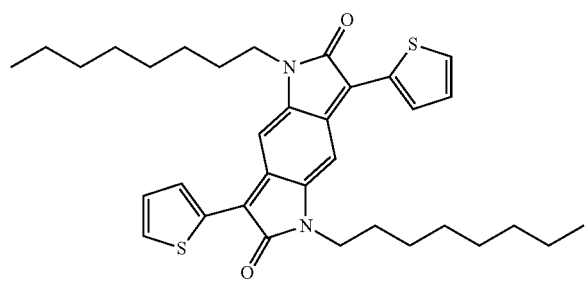

Compound 58 is synthesized in analogy to the synthesis described for compound 24 in Example 6, using 1-octylamine instead of 2-hexyldecylamine. $^1$H-NMR data (ppm, CDCl$_3$): 8.01 2H d, 7.54 2H d, 7.21 2H dxd, 6.58 2H s, 3.69 4H t, 1.72 4H txt, 1.50-1.25 20H m, 0.89 6H t.

Example 27

Synthesis of Compound 59 [=Compound B-19]

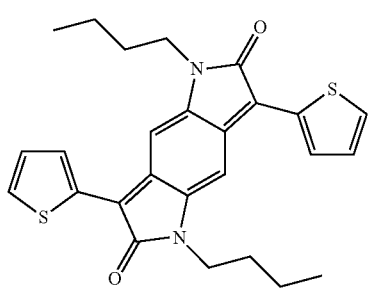

Compound 59 is synthesized in analogy to the synthesis described for compound 24 in Example 6, using 1-butylamine instead of 2-hexyldecylamine. $^1$H-NMR data (ppm, CDCl$_3$): 8.01 2H d, 7.54 2H d, 7.21 2H dxd, 6.59 2H s, 3.72 4H t, 1.71 4H txt, 1.46 4H txt, 1.01 6H t.

Example 28

Synthesis of Compound 60

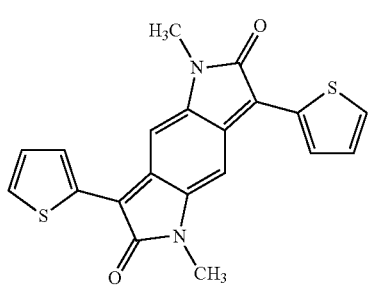

Compound 60 is synthesized in analogy to the synthesis described for compound 24 in Example 6, using 1-methylamine instead of 2-hexyldecylamine.

Application Example 3

Bottom Gate Bottom Contacts Field Effect Transistor (BGBC)

Semiconductor Film Deposition:

Siliconwafers (Si n-(425±40 μm)) with a 230 nm thick SiO$_2$ dielectric and patterned indium tin oxide (15 nm) gold (30 nm) contacts (L=20, 10, 5, 2.5 μm, W=0.01 m; Fraunhofer IPMS (Dresden)) are prepared by washing with acetone and i-propanol followed by oxygen plasma treatment for 30 minutes.

The substrates are transferred in a glove box. An octylsilane (OTS) monolayer is grown on the dielectric surface by putting the substrates in a 50 mM solution of octyltrichlorosilane (OTS) in toluene for 1 h. After monolayer growth, the substrates are washed with toluene to remove physisorbed silane.

The semiconductor is dissolved in a proper solvent in a concentration 0.75% by weight at 80° C. and spin-coated at 1500 rpms for 60 s onto the substrates.

OFET Measurement: OFET transfer and output characteristics are measured on an Agilent 4155C semiconductor parameter analyzer. The devices are annealed in a glovebox at 150° C. for 15 minutes before the measurements are done in a glove box under a nitrogen atmosphere at room temperature. For p-type transistors the gate voltage ($V_g$) varies from 10 to −30 V and at drain voltage ($V_d$) equal to −3 and −30V for the transfer characterisation. For the output characterization $V_d$ is varied from 0 to −30V at $V_g$=0, −10, −20, −30 V. Mobilities reported are the saturation mobilities at $V_d$=−30V.

For n-type transistors the gate voltage ($V_g$) varies from −10 to 30 V and at drain voltage ($V_d$) equal to 3 and 30V for the transfer characterisation. For the output characterization $V_d$ is varied from 0 to 30V at $V_g$=0, 10, 20, 30 V. Mobilities reported are the saturation mobilities at $V_d$=30V.

The OFET performance of Cpd. B-3 and C-2 as well as Polymers P-1 and P-2 is shown in the table below:

| Appl. Example | Semi-conductor | Solvent | OFET-type | Sat. Mobility, cm$^2$/VS | On/off |
|---|---|---|---|---|---|
| 3a | Cpd. B-3 | CHCl$_3$ | p | $5.0 \cdot 10^{-4}$ | $1.0 \cdot 10^{+4}$ |
| 3b | Cpd. B-3 | CHCl$_3$ | n | $3.7 \cdot 10^{-4}$ | $2.4 \cdot 10^{+3}$ |
| 3c | Cpd. B-2 | CHCl$_3$ | p | $6.6 \cdot 10^{-4}$ | $1.5 \cdot 10^{+3}$ |
| 3d | Cpd. C-2 | Toluene | p | $3.0 \cdot 10^{-6}$ | $4.0 \cdot 10^{+2}$ |
| 3e | Polymer P-1 | Toluene | p | $5.1 \cdot 10^{-3}$ | $1.0 \cdot 10^{+2}$ |
| 3f | Polymer P-1 | CHCl$_3$ | p | $7.9 \cdot 10^{-3}$ | $5.4 \cdot 10^{+2}$ |
| 3g | Polymer P-1 | CHCl$_3$ | n | $1.1 \cdot 10^{-2}$ | $1.3 \cdot 10^{+2}$ |
| 3h | Polymer P-2 | Toluene | p | $6.1 \cdot 10^{-3}$ | $1.0 \cdot 10^{+2}$ |
| 3i | Polymer P-2 | CHCl$_3$ | p | $1.5 \cdot 10^{-2}$ | $1.9 \cdot 10^{+3}$ |
| 3j | Polymer P-2 | CHCl$_3$ | n | $1.8 \cdot 10^{-2}$ | $6.2 \cdot 10^{+2}$ |

The polymers P-1 and P-2 have good solubility in organic solvents and excellent film-forming properties. The OFETs of Application Examples 3e to 3j, where the semiconductor layer consists of polymer P-1, or P-2, show good processibility, equally good hole and electron mobilities.

The compounds B-2, B-3 and C-2 have excellent solubility in organic solvents and excellent film-forming properties (excellent film uniformity).

Application Example 4

Top Gate Bottom Contacts Field Effect Transistor (TGBC FET)

Substrate Preparation: For TGBC FETs polyethylene terephthalate (PET) substrates with lithographically patterned 50 nm gold (Au) contacts covered with photoresist are used. Substrates are prepared by standard cleaning in acetone and ethanol and dried at 60° C. for 30 minutes.

Transistor Preparation: The semiconductor polymer P-1 is dissolved in chloroform (0.75 wt %) at 50° C. for 4 h, filtered through a 0.45 μm filter, spun to achieve a 50 nm layer thickness and dried for 30 seconds at 80° C.

Immediately after a 500 nm thick layer of a dielectric (Allresist GmbH, 4% 950K polymethyl methacrylate (PMMA) in butylacetate: ethyllacetate solvent mixture) has been spin-coated and dried for 2 minutes at 80° C. 120 nm thick gold contacts are evaporated through a shadow mask as gate contacts.

The OFET performance of polymer P-1 is summarized in the table below:

| Example | Semiconductor | Sat. Mobility, cm$^2$/VS | rel. Sigma Mobility Sat, % |
|---|---|---|---|
| 4 | P-1 | 0.0088 | 3 |

Semiconducting polymer P-1 of application example 4 shows good processability, moderate mobility and excellent film uniformity, when used for the preparation of a TGBC FET.

Example 29

Synthesis of Compound 65

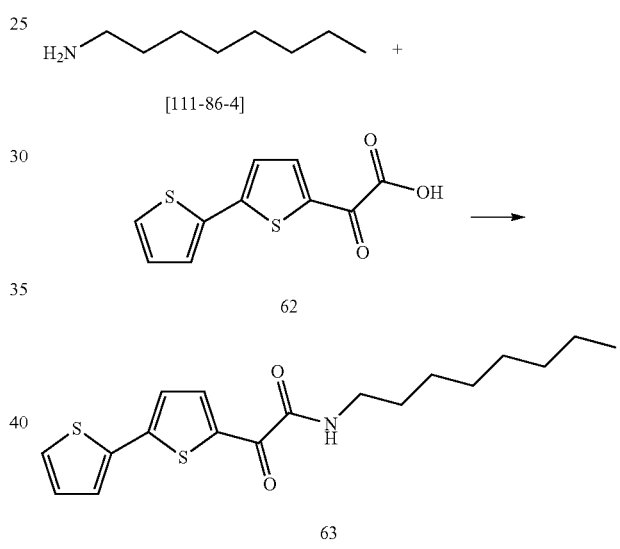

a) Compound 61 is obtained in analogy to compound 1 starting from bi-thiophene [492-97-7] and ethyl-chlo-rooxoacetate [4755-77-5]. $^1$H-NMR data (ppm, CDCl$_3$): 8.04 1H d, 7.38 2H d, 7.20 1H d, 7.07 1H dxd, 4.43 2H q, 1.43 3H t.

b) Compound 62 is obtained in analogy to compound 2 by hydrolysis of compound 61. $^1$H-NMR data (ppm, CDCl$_3$): 8.49 1H d, 7.47 2H dd, 7.32 1H d, 7.12 1H dxd, OH signal not visible.

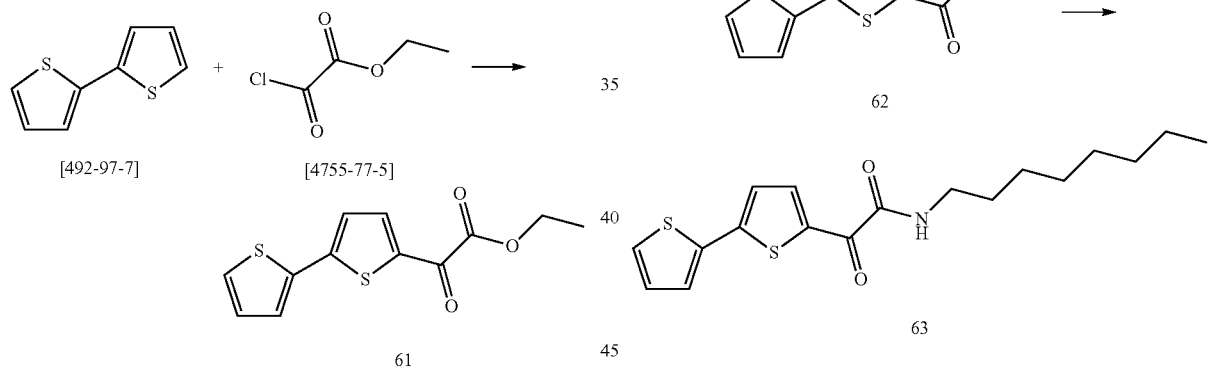

c) Compound 63 is obtained in analogy to compound 4 from compound 62 and the amine [111-86-4].

$^1$H-NMR data (ppm, CDCl$_3$): 8.31 1H d, 7.43 1H d, 7.39 1H d, 7.37 1H broad s, 7.26 1H d, 7.11 1H dxd, 3.39 2H dxt, 1.62 2H txt, 1.45-1.21 10H m, 0.90 3H t.

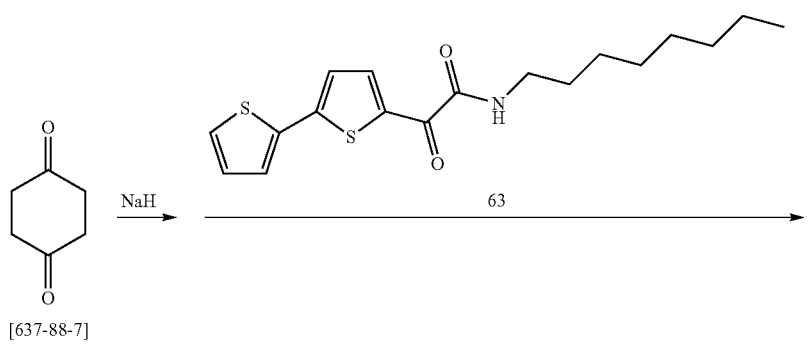

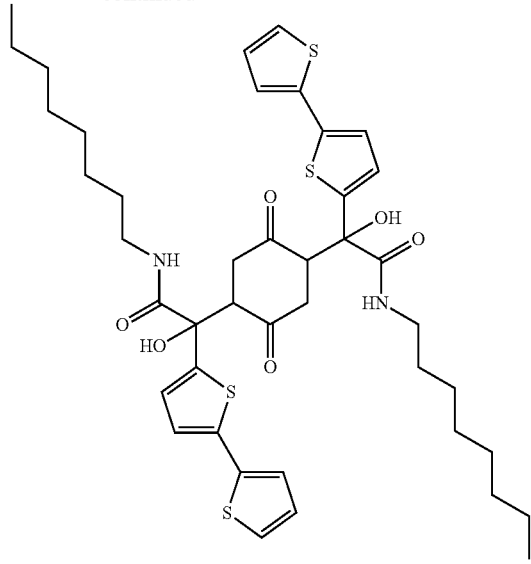
64
e) Compound 64 is obtained in analogy to compound 5 starting from compound [637-88-7] and compound 63. Compound 64 is used directly in the synthesis of compound 65 without purification.
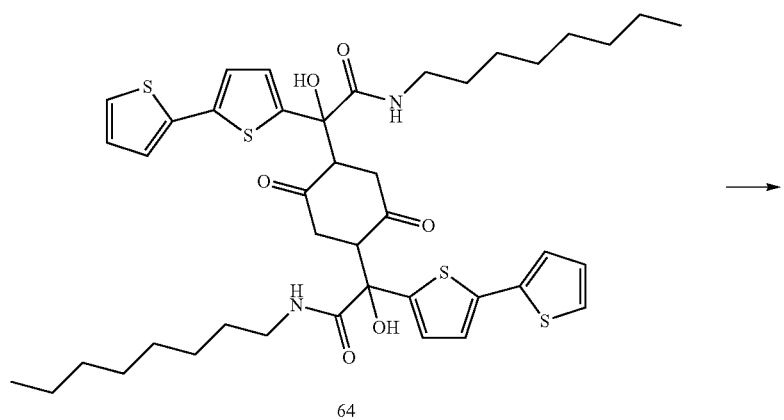
64
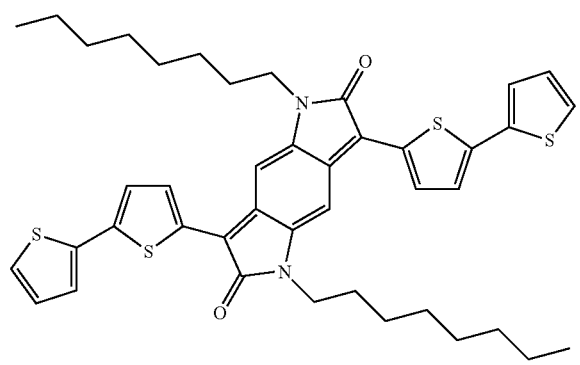
65 f) Compound 65 [=Cpd. B-9] is obtained in analogy to compound 6 starting from compound 64. ¹H-NMR data (ppm, CDCl₃): 7.93 2H d, 7.31 4H d+d, 7.26 2H d, 7.08 2H dxd, 6.56 2H s, 3.72 4H t, 1.76-1.69 4H m, 1.50-1.25 20H m, 0.88 6H t.

Example 30

Synthesis of Compound 68

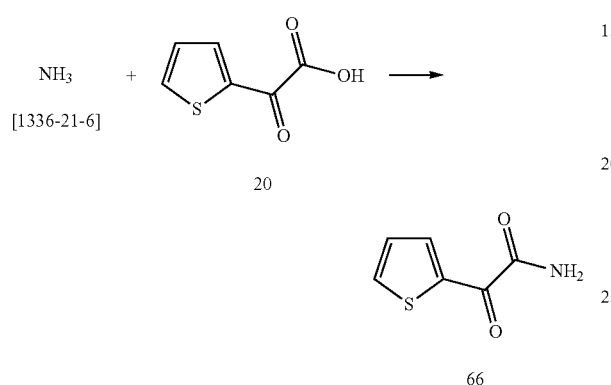

a) Compound 66 is obtained in analogy to compound 4 starting from ammonium hydroxide [1336-21-6] and compound 20. ¹H-NMR data (ppm, CDCl₃): 8.43 1H d, 7.86 1H d, 7.21 1H dxd, 7.19 1H broad s, 5.74 1H broad s.

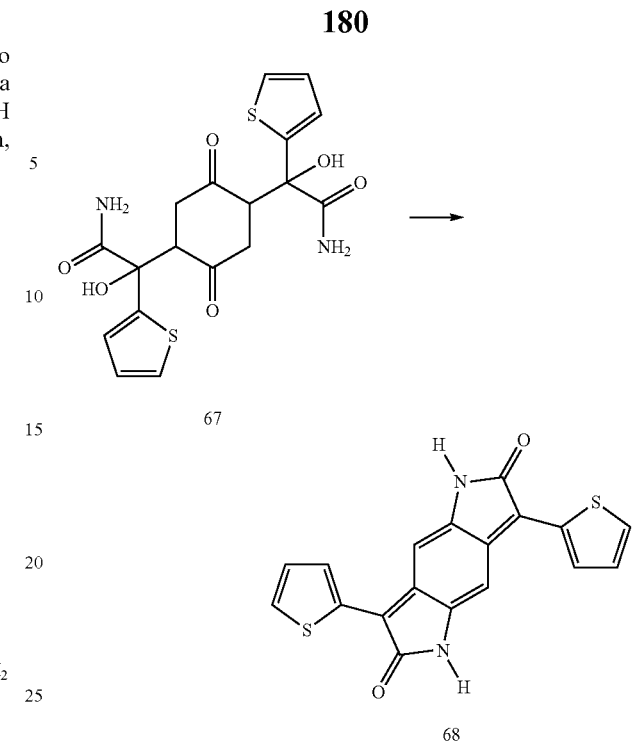

b) Compound 67 is obtained in analogy to compound 5 starting from compound [637-88-7] and compound 66. Compound 67 is used directly in the synthesis of compound 68 without purification.

c) Compound 68 [=Cpd. B-10] is obtained in analogy to compound 6 starting from compound 67.
¹H-NMR data (ppm, DMF-d7): 10.51 2H s, 8.18 2H d, 8.06 2H d, 7.47 2H dxd, 6.96 2H s.

Example 31

Synthesis of Compound 70 [=Compound B-11]

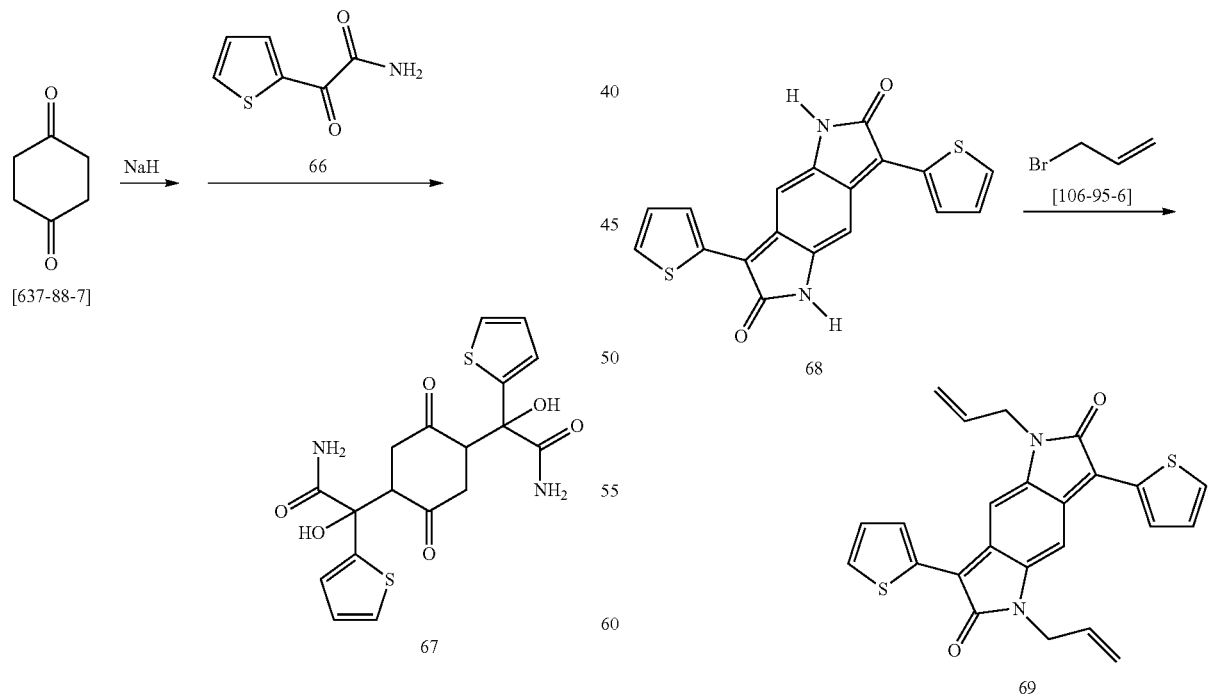

a) 1.086 g of compound 68 are suspended together with 1.714 g of potassium carbonate in 8 ml of dimethylformamide. The reaction mixture is heated to 50° C. and 1.5 g of allylbromide are added. The reaction mixture is then heated at 70° C. over night. Then the reaction mixture is cooled to room temperature and poured into water. The product is extracted with ethyl acetate. The organic phase is dried over MgSO$_4$, filtered and evaporated. The residue is purified by column chromatography over silica gel and a product of formula 69 [=Cpd. B-11] is obtained. $^1$H-NMR data (ppm, CDCl$_3$): 8.01 2H d, 7.54 2H d, 7.20 2H dxd, 6.64 2H s, 5.94-5.85 2H m, 5.39-5.30 2H m, 4.36 4H d.

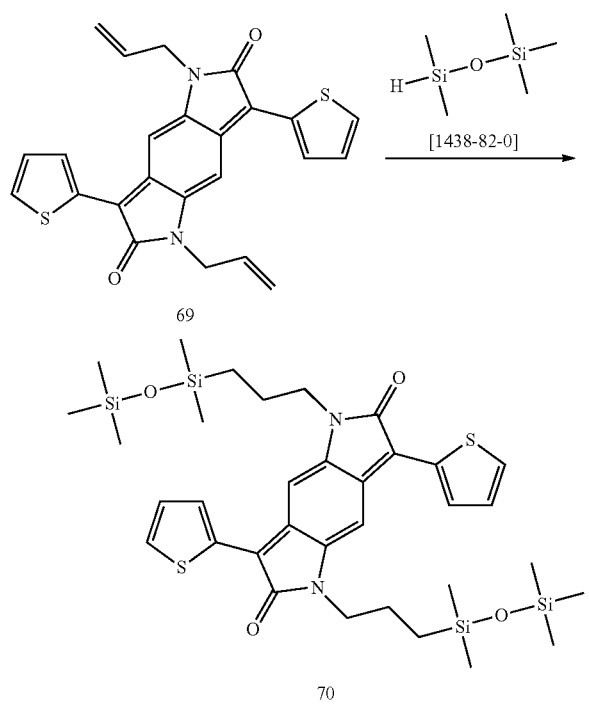

b) 220 mg of compound 69 are dissolved together with 170 mg of the pentamethyldisiloxane [1438-82-0] in 5 ml of dry toluene under nitrogen. Then 1 drop of Karstedt-catalyst is added and the reaction mixture is heated at reflux temperature over night. Then the solvent is evaporated and the product is purified over silica gel to give a compound of formula 70 [=Cpd. B-12].

$^1$H-NMR data (ppm, CDCl$_3$): 8.00 2H d, 7.54 2H d, 6.94 2H dxd, 6.60 2H s, 3.69 4H t, 1.77-1.71 4H m, 0.65-0.59 4H m, 0.11 12H s, 0.05 18H s.

Example 32

Synthesis of Compound 73

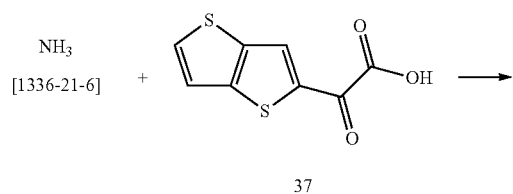

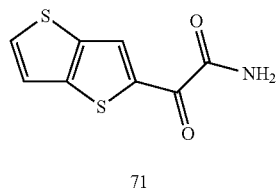

a) Compound 71 is obtained in analogy to compound 4 starting from ammonium hydroxide [1336-21-6] and compound 37.

$^1$H-NMR data (ppm, CDCl$_3$): 8.77 1H s, 7.76 1H d, 7.34 1H d, 7.18 1H broad s, 5.66 1H broad s.

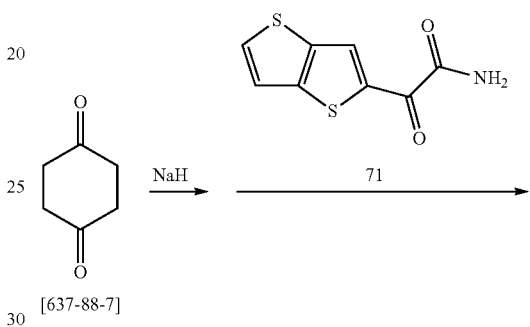

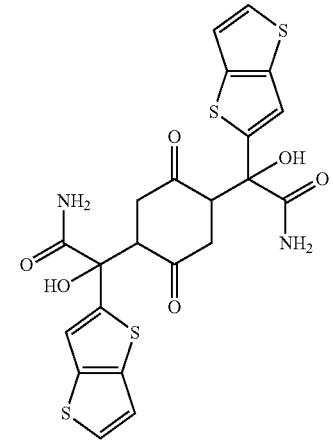

b) Compound 72 is obtained in analogy to compound 5 starting from compound [637-88-7] and compound 71. Compound 72 is used directly in the synthesis of compound 73 without purification.

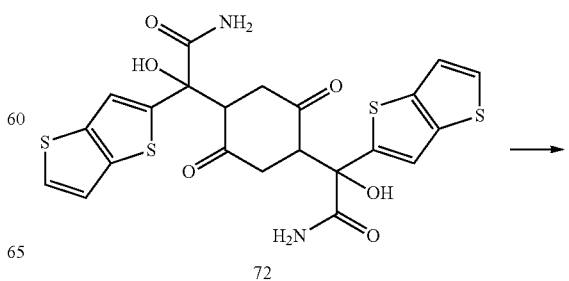

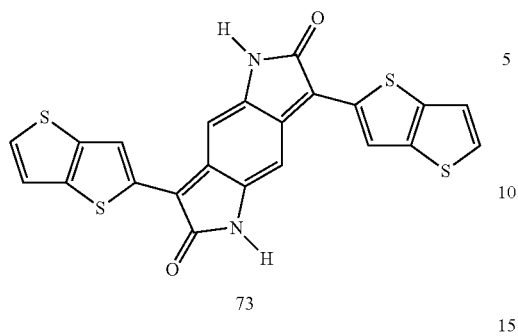

73 c) Compound 73 [=Cpd. B-13] is obtained in analogy to compound 6 starting from compound 72.

The MS spectrum (APCI positive mode) confirms the molecular mass of 462.

Example 33

Synthesis of Compound 76

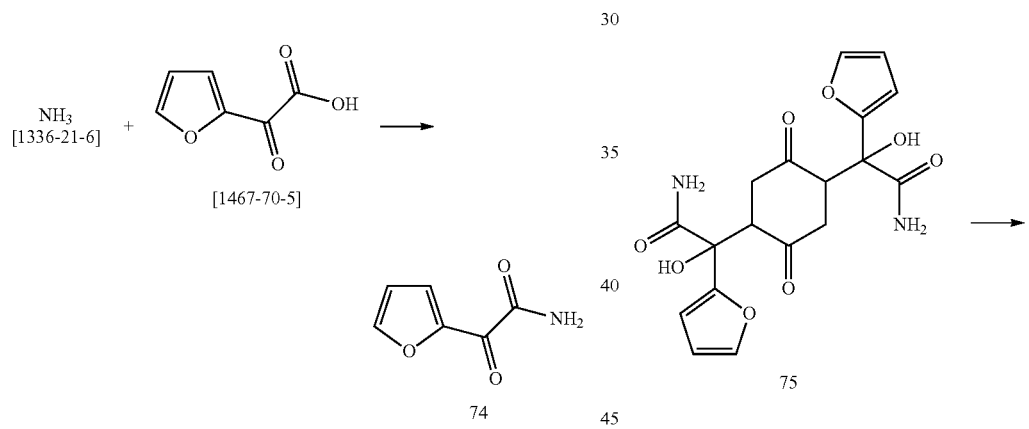

a) Compound 74 is obtained in analogy to compound 4 starting from ammonium hydroxide [1336-21-6] and compound [1467-70-5]. $^1$H-NMR data (ppm, CDCl$_3$): 8.14 1H d, 7.78 1H d, 7.18 1H broad s, 6.65 1H dxd, 5.83 1H broad s.

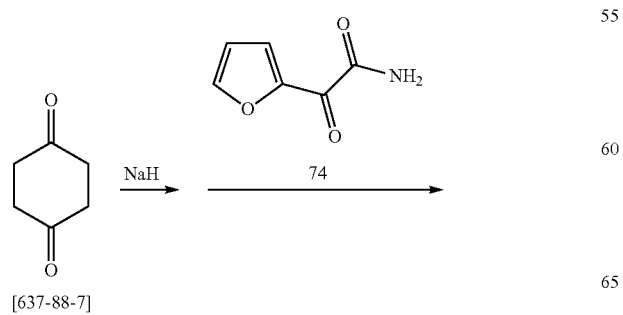

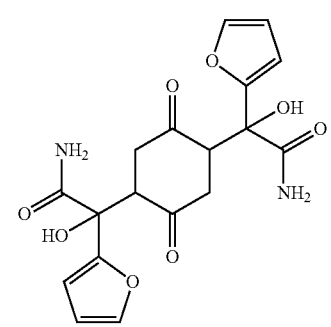

75 b) Compound 75 is obtained in analogy to compound 5 starting from compound [637-88-7] and compound 74. Compound 75 is used directly in the synthesis of compound 76 without purification.

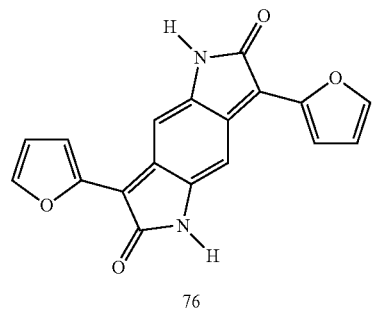

76 c) Compound 76 [=Cpd. B-14] is obtained in analogy to compound 6 starting from compound 75.

The MS spectrum (APCI positive mode) confirms the molecular mass of 318.

Example 34
Synthesis of Compound 77
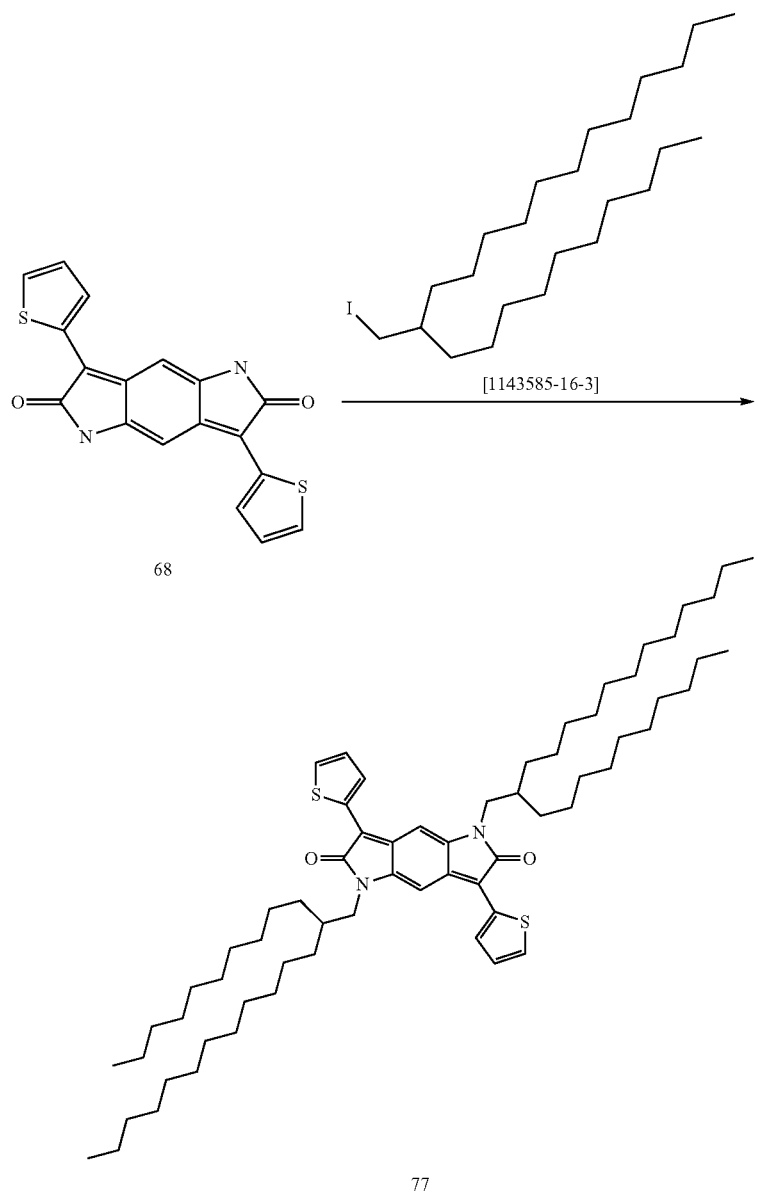
Compound 77 [=Cpd. B-15] is obtained in analogy to compound 69 starting from compound 68 and the decyltetradecyliodide [1143585-16-3].
$^1$H-NMR data (ppm, CDCl$_3$): 8.03 2H d, 7.52 2H d, 7.19 2H dxd, 6.60 2H s, 3.57 4H d, 1.86 2H broad s, 1.45-1.20 80H m, 0.88 12H t.
Example 35
Synthesis of Compound 80
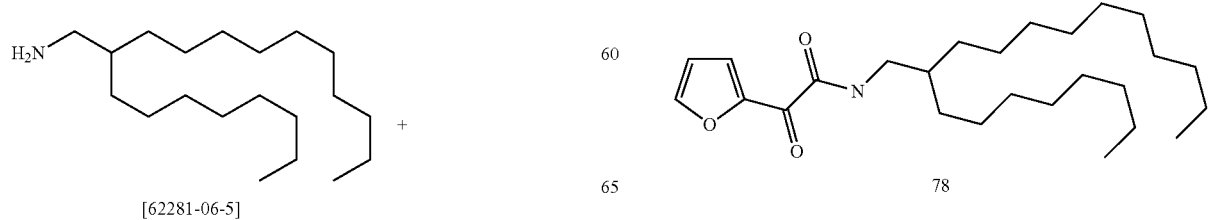

a) Compound 78 is obtained according to compound 4 starting from compound [62281-06-5] and compound [1467-70-5]. $^1$H-NMR data (ppm, CDCl$_3$): 8.21 1H d, 7.77 1H d, 7.28 1H broad s, 6.64 1H dxd, 3.31 2H dxd, 1.61 1H broad s, 1.38-1.22 32H m, 0.90 6H t.
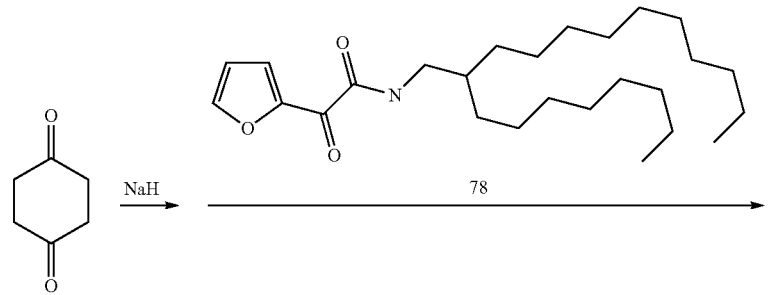
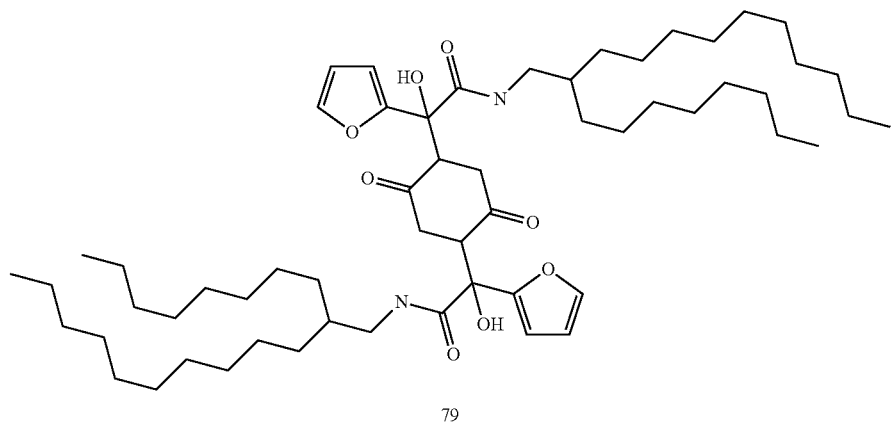
b) Compound 79 is obtained according to compound 5 starting from compound [637-88-7] and compound 78. Compound 479 is used directly in the synthesis of compound 80 without purification.
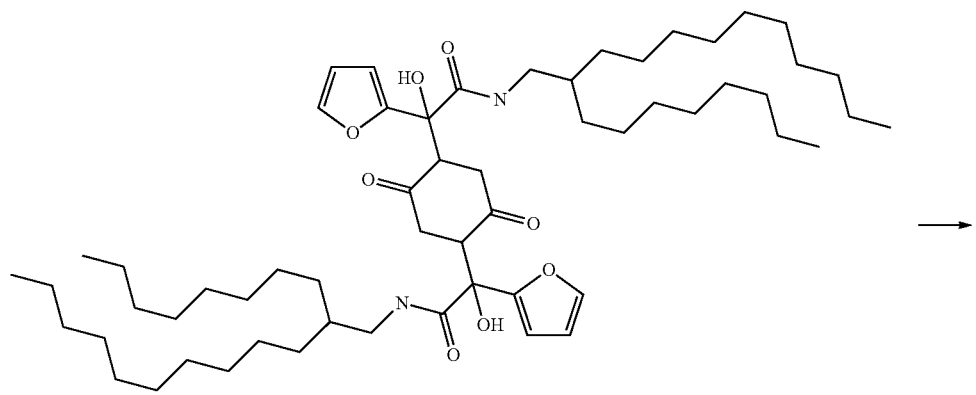

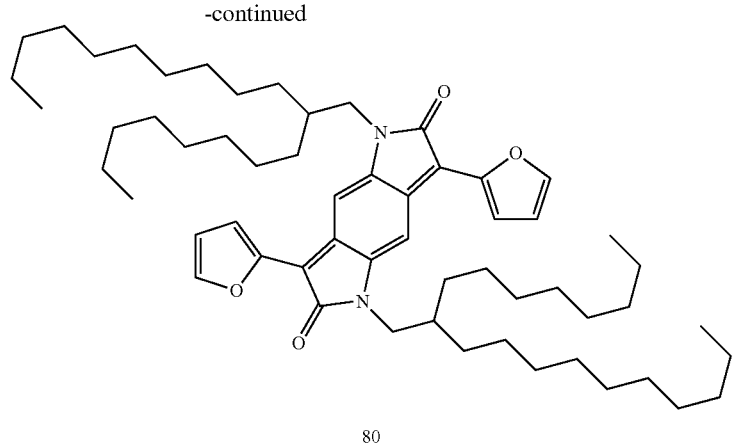
80
c) Compound 80 [=Cpd. B-16] is obtained according to compound 6 starting from compound 79. $^1$H-NMR data (ppm, CDCl$_3$): 7.61 2H d, 7.42 2H d, 6.30 2H s, 6.60 2H dxd, 3.54 4H d, 1.86 2H broad s, 1.45-1.12 64H m, 0.88 12H t.
Example 36
Synthesis of Compound 83
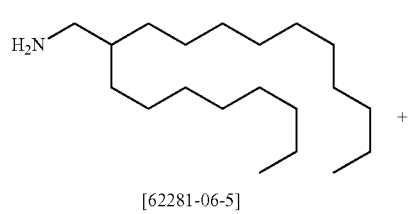
[62281-06-5]
+
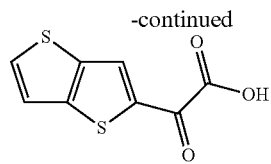
37
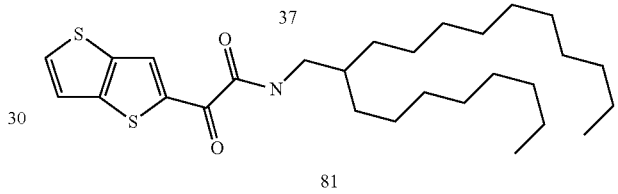
81
a) Compound 81 is obtained according to compound 4 starting from compound [62281-06-5] and compound 37. $^1$H-NMR data (ppm, CDCl$_3$): 8.77 1H s, 7.75 1H d, 7.33 1H d, 7.31 1H broad s, 3.35 2H dxd, 1.63 1H broad s, 1.45-1.25 32H m, 0.90 6H t.
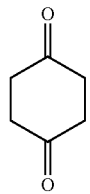
[637-88-7]
NaH, 81
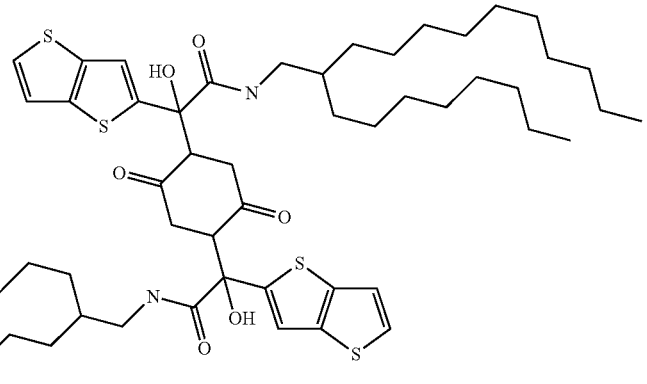
82 b) Compound 82 is obtained according to compound 5 starting from compound [637-88-7] and compound 81. Compound 82 is used directly in the synthesis of compound 83 without purification.
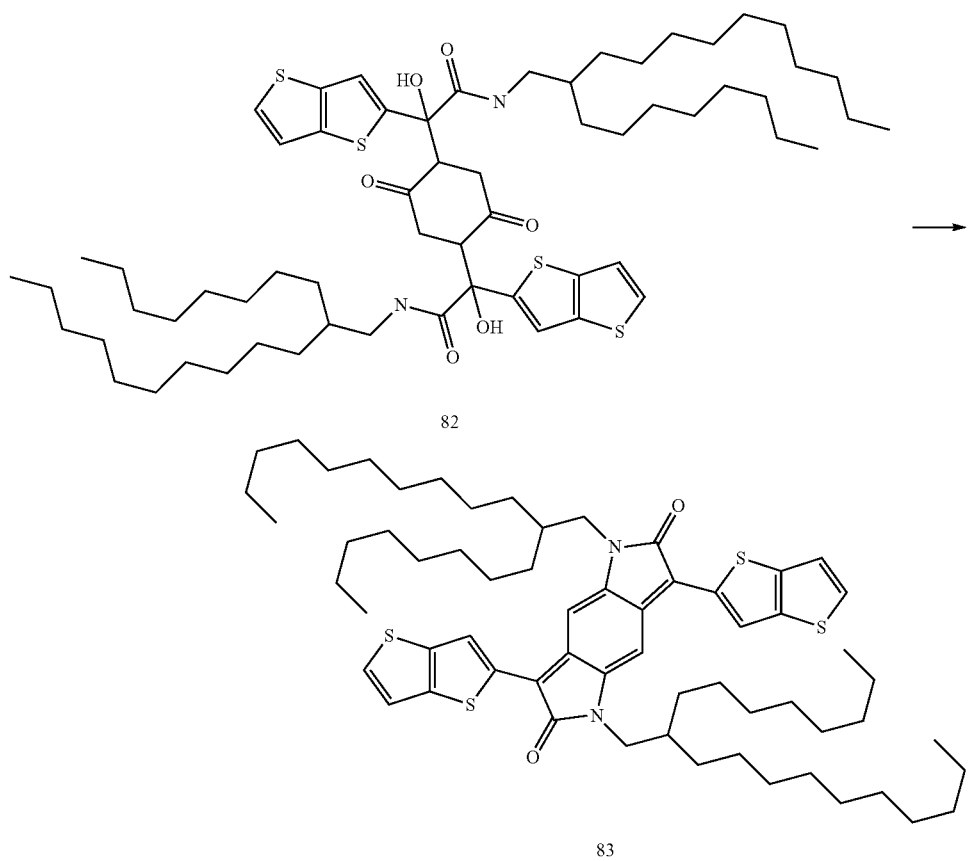
c) Compound 83 [=Cpd. B-17] is obtained according to compound 6 starting from compound 82. $^1$H-NMR data (ppm, CDCl$_3$): 8.36 2H s, 7.52 2H d, 7.26 2H d, 6.64 2H s, 3.61 4H d, 1.88 2H broad s, 1.50-1.20 64H m, 0.86 12H t.
Example 37
Synthesis of Compound 84
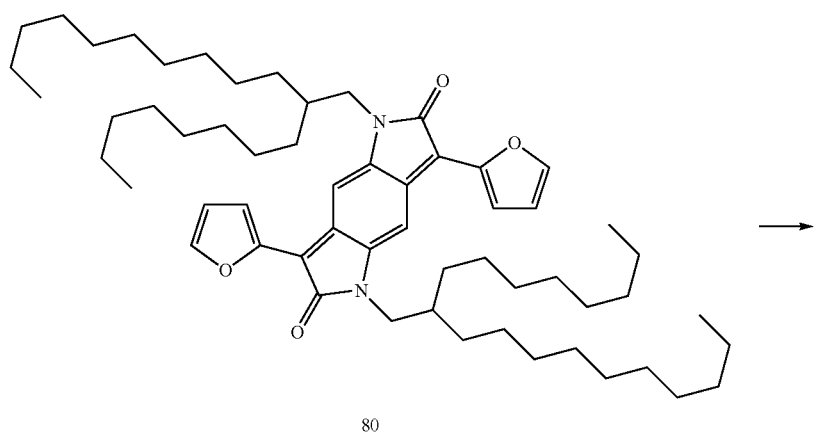

-continued
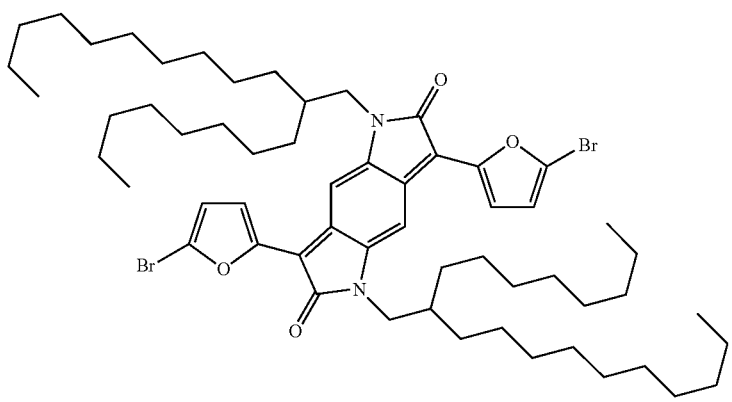
84
Compound 84 [=Cpd. I-11] is obtained in analogy to example 13 starting from compound 80.
Example 38
Synthesis of Compound 85
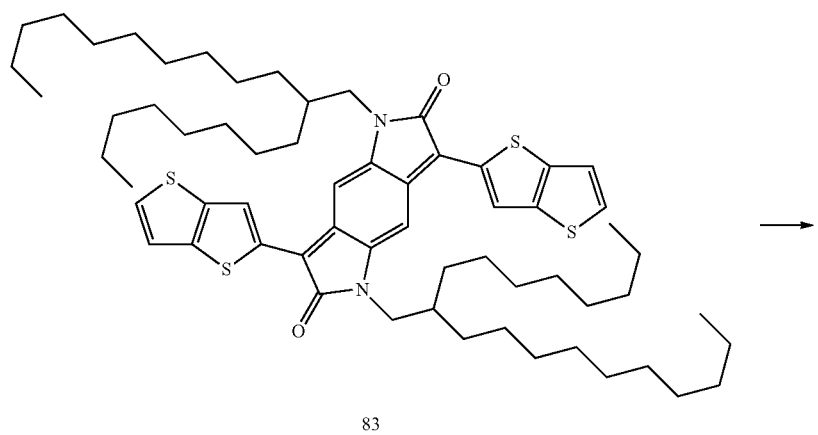
83
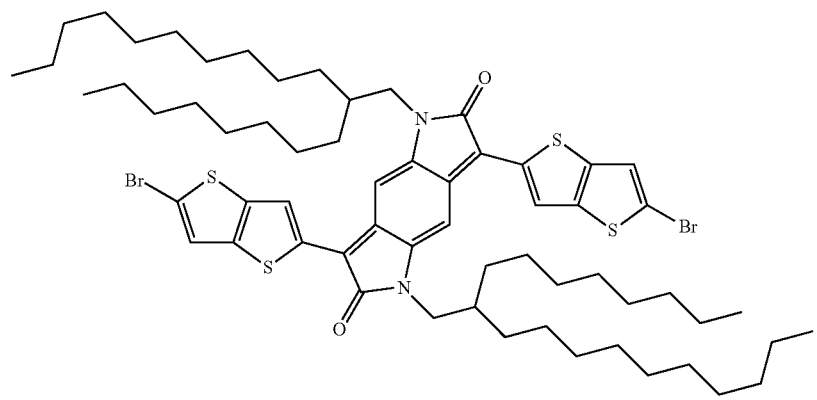
85

Compound 85 [=Cpd. 1-12] is obtained in analogy to example 15 starting from compound 83, without the addition of perchloric acid. ¹H-NMR data (ppm, CDCl$_3$): 8.20 2H s, 7.18 2H s, 6.42 2H s, 3.51 4H d, 1.77 2H broad s, 1.48-1.20 64H m, 0.88 12H t.
Example 39
Synthesis of Polymer 86 [=Polymer P-11]
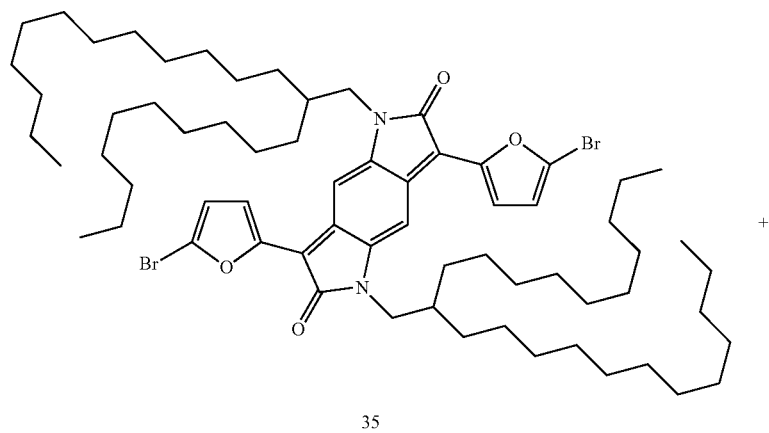
35
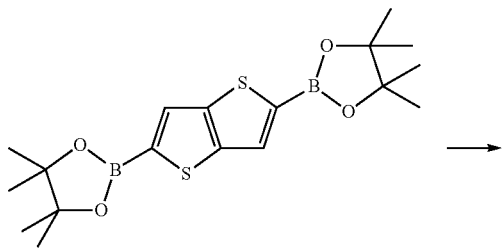
[924894-85-9]
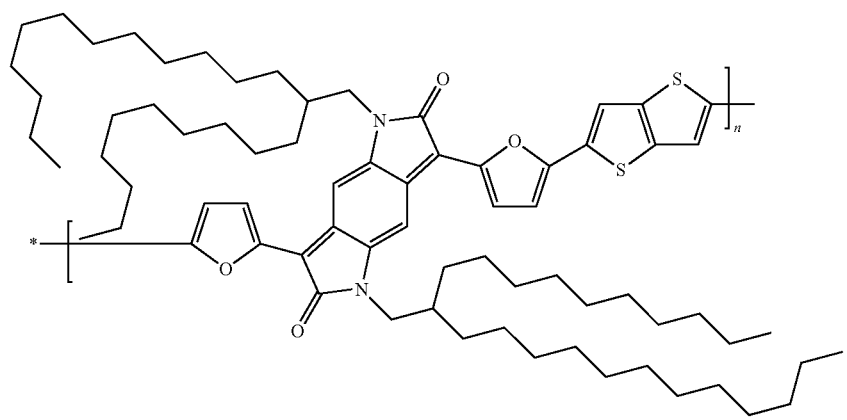
86

Polymer 86 [=polymer P-11] is synthesized according to the method of compound 28 starting from compound 35 and thieno-thiophene-di-boronicacid-pinacolester [924894-85-9] in a 1:1 ratio. The product is fractionated in a Soxhlet apparatus with tetrahydrofurane and chloroform.

Example 40

Synthesis of Polymer 87 [=Polymer P-12]

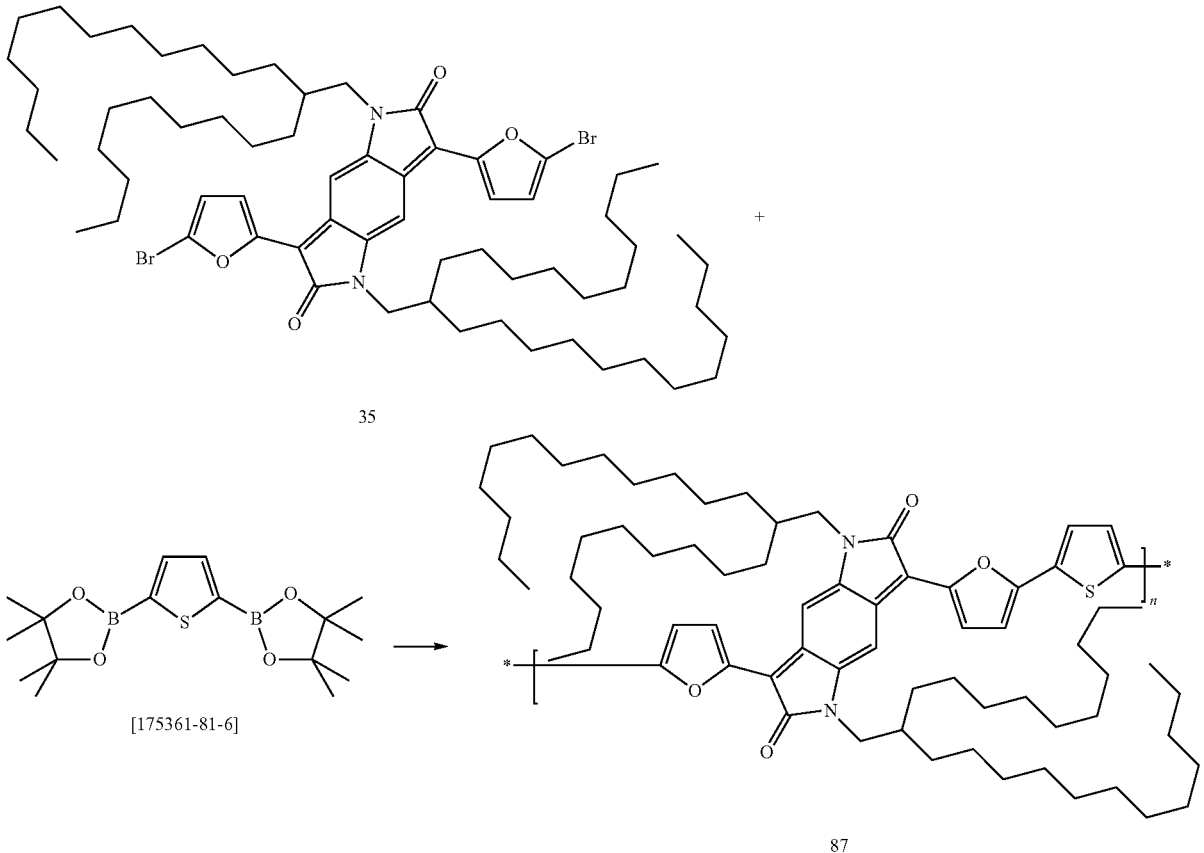

Polymer 87 [=polymer P-12] is synthesized according to the method of compound 28 starting from compound 35 and thiophene-di-boronicacid-pinacolester [175361-81-6] in a 1:1 ratio. The product is fractionated in a Soxhlet apparatus with tetrahydrofurane and chloroform.

Example 41

Synthesis of Polymer 88 [=Polymer P-13]

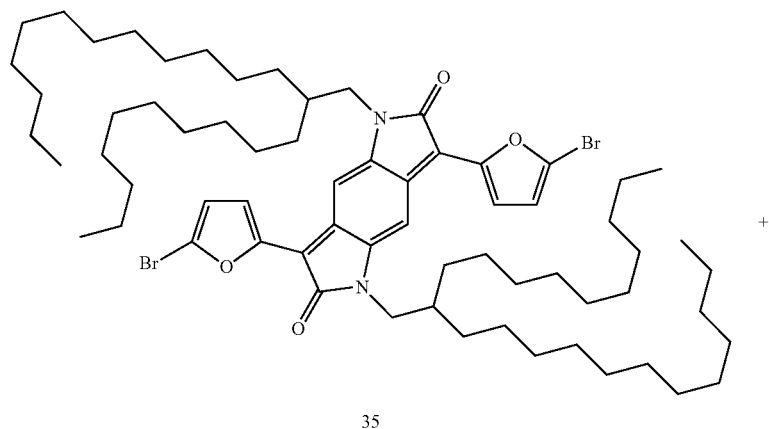

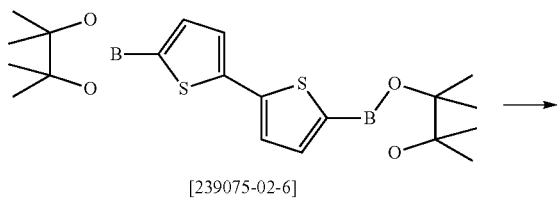
[239075-02-6]
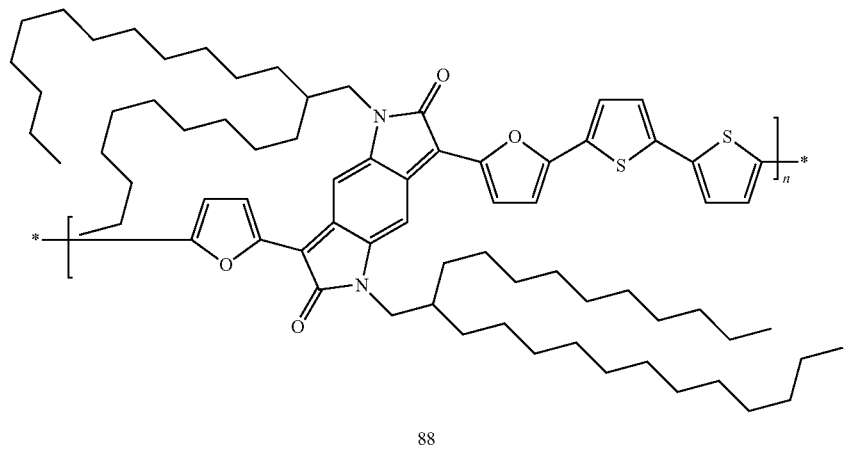
88
Polymer 88 [=polymer P-13] is synthesized according to the method of compound 28 starting from compound 35 and bi-thiophene-di-boronicacid-pinacolester [239075-02-6] in a 1:1 ratio. The product is fractionated in a Soxhlet apparatus with tetrahydrofurane and chloroform.
Example 42
Synthesis of Polymer 89 [=Polymer P-14]
35
42
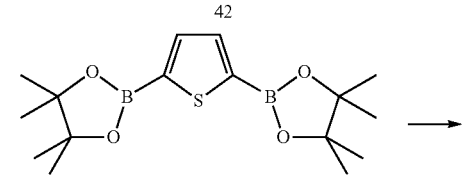
[175361-81-6]

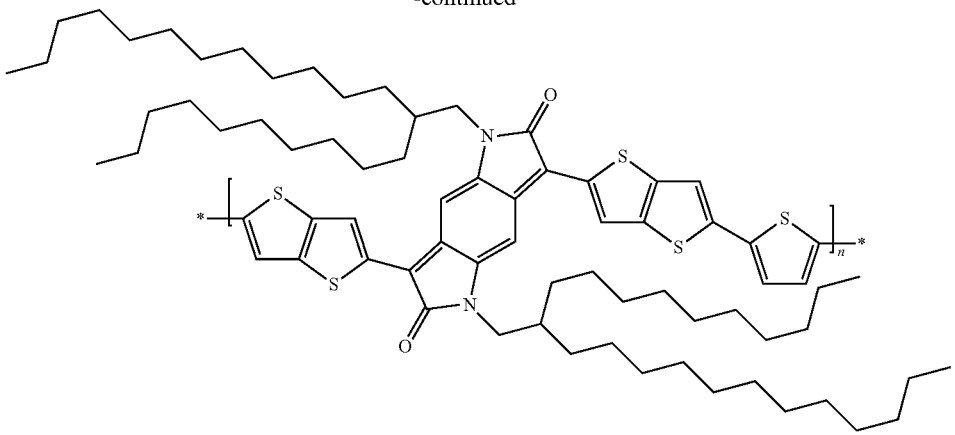

89

Polymer 89 [=polymer P-14] is synthesized according to the method of compound 28 starting from compound 42 and thiophene-di-boronicacid-pinacolester [175361-81-6] in a 1:1 ratio. The product is fractionated in a Soxhlet apparatus with tetrahydrofurane and chloroform.

The invention claimed is:

1. A polymer, comprising a unit of formula $-\!\!\!+\!\!Ar^3\!\!+\!\!_c\!\!-\!\![\,Ar^2\!\!+\!\!_b\!\!+\!\!Ar^1\!\!+\!\!_a Y\!\!+\!\!Ar^{1'}\!\!+\!\!_{a'}\!\!+\!\!Ar^{2'}\!\!+\!\!_{b'}\!\!+\!\!Ar^{3'}\!\!+\!\!_{c'}$ (I), wherein Y is a group of formula

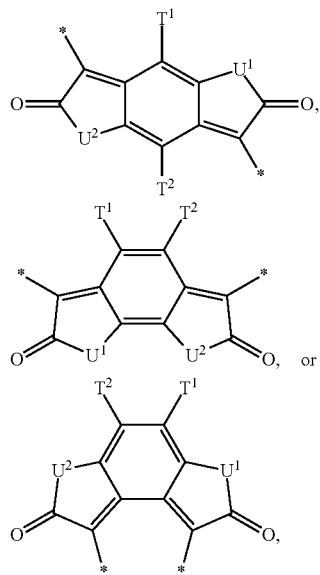

a is 1, 2, or 3; a' is 1, 2, or 3; b is 0, 1, 2, or 3; b' is 0, 1, 2, or 3; c is 0, 1, 2, or 3; c' is 0, 1, 2, or 3;

$U^1$ is O, S, or $NR^1$;

$U^2$ is O, S, or $NR^2$;

$T^1$ and $T^2$ are each independently hydrogen, halogen, hydroxyl, cyano, $-COOR^{103}$, $-OCOR^{103}$, $-NR^{112}COR^{103}$, $-CONR^{112}R^{113}$, $-OR^{103'}$, $-SR^{103'}$, $-SOR^{103'}$, $-SO_2R^{103'}$, $-NR^{112}SO_2R^{103'}$, $-NR^{112}R^{113}$, $C_1-C_{25}$alkyl, which may be substituted by E and/or interrupted by D, $C_5-C_{12}$cycloalkyl, which can be substituted one to three times with $C_1-C_8$alkyl and/or $C_1-C_8$alkoxy; $C_7-C_{25}$arylalkyl, $C_6-C_{24}$aryl, $C_6-C_{24}$aryl which is substituted by G, $C_2-C_{20}$heteroaryl, or $C_2-C_{20}$heteroaryl which is substituted by G;

$R^1$ and $R^2$ may be the same or different and are each independently selected from hydrogen, a $C_1-C_{100}$alkyl group which can optionally be substituted with $C_1-C_{12}$alkyl, $C_1-C_{12}$alkoxy, halogen, $C_5-C_{12}$cycloalkyl, nitro, cyano, vinyl, allyl, $C_6-C_{24}$aryl, $C_2-C_{20}$heteroaryl, a silyl group, or a siloxanyl group; and/or can optionally be interrupted by —O—, —S—, $-NR^{39}-$, $CONR^{39}-$, $NR^{39}CO-$, —COO—, —CO— or —OCO—, a $C_2-C_{100}$alkenyl group which can optionally be substituted with $C_1-C_{12}$alkyl, $C_1-C_{12}$alkoxy, halogen, $C_5-C_{12}$cycloalkyl, nitro, cyano, vinyl, allyl, $C_6-C_{24}$aryl, $C_2-C_{20}$heteroaryl, a silyl group, or a siloxanyl group; and/or can optionally be interrupted by —O—, —S—, $-NR^{39}-$, $CONR^{39}-$, $NR^{39}CO-$, —COO—, —CO— or —OCO—, a $C_3-C_{100}$alkinyl group which can optionally be substituted with $C_1-C_{12}$alkyl, $C_1-C_{12}$alkoxy, halogen, $C_5-C_{12}$cycloalkyl, nitro, cyano, vinyl, allyl, $C_6-C_{24}$aryl, $C_2-C_{20}$heteroaryl, a silyl group, or a siloxanyl group; and/or can optionally be interrupted by —O—, —S—, $-NR^{39}-$, $CONR^{39}-$, $NR^{39}CO-$, —COO—, —CO— or —OCO—, a $C_3-C_{12}$cycloalkyl group which can optionally be substituted with $C_1-C_{12}$alkyl, $C_1-C_{12}$alkoxy, halogen, $C_5-C_{12}$cycloalkyl, nitro, cyano, vinyl, allyl, $C_6-C_{24}$aryl, $C_2-C_{20}$heteroaryl, a silyl group, or a siloxanyl group; and/or can optionally be interrupted by —O—, —S—, $-NR^{39}-$, $CONR^{39}-$, $NR^{39}CO-$, —COO—, —CO— or —OCO—, a $C_6-C_{24}$aryl group which can optionally be substituted with $C_1-C_{12}$alkyl, $C_1-C_{12}$alkoxy, halogen, $C_5-C_{12}$cycloalkyl, nitro, cyano, vinyl, allyl, $C_6-C_{24}$aryl, $C_2-C_{20}$heteroaryl, a silyl group, or a siloxanyl group, a $C_2-C_{20}$heteroaryl group which can optionally be substituted with $C_1-C_{12}$alkoxy, $C_1-C_{12}$alkoxy, halogen, $C_5-C_{12}$cycloalkyl, nitro, cyano, vinyl, allyl, $C_6-C_{24}$aryl, $C_2-C_{20}$heteroaryl, a silyl group, or a siloxanyl group, a $-CO-C_1-C_{18}$alkyl group, a $-CO-C_5-C_{12}$cycloalkyl group, or $-COO-C_1-C_{18}$alkyl group;

$R^{39}$ is hydrogen, $C_1-C_{18}$alkyl, $C_1-C_{18}$haloalkyl, $C_7-C_{25}$arylalkyl, or $C_1-C_{18}$alkanoyl, $R^{103}$ and $R^{103'}$ are each independently $C_1-C_{100}$alkyl, $C_1-C_{25}$alkyl substituted by E and/or interrupted with D, $C_7$-$C_{25}$arylalkyl, $C_6$-$C_{24}$aryl, $C_6$-$C_{24}$aryl which is substituted by G, $C_2$-$C_{20}$heteroaryl, or $C_2$-$C_{20}$heteroaryl which is substituted by G;
$Ar^1$ and $Ar^{1'}$ are each independently
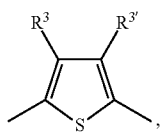
(XIa)
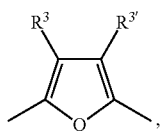
(XIb)
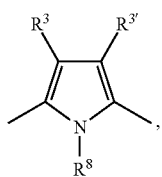
(XIc)
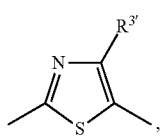
(XId)
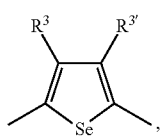
(XIe)
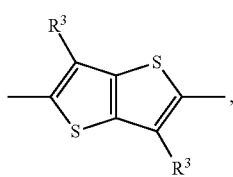
(XIf)
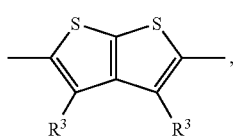
(XIg)
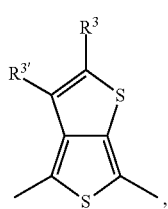
(XIh)
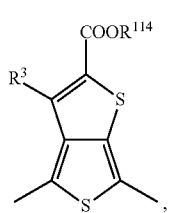
(XIi)
-continued
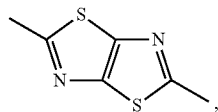
(XIj)
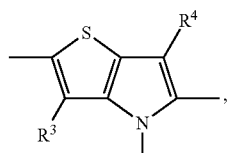
(XIk)
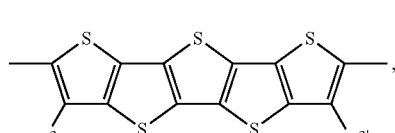
(XIl)
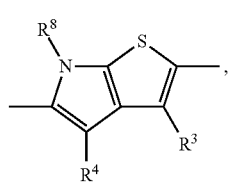
(XIm)
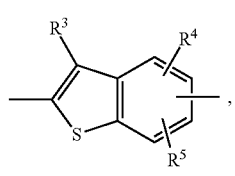
(XIn)
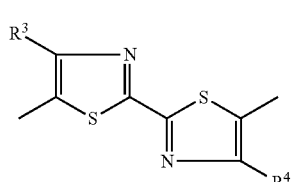
(XIo)
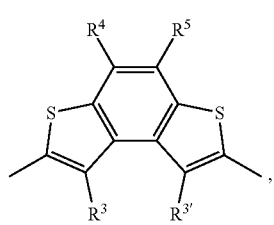
(XIp)
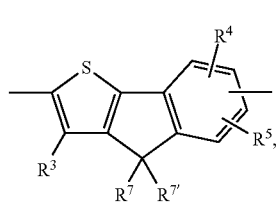
(XIq)
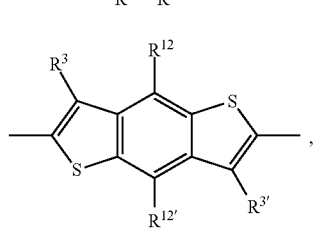
(XIr)

-continued
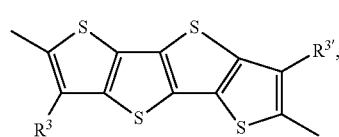 (XIs)
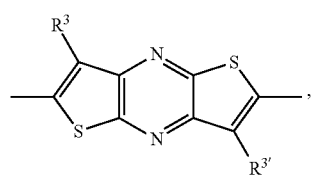 (XIt)
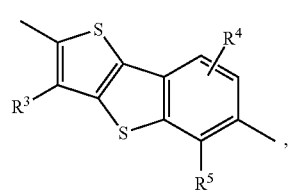 (XIu)
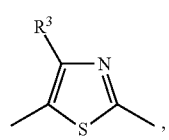 (XIv)
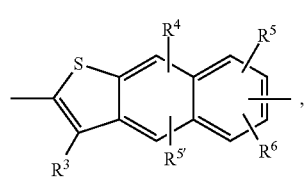 (XIw)
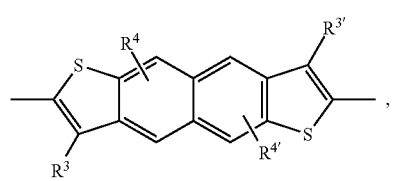 (XIx)
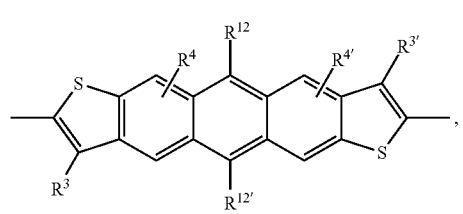 (XIy)
 (XIz)
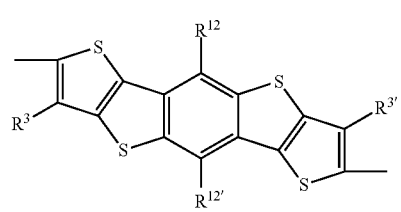 (XIIa)
-continued
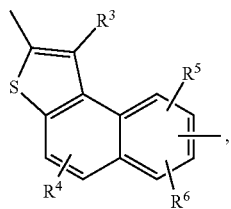 (XIIb)
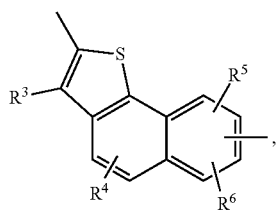 (XIIc)
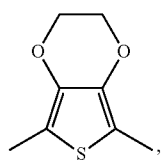 (XIId)
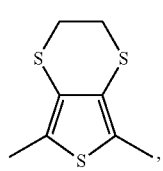 (XIIe)
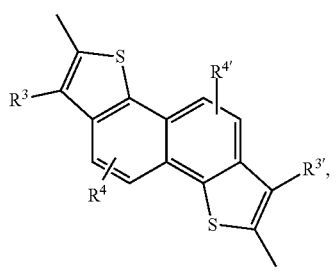 (XIIf)
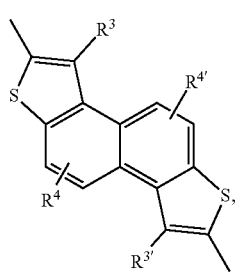 (XIIg)
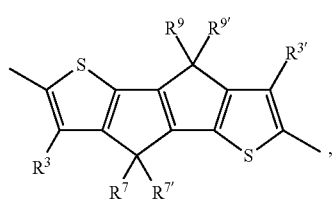 (XIIh)

-continued
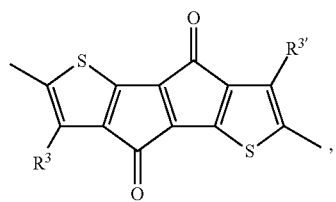 (XIIi)
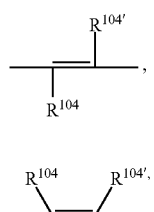 (XIIj)
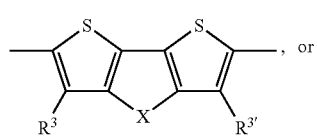 (XIIk)
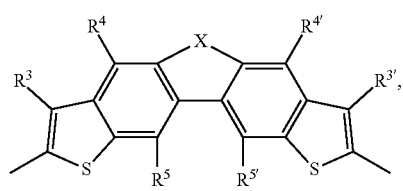 (XIII), or
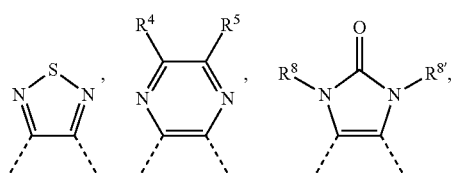 (XIV)
wherein
X is —O—, —S—, —NR⁸—, —Si(R¹¹)(R¹¹')—, —Ge(R¹¹)(R¹¹')—, —C(R⁷)(R⁷')—, —C(=O)—, —C(=CR¹⁰⁴R¹⁰⁴')—,
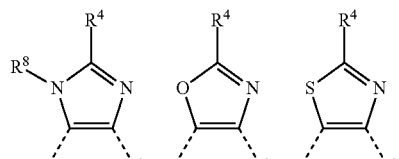
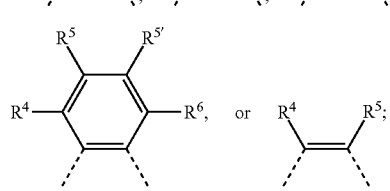
Ar², Ar²', Ar³ and Ar³' have independently of each other the meaning of Ar¹, or are independently of each other
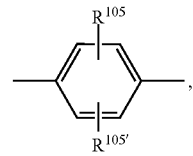 (XVa)
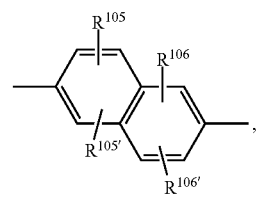 (XVb)
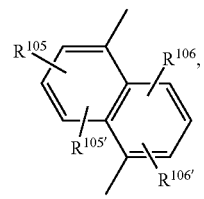 (XVc)
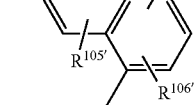
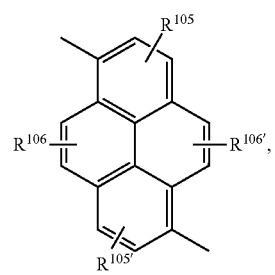 (XVd)
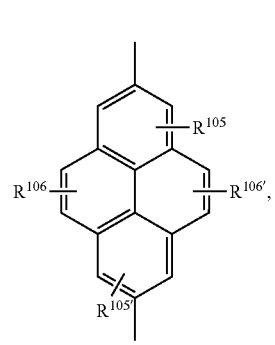 (XVe)
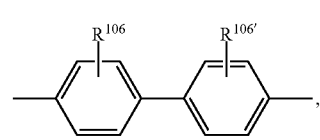 (XVf)
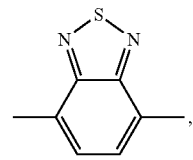 (XVg)

-continued

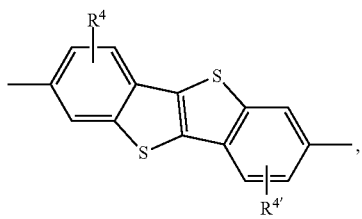
(XVh)

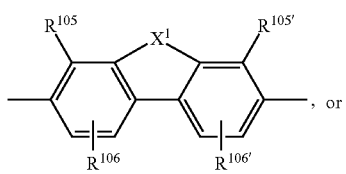
(XVI)

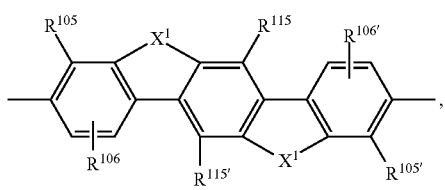
(XVII)

wherein
$X^1$ is S, O, $NR^{107}$—, —$Si(R^{117})(R^{117'})$—, —$Ge(R^{117})(R^{117'})$—, —$C(R^{106})(R^{109})$—, —$C(=O)$—, —$C(=CR^{104}R^{104'})$—,

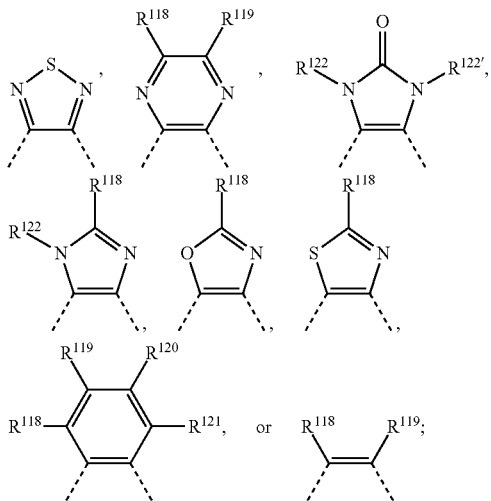

$R^3$ and $R^{3'}$ are each independently hydrogen, halogen, halogenated $C_1$-$C_{25}$alkyl, cyano, $C_1$-$C_{25}$alkyl, which may optionally be interrupted by an oxygen or sulphur atom; $C_7$-$C_{25}$arylalkyl, or $C_1$-$C_{25}$alkoxy;

$R^{104}$ and $R^{104'}$ are each independently hydrogen, cyano, $COOR^{103}$, a $C_1$-$C_{25}$alkyl group, or $C_6$-$C_{24}$aryl or $C_2$-$C_{20}$heteroaryl;

$R^4$, $R^{4'}$, $R^5$, $R^{5'}$, $R^6$, and $R^{6'}$ are each independently hydrogen, halogen, halogenated $C_1$-$C_{25}$alkyl, cyano, $C_1$-$C_{25}$alkyl, which may optionally be interrupted by an oxygen or sulphur atom; $C_7$-$C_{25}$arylalkyl, or $C_1$-$C_{25}$alkoxy;

$R^7$, $R^{7'}$, $R^9$ and $R^{9'}$ are each independently hydrogen, $C_1$-$C_{25}$alkyl, which may optionally be interrupted by an oxygen, or sulphur atom; or $C_7$-$C_{25}$arylalkyl, $R^8$ and $R^{8'}$ are each independently hydrogen, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, which may optionally be interrupted by an oxygen or sulphur atom; or $C_7$-$C_{25}$arylalkyl, $R^{11}$ and $R^{11'}$ are each independently $C_1$-$C_{25}$alkyl group, which can be substituted with $C_1$-$C_8$alkyl and/or $C$-$C_8$alkoxy;

$R^{12}$ and $R^{12'}$ are each independently hydrogen, halogen, cyano, $C_1$-$C_{25}$alkyl, which may optionally be interrupted by an oxygen, or sulphur atom, $C_1$-$C_{25}$alkoxy, $C_7$-$C_{25}$arylalkyl, or —≡—$R^{13}$, wherein $R^{13}$ is a $C_1$-$C_{10}$alkyl group, or a tri($C_1$-$C_8$alkyl)silyl group;

$R^{104}$ and $R^{104'}$ are each independently hydrogen, $C_1$-$C_{18}$alkyl, $C_6$-$C_{10}$aryl, which may optionally be substituted by G, or $C_2$-$C_8$heteroaryl, which may optionally be substituted by G, $R^{105}$, $R^{105'}$, $R^{106}$ and $R^{106'}$ are each independently hydrogen, halogen, cyano, $C_1$-$C_{25}$alkyl, which may optionally be interrupted by an oxygen or sulphur atom; $C_7$-$C_{25}$arylalkyl, or $C_1$-$C_{18}$alkoxy;

$R^{107}$ is hydrogen, $C_7$-$C_{25}$arylalkyl, $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$perfluoroalkyl; $C_1$-$C_{25}$alkyl, which may be interrupted by —O—, or —S—; or —$COOR^{103}$ ;

$R^{108}$ and $R^{109}$ are each independently H, $C_1$-$C_{25}$alkyl, $C_1$-$C_{25}$alkyl which is substituted by E and/or interrupted by D, $C_7$-$C_{25}$arylalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, or $R^{108'}$ and $R^{109'}$ together form a group of formula =$CR^{110}R^{111}$, wherein $R^{110}$ and $R^{111}$ are each independently H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^{108}$ and $R^{109}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl;

D is —CO—, —COO—, —S—, —O—, or —$NR^{112}$—;
E is $C_1$-$C_8$thioalkoxy, $C_1$-$C_8$alkoxy, CN, —$NR^{112}R^{113}$, —$CONR^{112}R^{113}$, or halogen;
G is E, or $C_1$-$C_{18}$alkyl;

$R^{112}$ and $R^{113}$ are each independently H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—;

$R^{114}$ is $C_1$-$C_{25}$alkyl, which may optionally be interrupted by an oxygen, or sulphur atom;

$R^{115}$ and $R^{115'}$ are each independently hydrogen, halogen, cyano, $C_1$-$C_{25}$alkyl, which may optionally be interrupted by an oxygen, or sulphur atom, $C_1$-$C_{25}$alkoxy, $C_7$-$C_{25}$arylalkyl, or —≡—$R^{116}$, wherein $R^{116}$ is a $C_1$-$C_{10}$alkyl group, or a tri($C_1$-$C_8$alkyl)silyl group;

$R^{117}$ and $R^{117'}$ are each independently $C_1$-$C_{25}$alkyl group, which can be substituted one to three times with $C_1$-$C_8$alkyl and/or $C_1$-$C_8$alkoxy;

R[118], R[119], R[120] and R[121] are each independently hydrogen, halogen, halogenated $C_1$-$C_{25}$alkyl, cyano, $C_1$-$C_{25}$alkyl, which may optionally be interrupted by an oxygen or sulphur atom; $C_7$-$C_{25}$arylalkyl, or $C_1$-$C_{25}$alkoxy; and R[122] and R[122'] are each independently hydrogen, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, which may optionally be interrupted by an oxygen or sulphur atom; or $C_7$-$C_{25}$arylalkyl.

2. The polymer according to claim 1, which is a polymer comprising a unit of formula $-\!\!\!+\!\!Ar^1\!\!-\!\!]_a Y\!-\!\![Ar^{1'}\!\!-\!\!]_{a'}$, (I'), wherein Y is a group of formula

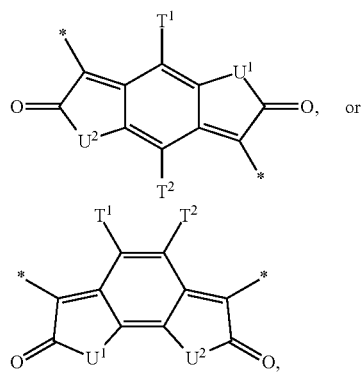

$U^1$ is O, S, or $NR^1$;

$U^2$ is O, S, or $NR^2$;

$T^1$ and $T^2$ are each independently hydrogen, halogen, cyano, —COOR[103], —OCOR[103], —OR[103'], $C_1$-$C_{25}$alkyl, which may be substituted by E and/or interrupted by D, $C_6$-$C_{24}$aryl, $C_6$-$C_{24}$aryl which is substituted by G, $C_2$-$C_{20}$heteroaryl, or $C_2$-$C_{20}$heteroaryl which is substituted by G;

$R^1$ and $R^2$ may be the same or different and are each independently selected from the group consisting of hydrogen, $C_1$-$C_{50}$alkyl, $C_1$-$C_{50}$haloalkyl, $C_7$-$C_{25}$arylalkyl, $C_2$-$C_{50}$alkenyl, $C_2$-$C_{50}$haloalkenyl, allyl, $C_5$-$C_{12}$cycloalkyl, phenyl or naphthyl which can optionally be substituted with $C_1$-$C_{12}$alkyl or $C_1$-$C_{12}$alkoxy, —CO—$C_1$-$C_{18}$alkyl, —CO—$C_5$-$C_{12}$cycloalkyl, and —COO—$C_1$-$C_{18}$alkyl;

a is 1, 2, or 3, a' is 1, 2, or 3; wherein $Ar^1$ and $Ar^{1'}$ are as defined in claim 1; and R[103], R[103'], D, E and G are as defined in claim 1.

3. The polymer according to claim 1, comprising at least one unit selected from the group consisting of formula

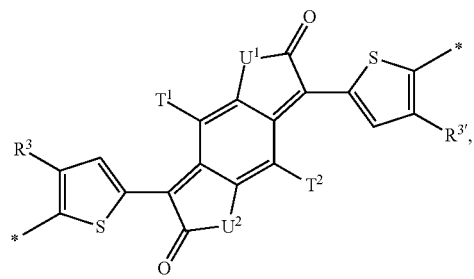

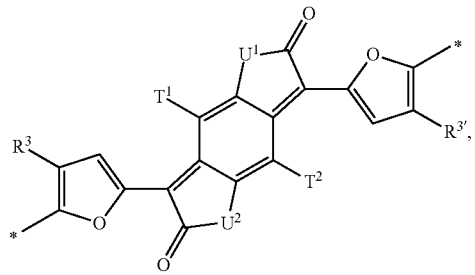

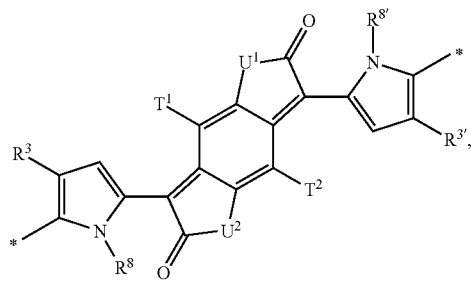

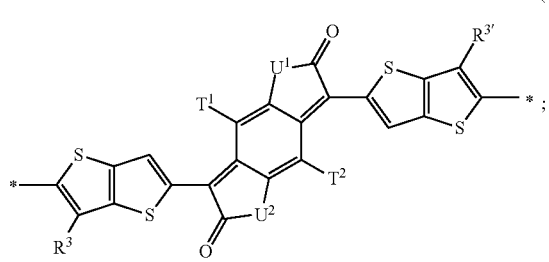

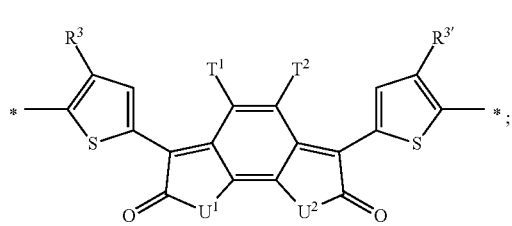

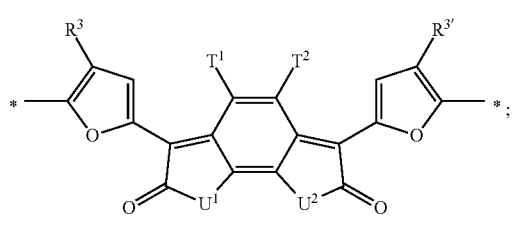

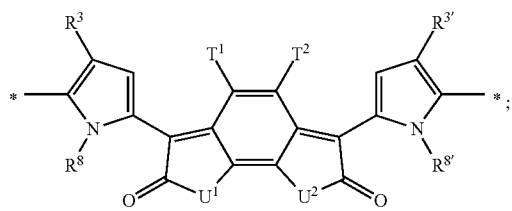

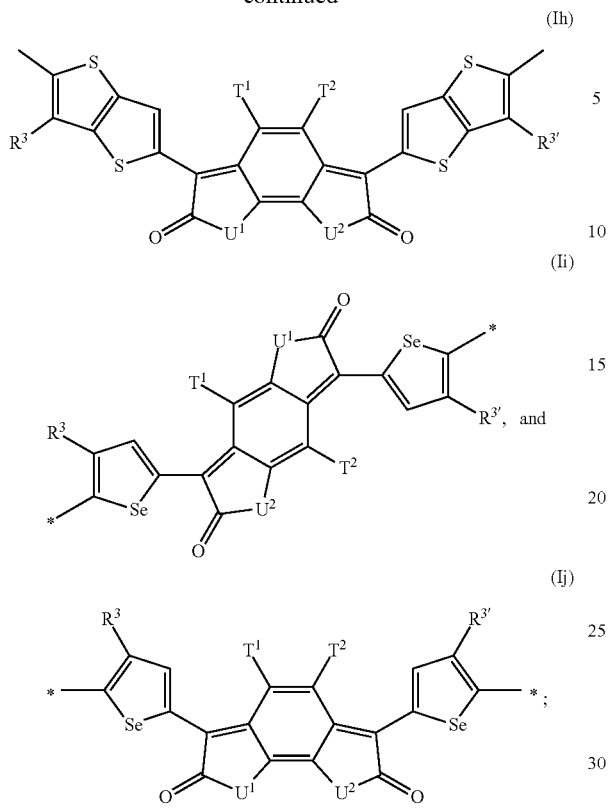

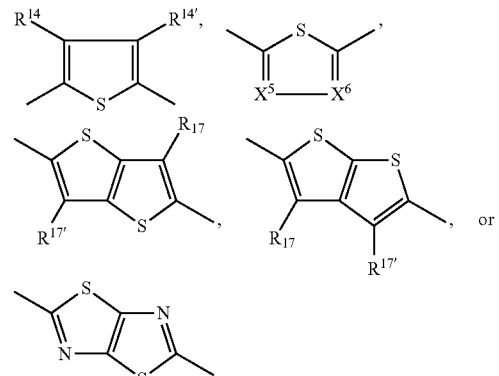

wherein one of $X^5$ and $X^6$ is N and the other is $CR^{14}$, and $R^{14}$, $R^{14'}$, $R^{17}$ and $R^{17'}$ are each independently H, or a $C_1$-$C_{25}$alkyl group.

5. The polymer according to claim 4, wherein A is a repeating unit of formula (Ia), (Ib), (Id), or (Ii), and *—(—COM¹—)—* is a group of formula

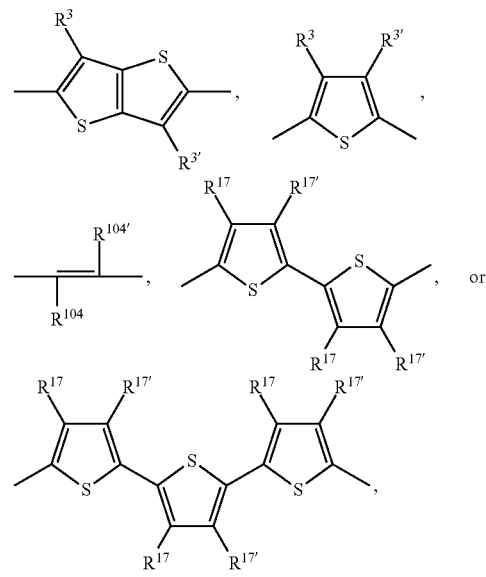

where $R^3$, $R^{3'}$, $R^{17}$ and $R^{17'}$ are each independently hydrogen, or $C_1$-$C_{25}$alkyl.

6. The polymer according to claim 4, which is a polymer of formula wherein
U¹ is O, or NR¹;
U² is O, or NR²;
T¹ and T² are each independently hydrogen, or $C_1$-$C_{25}$alkyl;
R¹ and R² may be the same or different and are each independently selected from a $C_1$-$C_{38}$alkyl group;
R³ and R³' are each independently hydrogen or $C_1$-$C_{25}$alkyl; and
R⁸ and R⁸' are each independently hydrogen or $C_1$-$C_{25}$alkyl.

4. The polymer according to claim 3, comprising a unit of formula *—(—A—)—* and *—(—COM¹—)—*, wherein
A is a repeating unit of formula (I), and
—COM¹— is a repeating unit, which has the meaning of Ar², or a group of formula *—(—Ar¹⁴—)—ₛ(—Ar¹⁵—)—ₜ—[ Ar¹⁶—]ᵤ(—Ar¹⁷—)ᵥ*,
s is 1, t is 1, u is 0, or 1, v is 0, or 1, and
Ar¹⁴, Ar¹⁵, Ar¹⁶ and Ar¹⁷ are each independently a group of formula (Ia1)

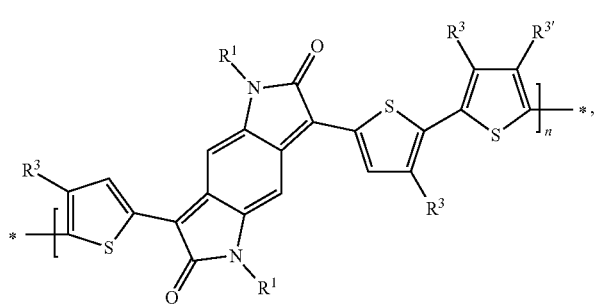

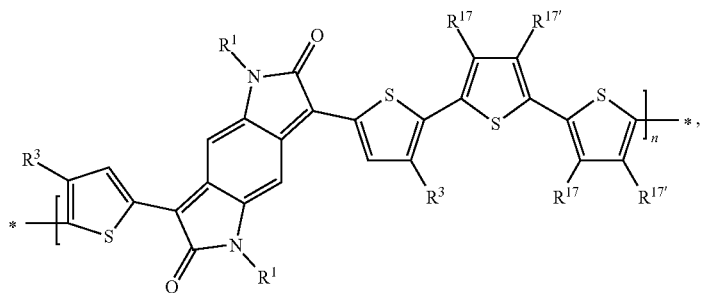
(Ia2)
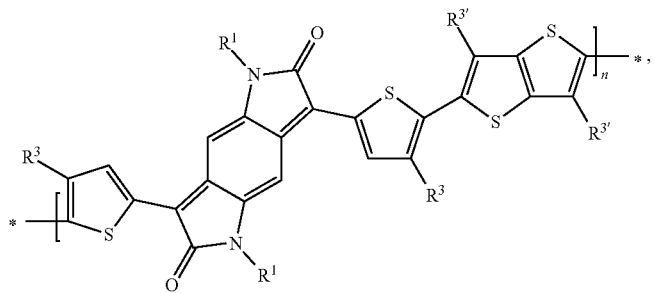
(Ia3)
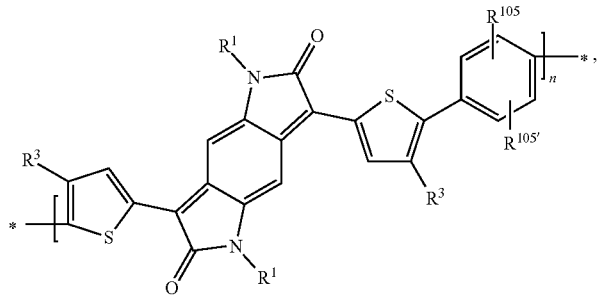
(Ia4)
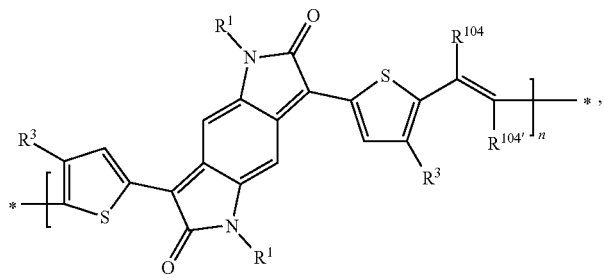
(Ia5)
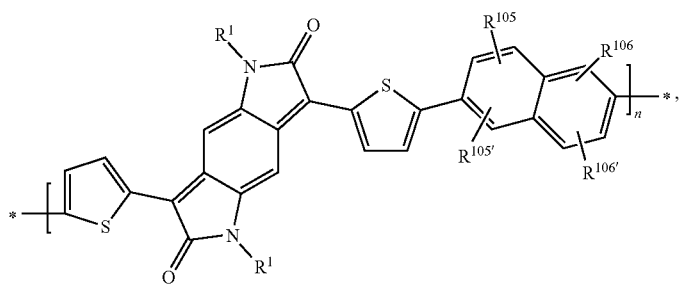
(Ia6)

-continued
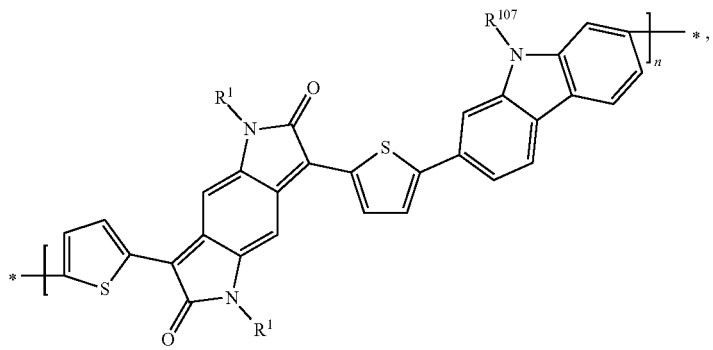
(Ia-7)
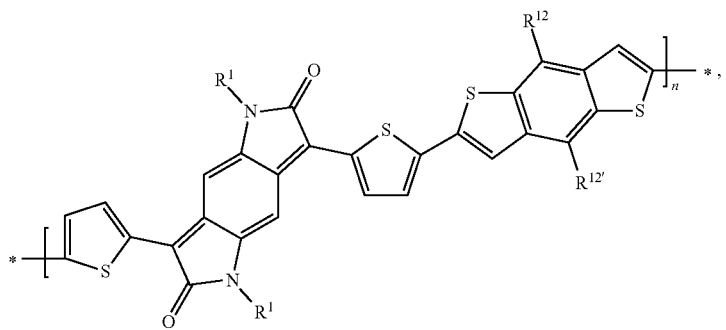
(Ia-8)
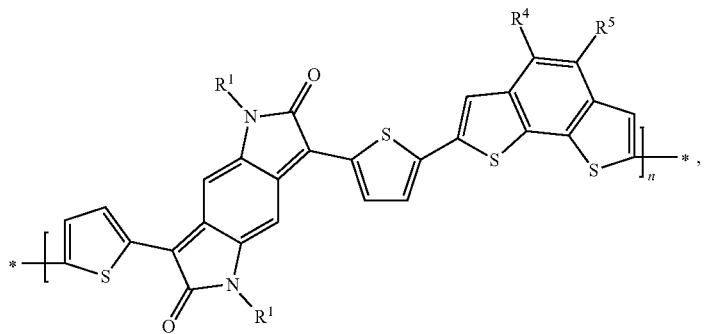
(Ia-9)
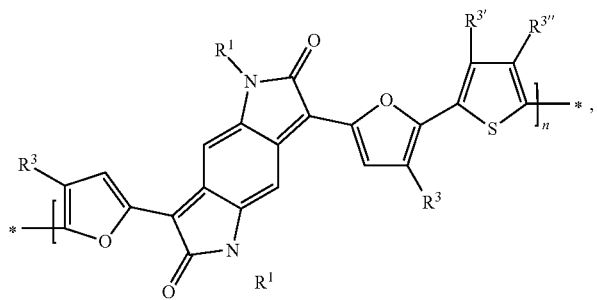
(Ia-10)
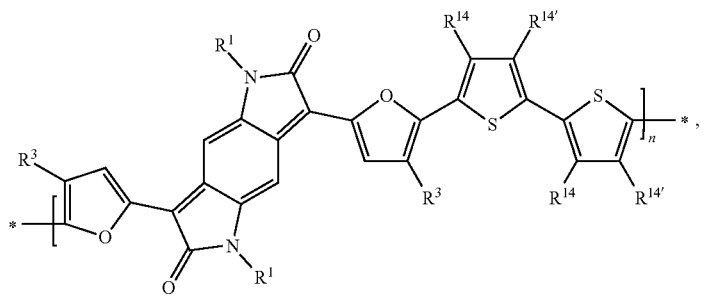
(Ia-11)

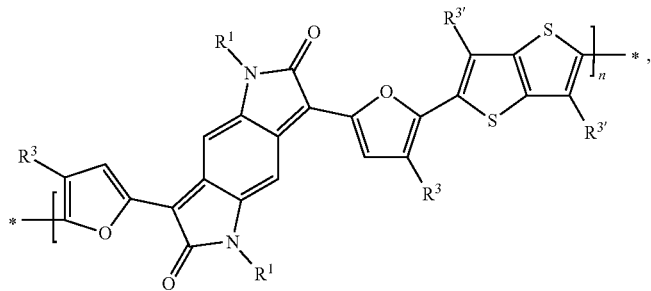
(Ia-12)
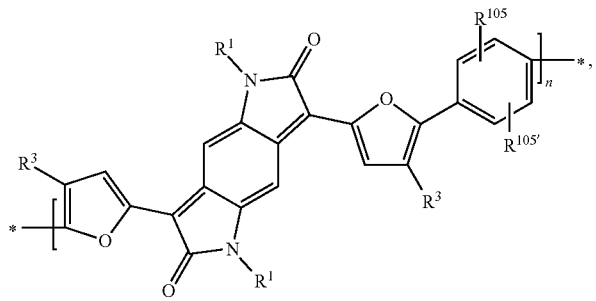
(Ia-13)
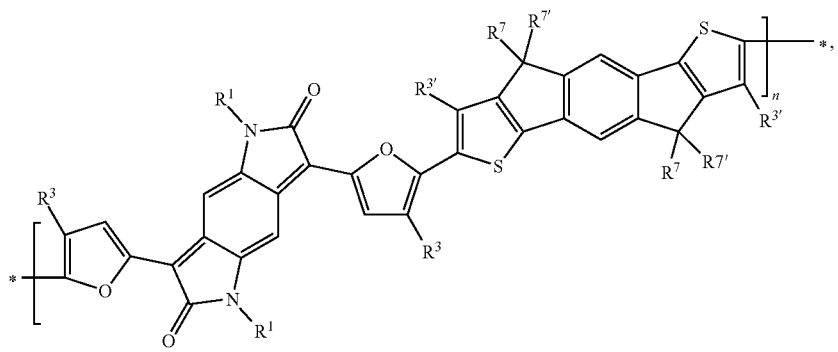
(Ia-14)
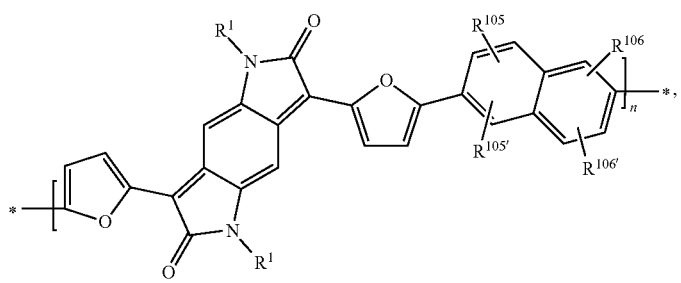
(Ia-15)
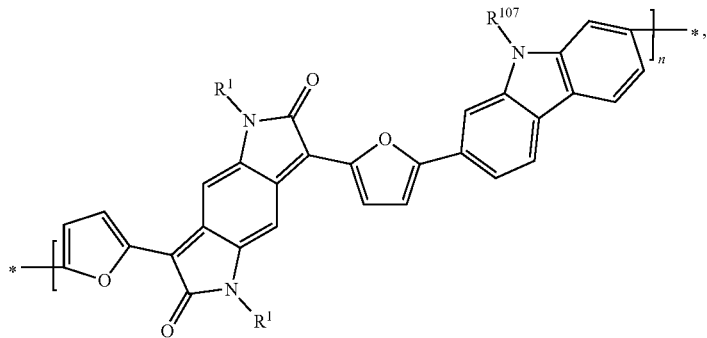
(Ia-16)

-continued
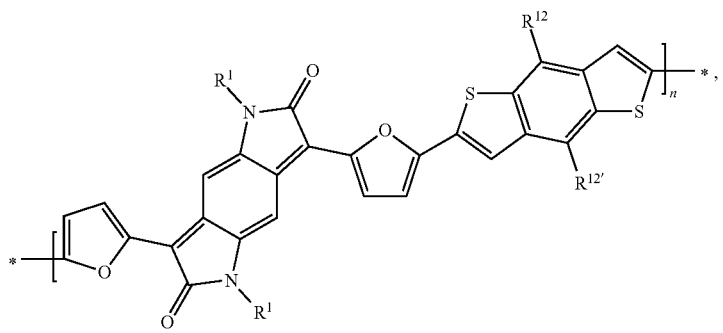
(Ia-17)
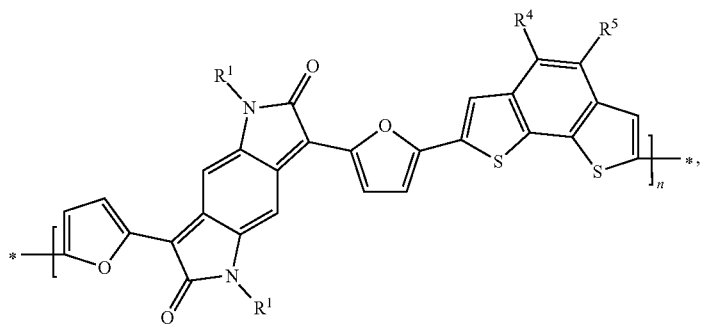
(Ia-18)
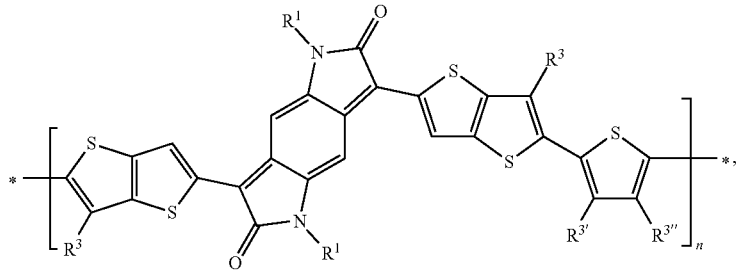
(Ia-19)
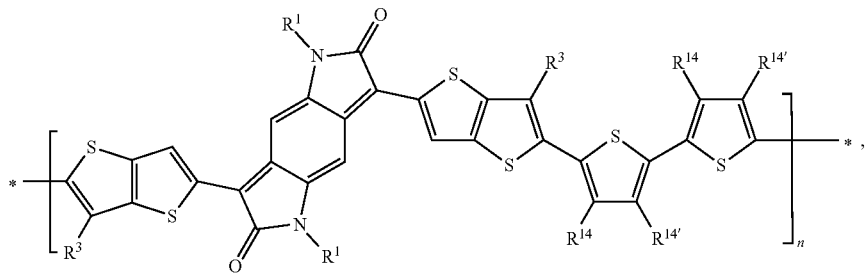
(Ia-20)
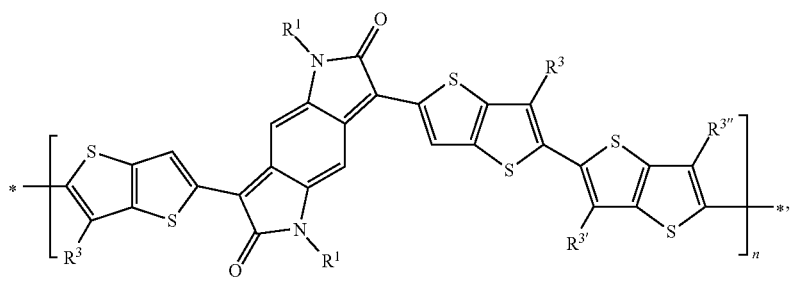
(Ia-21)

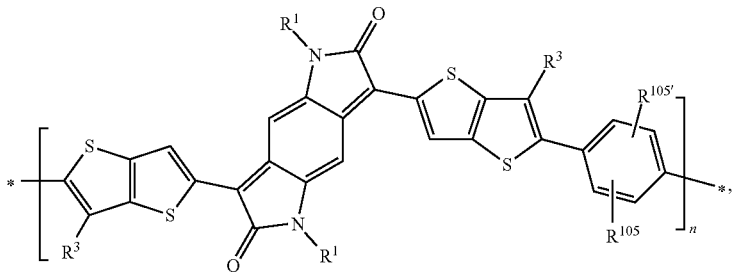
(Ia-22)
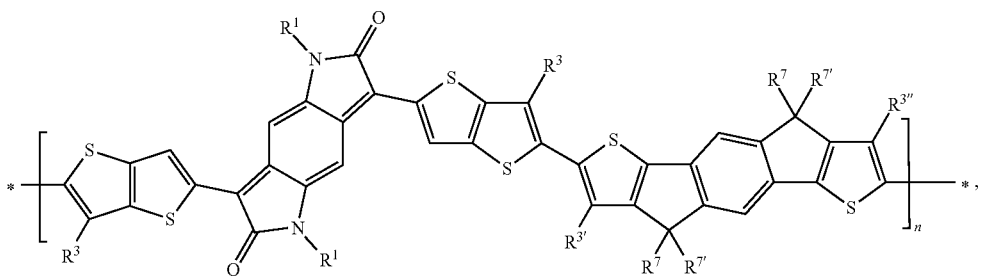
(Ia-23)
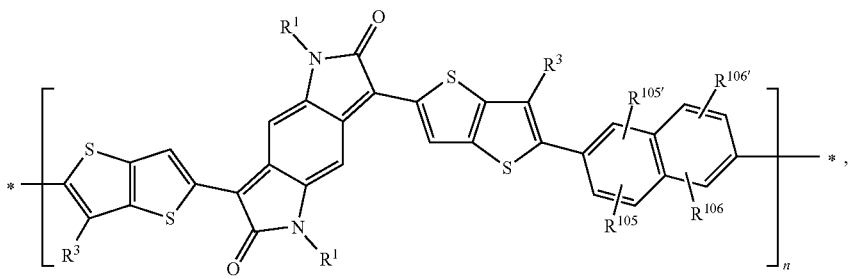
(Ia-24)
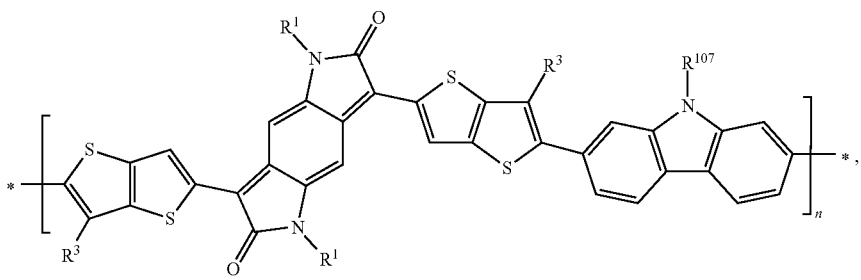
(Ia-25)
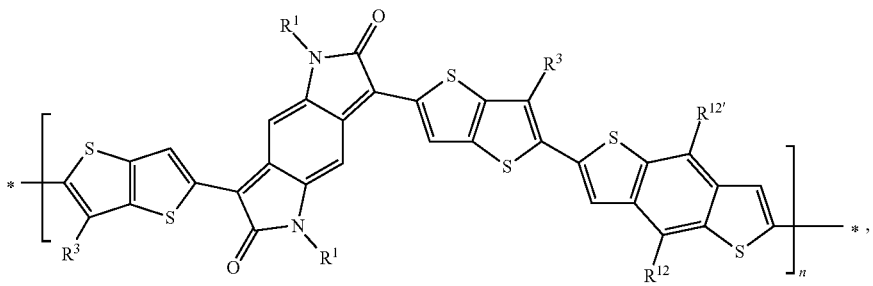
(Ia-26)

-continued

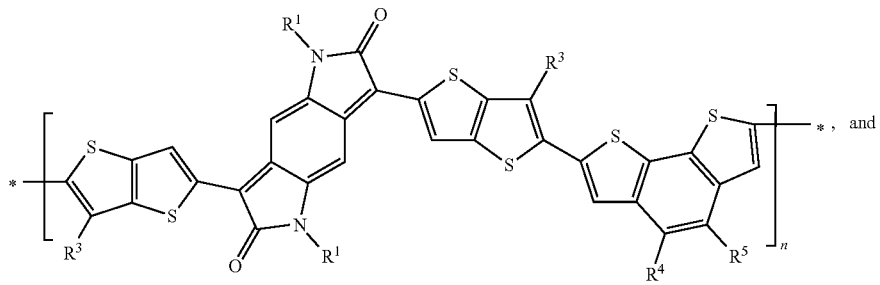

(Ia-27)

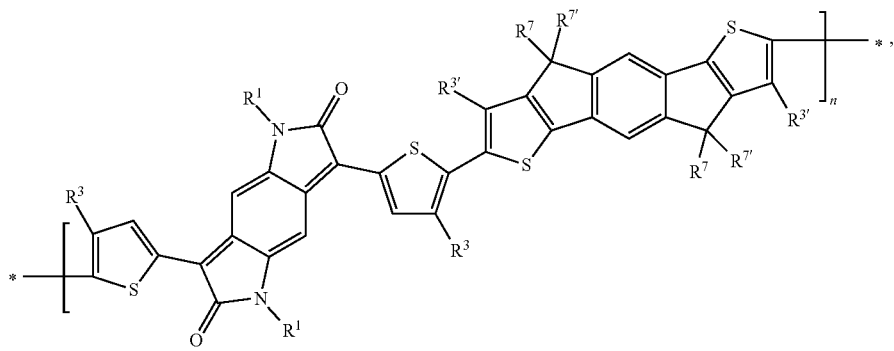

(Ia-27)

wherein
n is from 4 to 1000,
R$^1$ is a C$_1$-C$_{38}$alkyl group,
R$^3$, R$^{3'''}$ and R$^{3'}$ are each independently hydrogen, halogen, cyano, C$_1$-C$_{25}$alkyl or C$_1$-C$_{25}$alkoxy;
R$^4$ and R$^5$ are each independently hydrogen, or C$_1$-C$_{25}$alkyl;
R$^{12}$ and R$^{12'}$ are H, or a C$_1$-C$_{25}$alkyl group;
R$^7$ and R$^{7'}$ are independent of each other;
R$^{14}$ and R$^{14'}$ are each independently hydrogen, halogen, cyano, C$_1$-C$_{25}$alkyl or C$_1$-C$_{25}$alkoxy;
R$^{17}$ and R$^{17'}$ are each independently H, or a C$_1$-C$_{25}$alkyl group;
R$^{103}$ is C$_1$-C$_{25}$alkyl;
R$^{104}$ and R$^{104'}$ are each independently hydrogen, cyano, COOR$^{103}$, C$_1$-C$_{25}$alkyl;
R$^{105}$, R$^{105'}$, R$^{106}$ and R$^{106'}$ are each independently hydrogen, halogen, cyano, C$_1$-C$_{25}$alkyl or C$_1$-C$_{25}$alkoxy; and
R$^{107}$ is C$_1$-C$_{25}$alkyl.

7. A process for the preparation of a polymer of formula

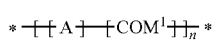 (VII')

according to claim 4, comprising reacting a dihalogenide of formula X$^{10}$-A-X$^{10}$ with an equimolar amount of a diboronic acid or diboronate corresponding to formula X$^{11}$—[COM$^1$]—X$^{11}$, or reacting a dihalogenide of formula X$^{10}$—[COM$^1$]—X$^{10}$ with an equimolar amount of a diboronic acid or diboronate corresponding to formula X$^{11}$-A-X$^{11}$, wherein X$^{10}$ is halogen, and X$^{11}$ is independently in each occurrence —B(OH)$_2$, —B(OY$^1$)$_2$,

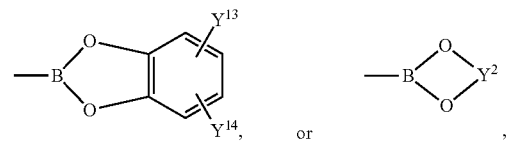

wherein Y$^1$ is independently in each occurrence a C$_1$-C$_{10}$alkyl group and Y$^2$ is independently in each occurrence a C$_2$-C$_{10}$alkylene group and Y$^{13}$ and Y$^{14}$ are independently of each other hydrogen, or a C$_1$-C$_{10}$alkyl group, in a solvent and in the presence of a catalyst; or reacting a dihalogenide of formula X$_{10}$-A-X$^{10}$ with an equimolar amount of an organo tin compound corresponding to formula X$^{11'}$—[COM$^1$]—X$^{11'}$, or reacting a dihalogenide of formula X$^{10}$—[COM$^1$]—X$^{10}$ with an equimolar amount of an organo tin compound corresponding to formula X$^{11'}$-A-X$^{11'}$, wherein
X$^{11'}$ is independently in each occurrence —SnR$^{207}$R$^{208}$R$^{209}$, wherein R$^{207}$, R$^{208}$ and R$^{209}$ are identical or different and are H or C$_1$-C$_6$alkyl, or two of the groups R$^{207}$, R$^{208}$ and R$^{209}$ form a ring and these groups are optionally branched, A and COM$^1$ are as defined in claim 4 and n is in the range of 4 to 1000.

8. An organic semiconductor material, layer or component, comprising a polymer according to claim 1.

9. A semiconductor device, comprising a polymer according to claim 1.

10. The semiconductor device according to claim 9, which is an organic photovoltaic device, a photodiode, or an organic field effect transistor.

11. The polymer according to claim 1, wherein the polymer is suitable for PV devices, photodiodes, as IR absorber, or organic field effect transistor.

12. A compound of formula A$^1$-Y—[A$^3$-y$^{15}$]$_o$—[A$^4$-Y$^{16}$]$_p$—[A$^5$-Y$^{17}$]$_q$A$^2$ (III), wherein Y, Y$^{15}$, Y$^{16}$ and Y$^{17}$ are each independently a group of formula -continued

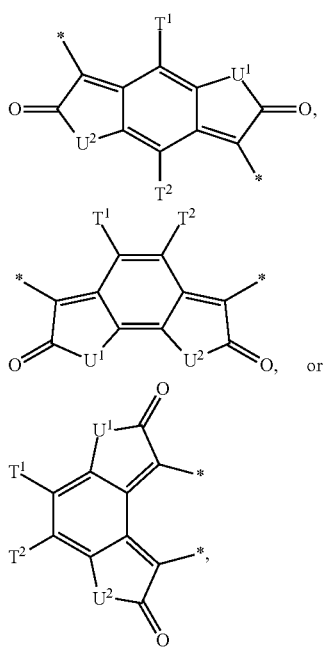

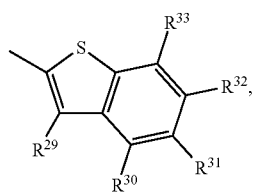
(IVc)

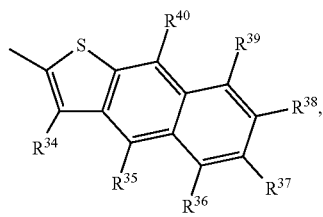
(IVd)

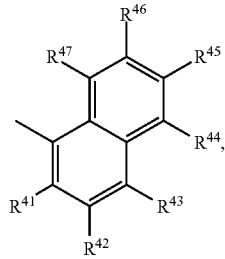
(IVe)

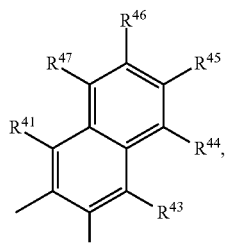
(IVf)

o is 0, or 1, p is 0, or 1, q is 0, or 1;
$A^1$ and $A^2$ are each independently a group of formula
$-[Ar^1]_a-[Ar^2]_b-[Ar^3]_c-R^{10}$,
$A^3$, $A^4$ and $A^5$ are each independently a group of formula
$*-[Ar^4]_k-[Ar^5]_l-[Ar^6]_r-[Ar^7]_z-*$,
k is 1, 2, or 3; l is 0, 1, 2, or 3; r is 0, 1, 2, or 3; z is 0, 1, 2, or 3;
$R^{10}$ is hydrogen, halogen, cyano, $C_1$-$C_{25}$alkyl, $C_1$-$C_{25}$alkyl which is substituted by E and/or interrupted by D,

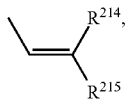

COO—$C_1$-$C_{18}$alkyl, $C_4$-$C_{18}$cycloalkyl group, $C_4$-$C_{18}$cycloalkyl group, which is substituted by G, $C_2$-$C_{18}$alkenyl, $C_2$-$C_{18}$alkynyl, $C_1$-$C_{18}$thioalkoxy, $C_1$-$C_{18}$alkoxy, $C_1$-$C_{18}$alkoxy which is substituted by E and/or interrupted by D, $C_7$-$C_{25}$aralkyl, $C_7$-$C_{25}$aralkyl, which is substituted by G, or a group of formulae IVa to IVm,

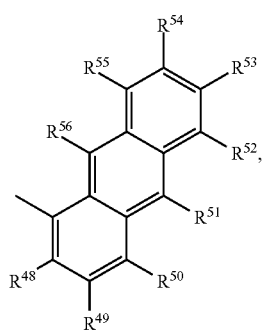
(IVg)

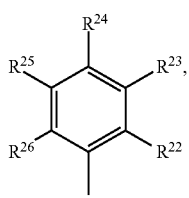
(IVa)

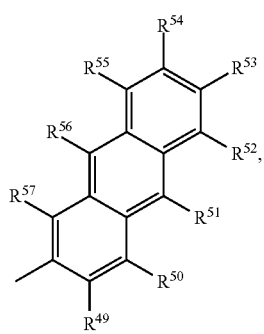
(IVh)

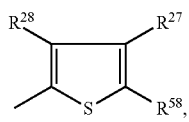
(IVb)

-continued

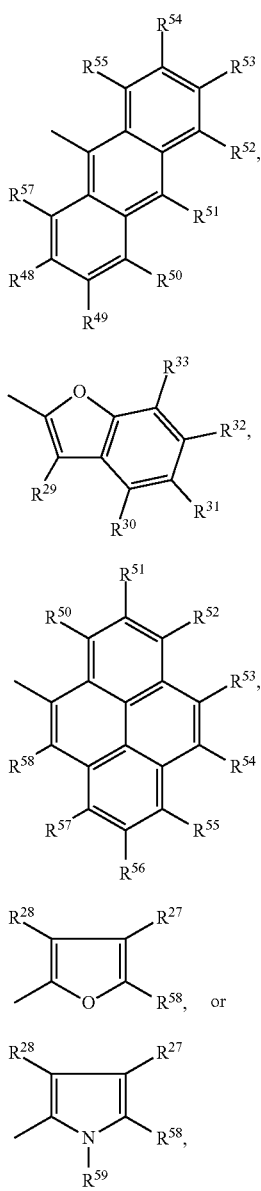

(IVi)

(IVj)

(IVk)

(IVl)

(IVm)

wherein $R^{22}$ to $R^{26}$ and $R^{29}$ to $R^{58}$ are each independently of H, halogen, cyano, $C_1$-$C_{25}$alkyl, $C_1$-$C_{25}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, a $C_4$-$C_{18}$cycloalkyl group, a $C_4$-$C_{18}$cycloalkyl group, which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G;

$R^{27}$ and $R^{28}$ are each independently hydrogen, $C_1$-$C_{25}$alkyl, halogen, cyano or $C_7$-$C_{25}$aralkyl, or $R^{27}$ and $R^{28}$ together represent alkylene or alkenylene which may be both bonded via oxygen and/or sulfur to the thienyl residue and which may both have up to 25 carbon atoms;

$R^{59}$ is hydrogen, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, which may optionally be interrupted by an oxygen or sulphur atom; or $C_7$-$C_{25}$arylalkyl;

D is —CO—, —COO—, —S—, —O—, or —NR$^{112}$—;

E is $C_1$-$C_8$thioalkoxy, $C_1$-$C_8$alkoxy, CN, —NR$^{112}$R$^{113}$, —CONR$^{112}$R$^{113}$, or halogen;

G is E, or $C_1$-$C_{18}$alkyl;

$R^{112}$ and $R^{113}$ are each independently H; $C_6$-$C_{18}$aryl; $C_6$-$C_{18}$aryl which is substituted by $C_1$-$C_{18}$alkyl, or $C_1$-$C_{18}$alkoxy; $C_7$-$C_{18}$alkyl; or $C_1$-$C_{18}$alkyl which is interrupted by —O—;

$R^{214}$ and $R^{215}$ are each independently hydrogen, $C_1$-$C_{18}$alkyl, $C_6$-$C_{24}$aryl, $C_2$-$C_{20}$heteroaryl, —CN or COOR$^{216}$;

$R^{216}$ is $C_1$-$C_{25}$alkyl, $C_1$-$C_{25}$haloalkyl, $C_7$-$C_{25}$arylalkyl, $C_6$-$C_{24}$aryl or $C_2$-$C_{20}$heteroaryl;

Ar$^4$, Ar$^5$, Ar$^6$ and Ar$^7$ have independently of each other the meaning of Ar$^1$, or are independently of each other a group of formula XVa, XVb, XVc, XVd, XVe, XVf, XVg, XVh, XVI, or XVII:

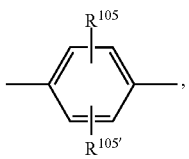
(XVa)

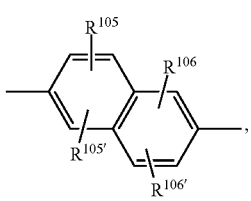
(XVb)

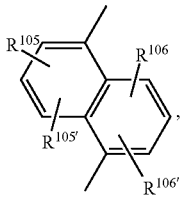
(XVc)

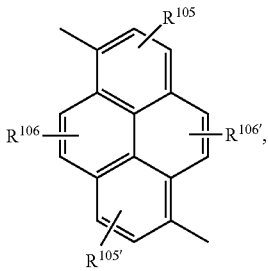
(XVd)

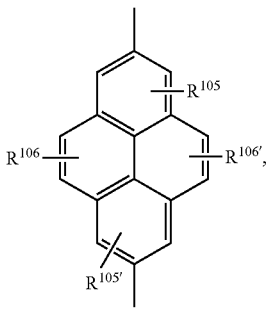
(XVe)

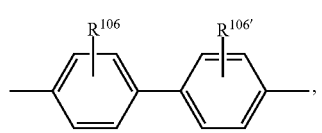 (XVf)

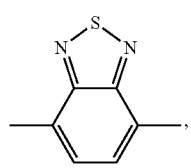 (XVg)

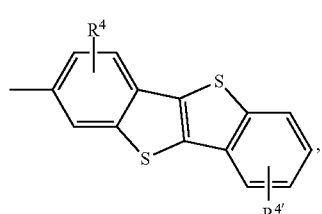 (XVh)

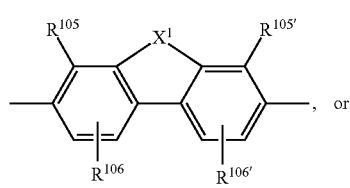 (XVI)

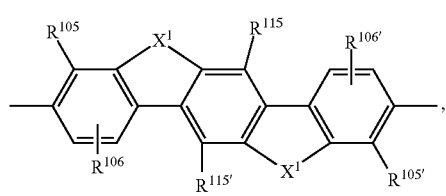 (XVII)

wherein
a is 1, 2, or 3;
b is 0, 1, 2, or 3;
c is 0, 1, 2, or 3;
$U^1$ is O, S, or $NR^1$;
$U^2$ is O, S, or $NR^2$;
$T^1$ and $T^2$ are each independently hydrogen, halogen, hydroxyl, cyano, —$COOR^{103}$, —$OCOR^{103}$, —$NR^{112}COR^{103}$, —$CONR^{112}R^{113}$, —$OR^{103'}$, —$SR^{103'}$, —$SOR^{103'}$, —$SO_2R^{103'}$, —$NR^{112}SO_2R^{103'}$, —$NR^{112}R^{113}$, $C_1$-$C_{25}$alkyl, which may be substituted by E and/or interrupted by D, $C_5$-$C_{12}$cycloalkyl, which can be substituted one to three times with $C_1$-$C_8$alkyl and/or $C_1$-$C_8$alkoxy; $C_7$-$C_{25}$arylalkyl, $C_6$-$C_{24}$aryl, $C_6$-$C_{24}$aryl which is substituted by G, $C_2$-$C_{20}$heteroaryl, or $C_2$-$C_{20}$heteroaryl which is substituted by G;
$R^1$ and $R^2$ may be the same or different and are each independently selected from hydrogen, a $C_1$-$C_{100}$alkyl group which can optionally be substituted with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group; and/or can optionally be interrupted by —O—, —S—, —$NR^{39}$—, $CONR^{39}$—, $NR^{39}CO$—, —COO—, —CO— or —OCO—,
a $C_2$-$C_{100}$alkenyl group which can optionally be substituted with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group; and/or can optionally be interrupted by —O—, —S—, —$NR^{39}$—, $CONR^{39}$—, $NR^{39}CO$—, —COO—, —CO— or —OCO—,
a $C_3$-$C_{100}$alkinyl group which can optionally be substituted with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group; and/or can optionally be interrupted by —O—, —S—, —$NR^{39}$—, $CONR^{39}$—, $NR^{39}CO$—, —COO—, —CO— or —OCO—,
a $C_3$-$C_{12}$cycloalkyl group which can optionally be substituted with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group; and/or can optionally be interrupted by —O—, —S—, —$NR^{39}$—, $CONR^{39}$—, $NR^{39}CO$—, —COO—, —CO— or —OCO—,
a $C_6$-$C_{24}$aryl group which can optionally be substituted with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group,
a $C_2$-$C_{20}$heteroaryl group which can optionally be substituted with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group,
a —CO—$C_1$-$C_{18}$alkyl group, a —CO—$C_5$-$C_{12}$cycloalkyl group, or —COO—$C_1$-$C_{18}$alkyl group;
$R^{39}$ is hydrogen, $C_1$-$C_{18}$alkyl, $C_1$-$C_{18}$haloalkyl, $C_7$-$C_{25}$arylalkyl, or $C_1$-$C_{18}$alkanoyl,
$R^{103}$ and $R^{103'}$ are each independently $C_1$-$C_{100}$alkyl, $C_1$-$C_{25}$alkyl substituted by E and/or interrupted with D, $C_7$-$C_{25}$arylalkyl, $C_6$-$C_{24}$aryl, $C_6$-$C_{24}$aryl which is substituted by G, $C_2$-$C_{20}$heteroaryl, or $C_2$-$C_{20}$heteroaryl which is substituted by G, $Ar^l$ is

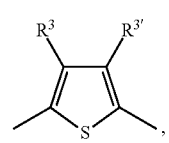 (XIa)

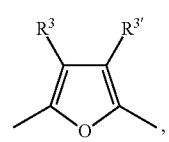 (XIb)

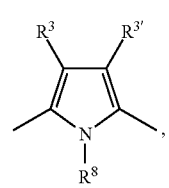 (XIc)

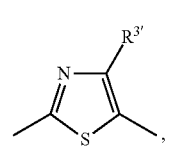 (XId)

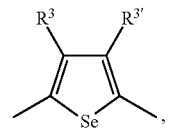 (IXe)

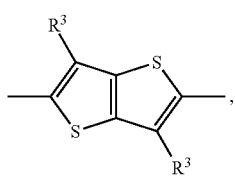 (IXf)
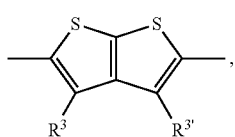 (XIg)
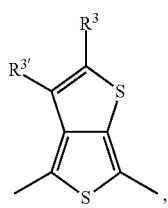 (XIh)
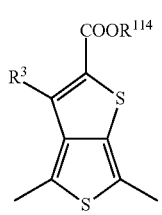 (XIi)
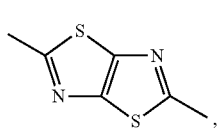 (XIj)
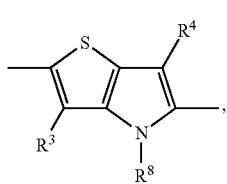 (XIk)
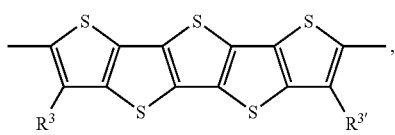 (XIl)
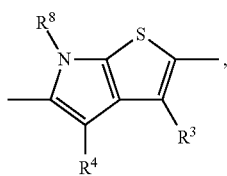 (XIm)
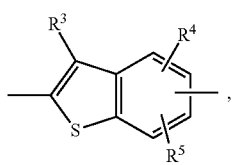 (XIn)
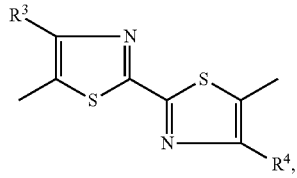 (XIo)
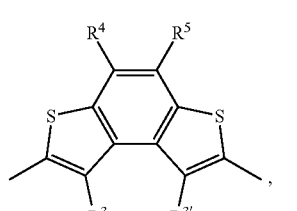 (XIp)
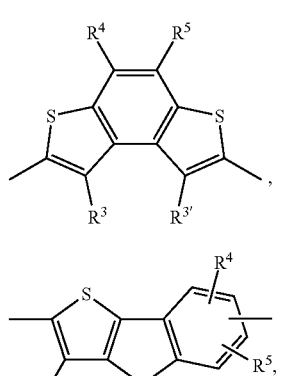 (XIq)
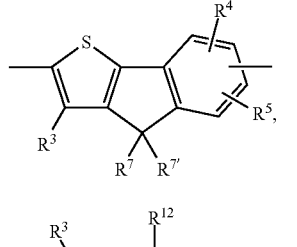 (XIr)
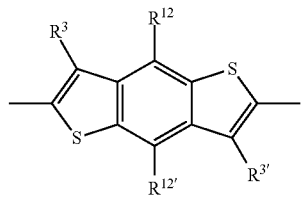 (XIs)
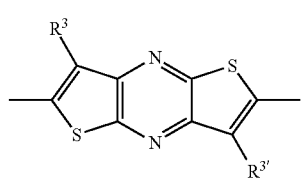 (XIt)
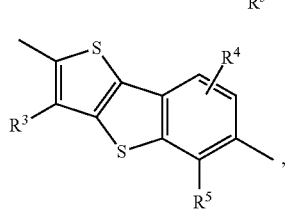 (XIu)
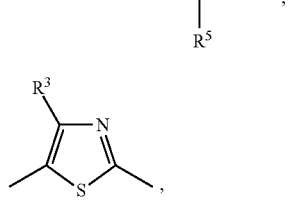 (XIv)
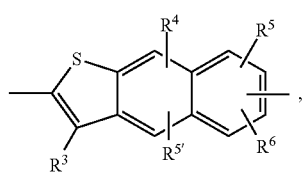 (XIw)

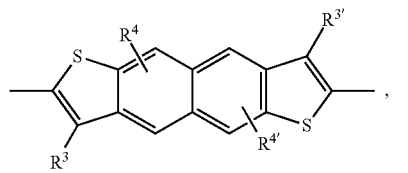 (XIx)
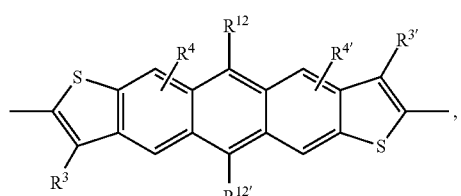 (XIy)
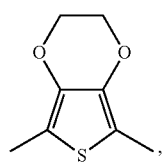 (XIz)
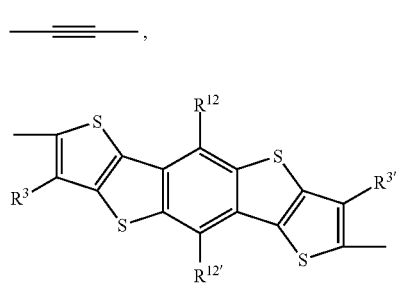 (XIIa)
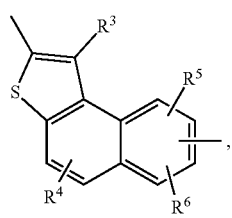 (XIIb)
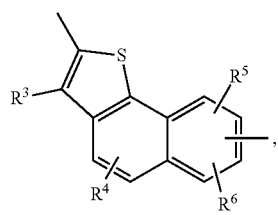 (XIIc)
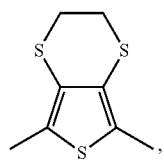 (XIId)
(XIIe)
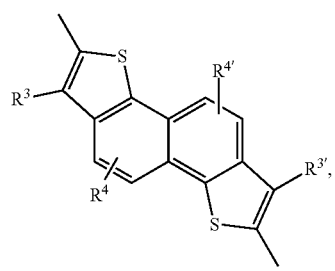 (XIIf)
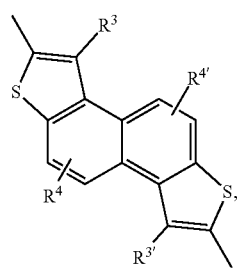 (XIIg)
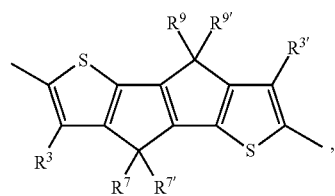 (XXIh)
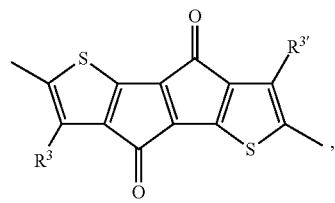 (XIIi)
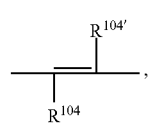 (XIIj)
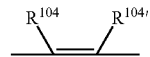 (XIIk)
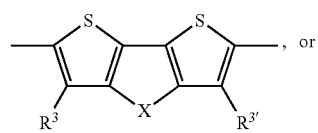, or
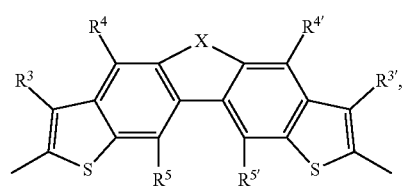 (XIV)
wherein
X is —O—, —S—, —NR$^8$—, —Si(R$^{11}$)(R$^{11'}$)—, —Ge(R$^{11}$)(R$^{11'}$)—, —C(R$^7$)(R$^{7'}$)—, —C(=O)—, —C(=CR$^{104}$R$^{104'}$)—,

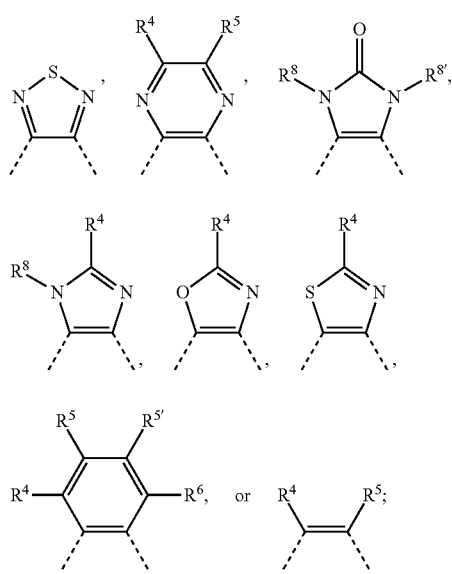
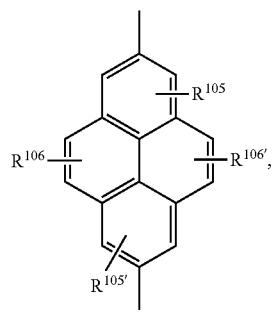
Ar² Ar³ have independently of each other the meaning of Ar¹, or are independently of each other
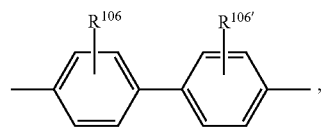 (XVa)
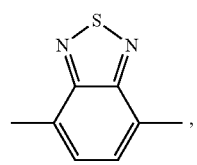 (XVb)
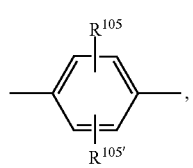 (XVc)
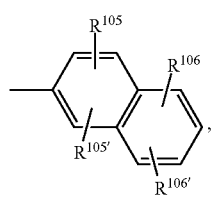 (XVd)
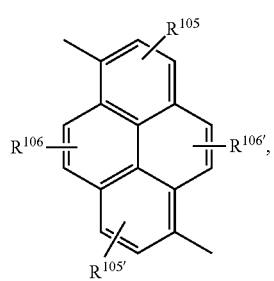
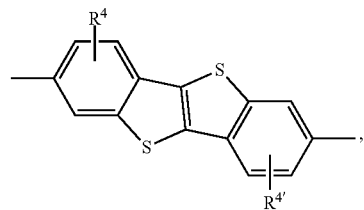 (XVe)
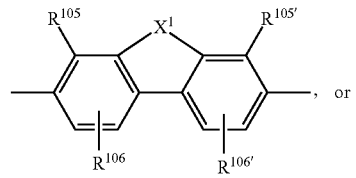 (XVf)
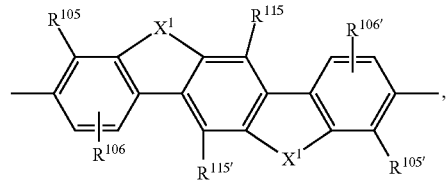 (XVg)
(XVh)
(XVI) or
(XVII)
wherein
$X^1$ is S, O, $NR^{107}$—, —$Si(R^{117})(R^{117'})$—, —$Ge(R^{117})(R^{117'})$—, —$C(R^{106})(R^{109})$—, —C(=O)—, —$C(=CR^{104}R^{104'})$—,
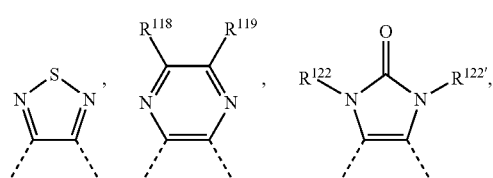

-continued

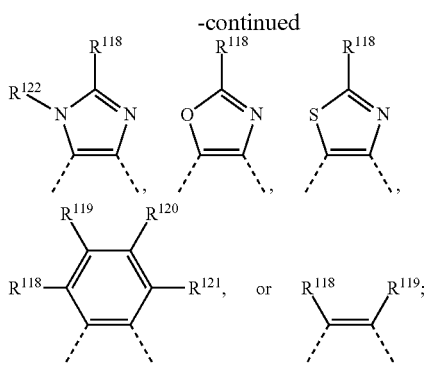

R³ and R³' are each independently hydrogen, halogen, halogenated $C_1$-$C_{25}$alkyl, cyano, $C_1$-$C_{25}$alkyl, which may optionally be interrupted by an oxygen or sulphur atom; $C_7$-$C_{25}$arylalkyl, or $C_1$-$C_{25}$alkoxy;

$R^{104}$ and $R^{104'}$ are each independently hydrogen, cyano, $COOR^{103}$, a $C_1$-$C_{25}$alkyl group, or $C_6$-$C_{24}$aryl or $C_2$-$C_{20}$heteroaryl;

$R^4$, $R^{4'}$, $R^5$, $R^{5'}$, $R^6$, and $R^{6'}$ are each independently hydrogen, halogen, halogenated $C_1$-$C_{25}$alkyl, cyano, $C_1$-$C_{25}$alkyl, which may optionally be interrupted by an oxygen, or sulphur atom; $C_7$-$C_{25}$arylalkyl, or $C_1$-$C_{25}$alkoxy;

$R^7$, $R^{7'}$, $R^9$ and $R^{9'}$ are each independently hydrogen, $C_1$-$C_{25}$alkyl, which may optionally be interrupted by an oxygen, or sulphur atom; or $C_7$-$C_{25}$arylalkyl;

$R^8$ and $R^{8'}$ are each independently hydrogen, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, which may optionally be interrupted by an oxygen or sulphur atom; or $C_7$-$C_{25}$arylalkyl;

$R^{11}$ and $R^{11'}$ are each independently $C_1$-$C_{25}$alkyl group, which can be substituted with $C_1$-$C_8$alkyl and/or $C_1$-$C_8$alkoxy;

$R^{12}$ and $R^{12'}$ are each independently hydrogen, halogen, cyano, $C_1$-$C_{25}$alkyl, which may optionally be interrupted by an oxygen, or sulphur atom, $C_1$-$C_{25}$alkoxy, $C_7$-$C_{25}$arylalkyl, or —≡—$R^{13}$, wherein $R^{13}$ is a $C_1$-$C_{10}$alkyl group, or a tri($C_1$-$C_8$alkyl)silyl group;

$R^{104}$ and $R^{104'}$ are each independently hydrogen, $C_1$-$C_{18}$alkyl, $C_6$-$C_{10}$aryl, which may optionally be substituted by G, or $C_2$-$C_8$heteroaryl, which may optionally be substituted by G;

$R^{105}$, $R^{105'}$, $R^{106}$ and $R^{106'}$ are each independently hydrogen, halogen, cyano, $C_1$-$C_{25}$alkyl, which may optionally be interrupted by an oxygen or sulphur atom; $C_7$-$C_{25}$arylalkyl, or $C_1$-$C_{18}$alkoxy;

$R^{107}$ is hydrogen, $C_7$-$C_{25}$arylalkyl, $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$perfluoroalkyl; $C_1$-$C_{25}$alkyl, which may be interrupted by —O—, or —S—; or —$COOR^{103}$;

$R^{108}$ and $R^{109}$ are each independently H, $C_1$-$C_{25}$alkyl, $C_1$-$C_{25}$alkyl, which is substituted by E and/or interrupted by D, $C_7$-$C_{25}$arylalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, or $R^{108}$ and $R^{109}$ together form a group of formula $=CR^{110}R^{111}$, wherein $R^{110}$ and $R^{111}$ are each independently H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^{108}$ and $R^{109}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, $R^{112}$ and $R^{113}$ are each independently H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{114}$ is $C_1$-$C_{25}$alkyl, which may optionally be interrupted by an oxygen, or sulphur atom, $R^{115}$ and $R^{115'}$ are each independently hydrogen, halogen, cyano, $C_1$-$C_{25}$alkyl, which may optionally be interrupted by an oxygen, or sulphur atom, $C_1$-$C_{25}$alkoxy, $C_7$-$C_{25}$arylalkyl, or —≡—$R^{116}$, wherein $R^{116}$ is a $C_1$-$C_{10}$alkyl group, or a tri($C_1$-$C_8$alkyl)silyl group;

$R^{117}$ and $R^{117'}$ are each independently $C_1$-$C_{25}$alkyl group, which can be substituted one to three times with $C_1$-$C_8$alkyl and/or $C_1$-$C_8$alkoxy;

$R^{118}$, $R^{119}$, $R^{120}$ and $R^{121}$ are each independently hydrogen, halogen, halogenated $C_1$-$C_{25}$alkyl, cyano, $C_1$-$C_{25}$alkyl, which may optionally be interrupted by an oxygen or sulphur atom; $C_7$-$C_{25}$arylalkyl, or $C_1$-$C_{25}$alkoxy; and $R^{122}$ and $R^{122'}$ are each independently hydrogen, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, which may optionally be interrupted by an oxygen or sulphur atom; or $C_7$-$C_{25}$arylalkyl.

13. The compound according to claim 12, which is a compound of formula

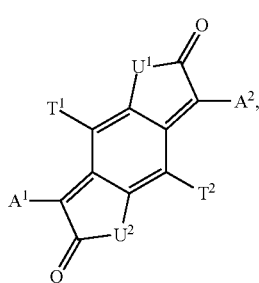 (IIIa)

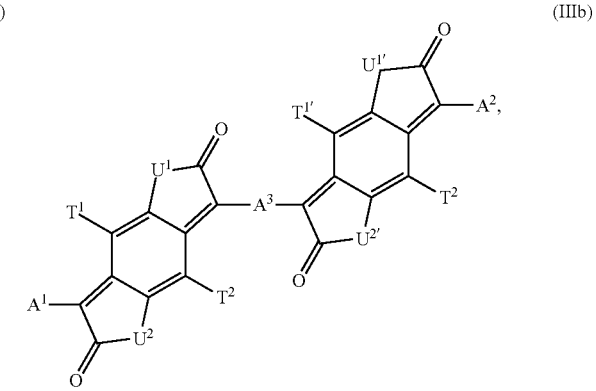 (IIIb)

-continued

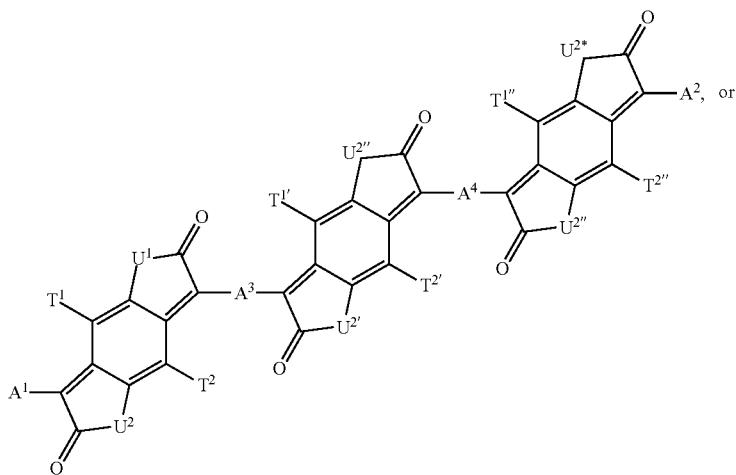
(IIIc)

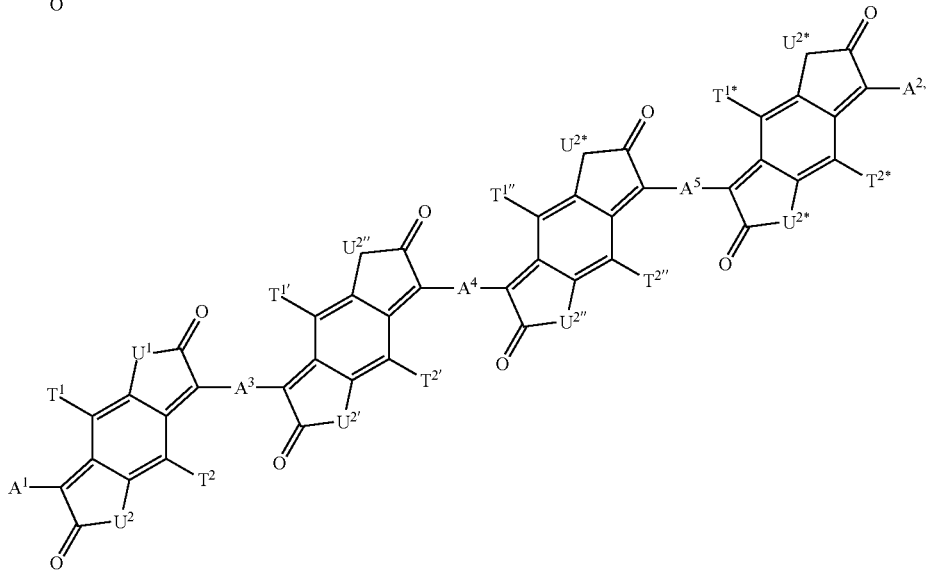
(IIId)

wherein
$A^1, A^2, A^3, A^4, A^5, T^1, T^2, U^1$ and $U^2$ are as defined in claim 12,
$T^{1'}, T^{2'}, T^{1''}, T^{2''}, T^{1*}$ and $T^{2*}$ each independently have the meaning of $T^1$, and
$U^{1'}, U^{2'}, U^{1''}, U^{2''}, U^{1*}$ and $U^{2*}$ each independently have the meaning of $U^1$.

14. A process for preparation of an organic semiconductor device, the process comprising: applying a solution, a dispersion, or both of a compound according to claim 12 in an organic solvent to a suitable substrates; and removing the solvent; or the process comprising evaporation of the compound according to claim 12.

15. A polymer comprising the compound according to claim 12, which is a repeating unit of formula

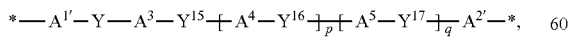
(X)

wherein
$A^{1'}$ and $A^{2'}$ are independently of each other a group of formula

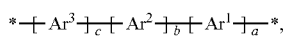

wherein a, b, c, p, q, $Ar^1, Ar^2, Ar^3, Y, Y^{15}, Y^{16}, Y^{17}, A^3, A^4$ and $A^5$ are as defined in claim 12.

16. A process for the preparation of a compound according to claim 12, which is a compound of formula

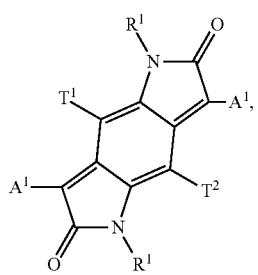
(IIIa')

comprising a) reacting one to three equivalents of a ketoamide of formula

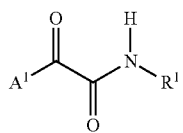

with one equivalent of a 1,4-cyclohexanedione of the formula

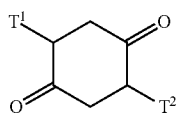

in the presence of a base in a solvent, whereby an intermediate product of the formula

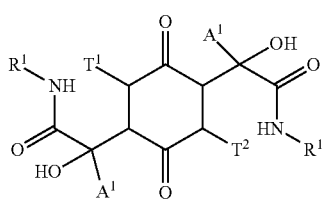

(IX)

is obtained, and
b) treating the intermediate product of the formula (IX) with an acid to obtain a compound of formula (IIIa'), wherein $R^1$, $T^1$, $T^2$, and $A^1$ are as defined in claim 12.

17. A process for the preparation of a compound according to claim 12, which is a compound of formula

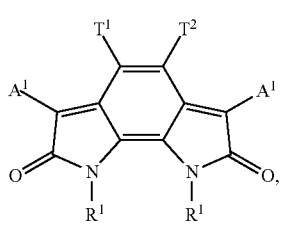

(IIIe)

comprising
a) reacting one to three equivalents of a ketoamide of formula

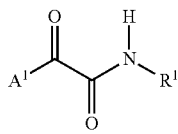

with one equivalent of a 1,2-cyclohexanedione of the formula

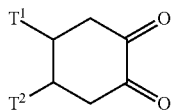

in the presence of a base in a solvent, whereby an intermediate product of the formula

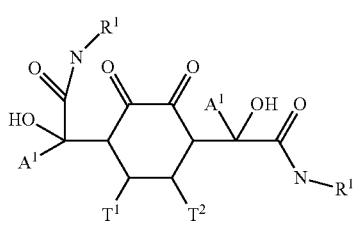

(VIII)

is obtained, and
b) treating the intermediate product of the formula (VIII) with an acid to obtain a compound of formula (IIIe), wherein $R^1$, $T^1$, $T_2$, and $A^1$ A are as defined in claim 12.

18. A 1,4-cyclohexanedione of formula

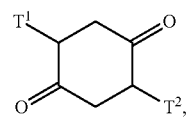

which is suitable for preparation of a compound according to claim 12, which is a compound of formula

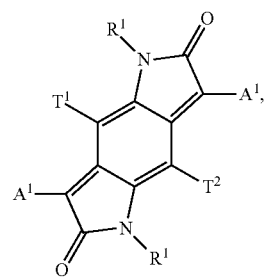

(IIIa')

wherein $R^1$, $T^1$, $T^2$, and $A^1$ are as defined in claim 12.

19. A 1,2-cyclohexanedione of formula

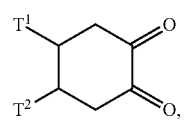

which is suitable for preparation of a compound according to claim 12, which is a compound of formula

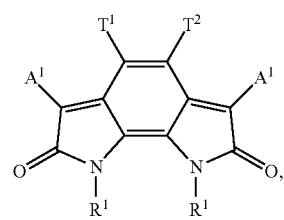

(IIIe)

wherein $R^1$, $T^1$, $T^2$, and $A^1$ are as defined in claim 12.

20. A compound of formula $X^2\!\!-\!\!\left[\text{Ar}^3\right]_c\!\!-\!\!\left[\text{Ar}^2\right]_b\!\!-\!\!\left[\text{Ar}^1\right]_a\!\!Y\!\!-\!\!\left[\text{Ar}^{1'}\right]_{a'}\!\!-\!\!\left[\text{Ar}^{2'}\right]_{b'}\!\!-\!\!\left[\text{Ar}^{3'}\right]_{c'}\!\!X^{2'}$ (V), wherein Y is a group of formula

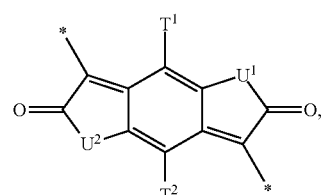

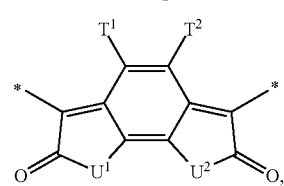 or

-continued

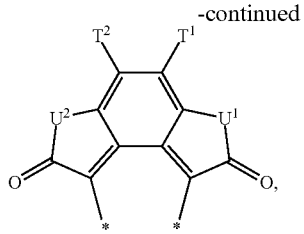

a is 1, 2, or 3, a' is 1, 2, or 3; b is 0, 1, 2, or 3; b' is 0, 1, 2, or 3; c is 0, 1, 2, or 3; c' is 0, 1, 2, or 3;
$U^1$ is O, S, or $NR^1$;
$U^2$ is O, S, or $NR^2$;
$T^1$ and $T^2$ are each independently hydrogen, halogen, hydroxyl, cyano, —$COOR^{103}$, —$OCOR^{103}$, —$NR^{112}COR^{103}$, —$CONR^{112}R^{113}$, —$OR^{103'}$, —$SR^{103'}$, —$SOR^{103'}$, —$SO_2R^{103'}$, —$NR^{112}SO_2R^{103'}$, —$NR^{112}R^{113}$, $C_1$-$C_{25}$alkyl, which may be substituted by E and/or interrupted by D, $C_5$-$C_{12}$cycloalkyl, which can be substituted one to three times with $C_1$-$C_8$alkyl and/or $C_1$-$C_8$alkoxy; $C_7$-$C_{25}$arylalkyl, $C_6$-$C_{24}$aryl which is substituted by G, $C_2$-$C_{20}$heteroaryl, or $C_2$-$C_{20}$heteroaryl which is substituted by G;
$R^1$ and $R^2$ may be the same or different and are each independently selected from hydrogen, a $C_1$-$C_{100}$alkyl group which can optionally be substituted with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2C_{20}$heteroaryl, a silyl group, or a siloxanyl group; and/or can optionally be interrupted by —O—, —S—, —$NR^{39}$—, $CONR^{39}$—, $NR^{39}CO$—, —COO—, —CO— or —OCO—,
a $C_2$-$C_{100}$alkenyl group which can optionally be substituted with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group; and/or can optionally be interrupted by —O—, —S—, —$NR^{39}$—, $CONR^{39}$—, $NR^{39}CO$—, —COO—, —CO— or —OCO—,
a $C_3$-$C_{100}$alkinyl group which can optionally be substituted with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group; and/or can optionally be interrupted by —O—, —S—, —$NR^{39}$—, $CONR^{39}$—, $NR^{39}CO$—, —COO—, —CO— or —OCO—,
a $C_3$-$C_{12}$cycloalkyl group which can optionally be substituted with $C_1$-$C_{12}$alkyl, $C_1$-$C_{12}$ alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group; and/or can optionally be interrupted by —O—, —S—, —$NR^{39}$—, $CONR^{39}$—, $NR^{39}CO$—, —COO—, —CO— or —OCO—,
a $C_6$-$C_{24}$aryl group which can optionally be substituted with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group,
a $C_2$-$C_{20}$heteroaryl group which can optionally be substituted with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group, or a siloxanyl group;
a —CO—$C_1$-$C_{18}$alkyl group, a —CO—$C_5$-$C_{12}$cycloalkyl group, or —COO—$C_1$-$C_{18}$alkyl group;
$R^{39}$ is hydrogen, $C_1$-$C_{18}$alkyl, $C_1$-$C_{18}$haloalkyl, $C_7$-$C_{25}$arylalkyl, or $C_1$-$C_{18}$alkanoyl;
$R^{103}$ and $R^{103'}$ are each independently $C_1$-$C_{100}$alkyl, $C_1$-$C_{25}$alkyl substituted by E and/or interrupted with D, $C_7$-$C_{25}$arylalkyl, $C_6$-$C_{24}$aryl, $C_6$-$C_{24}$aryl which is substituted by G, $C_2$-$C_{20}$heteroaryl, or $C_2$-$C_{20}$heteroaryl which is substituted by G;

$Ar^1$ and $Ar^{1'}$ are each independently

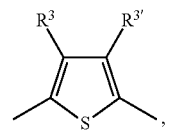
(XIa)

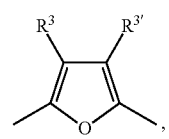
(XIb)

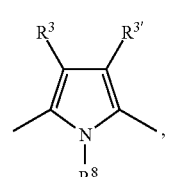
(XIc)

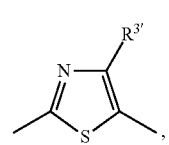
(XId)

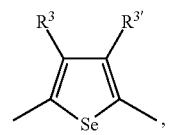
(IXe)

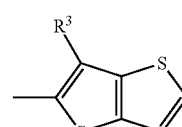
(IXf)

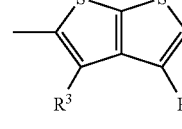
(XIg)

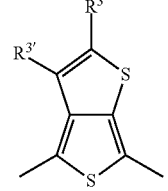
(XIh)

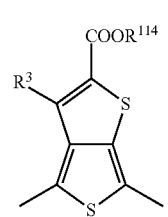
(XIi)

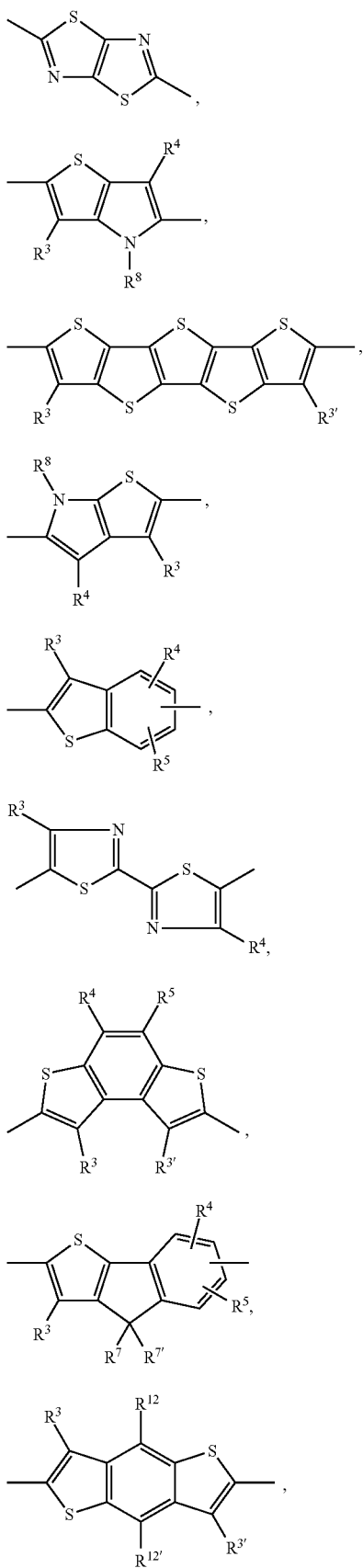
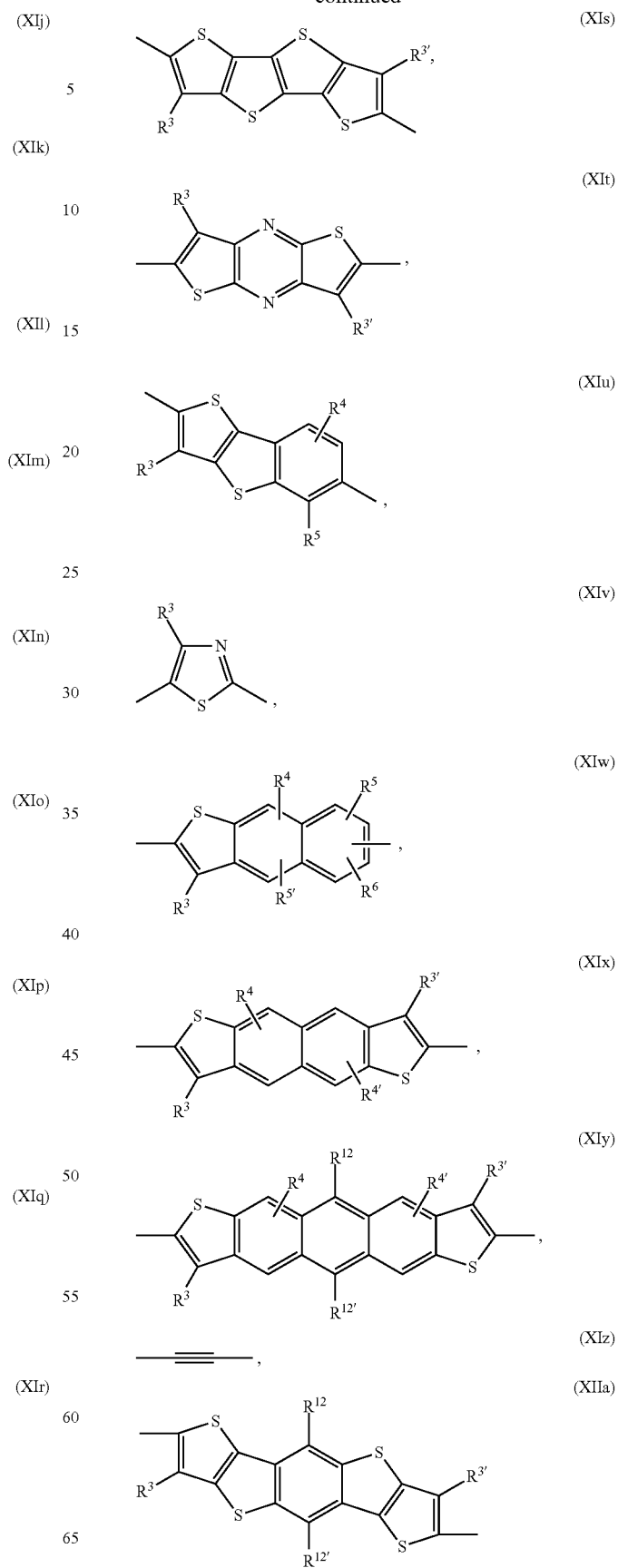

-continued
(XIIb) 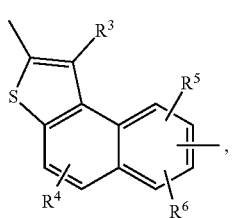
(XIIc) 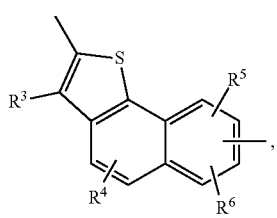
(XIId) 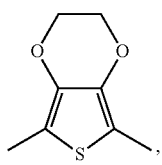
(XIIe) 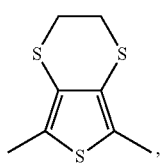
(XIIf) 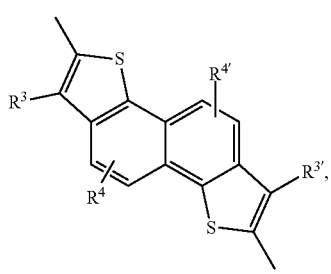
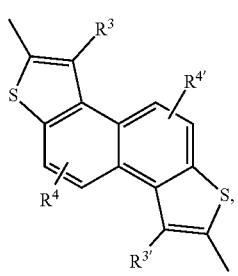
(XXIh) 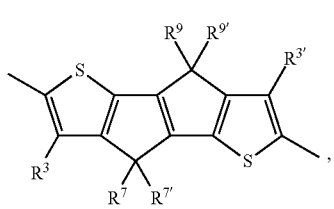
-continued
(XIIi) 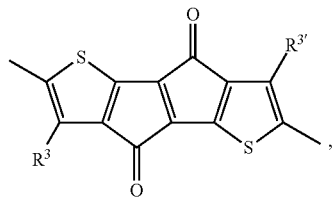
(XIIj) 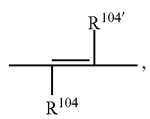
(XIIk) 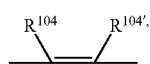
(XIII) 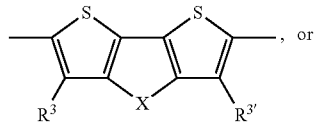
(XIV) 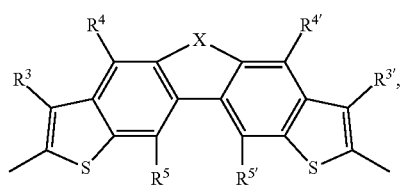
wherein
X is —O—, —S—, —NR$^8$—, —Si(R$^{11}$)(R$^{11'}$)—, —Ge(R$^{11}$)(R$^{11'}$)—, —C(R$^7$)(R$^{7'}$)—, —C(=O)—, —C(=CR$^{104}$R$^{104'}$)—,
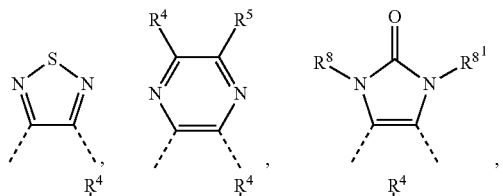
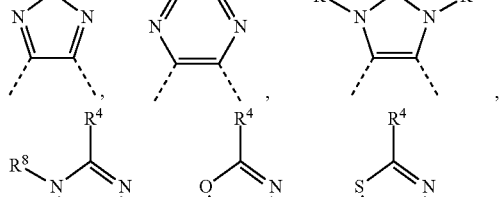
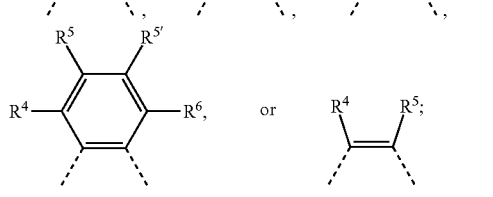
Ar$^2$, Ar$^{2'}$, Ar$^3$ and Ar$^{3'}$ have independently of each other the meaning of Ar$^1$, or are independently of each other

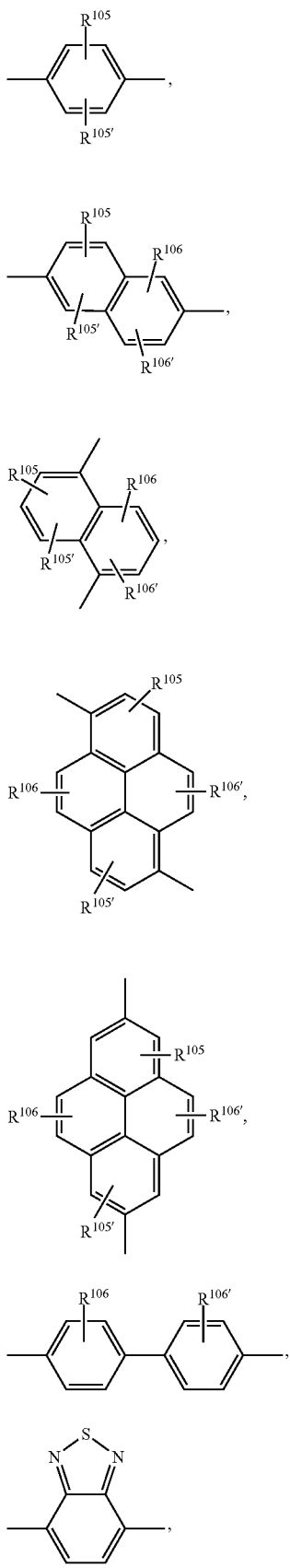

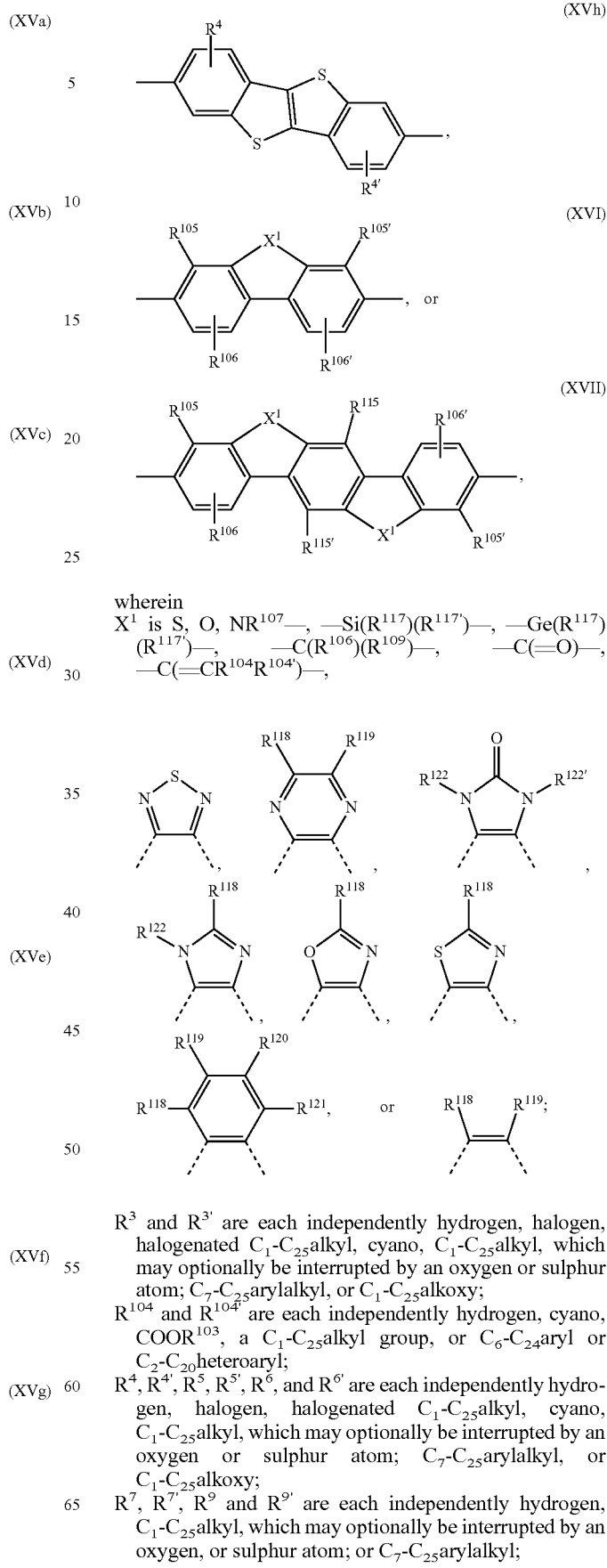

wherein
$X^1$ is S, O, $NR^{107}$—, —$Si(R^{117})(R^{117'})$—, —$Ge(R^{117})(R^{117'})$—, —$C(R^{106})(R^{109})$—, —$C(=O)$—, —$C(=CR^{104}R^{104'})$—, $R^3$ and $R^{3'}$ are each independently hydrogen, halogen, halogenated $C_1$-$C_{25}$alkyl, cyano, $C_1$-$C_{25}$alkyl, which may optionally be interrupted by an oxygen or sulphur atom; $C_7$-$C_{25}$arylalkyl, or $C_1$-$C_{25}$alkoxy;

$R^{104}$ and $R^{104'}$ are each independently hydrogen, cyano, $COOR^{103}$, a $C_1$-$C_{25}$alkyl group, or $C_6$-$C_{24}$aryl or $C_2$-$C_{20}$heteroaryl;

$R^4$, $R^{4'}$, $R^5$, $R^{5'}$, $R^6$, and $R^{6'}$ are each independently hydrogen, halogen, halogenated $C_1$-$C_{25}$alkyl, cyano, $C_1$-$C_{25}$alkyl, which may optionally be interrupted by an oxygen or sulphur atom; $C_7$-$C_{25}$arylalkyl, or $C_1$-$C_{25}$alkoxy;

$R^7$, $R^{7'}$, $R^9$ and $R^{9'}$ are each independently hydrogen, $C_1$-$C_{25}$alkyl, which may optionally be interrupted by an oxygen, or sulphur atom; or $C_7$-$C_{25}$arylalkyl;

$R^8$ and $R^{8'}$ are each independently hydrogen, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, which may optionally be interrupted by an oxygen or sulphur atom; or $C_7$-$C_{25}$arylalkyl;

$R^{11}$ and $R^{11'}$ are each independently $C_1$-$C_{25}$alkyl group, which can be substituted with $C_1$-$C_8$alkyl and/or $C_1$-$C_8$alkoxy;

$R^{12}$ and $R^{12'}$ are each independently hydrogen, halogen, cyano, $C_1$-$C_{25}$alkyl, which may optionally be interrupted by an oxygen, or sulphur atom, $C_1$-$C_{25}$alkoxy, $C_7$-$C_{25}$arylalkyl, or —≡—$R^{13}$, wherein $R^{13}$ is a $C_1$-$C_{10}$alkyl group, or a tri($C_1$-$C_8$alkyl)silyl group;

$R^{104}$ and $R^{104'}$ are each independently hydrogen, $C_1$-$C_{18}$alkyl, $C_6$-$C_{10}$aryl, which may optionally be substituted by G, or $C_2$-$C_8$heteroaryl, which may optionally be substituted by G;

$R^{105}$, $R^{105'}$, $R^{106}$ and $R^{106'}$ are each independently hydrogen, halogen, cyano, $C_1$-$C_{25}$alkyl, which may optionally be interrupted by an oxygen or sulphur atom; $C_7$-$C_{25}$arylalkyl, or $C_1$-$C_{18}$alkoxy;

$R^{107}$ is hydrogen, $C_7$-$C_{25}$arylalkyl, $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$perfluoroalkyl; $C_1$-$C_{25}$alkyl, which may be interrupted by —O—, or —S—; or —COOR$^{103}$;

$R^{108}$ and $R^{109}$ are each independently H, $C_1$-$C_{25}$alkyl, $C_1$-$C_{25}$alkyl which is substituted by E and/or interrupted by D, $C_7$-$C_{25}$arylalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, or $R^{108}$ and $R^{109}$ together form a group of formula =$CR^{110}R^{111}$, wherein $R^{110}$ and $R^{111}$ are each independently H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^{108}$ and $R^{109}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{18}$aralkyl;

D is —CO—, —COO—, —S—, —O—, or —NR$^{112}$—;

E is $C_1$-$C_8$thioalkoxy, $C_1$-$C_8$alkoxy, CN, —NR$^{112}$R$^{113}$, —CONR$^{112}$R$^{113}$, or halogen;

G is E, or $C_1$-$C_{18}$alkyl;

$R^{112}$ and $R^{113}$ are each independently H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{114}$ is $C_1$-$C_{25}$alkyl, which may optionally be interrupted by an oxygen, or sulphur atom;

$R^{115}$ and $R^{115'}$ are each independently hydrogen, halogen, cyano, $C_1$-$C_{25}$alkyl, which may optionally be interrupted by an oxygen, or sulphur atom, $C_1$-$C_{25}$alkoxy, $C_7$-$C_{25}$arylalkyl, or —≡—$R^{116}$, wherein $R^{116}$ is a $C_1$-$C_{10}$alkyl group, or a tri($C_1$-$C_8$alkyl)silyl group;

$R^{117}$ and $R^{117'}$ are each independently $C_1$-$C_{25}$alkyl group, which can be substituted one to three times with $C_1$-$C_8$alkyl and/or $C_1$-$C_8$alkoxy;

$R^{118}$, $R^{119}$, $R^{120}$ and $R^{121}$ are each independently hydrogen, halogen, halogenated $C_1$-$C_{25}$alkyl, cyano, $C_1$-$C_{25}$alkyl, which may optionally be interrupted by an oxygen or sulphur atom; $C_7$-$C_{25}$arylalkyl, or $C_1$-$C_{25}$alkoxy;

$R^{122}$ and $R^{122'}$ are each independently hydrogen, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, which may optionally be interrupted by an oxygen or sulphur atom; or $C_7$-$C_{25}$arylalky; and $X^2$ and $X^{2'}$ are each independently halogen, ZnX$^{12}$, —SnR$^{207}$R$^{208}$R$^{209}$, wherein R$^{207}$, R$^{208}$ and R$^{209}$ are identical or different and are each independently H or $C_1$-$C_6$alkyl, wherein two radicals optionally form a common ring and these radicals are optionally branched or unbranched and $X^{12}$ is a halogen atom; or —OS(O)$_2$CF$_3$, —OS(O)$_2$-aryl, —OS(O)$_2$CH$_3$, —B(OH)$_2$, —B(OY$^1$)$_2$,

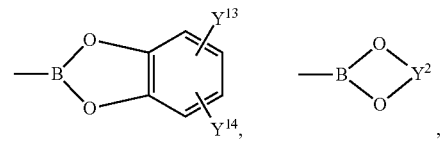

—BF$_4$Na, or —BF$_4$K, wherein $Y^1$ is independently in each occurrence a $C_1$-$C_{10}$alkyl group and $Y^2$ is independently in each occurrence a $C_2$-$C_{10}$alkylene group and $Y^{13}$ and $Y^{14}$ are each independently hydrogen, or a $C_1$-$C_{10}$alkyl group.

* * * * *